US010889605B2

(12) United States Patent
Li

(10) Patent No.: US 10,889,605 B2
(45) Date of Patent: Jan. 12, 2021

(54) PHENYL-CARBAZOLE BASED TETRADENTATE CYCLOMETALATED PLATINUM COMPLEX AND APPLICATION THEREOF

(71) Applicants: Zhejiang University of Technology, Hangzhou (CN); AAC Microtech (Changzhou) Co., Ltd., Changzhou (CN)

(72) Inventor: Guijie Li, Shenzhen (CN)

(73) Assignees: AAC MICROTECH(CHANGZHOU)CO., LTD., Changzhou (CN); ZHEJIANG UNIVERSITY OF TECHNOLOGY, Zhenqjianq (CN)

( * ) Notice: Subject to any disclaimer, the term of this patent is extended or adjusted under 35 U.S.C. 154(b) by 374 days.

(21) Appl. No.: 16/102,897

(22) Filed: Aug. 14, 2018

(65) Prior Publication Data

US 2019/0248820 A1 Aug. 15, 2019

(30) Foreign Application Priority Data

Feb. 9, 2018 (CN) .......................... 2018 1 0132616

(51) Int. Cl.
*H01L 51/50* (2006.01)
*C07F 15/00* (2006.01)
*H01L 51/00* (2006.01)

(52) U.S. Cl.
CPC ...... *C07F 15/0086* (2013.01); *H01L 51/0087* (2013.01); *H01L 51/5016* (2013.01); *H01L 51/5036* (2013.01)

(58) Field of Classification Search
None
See application file for complete search history.

(56) References Cited

U.S. PATENT DOCUMENTS

2018/0208615 A1* 7/2018 Lin .................... H01L 51/0087

* cited by examiner

*Primary Examiner* — Gregory D Clark
(74) *Attorney, Agent, or Firm* — IPro, PLLC; Na Xu

(57) ABSTRACT

The present disclosure relates to a light emitting material for a tetradentate cyclometalated platinum complex and an application thereof in the field of OLED. The tetradentate cyclometalated platinum complex is selected from one of compounds as shown in formula I. The present disclosure adjusts the photophysical properties of the tetradentate cyclometalated platinum complex by changing the structure of a ligand surrounding a metal center or regulating and controlling the structure of a substituent on a ligand, which can emit light in a range of about 400 nm to about 700 nm and has the advantages of narrow emission spectrum, high stability and high efficiency and has a wide application prospect in the field of OLED display and illumination.

13 Claims, 7 Drawing Sheets

High resolution mass spectrum analysis report

Operation Instrument: Thermo Fisher Scientific LTQ FTICR-MS

Card serial No.: D172118

Sample serial No.: Z-9-2

Operator: DONG Date : 2017/12/20

Operation: cation method

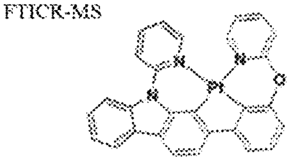

Chemical Formula: $C_{28}H_{17}N_3OPt$
Exact Mass: 606.10

Pt 1

Elemental composition search on mass 607.11 m/z= 602.11-612.11

| m/z | Theo. Mass | Delta (ppm) | RDB equiv. | Composition |
| --- | --- | --- | --- | --- |
| 607.1092 | 607.1092 | -0.00 | 21.5 | $C_{28}H_{18}ON_3Pt$ ← $[M+H]^+$ |
| | 607.1097 | -0.88 | 33.0 | $C_{35}H_{17}O_2N_5S$ |
| | 607.1086 | 1.07 | 12.5 | $C_{20}H_{21}O_2N_5PtS$ |
| | 607.1099 | -1.14 | 13.0 | $C_{22}H_{24}O_4N_2PtS$ |
| | 607.1106 | -2.22 | 21.0 | $C_{28}H_{20}O_2Pt$ |
| | 607.1077 | 2.46 | 37.5 | $C_{40}H_{16}O_3N_2$ |
| | 607.1111 | -3.10 | 32.5 | $C_{46}H_{19}O_5N_2S$ |
| | 607.1071 | 3.83 | 28.5 | $C_{35}H_{15}O_4N_4S$ |
| | 607.1065 | 4.41 | 17.0 | $C_{22}H_{20}O_4N_2Pt$ |
| | 607.1064 | 4.87 | 38.0 | $C_{41}H_{13}O_2N_5$ |

FIG. 4

High resolution mass spectrum analysis report

Operation Instrument: Thermo Fisher Scientific LTQ FTICR-MS
Card serial No.: D172120
Sample serial No.: Z-10-75
Operator: DONG Date: 2017/12/20
Operation Method: cation method

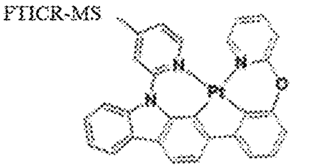

Pt 22

Chemical Formula: $C_{29}H_{19}N_3OPt$
Exact Mass: 620.12

Elemental composition search on mass 621.13 m/z= 616.13~626.13

| m/z | Theo. Mass | Delta (ppm) | RDB equiv. | Composition |
|---|---|---|---|---|
| 621.1256 | 621.1256 | 0.01 | 12.0 | $C_{33}H_{26}O_4N_2PtS$ |
| | 621.1254 | 0.28 | 33.0 | $C_{39}H_{18}O_2N_3S$ |
| | 621.1262 | -1.04 | 21.0 | $C_{31}H_{22}O_7Pt$ |
| | 621.1249 | 1.12 | 21.5 | $C_{29}H_{20}ON_3Pt$ ←···· $[M+H]^+$ |
| | 621.1267 | -1.90 | 32.5 | $C_{41}H_{21}O_3N_2S$ |
| | 621.1242 | 2.17 | 12.5 | $C_{23}H_{26}O_3N_5PtS$ |
| | 621.1234 | 3.53 | 37.5 | $C_{46}H_{19}O_2N_2$ |
| | 621.1282 | -4.30 | 16.5 | $C_{24}H_{26}ON_5PtS$ |
| | 621.1227 | 4.58 | 28.5 | $C_{36}H_{21}O_5N_4S$ |

FIG. 7

PHENYL-CARBAZOLE BASED TETRADENTATE CYCLOMETALATED PLATINUM COMPLEX AND APPLICATION THEREOF

CROSS-REFERENCE TO RELATED APPLICATIONS

This application claims the priority benefit of Chinese Patent Applications Ser. No. 201810132616.2 filed on Feb. 9, 2018, the entire content of which is incorporated herein by reference.

FIELD OF THE PRESENT DISCLOSURE

The present disclosure relates to the technical field of organic light emitting materials, and more particularly, to a light emitting material of a tetradentate cyclometalated platinum complex having an improved emission spectrum.

DESCRIPTION OF RELATED ART

Compounds capable of absorbing and/or emitting light can be ideally adoptable for use in a wide variety of optical and electroluminescent devices, including, for example, light absorbing devices such as solar-sensitive devices and photo-sensitive devices, organic light emitting diodes (OLEDs), light emitting devices or devices capable of conducting light absorption as well as light emission and being regarded as markers used for bio-applications. Many studies have been devoted to the discovery and optimization of organic and organometallic materials for using in optical and electroluminescent devices. Generally, studies in this area aim to accomplish a number of goals, including improvements in absorption and emission efficiency and improvements in processing ability.

Despite notable progresses obtained in studies of chemical and electro-optical materials (e.g., red and green phosphorescent organometallic materials are commercialized and have been used as phosphorescence materials in organic electroluminescent devices OLEDs, lighting equipment, and advanced displays), the currently available materials still have a number of defects, including poor machining property, inefficient emission or absorption and unsatisfactory stability.

Moreover, good blue light emitting materials are particularly scarce, and one great challenge is that the stability of a blue light device is not good enough. Meanwhile, the choice of host materials has an important impact on the stability and the efficiency of the devices. The lowest triplet state energy of a blue phosphorescent material is higher compared with that of red and green phosphorescent materials, which means that the lowest triplet state energy of the host material in the blue light device should be even higher. Therefore, the limitation of the host material in the blue light device is another important issue for the development of the blue light device.

Generally, a chemical structural change will affect the electronic structure of the compound, which thereby affects the optical properties of the compound (e.g., emission and absorption spectrum). Thus, the compound described in the present disclosure can be regulated or adjusted to a specific emission or absorption energy. In some aspects, the optical properties of the compound disclosed in the present disclosure can be regulated by varying the structure of the ligand surrounding the metal center. For example, compounds having a ligand with donative electron substituents or electro-withdrawing substituents generally show different optical properties, including different emission and absorption spectrum.

Since the phosphorescent multidentate platinum metal complexes can simultaneously utilize the electro-excited singlet and triplet state exciton to obtain 100% internal quantum efficiency, these complexes can be used as alternative light emitting materials for OLEDs. Generally, multidentate platinum metal complex ligands include light emitting groups and auxiliary groups. If conjugated groups, such as aromatic ring substituents or heteroatom substituents, are introduced into the light emitting part, the energy levels of the Highest Occupied Molecular Orbital (HOMO) and Lowest Unoccupied Molecular Orbital (LUMO) of the light emitting materials are changed. Meanwhile, further regulating the energy level gap between the HOMO orbit and the LUMO orbit can regulate the emission spectrum properties of the phosphorescent multidentate platinum metal complex, such as making the emission spectrum wider or narrower, or resulting in red shift or blue shift of the emission spectrum. Therefore, there is a need for new materials that show improved performances in light emission and absorption applications.

SUMMARY

The prevent disclosure aims at providing a light emitting material of a tetradentate cyclometalated platinum complex for improving emission spectrum.

The first aspect of the present disclosure provides a tetradentate cyclometalated platinum complex, wherein the tetradentate cyclometalated platinum complex is selected from at least one of the compounds as shown in formula I:

(I)

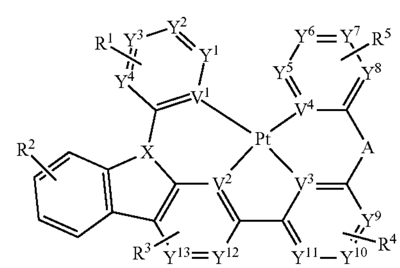

wherein:

each of $V^1$, $V^2$, $V^3$ and $V^4$ is an atom connected with Pt and independently selected from N atoms or C atoms, and $V^1$, $V^2$, $V^3$ and $V^4$ at least comprise two N atoms;

each of $Y^1$, $Y^2$, $Y^3$, $Y^4$, $Y^5$, $Y^6$, y, $Y^8$, $Y^9$, $Y^{10}$, $Y^{11}$, $Y^{12}$ and $Y^{13}$ is independently selected from N atoms or CH groups;

A represents O, S, $CH^2$, $CD^2$, $CR^aR^b$, C=O, $SiR^aR^b$, $GeH_2$, $GeR^aR^b$, NH, $NR^c$, PH, $PR^c$, $R^cP$=O, $AsR^c$, $R^cAs$=O, S=O, $SO_2$, Se, Se=O, $SeO_2$, BH, BRc, $R^cBi$=O, BiH, or $BiR^c$;

X represents N, B, CH, CD, $CR^a$, SiH, SiD, $SiR^a$, GeH, GeD, $GeR^d$, P, P=O, As, As=O, Bi or Bi=O;

each of $R^1$, $R^2$, $R^3$, $R^4$ and $R^5$ independently represents mono-, di-, tri-, tetra-substitutions or unsubstitutions, and each of $R^1$, $R^2$, $R^3$, $R^4$ and $R^5$ is independently hydrogen, deuterium, aryl, cycloalkyl, cycloalkenyl, heterocyclyl, heteroaryl, alkyl, alkenyl, alkynyl, halogen, hydroxyl, sulfydryl, nitro, cyano, amino, monoalkylamino or dialkylamino, monoarylamino or diarylamino, alkoxy, aryloxy, haloalkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramido, imino, sulfo, carboxyl, thiol, substituted silyl, polymeric groups or a combination thereof; and two or more adjacent R1, R2, R3, R4, and R5 can be optionally connected to form a fused ring.

The present disclosure also provides a device comprising the tetradentate cyclometalated platinum complex described above.

Preferably, the device comprises a full color display.

Preferably, the device is a photovoltaic device.

Preferably, the device is a light emitting display device.

Preferably, the device comprises an organic light emitting diode.

Preferably, the device comprises a phosphorescent organic light emitting diode.

Preferably, the device is a phosphorescent organic light emitting diode.

Preferably, the tetradentate cyclometalated platinum complex is selected to have 100% internal quantum efficiency in the device environment.

The present disclosure further provides a light emitting device comprising at least one cathode, at least one anode, and at least one light emitting layer, wherein at least one of the light emitting layers comprises the tetradentate cyclometalated platinum complex described above.

The present disclosure has the beneficial effects that: the present disclosure adjusts the photophysical properties of the metal platinum complex by changing the structure of a ligand surrounding a metal center or regulating and controlling the structure of a substituent on a ligand, which can emit light in a range of about 400 nm to about 700 nm and has the advantages of narrow emission spectrum, high stability and high efficiency; the application of the metal platinum complex to a light emitting device can improve the light emitting efficiency and the operation time of the device, which has a wide application prospect in the field of OLED display and illumination.

BRIEF DESCRIPTION OF THE DRAWINGS

In order to illustrate the technical solutions in the embodiments of the present disclosure more clearly, the drawings need to be used in the description of the embodiments will be briefly described below. Obviously, the drawings in the following description are merely some embodiments of the present disclosure. For those of ordinary skill in the art, other drawings may also be obtained based on these drawings without any creative work, wherein:

FIG. 4 is a high resolution mass spectrum analysis report of the platinum complex Pt 1;

FIG. 7 is a high resolution mass spectrum analysis report of the platinum complex Pt 22.

Figure 1:
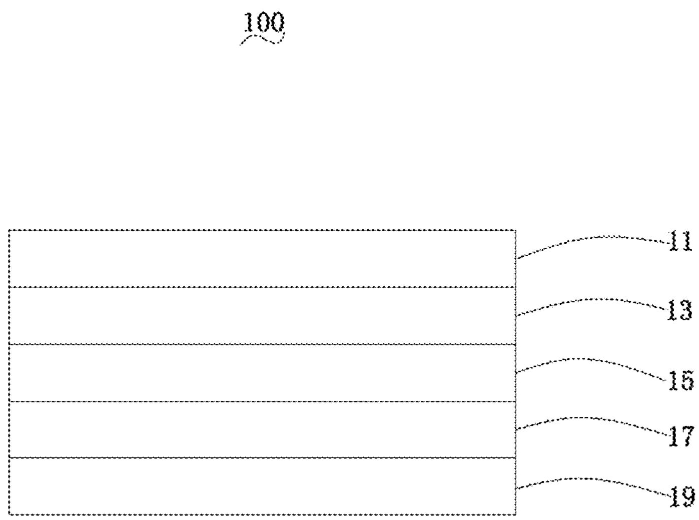
FIG. 1 is a schematic diagram of a light emitting device provided by an embodiment of the present disclosure.

Other aspects of the drawings are also described in the drawing description after the drawings. The advantages are realized and obtained by means of the elements and combinations particularly pointed out in the claims. It should be noted that the above general description and the following detailed description are exemplary and explanatory only and are not limiting.

DETAILED DESCRIPTION OF THE EXEMPLARY EMBODIMENTS

The present disclosure can be understood more readily by reference to the following detailed description and the examples included therein.

Before the compounds, devices, and/or methods of the disclosure are disclosed and described, it is to be understood that they are not limited to specific synthetic methods unless otherwise specified, or to specific reagents unless otherwise specified, as such can, of course, vary. It is also to be understood that the terms used in the present disclosure is for the purpose of describing particular aspects only and is not intended to limit. Although any methods and materials similar or equivalent to those described in the present disclosure can be used in the practice or test, exemplary methods and materials are described hereinafter.

The term "optional" or "optionally" used in the present disclosure means that the subsequently described event or circumstance can or cannot occur, and the description includes cases which said event or circumstance occurs and does not occur.

Disclosed are the components to be used to prepare the compositions described in the present disclosure as well as the compositions themselves to be used in the methods disclosed in the present disclosure. These and other materials are disclosed in the present disclosure, and it is to be understood that when combinations, subsets, interactions, groups, etc. of these materials are disclosed, while specific reference of each various individual and collective combinations and permutation of these compounds cannot be specifically disclosed, each one is specifically expected and described in the present disclosure. For example, if a specific compound is disclosed and discussed and a number of modifications that can be made to a number of molecules including the compounds are discussed, various and each combination and permutation of the compound are specifically expected and the modifications may be possibly conducted unless specifically indicated to the contrary. Thus, if a class of molecules A, B, and C are disclosed as well as a class of molecules D, E, and F and an example of a combination molecules A-D is disclosed, then even if each is not individually described, each of the individually and collectively expected meaning combinations A-E, A-F, B-D, B-E, B—F, C-D, C-E, and C—F are considered to be disclosed. Likewise, any subset or combination of these is also disclosed. Thus, for example, sub-groups A-E, B-F, and C-E would be considered to be disclosed. These concepts are applied to all aspects of the present disclosure including but not limited to steps of methods of preparing and using the compositions. Thus, if there are a variety of additional steps that can be performed, it is to be understood that each of these additional steps can be performed with specific embodiment or combination of embodiments of the methods.

A linking atom as used in the present disclosure can connect two groups, for example, N and C groups. The linking atom can optionally, if valence linkage permits, have other attached chemical moieties. For example, in one aspect, oxygen would not have any other chemical groups attached as the valence linkage has been satisfied once it is bonded to two atoms (e.g., N or C). On contrary, when carbon is the linking atom, two additional chemical moieties can be attached to the carbon atom. Suitable chemical moieties include but not limited to hydrogen, hydroxyl, alkyl, alkoxy, =O, halogen, nitro, amine, amide, thiol, aryl, heteroaryl, cycloalkyl and heterocyclyl.

The term "cyclic structure" or the similar terms used in the present disclosure refer to any cyclic chemical structure which includes but not limited to aryl, heteroaryl, cycloalkyl, cycloalkenyl, heterocyclyl, carbene and N-heterocyclic carbene.

The term "substituted" used in the present disclosure is expected to include all permissible substituents of organic compounds. In a broad aspect, the permissible substituents include acyclic and cyclic, branched and unbranched, carbocyclic and heterocyclic and aromatic and nonaromatic substituents of organic compounds. Illustrative substituents include, for example, those described below. The permissible substituents can be one or more and the same or different for appropriate organic compounds. For the target of the present disclosure, the heteroatoms, such as nitrogen, can have hydrogen substituents and/or any permissible substituents of the organic compounds described in the present disclosure which satisfy the valence linkage of the heteroatoms. This disclosure is not intended to limit in any manner by the permissible substituents of the organic compounds. Likewise, the terms "substitution" or "substituted with" include the implied condition that such substitution is in accordance with permitted valence linkages of the substituted atom and the substituent, and the substitution results in a stable compound, e.g., a compound that does not spontaneously undergo transformation (such as by rearrangement, cyclization, elimination, or the like). It is also expected that, in certain aspects, unless expressly indicated to the contrary, individual substituents can be further optionally substituted (i.e., further substituted or unsubstituted).

In defining various terms, "$R^1$", "$R^2$", "$R^3$" and "$R^4$" are used as general symbols to represent various specific substituents in the present disclosure. These symbols can be any substituent, not limited to those disclosed in the present disclosure, and when they are defined to be certain substituents in one case, they can, in other cases, be defined as some other substituents.

The term "alkyl" as used herein is a branched or unbranched saturated hydrocarbon of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl can be cyclic or acyclic. The alkyl may be branched or unbranched. The alkyl can also be substituted or unsubstituted. For example, the alkyl can be substituted with one or more groups including, but not limited to, alkyl, cycloalkyl, alkoxy, amino, ether, halogen, hydroxyl, nitro, silyl, sulfo-oxo, or thiol, as described in the present disclosure. A "lower alkyl" group is an alkyl containing from one to six (e.g., from one to four) carbon atoms.

Throughout the specification, "alkyl" is generally used to refer to both unsubstituted alkyl and substituted alkyl; however, substituted alkyl is also specifically mentioned in the present disclosure by identifying the specific substituent(s) on the alkyl. For example, the term "halogenated alkyl" or "haloalkyl" specifically refers to an alkyl that is substituted with one or more halogens, e.g., fluorine, chlorine, bromine, or iodine. The term "alkoxyalkyl" specifically refers to an alkyl that is substituted with one or more alkoxys, as described below. The term "alkylamino" specifically refers to an alkyl that is substituted with one or more aminos as described below, and the like. When "alkyl" is used in one case and a specific term such as "alkylalcohol" is used in another case, it does not mean to imply that the term "alkyl" does not also refer to specific terms such as "alkylalcohol" and the like at the same time.

The present practice is also used for other groups described in the present disclosure. That is, while a term such as "cycloalkyl" refers to both unsubstituted and substituted cycloalkyl moieties, the substituted moieties can, in addition, be specifically identified in the present disclosure; for example, a specific substituted cycloalkyl can be referred to as, e.g., "alkylcycloalkyl". Similarly, a substituted alkoxy can be specifically referred to as, e.g., "halogenated alkoxy", and a specific substituted alkenyl can be, e.g., "enol" and the like. Likewise, the practice of using a general term, such as "cycloalkyl", and a specific term, such as "alkylcycloalkyl", does not intend to imply that the general term does not also include the specific term at the same time.

The term "cycloalkyl" used in the present disclosure is a non-aromatic carbon-based ring composed of at least three carbon atoms. Examples of cycloalkyl include, but are not limited to, cyclopropyl, cyclobutyl, cyclopentyl, cyclohexyl, cyclononyl, and the like. The term "heterocycloalkyl" is a type of cycloalkyl as defined above and is included within the meaning of the term "cycloalkyl," wherein at least one of the carbon atoms of the ring is replaced with a heteroatom such as, but not limited to, nitrogen, oxygen, sulfur, or phosphorus. The cycloalkyl and heterocycloalkyl can be substituted or unsubstituted. The cycloalkyl and heterocycloalkyl can be substituted with one or more groups including but not limited to alkyl, cycloalkyl, alkoxy, amino, ether, halide, hydroxy, nitro, silyl, sulfo-oxo, or thiol as described in the present disclosure.

The term "polyalkene group" is used in the present disclosure to refer to containing two or more CH2 groups and connecting other identical moieties. The "polyolefin group" can be represented as $-(CH_2)_a-$, wherein "a" is an integer from 2 to 500.

The terms "alkoxy" and "alkoxyl group" are used in the present disclosure to refer to an alkyl or cycloalkyl bonded through an ether linkage; that is, an "alkoxy" can be defined as $-OR^1$ wherein $R^1$ is alkyl or cycloalkyl as defined above. "Alkoxy" also includes polymers of the alkoxy as just described; that is, an alkoxy can be a polyether such as $-OR^1-OR^2$ or $-OR^1-(OR^2)a-OR^3$, wherein "a" is an integer of from 1 to 200 and each of $R^1$, $R^2$, and $R^3$ is independently alkyl, cycloalkyl or a combination thereof.

The term "alkenyl" used in the present disclosure is a hydrocarbyl of carbon atoms from 2 to 24 with a structural formula containing at least one carbon-carbon double bond. Asymmetric structures such as $(R^1R^2)C=C(R^3R^4)$ are intended to include both E and Z isomers. It can be presumed that there is an asymmetric alkene in the structural formulas of the present disclosure, or it can be explicitly indicated by the bond symbol C=C. The alkenyl can be substituted with one or more groups including but not limited to alkyl, cycloalkyl, alkoxy, alkenyl, cycloalkenyl, alkynyl, cycloalkynyl, aryl, heteroaryl, aldehyde, amino, carboxylic acid, ester, ether, halogen, hydroxyl, ketone, azide, nitro, silyl, sulfo-oxo or thiol as described in the present disclosure.

The term "cycloalkenyl" used in the present disclosure is a non-aromatic carbon-based ring composed of at least three carbon atoms and containing at least one carbon-carbon double bound, i.e., C=C. Examples of cycloalkenyl include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl as defined above and is included within the meaning of the term "cycloalkenyl", wherein at least one of the carbon atoms of the ring is replaced with a heteroatom such as, but not limited to, nitrogen, oxygen, sulfur, or phosphorus. The cycloalkenyl and heterocycloalkenyl can be substituted or unsubstituted. The cycloalkenyl and heterocycloalkenyl can be substituted with one or more groups including but not limited to alkyl, cycloalkyl, alkoxy, alkenyl, cycloalkenyl, alkynyl, cycloalkynyl, aryl, heteroaryl, aldehyde, amino, carboxylic acid, ester, ether, halogen, hydroxyl, ketone, azide, nitro, silyl, sulfo-oxo or thiol as described in the present disclosure.

The term "alkynyl" used in the present disclosure is a hydrocarbon of 2 to 24 carbon atoms with a structural formula containing at least one carbon-carbon triple bond. The alkynyl can be unsubstituted or substituted with one or more groups including but not limited to alkyl, cycloalkyl, alkoxy, alkenyl, cycloalkenyl, alkynyl, cycloalkynyl, aryl, heteroaryl, aldehyde, amino, carboxylic acid, ester, ether, halogen, hydroxyl, ketone, azide, nitro, silyl, sulfo-oxo or thiol as described in the present disclosure.

The term "cycloalkynyl" used in the present disclosure is a non-aromatic carbon-based ring composed of at least seven carbon atoms and containing at least one carbon-carbon triple bound. Examples of cycloalkynyl include, but are not limited to, cycloheptynyl, cyclooctynyl, cyclononynyl, and the like. The term "heterocycloalkynyl" is a type of cycloalkenyl as defined above and is included within the meaning of the term "cycloalkynyl", wherein at least one of the carbon atoms of the ring is replaced with a heteroatom such as, but not limited to, nitrogen, oxygen, sulfur or phosphorus. The cycloalkynyl and heterocycloalkynyl can be substituted or unsubstituted. The cycloalkynyl and heterocycloalkynyl can be substituted with one or more groups including but not limited to alkyl, cycloalkyl, alkoxy, alkenyl, cycloalkenyl, alkynyl, cycloalkynyl, aryl, heteroaryl, aldehyde, amino, carboxylic acid, ester, ether, halogen, hydroxyl, ketone, azide, nitro, silyl, sulfo-oxo or thiol as described in the present disclosure.

The term "aryl" used in the present disclosure is a group that contains any carbon-based aromatic group including but not limited to benzene, naphthalene, phenyl, biphenyl, phenoxybenzene and the like. The term "aryl" also includes "heteroaryl", which is defined as a group containing an aromatic group that has at least one heteroatom incorporated into the ring of the aromatic group. Examples of heteroatoms include, but are not limited to, nitrogen, oxygen, sulfur and phosphorus. Likewise, the term "non-heteroaryl" (which is also included in the term "aryl") defines a group containing an aromatic group that does not contain a heteroatom. The aryl can be substituted or unsubstituted. The aryl can be substituted with one or more groups including but not limited to alkyl, cycloalkyl, alkoxy, alkenyl, cycloalkenyl, alkynyl, cycloalkynyl, aryl, heteroaryl, aldehyde, amino, carboxylic acid, ester group, ether group, halogen, hydroxyl, ketone group, azide, nitro, silyl, sulfo-oxo or sulfydryl as described in the present disclosure. The term "biaryl" is a specific type of aryl and is included in the definition of "aryl". Biaryl refers to two aryls that are bound together via a fused ring structure, as in naphthalene, or two aryls being connected via one or more carbon-carbon bonds, as in biphenyl.

The term "aldehyde" used in the present disclosure is represented by the formula —C(O)H. Throughout the specification, "C(O)" is an abbreviated form of carbonyl (i.e., C═O).

The terms "amine" or "amino" used in the present disclosure are represented by the formula $—NR^1R^2$, wherein $R^1$ and $R^2$ can be independently selected from hydrogen, alkyl, cycloalkyl, alkenyl, cycloalkenyl, alkynyl, cycloalkynyl, aryl or heteroaryl.

The term "alkylamino" used in the present disclosure is represented by the formula —NH(-alkyl), wherein alkyl is described as in the present disclosure. Representative examples include, but are not limited to, methylamino, ethylamino, propylamino, isopropylamino, butylamino, isobutylamino (s-butyl)amino, (t-butyl)amino, pentylamino, isopentylamino, (tert-pentyl)amino, hexylamino and the like.

The term "dialkylamino" used in the present disclosure is represented by the formula $—N(\text{-alkyl})_2$, wherein alkyl is described as in the present disclosure. Representative examples include, but are not limited to, dimethylamino, diethylamino, dipropylamino, diisopropylamino, dibutylamino, diisobutylamino, di(s-butyl)amino, di(t-butyl)amino, dipentylamino group, diisopentylamino, di(tert-pentyl)amino, dihexylamino, N-ethyl-N-methylamino, N-methyl-N-propylamino, N-ethyl-N-propylamino and the like.

The term "arboxylic acid" used in the present disclosure is represented by the formula —C(O)OH.

The term "ester" used in the present disclosure is represented by the formula $—OC(O)R^1$ or $—C(O)OR^1$, wherein $R^1$ can be alkyl, cycloalkyl, alkenyl, cycloalkenyl, alkynyl, cycloalkynyl, aryl or heteroaryl as described in the present disclosure. The term "polyester" used in the present disclosure is represented by the formula $—(R^1O(O)C—R^2—C(O)O)_a—$ or $—(R^1O(O)C—R^2—OC(O))_a—$, wherein $R^1$ and $R^2$ can be, independently, alkyl, cycloalkyl, alkenyl, cycloalkenyl, alkynyl, cycloalkynyl, aryl or heteroaryl described in the present disclosure, and "a" is an integer of from 1 to 500. The term "polyester" is used to describe the group produced by the reaction between a compound having at least two carboxyl groups and a compound having at least two hydroxyl groups.

The term "ether" used in the present disclosure is represented by the formula $R^1OR^2$, wherein $R^1$ and $R^2$ can be, independently, alkyl, cycloalkyl, alkenyl, cycloalkenyl, alkynyl, cycloalkynyl, aryl or heteroary described in the present disclosure. The term "polyether" used in the present disclosure is represented by the formula $—(R^1O—R^2O)_a—$, wherein $R^1$ and $R^2$ can be, independently, alkyl, cycloalkyl, alkenyl, cycloalkenyl, alkynyl, cycloalkynyl, aryl or heteroaryl described in the present disclosure, and "a" is an integer of from 1 to 500. Examples of polyether groups include polyethylene oxide, polypropylene oxide and polybutylene oxide.

The term "halogen" used in the present disclosure refers to the halogens fluorine, chlorine, bromine and iodine.

The term "heterocyclyl" used in the present disclosure refers to single and multi-cyclic non-aromatic ring systems and "heteroaryl" used in the present disclosure refers to single and multi-cyclic aromatic ring systems: in which at least one of the ring members is not carbon. The terms includes azetidine, dioxane, furan, imidazole, isothiazole, isoxazole, morpholine, oxazole, oxazole including 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine including 1,2,4,5-tetrazine, tetrazole including 1,2,3,4-tetrazole and 1,2,4,5-tetrazole, thiadiazole including 1,2,3-thiadiazole, 1,2,5-thiadiazole and 1,3,4-thiadiazole, thiazole, thiophene, triazine including 1,3,5-triazine and 1,2,4-triazine, triazole including 1,2,3-triazole, 1,3,4-triazole and the like.

The term "hydroxyl" used in the present disclosure is represented by the formula —OH.

The term "ketone" used in the present disclosure is represented by the formula $R^1C(O)R^2$, wherein $R^1$ and $R^2$ can be, independently, alkyl, cycloalkyl, alkenyl, cycloalkenyl, alkynyl, cycloalkynyl, aryl or heteroary described in the present disclosure.

The term "azide" used in the present disclosure is represented by the formula $—N_3$.

The term "nitro" used in the present disclosure is represented by the formula $—NO_2$.

The term "nitrile" used in the present disclosure is represented by the formula —CN.

The term "silyl" used in the present disclosure is represented by the formula $—SiR^1R^2R^3$, wherein $R^1$, $R^2$, and $R^3$ can be, independently, hydrogen or alkyl, cycloalkyl, alkoxy, alkenyl, cycloalkenyl, alkynyl, cycloalkynyl, aryl or heteroaryl group as described in the present disclosure.

The term "sulfo-oxo group" used in the present disclosure is represented by the formulas $—S(O)R^1$, $—S(O)_2R^1$, $—OS(O)_2R^1$, or $—OS(O)_2OR^1$, wherein $R^1$ can be hydrogen or alkyl, cycloalkyl, alkenyl, cycloalkenyl, alkynyl, cycloalkynyl, aryl or heteroaryl group as described in the present disclosure. Throughout this specification, "S(O)" is an abbreviated form for S═O. The term "sulfonyl" used in the present disclosure refers to the sulfo-oxo group represented by the formula $—S(O)_2R^1$, wherein $R^1$ can be alkyl, cycloalkyl, alkenyl, cycloalkenyl, alkynyl, cycloalkynyl, aryl or heteroaryl. The term "sulfone" used in the present disclosure is represented by the formula $R^1S(O)_2R^2$, wherein $R^1$ and $R^2$ can be, independently, alkyl, cycloalkyl, alkenyl, cycloalkenyl, alkynyl, cycloalkynyl, aryl or heteroaryl as described in the present disclosure. The term "sulfoxide" used in the present disclosure is represented by the formula $R^1S(O)R^2$, wherein $R^1$ and $R^2$ can be, independently, alkyl, cycloalkyl, alkenyl, cycloalkenyl, alkynyl, cycloalkynyl, aryl or heteroaryl as described in the present disclosure.

The term "sulfydryl" used in the present disclosure is represented by the formula —SH.

"$R^1$", "$R^2$", "$R^3$" and "$R^e$" (wherein n is an integer), as used in the present disclosure, can independently possess one or more of the groups listed above. For example, if $R^1$ is a linear alkyl, then one of the hydrogen atoms of the alkyl may be optionally substituted with hydroxyl, alkoxy, alkyl, halogen and the like. Depending upon the groups that are selected, a first group can be incorporated within a second group, or alternatively, the first group can be hung (i.e., connected) to the second group. For example, to the phrase "alkyl comprising an amino", the amino can be incorporated within the backbone of the alkyl. Alternatively, the amino can be combined to the main chain of the alkyl. The nature of the selected group will determine whether the first group is embedded or connected to the second group.

Compounds described in the present disclosure may contain "optionally substituted" moieties. In general, the term "substituted" (no matter whether preceded by the term "optionally" or not), means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at each position. Combinations of substituents considered in the present disclosure are preferably those resulted in the formation of stable or chemically feasible compounds. It also shows that, in certain aspects, unless expressly indicated to the contrary, individual substituent can be further optionally substituted (i.e., further substituted or unsubstituted).

The structure of the compound can be represented by a following formula:

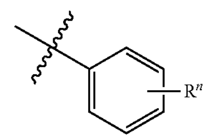

which is understood to be equivalent to a following formula:

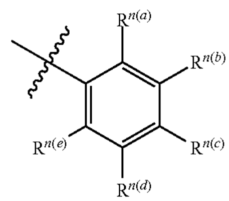

wherein n is typically an integer. That is, $R^n$ is understood to represent five independent substituents $R^{n(a)}$, $R^{n(b)}$, $R^{n(c)}$, $R^{n(d)}$ and $r^{n(e)}$. The "independent substituent" means that each R substituent can be independently defined. For example, if in one case, $R^{n(a)}$ is halogen, then $R^{N(b)}$ is not necessarily halogen in that case.

$R^1$, $R^2$, $R^3$, $R^4$, $R^5$, $R^6$, etc. are mentioned for several times in chemical structures and moieties disclosed and described in the present disclosure. Unless otherwise indicated, any description of $R^1$, $R^2$, $R^3$, $R^4$, $R^5$, $R^6$, etc. in the specification is applicable to any structure or moiety reciting $R^1$, $R^2$, $R^3$, $R^4$, $R^5$, $R^6$, etc. respectively.

Photoelectronic devices that use organic materials are becoming increasingly desirable for a number of reasons. Many of the materials used to make such devices are relatively inexpensive, so organic photoelectronic devices have the potential for cost advantages of inorganic devices. In addition, the inherent properties of organic materials, such as their flexibility, may make them well suit for particular applications such as fabrication on a flexible substrate. Examples of organic photoelectronic devices include organic light emitting devices (OLEDs), organic phototransistors, organic photovoltaic cells and organic photodetectors. For OLEDs, the organic materials may have performance advantages over conventional materials. For example, the wavelength at which an organic light emitting layer emits light may generally be tuned with appropriate dopants.

Excitons decay from singlet excited states to ground state to emit light, which is fluorescence. Excitons decay from triplet excited states to ground state to generate light, which is phosphorescence. Because the strong self-spin orbit coupling of the heavy metal atom enhances intersystem crossing (ISC) efficiently between singlet and triplet excited states, phosphorescent metal complexes, such as platinum complex complexes, have demonstrated their potential to use both the singlet and triplet excitons to achieve 100% internal quantum efficiency. Thus, phosphorescent metal complexes are good selections as dopants in the emission layer of organic light emitting devices (OLEDs), and a great deal of attention has been received both in the academic and industrial fields. Many achievements have been made in the past decade to lead to the lucrative commercialization of the technology, for example, OLEDs have been used in advanced displays in smart phones, televisions and digital cameras.

However, so far, blue electroluminescent devices remain the most challenging area of this technology, and one of the big issues is the stability of the blue devices. It has been proven that the choice of host materials is very important to the stability of the blue devices. However, the lowest energy of the triplet excited state (Ti) of the blue light emitting material is very high, which means that the lowest energy of the triplet excited state (Ti) of the host materials of the blue devices should be higher. This leads to the difficulty in the development of the host materials for the blue devices.

The metal complexes of the present disclosure can be customized or tuned to expected specific applications having particular emission or absorption characteristics. The optical properties of the metal complexes disclosed in the present disclosure can be adjusted by varying the structure of the ligand surrounding the metal center or varying the structure of fluorescent luminophores on the ligands. For example, in emission and absorption spectrum, the metal complexes having a ligand with electron donating substituents or electron withdrawing substituents can generally show different optical properties. The color of the metal complexes can be adjusted by modifying the conjugated groups on the fluorescent luminophores and ligands.

The emission of such complexes can be adjusted, for example, from the ultraviolet to near-infrared, by, for example, modifying the ligand or fluorescent luminophore structure. A fluorescent luminophore is a group of atoms in an organic molecule, which can absorb energy to generate singlet excited state, and the singlet excitons decay rapidly to emit light. In one aspect, the complexes of the present disclosure can provide emission over a majority of the visible spectrums. In a specific embodiment, the complexes of the present disclosure can emit light in a range of from about 400 nm to about 700 nm. In another aspect, the complexes of the disclosure have improved stability and efficiency over traditional emission complexes. Moreover, the complexes of the present disclosure can be used as luminescent labels in, for example, bio-applications, anti-cancer agents, emitters in organic light emitting diodes (OLED) or a combination thereof. In another aspect, the complexes of the present disclosure can be used in light emitting devices, such as compact fluorescent lamps (CFL), light emitting diodes (LED), incandescent lamps and combinations thereof.

The present disclosure has disclosed compounds or compound complexes comprising platinum. The term compound and complex can be used interchangeably in the present disclosure. In another aspect, the compound disclosed in the present disclosure has a neutral charge.

The compounds disclosed in the present disclosure can show expected properties and have emission and/or absorption spectrum that can be adjusted via the selection of appropriate ligands. In another aspect, any one or more of the compounds, structures or portions thereof, specifically recited in the present disclosure, may be excluded.

The compounds disclosed in the present disclosure are applicable to a wide variety of optical and electro-optical devices, including but not limited to light absorbing devices such as solar and photo-sensitive devices, organic light emitting diodes (OLEDs), light emitting devices or devices that are compatible with light absorption and emission and markers used for biological applications.

As described above, the disclosed compounds are platinum complexes. At the same time, the compounds disclosed herein can be used as host materials for OLED applications, such as full color displays.

The compounds disclosed herein can be used in a variety of applications. As light emitting materials, the compounds can be used for organic light emitting diodes (OLEDs), light emitting devices and displays and other light emitting devices.

In addition, the compounds of the present disclosure are used in the light emitting devices (such as OLEDs), which can improve the light emitting efficiency and the operation time of the devices relative to the conventional materials.

The compounds of the present disclosure can be prepared by using a variety of methods, including but not limited to those recited in the embodiments provided herein.

The compounds disclosed herein can be delayed fluorescent and/or phosphorescent emitters. In one aspect, the compounds disclosed herein can be delayed fluorescent emitters. In another aspect, the compound disclosed herein can be phosphorescent emitters. In yet another aspect, the compounds disclosed herein can be delayed fluorescent emitters and phosphorescent emitters.

The present disclosure relates to the organic light emitting materials, and the present patent includes a tetradentate metal platinum complex of benzene-carbazole and a derivative thereof. Such kind of complex can be used as a phosphorescent light emitting material in the OLED device to improve the efficiency and service life of the device.

Disclosed herein is a type I tetradentate cyclometalated platinum complex.

(I)

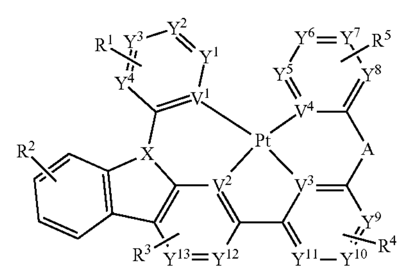

wherein:

each of $V^1$, $V^2$, $V^3$ and $V^4$ is an atom connected with Pt and independently selected from N atoms or C atoms, and $V^1$, $V^2$, $V^3$ and $V^4$ at least comprise two N atoms;

each of $Y^1$, $Y^2$, $Y^3$, $Y^4$, $Y^5$, $Y^6$, $Y^7$, $Y^8$, $Y^9$, $Y^{10}$, $Y^{11}$, $Y^{12}$ and $Y^{13}$ is independently selected from N atoms or CH groups;

A represents O, S, $CH^2$, $CD^2$, $CR^aR^b$, C═O, $SiR^aR^b$, $GeH_2$, $GeR^aR^b$, NH, NR PH, $PR^c$, $R^cP$═O, $AsR^c$, $R^cAs$═O, S═O, $SO_2$, Se, Se═O, $SeO_2$, BH, BRc, $R^cBi$═O, BiH, or $BiR^c$;

X represents N, B, CH, CD, $CR^a$, SiH, SiD, $SiR^a$, GeH, GeD, $GeR^d$, P, P═O, As, As═O, Bi or Bi═O;

each of $R^1$, $R^2$, $R^3$, $R^4$ and $R^5$ independently represents mono-, di-, tri-, tetra-substitutions or unsubstitutions, and each of $R^1$, $R^2$, $R^3$, $R^4$ and $R^5$ is independently hydrogen, deuterium, aryl, cycloalkyl, cycloalkenyl, heterocyclyl, heteroaryl, alkyl, alkenyl, alkynyl, halogen, hydroxyl, sulfydryl, nitro, cyano, amino, monoalkylamino or dialkylamino, monoarylamino or diarylamino, alkoxy, aryloxy, haloalkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramido, imino, sulfo, carboxyl, thiol, substituted silyl, polymeric groups or a combination thereof; and two or more adjacent $R^1$, $R^2$, $R^3$, $R^4$, and $R^5$ can be optionally connected to form a fused ring.

For the molecular formula I described in the present disclosure, groups of the molecular formula may be defined in the following description.

1) Group V each of $V^1$, $V^2$, $V^3$ and $V^4$ is an atom connected with Pt and may be independently N or C atoms, wherein $V^1$, $V^2$, $V^3$ and $V^4$ at least comprise two N atoms;

In one aspect, $V^1$ and $V^4$ are N, while $V^2$ and $V^3$ are C;

in another aspect, $V^1$ and $V^3$ are N, while $V^2$ and $V^4$ are C;

furthermore, $V^1$ and $V^2$ are N, while $V^3$ and $V^4$ are C;

2) Group Y each of $Y^1$, $Y^2$, $Y^3$, $Y^4$, $Y^5$, $Y^6$, $Y^7$, $Y^8$, $Y^9$, $Y^{10}$, $Y^{11}$, $Y^{12}$ and $Y^{13}$ is independently selected from N and CH groups;

each of $Y^1$, $Y^2$, $Y^3$, $Y^4$, $Y^5$, $Y^6$, $Y^7$, $Y^8$, $Y^9$, $Y^{10}$, $Y^{11}$, $Y^{12}$ and $Y^{13}$ is respectively independent, and can be N;

each of $Y^1$, $Y^2$, $Y^3$, $Y^4$, $Y^5$, $Y^6$, $Y^7$, $Y^8$, $Y^9$, $Y^{10}$, $Y^{11}$, $Y^{12}$ and $Y^{13}$ is respectively independent, and can be CH groups;

3) Group A wherein, A may be O, S, $CH^2$, $CD^2$, $CR^aR^b$, C═O, $SiR^aR^b$, $GeH_2$, $GeR^aR^b$, NH, $NR^c$, PH, $PR^c$, $R^cP$═O, $AsR^c$, $R^cAs$═O, S═O, $SO_2$, Se, Se═O, $SeO_2$, BH, BRc, $R^cBi$═O, BiH or $BiR^c$;

in another aspect, A is O;

in another aspect, A is S;

in another aspect, A is $CR^aR^b$;

in another aspect, A is $NR^c$;

in another aspect, A is P═$PR^c$;

in another aspect, A is $PR^c$;

in another aspect, A is $BR^c$;

4) Group X

X can be selected from N, B, CH, CD, $CR^a$, SiH, SiD, $SiR^a$, GeH, GeD, $GeR^d$, P, P═O, As, As═O, Bi or Bi═O groups;

in another aspect, X is N;

in another aspect, X is B;

in another aspect, X is CH;

in another aspect, X is $GeR^d$;

in another aspect, X is As═O;

in another aspect, X is P═O;

in another aspect, X is Bi═O;

in another aspect, X is Bi;

in another aspect, X is $CR^a$;

in another aspect, X is $SiR^a$;

5) Group R

Wherein, $R^1$ is present, while in another aspect, $R^1$ is absent.

In one aspect, $R^1$ is mono-substituted, while in another aspect, $R^1$ is di-substituted; in another aspect, $R^1$ is tri-substituted; furthermore, $R^1$ is tetra-substituted.

Meanwhile, $R^1$ is selected from hydrogen, deuterium, aryl, cycloalkyl, cycloalkenyl, heterocyclyl, heteroaryl, alkyl, alkenyl, alkynyl, halogen, hydroxyl, sulfydryl, nitro, cyano, amino, monoalkylamino or dialkylamino, monoarylamino or diarylamino, alkoxy, aryloxy, haloalkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, urea, phosphoramido, imino, sulfo, carboxy, thiol, substituted silyl, polymeric groups or a combination thereof.

Wherein, $R^2$ is present, while in another aspect, $R^2$ is absent.

in one aspect, $R^2$ is mono-substituted, while in another aspect, $R^2$ is di-substituted; in another aspect, $R^2$ is tri-substituted; furthermore, $R^2$ is tetra-substituted.

Meanwhile, $R^2$ is selected from hydrogen, deuterium, aryl, cycloalkyl, cycloalkenyl, heterocyclyl, heteroaryl, alkyl, alkenyl, alkynyl, halogen, hydroxyl, sulfydryl, nitro, cyano, amino, monoalkylamino or dialkylamino, monoarylamino or diarylamino, alkoxy, aryloxy, haloalkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, urea, phosphoramido, imino, sulfo, carboxy, thiol, substituted silyl, polymeric groups or a combination thereof.

Wherein, $R^3$ is present, while in another aspect, $R^3$ is absent.

In one aspect, $R^3$ is mono-substituted, while in another aspect, $R^3$ is di-substituted; in another aspect, $R^3$ is tri-substituted; furthermore, $R^3$ is tetra-substituted.

Meanwhile, $R^3$ is selected from hydrogen, deuterium, aryl, cycloalkyl, cycloalkenyl, heterocyclyl, heteroaryl, alkyl, alkenyl, alkynyl, halogen, hydroxyl, sulfydryl, nitro, cyano, amino, monoalkylamino or dialkylamino, monoarylamino or diarylamino, alkoxy, aryloxy, haloalkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, urea, phosphoramido, imino, sulfo, carboxy, thiol, substituted silyl, polymeric groups or a combination thereof.

Wherein, $R^4$ is present, while in another aspect, $R^4$ is absent.

In one aspect, $R^4$ is mono-substituted, while in another aspect, $R^4$ is di-substituted.

Meanwhile, $R^4$ is selected from hydrogen, deuterium, aryl, cycloalkyl, cycloalkenyl, heterocyclyl, heteroaryl, alkyl, alkenyl, alkynyl, halogen, hydroxyl, sulfydryl, nitro, cyano, amino, monoalkylamino or dialkylamino, monoarylamino or diarylamino, alkoxy, aryloxy, haloalkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, urea, phosphoramido, imino, sulfo, carboxy, thiol, substituted silyl, polymeric groups or a combination thereof.

Wherein, $R^5$ is present, while in another aspect, $R^5$ is absent.

In one aspect, $R^5$ is mono-substituted, while in another aspect, $R^5$ is di-substituted.

Meanwhile, $R^5$ is selected from hydrogen, deuterium, aryl, cycloalkyl, cycloalkenyl, heterocyclyl, heteroaryl, alkyl, alkenyl, alkynyl, halogen, hydroxyl, sulfydryl, nitro, cyano, amino, monoalkylamino or dialkylamino, monoarylamino or diarylamino, alkoxy, aryloxy, haloalkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, urea, phosphoramido, imino, sulfo, carboxy, thiol, substituted silyl, polymeric groups or a combination thereof.

I. Exemplary Compounds

In one aspect, any of the tetradentate ring metal platinum complexes reported in the present disclosure may include one or more of the following structures. In addition, the metal platinum complexes may also include other structures or parts, which are not specifically listed here. At the same time, the scope of protection of the disclosure at present is not limited to the structures and parts listed in this patent.
Pt 1
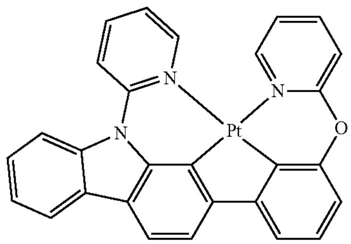
Pt 2
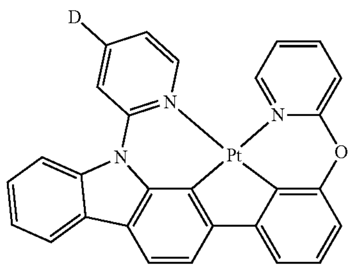
Pt 3
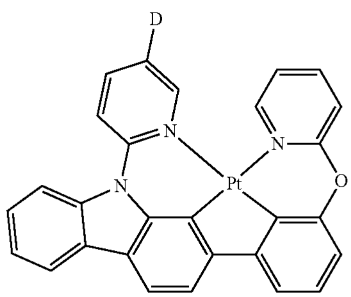
Pt 4
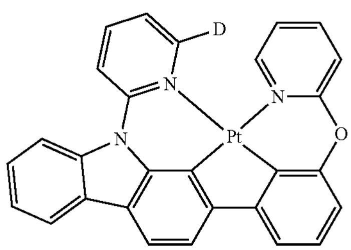
Pt 5
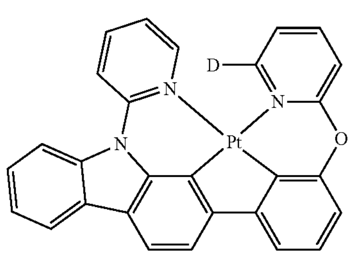
-continued
Pt 6
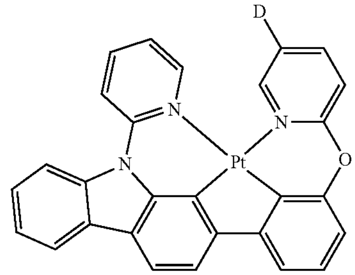
Pt 7
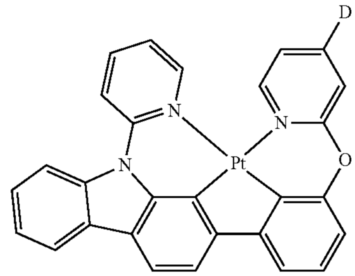
Pt 8
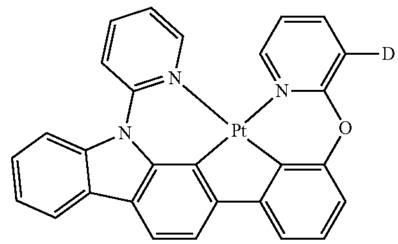
Pt 9
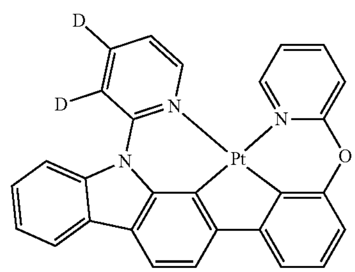
Pt 10
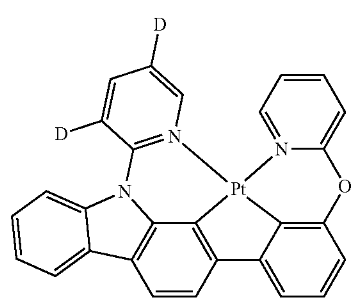
Pt 11
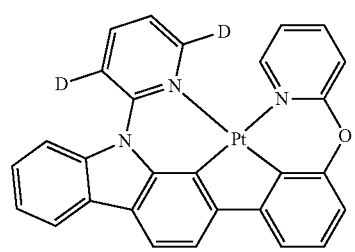

-continued
Pt 12
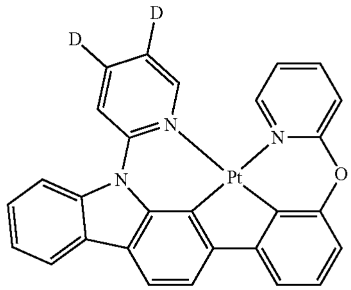
Pt 13
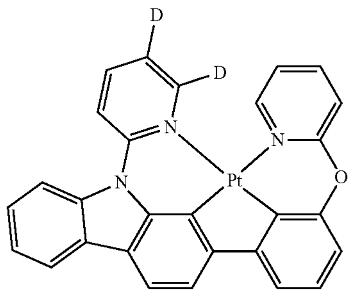
Pt 14
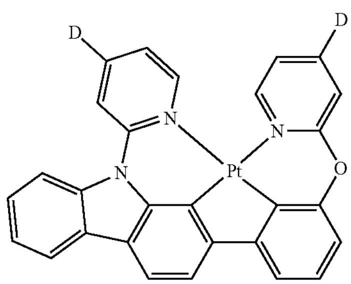
Pt 15
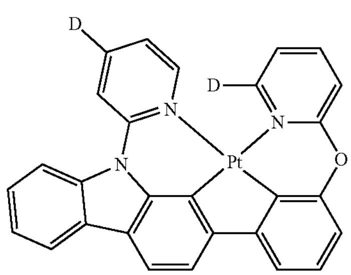
Pt 16
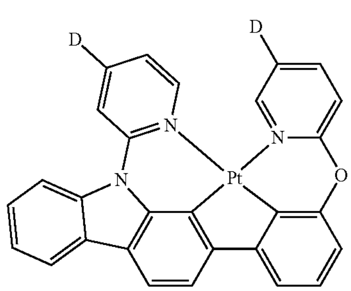
-continued
Pt 17
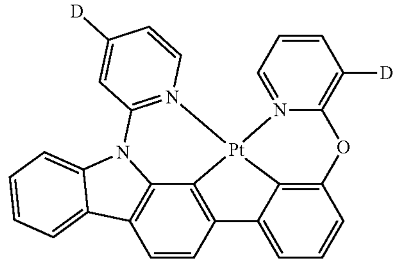
Pt 18
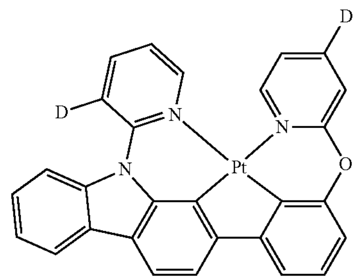
Pt 19
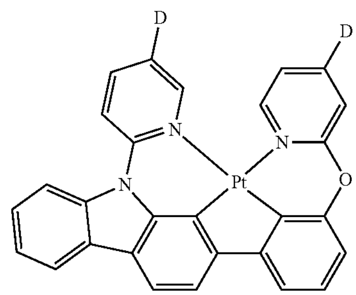
Pt 20
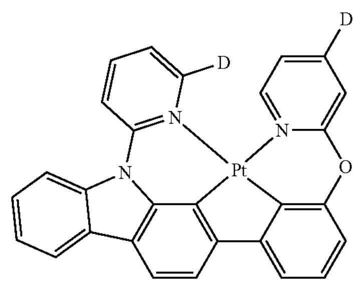
Pt 21
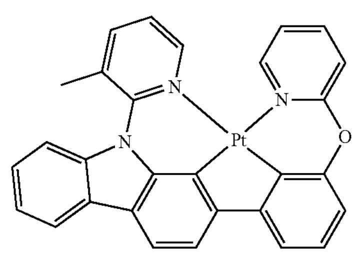
Pt 22
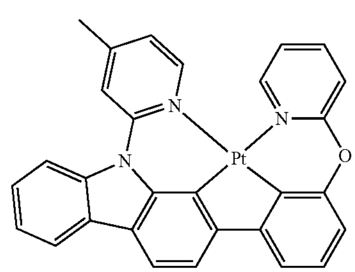

-continued
Pt 23
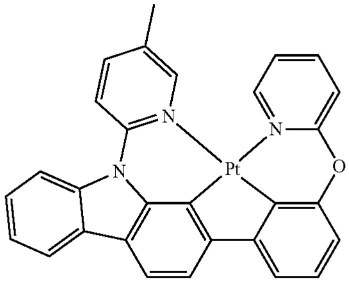
Pt 24
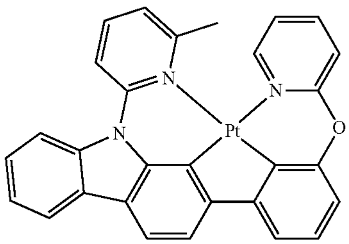
Pt 25
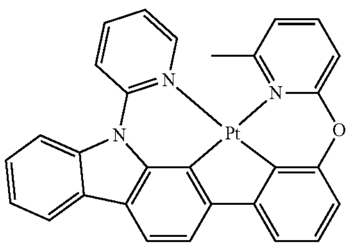
Pt 26
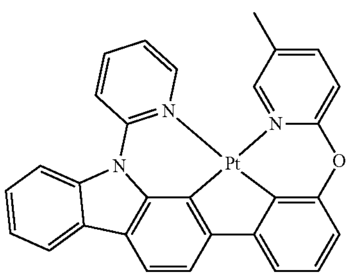
Pt 27
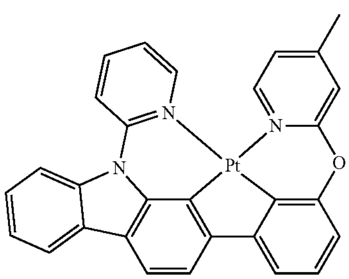
Pt 28
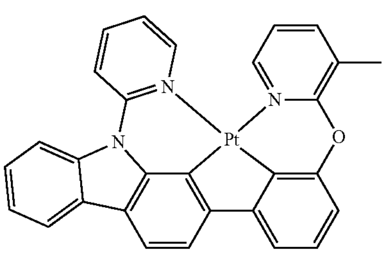
-continued
Pt 29
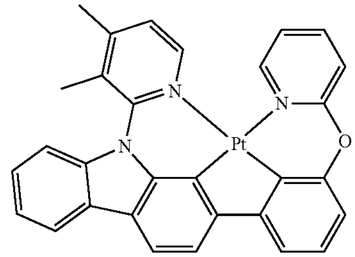
Pt 30
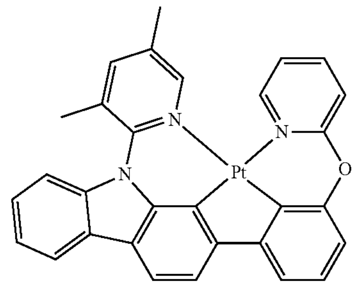
Pt 31
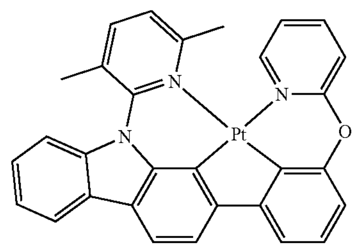
Pt 32
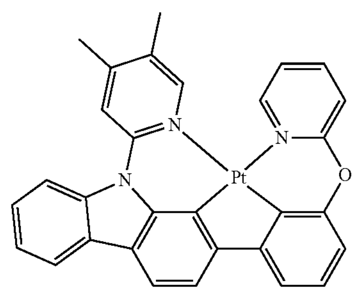
Pt 33
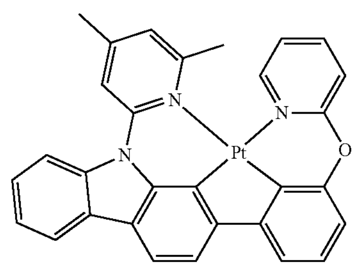
Pt 34
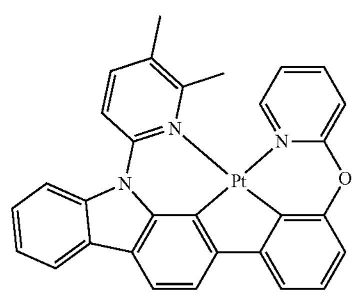

-continued
Pt 35
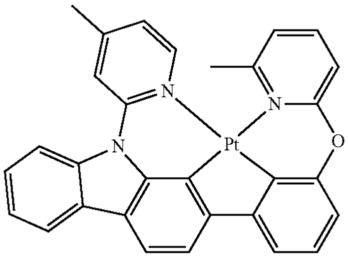
Pt 36
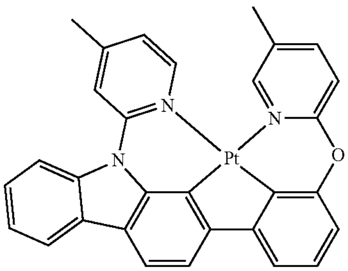
Pt 37
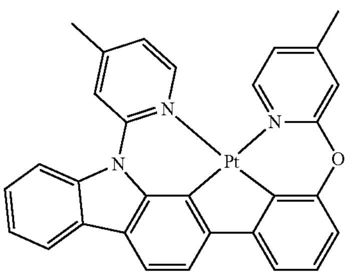
Pt 38
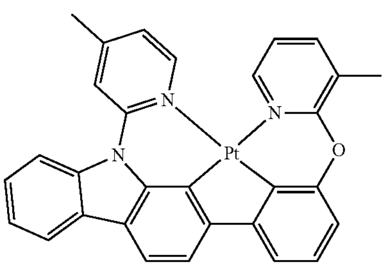
Pt 39
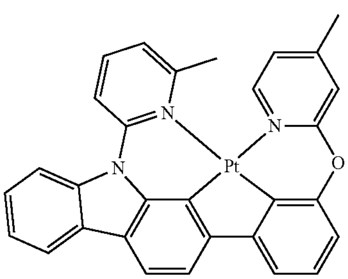
Pt 40
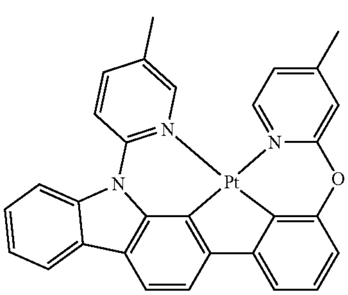
-continued
Pt 41
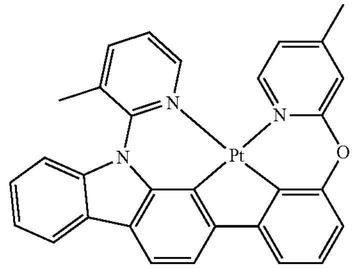
Pt 42
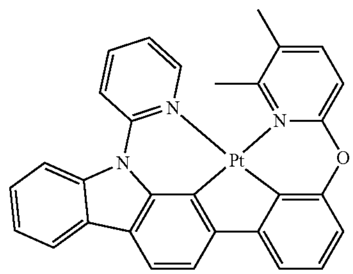
Pt 43
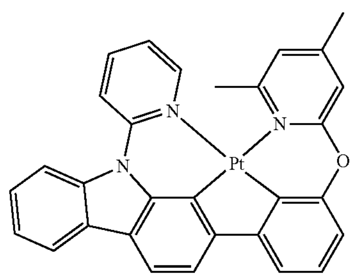
Pt 44
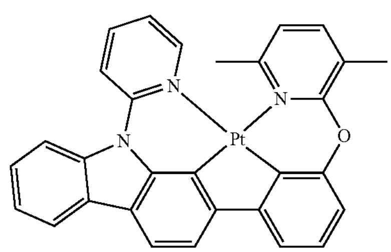
Pt 45
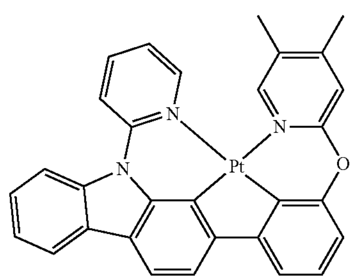
Pt 46
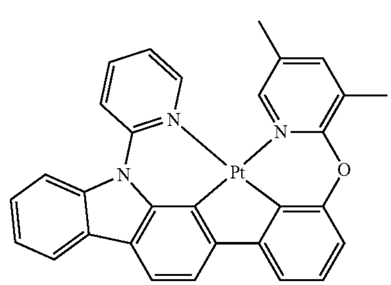

-continued
Pt 47
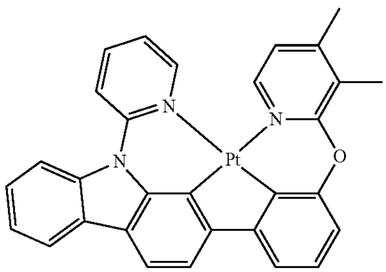
Pt 48
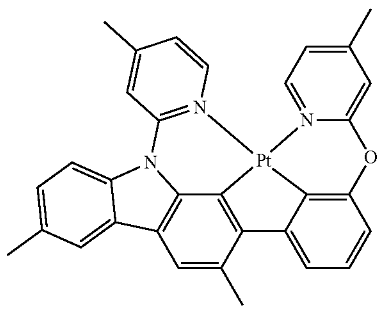
Pt 49
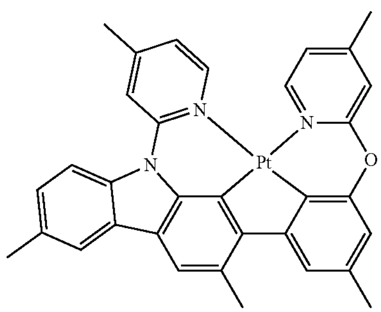
Pt 50
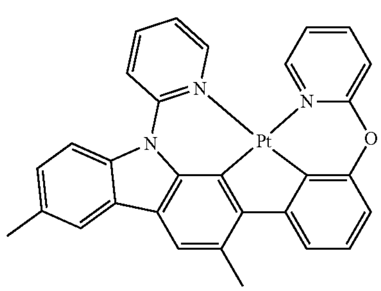
Pt 51
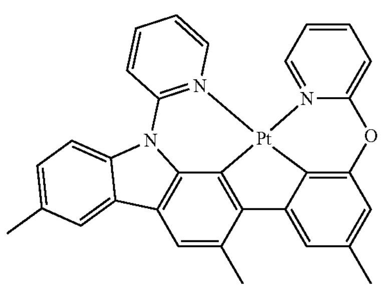
-continued
Pt 52
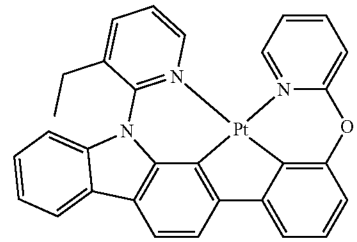
Pt 53
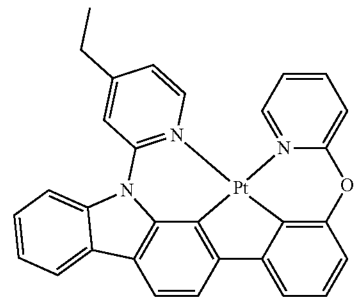
Pt 54
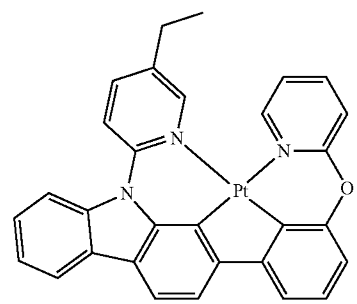
Pt 55
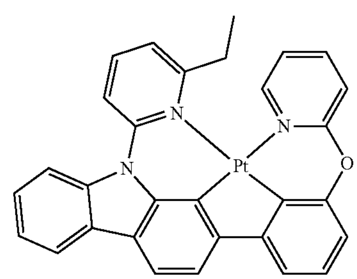
Pt 56
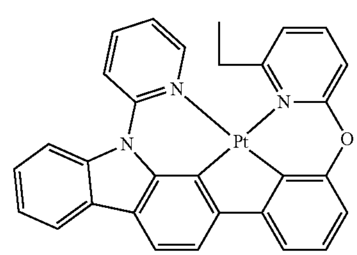

-continued
Pt 57
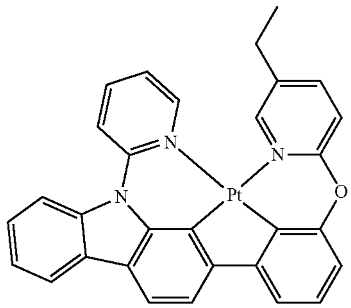
Pt 58
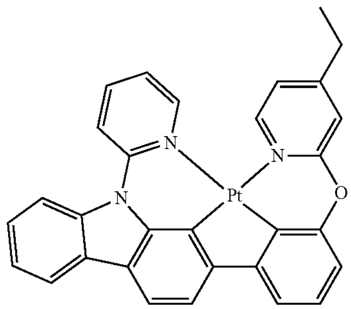
Pt 59
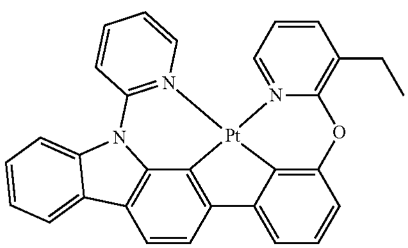
Pt 60
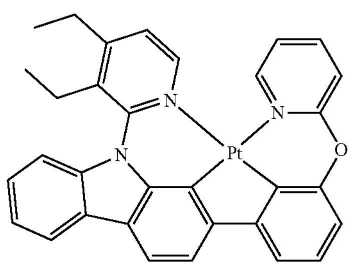
Pt 61
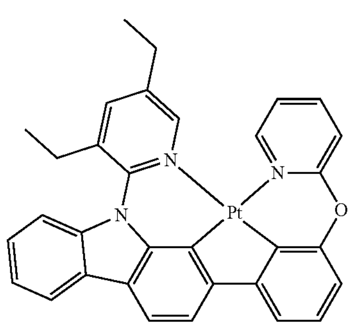
-continued
Pt 62
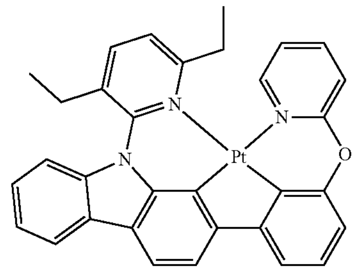
Pt 63
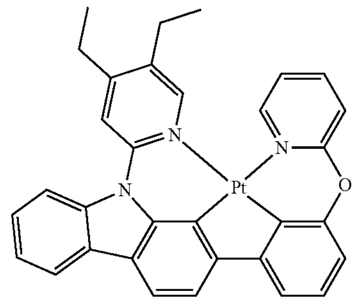
Pt 64
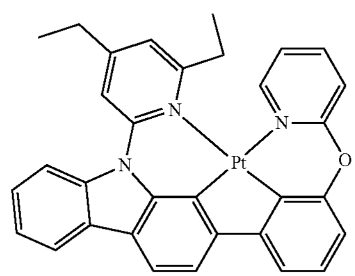
Pt 65
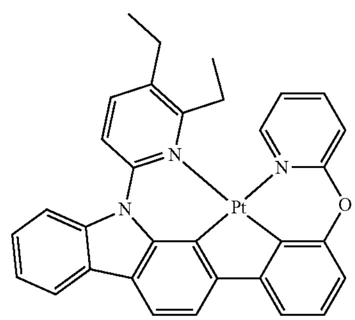
Pt 66
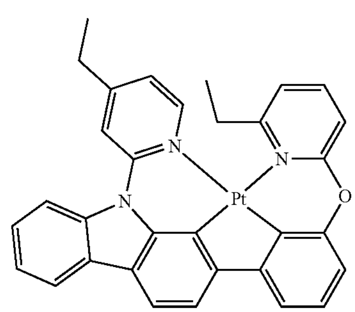

-continued
Pt 67
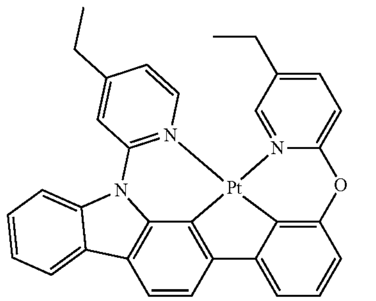
Pt 68
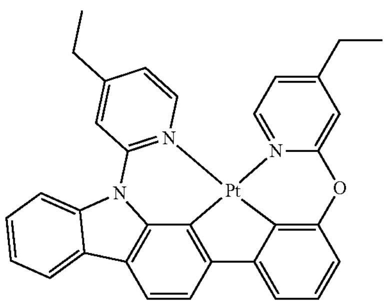
Pt 69
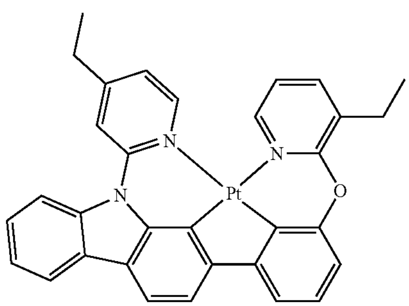
Pt 70
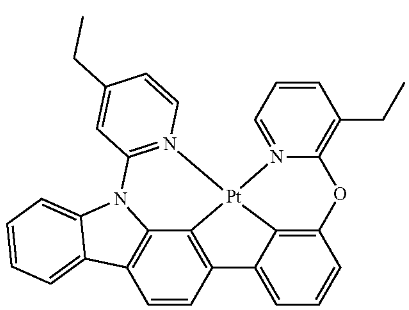
Pt 71
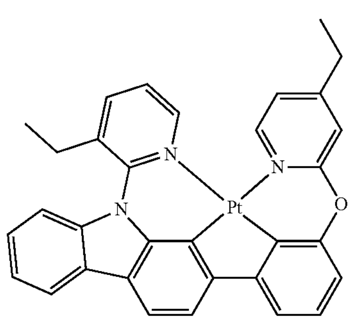
-continued
Pt 72
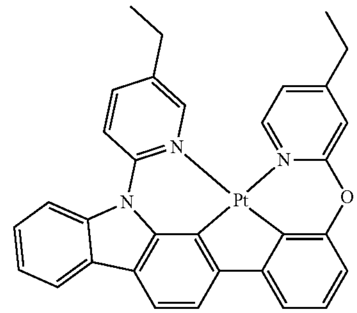
Pt 73
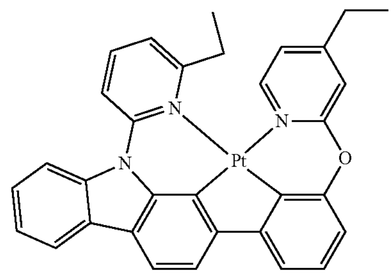
Pt 74
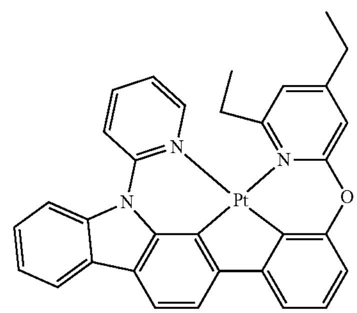
Pt 75
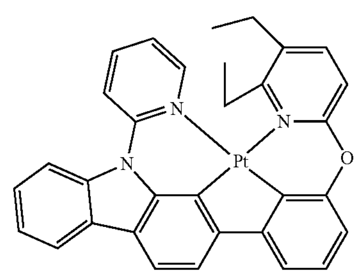
Pt 76
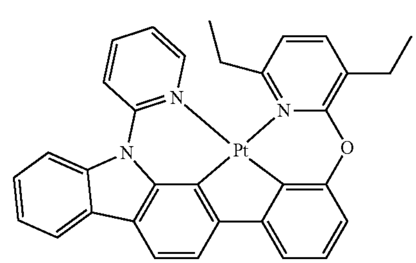

-continued
Pt 77
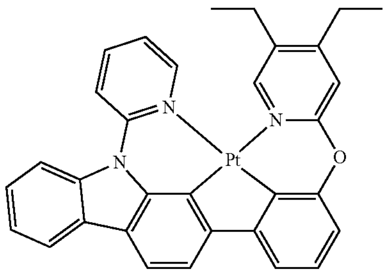
Pt 78
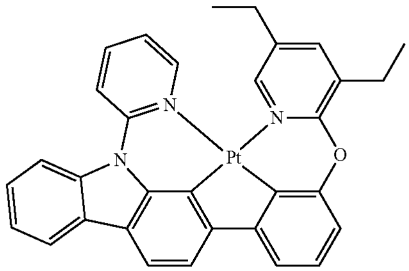
Pt 79
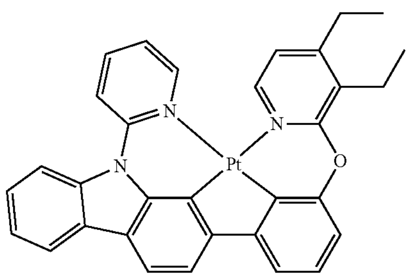
Pt 80
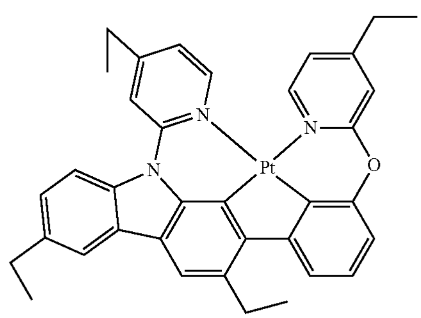
Pt 81
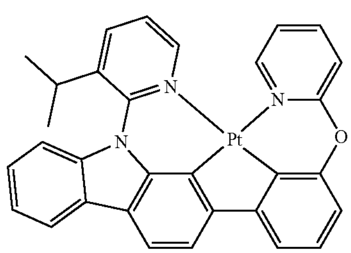
-continued
Pt 82
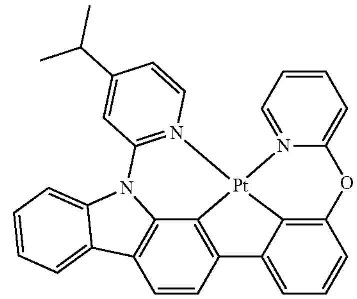
Pt 83
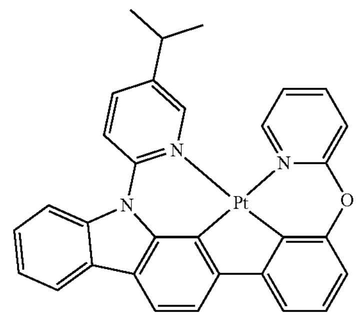
Pt 84
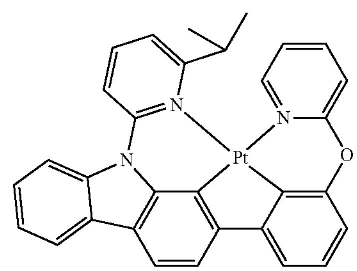
Pt 85
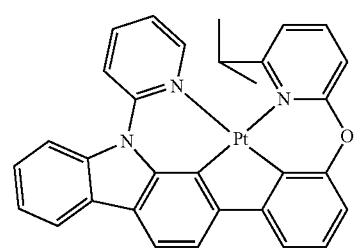
Pt 86
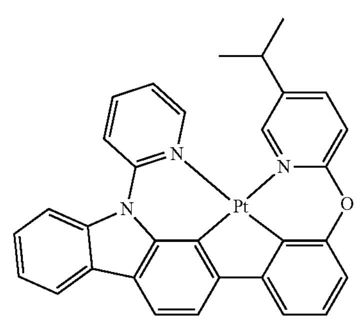

Pt 87
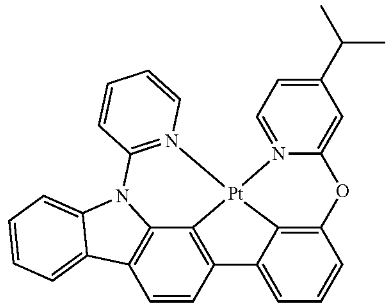
Pt 88
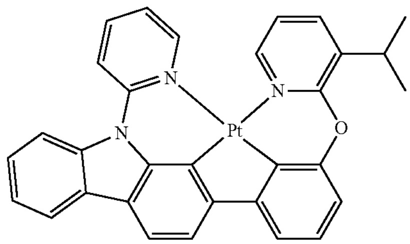
Pt 89
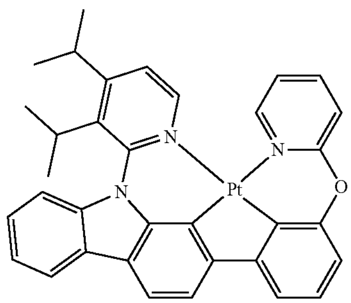
Pt 90
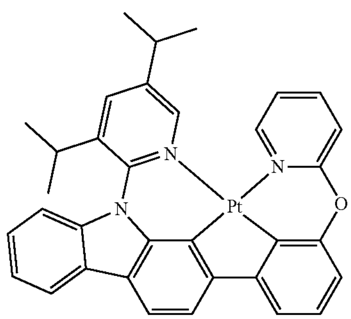
Pt 91
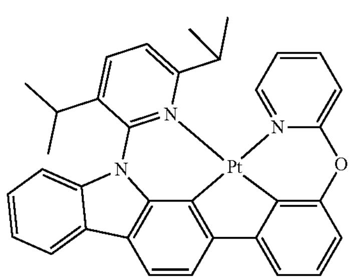
Pt 92
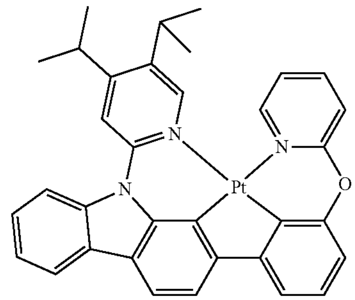
Pt 93
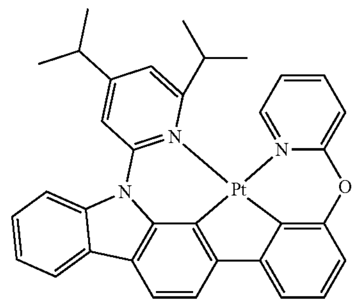
Pt 94
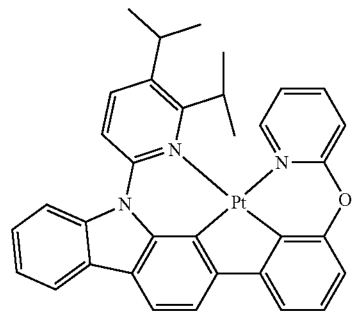
Pt 95
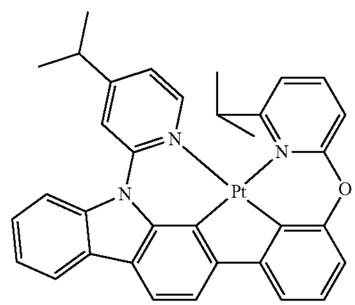
Pt 96
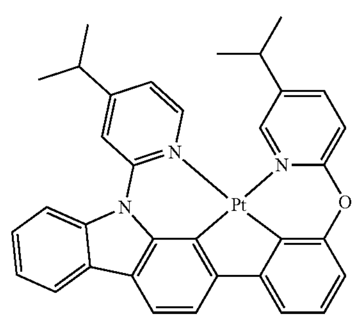

-continued
Pt 97
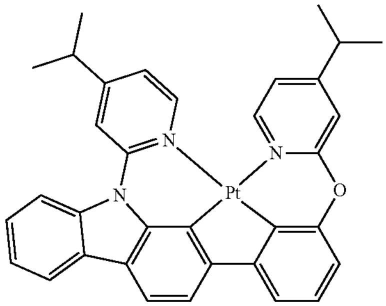
Pt 98
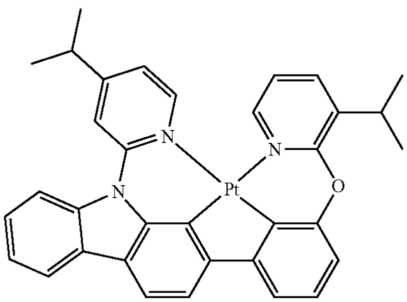
Pt 99
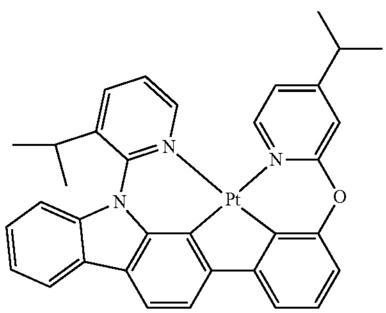
Pt 100
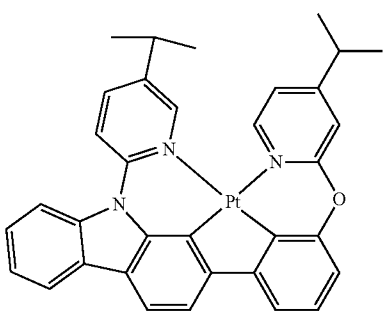
Pt 101
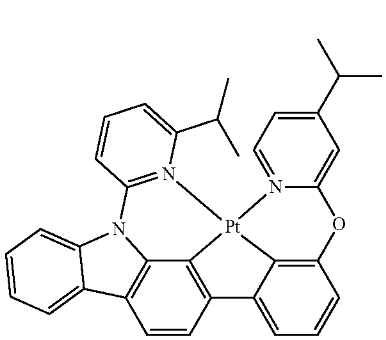
-continued
Pt 102
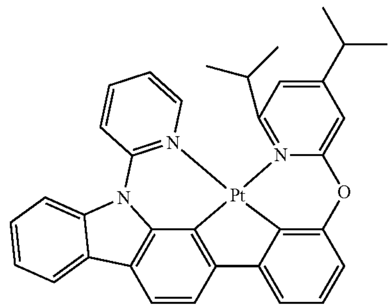
Pt 103
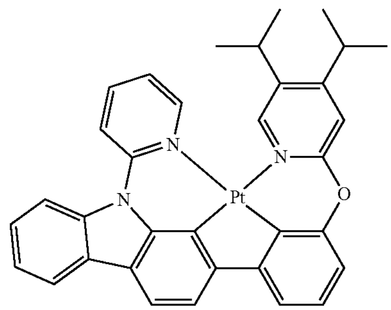
Pt 104
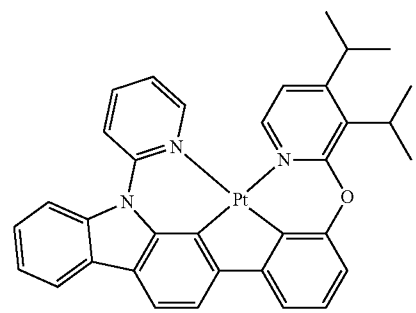
Pt 105
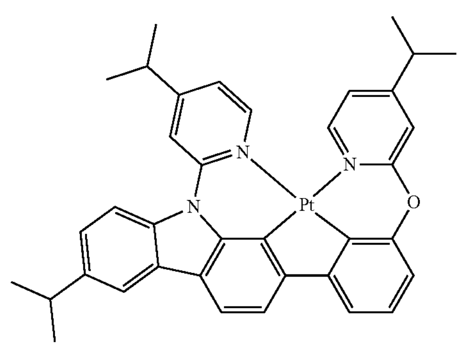
Pt 106
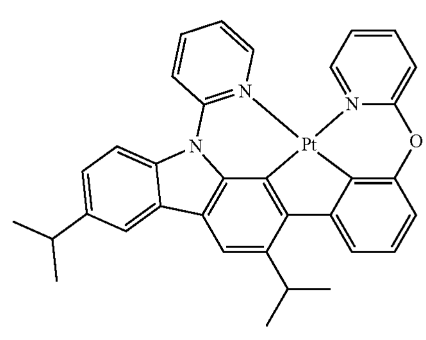

-continued
Pt 107
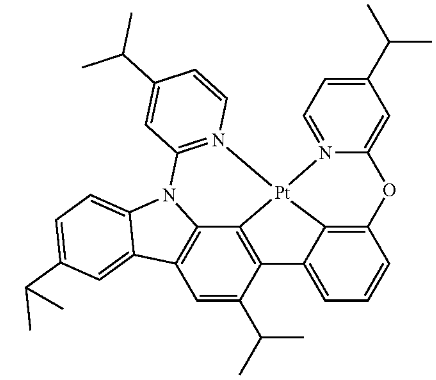
Pt 108
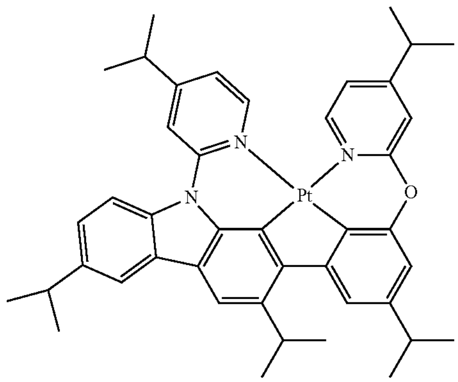
Pt 109
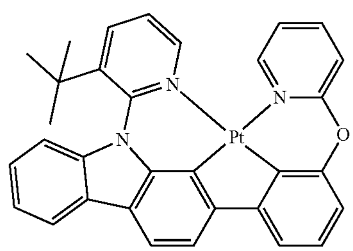
Pt 110
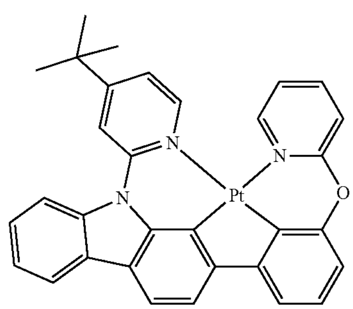
Pt 111
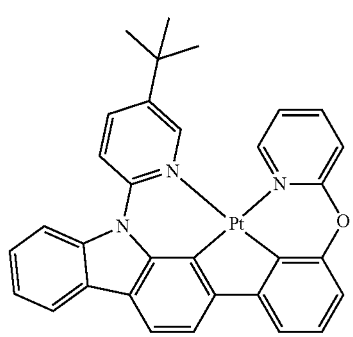
-continued
Pt 112
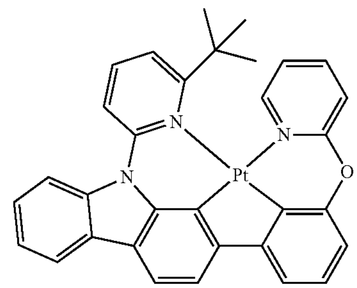
Pt 113
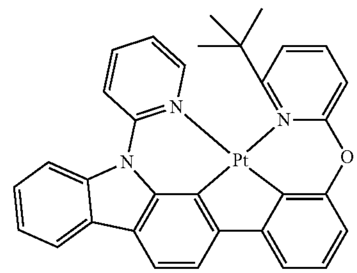
Pt 114
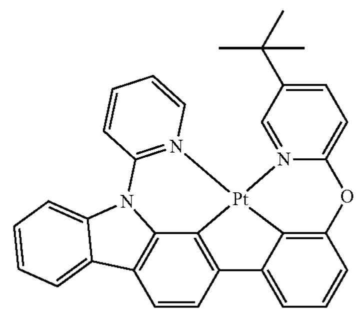
Pt 115
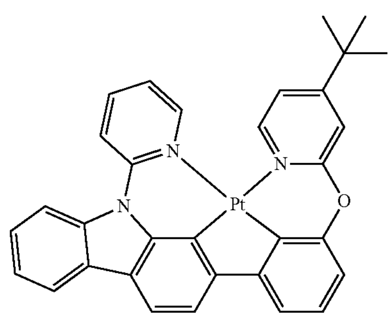
Pt 116
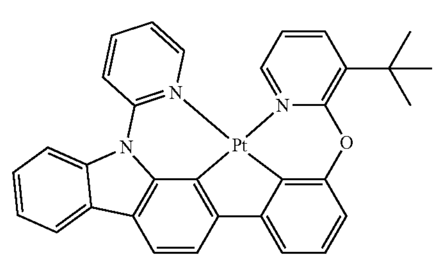

-continued
Pt 117
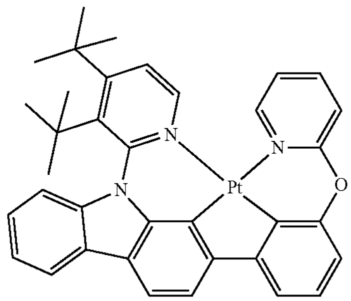
Pt 118
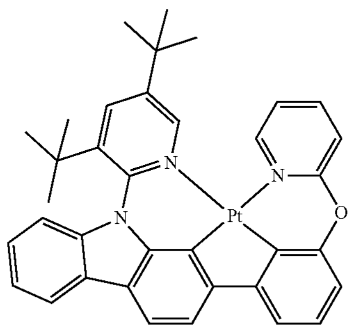
Pt 119
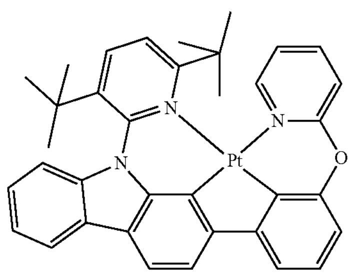
Pt 120
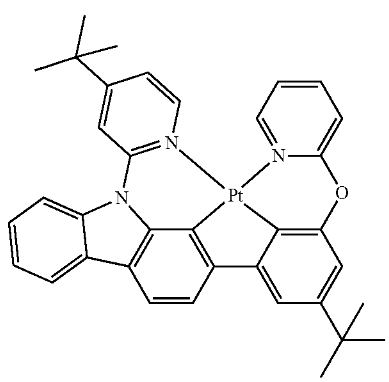
Pt 121
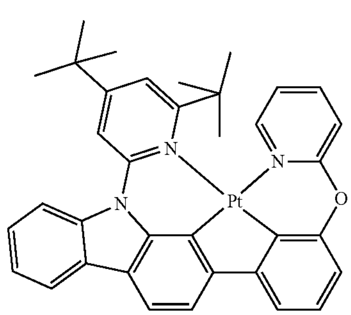
-continued
Pt 122
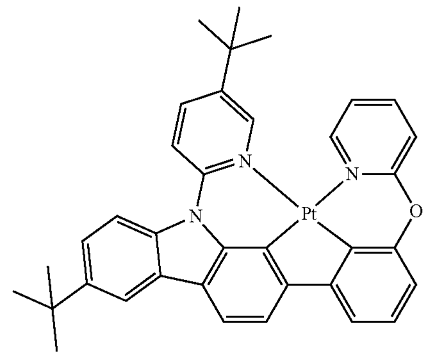
Pt 123
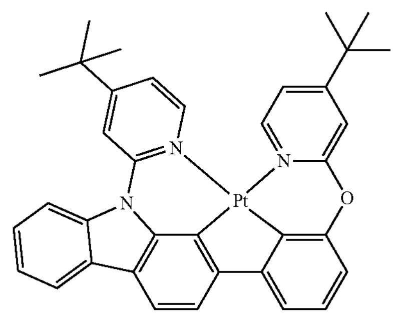
Pt 124
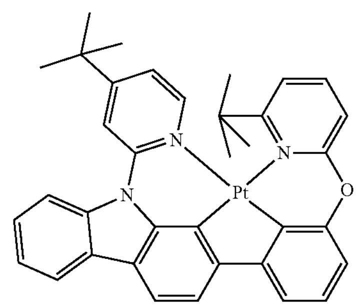
Pt 125
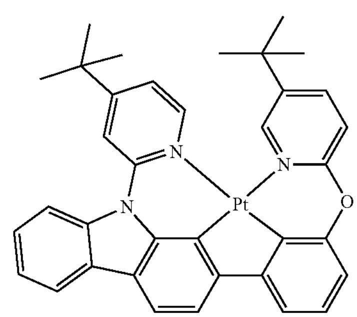
Pt 126
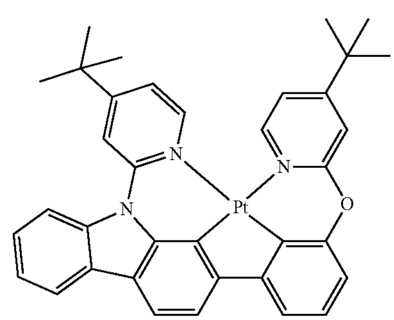

-continued
Pt 127
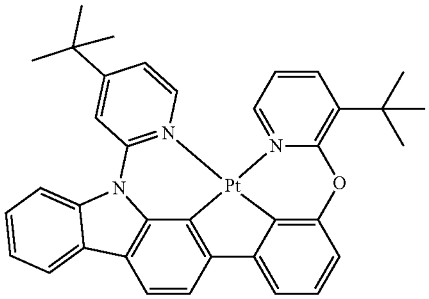
Pt 128
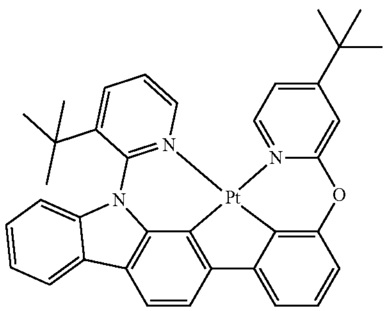
Pt 129
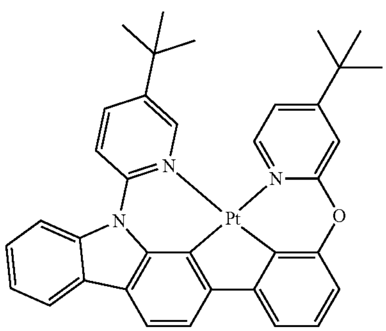
Pt 130
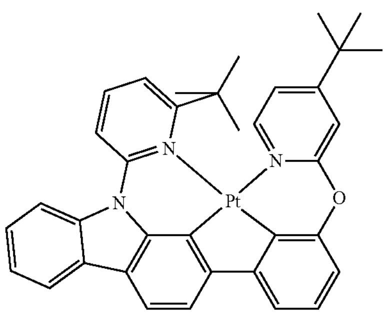
Pt 131
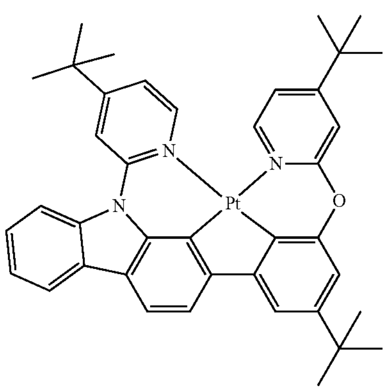
-continued
Pt 132
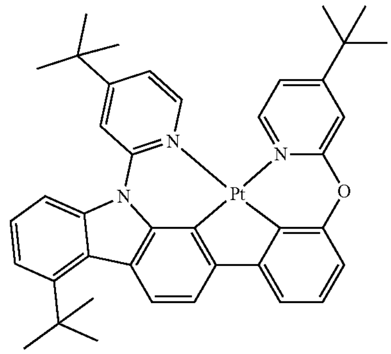
Pt 133
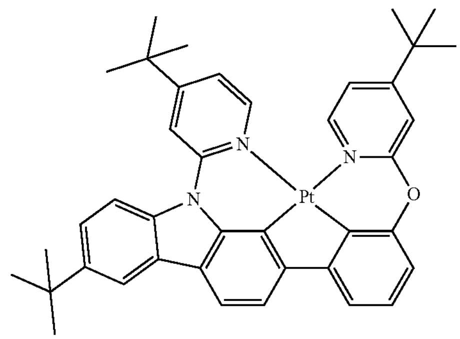
Pt 134
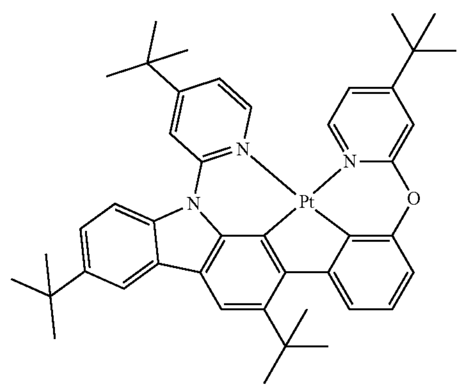
Pt 135
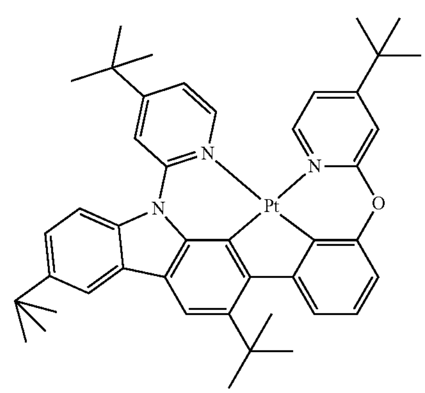

-continued
Pt 136
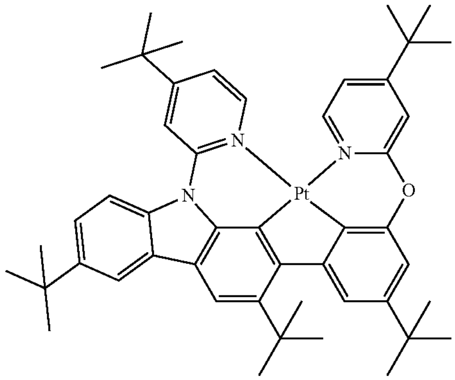
Pt 137
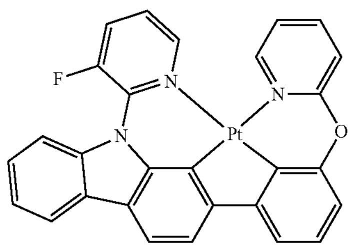
Pt 138
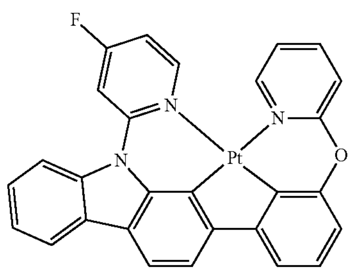
Pt 139
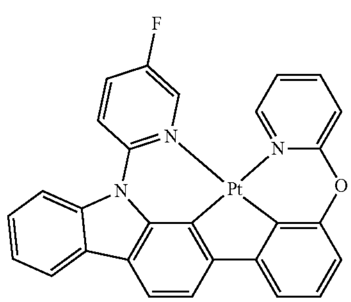
Pt 140
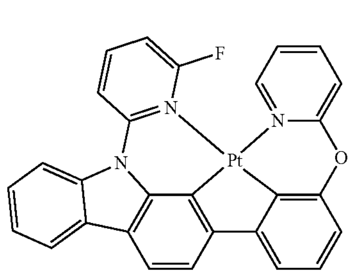
-continued
Pt 141
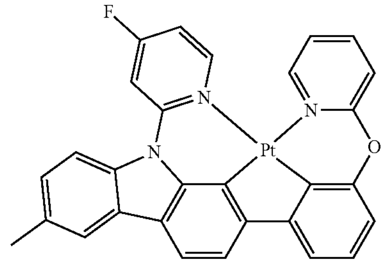
Pt 142
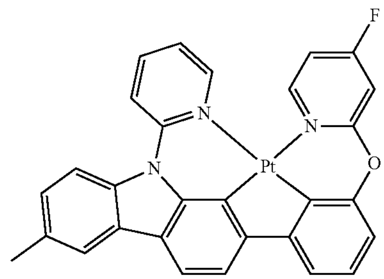
Pt 143
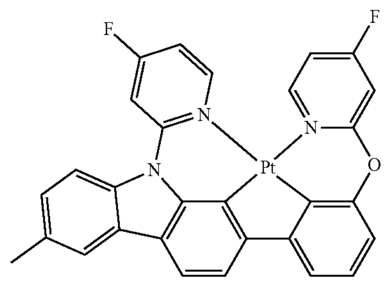
Pt 144
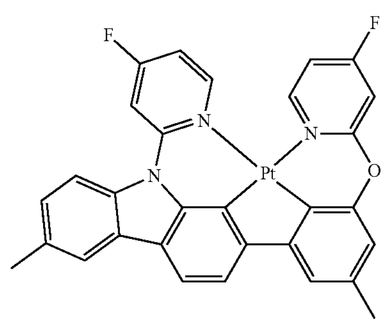
Pt 145
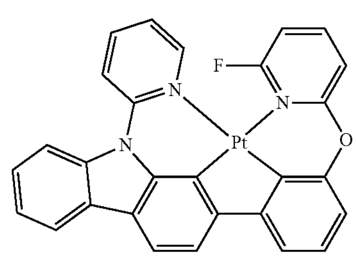

-continued
Pt 146
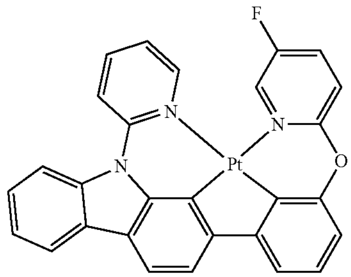
Pt 147
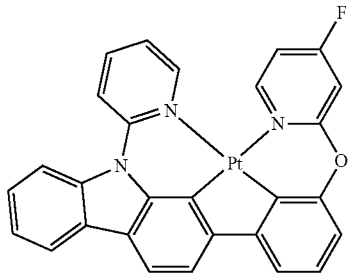
Pt 148
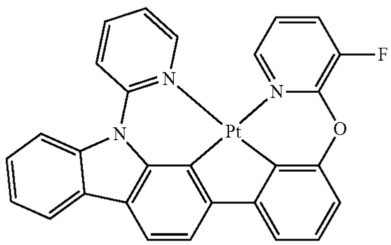
Pt 149
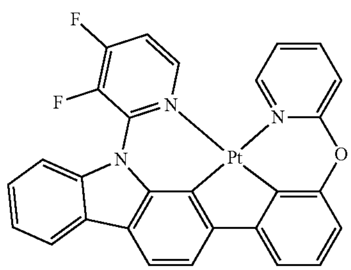
Pt 150
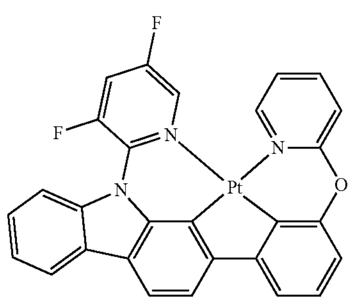
Pt 151
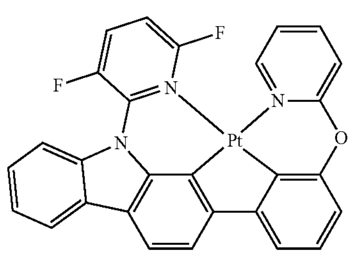
-continued
Pt 152
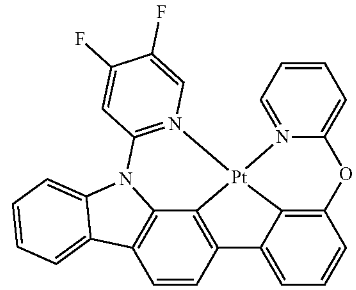
Pt 153
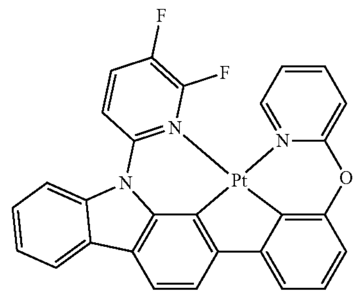
Pt 154
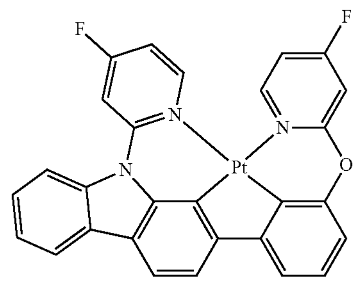
Pt 155
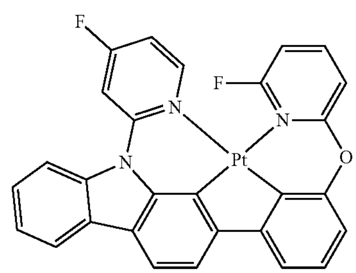
Pt 156
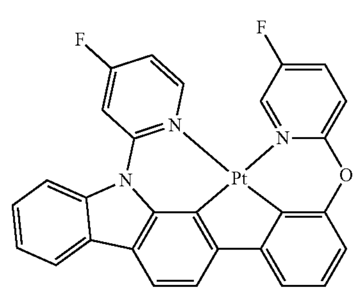

-continued
Pt 157
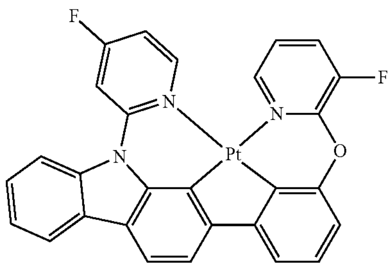
Pt 158
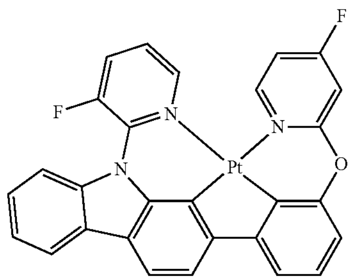
Pt 159
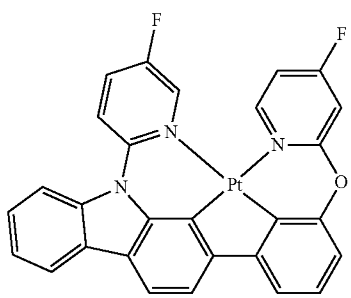
Pt 160
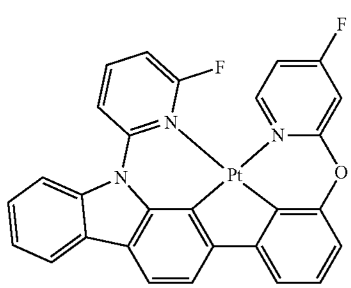
Pt 161
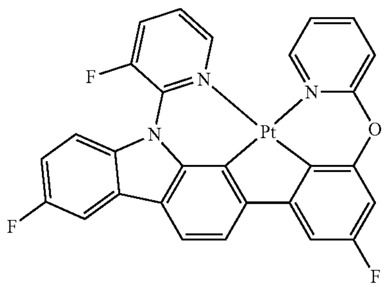
-continued
Pt 162
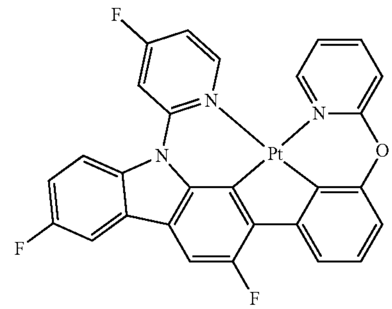
Pt 163
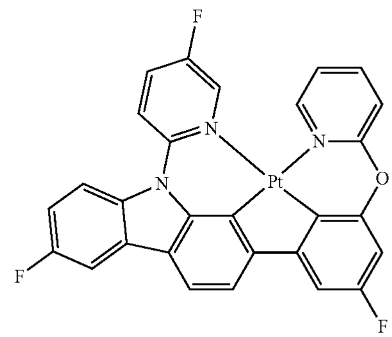
Pt 164
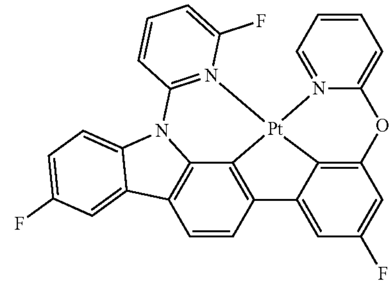
Pt 165
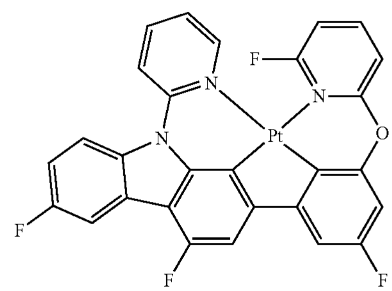
Pt 166
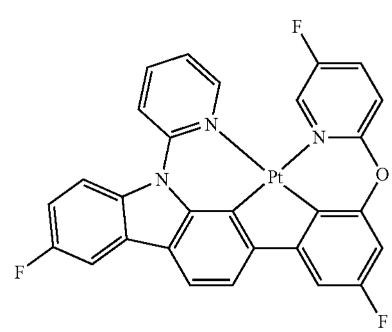

-continued
Pt 167
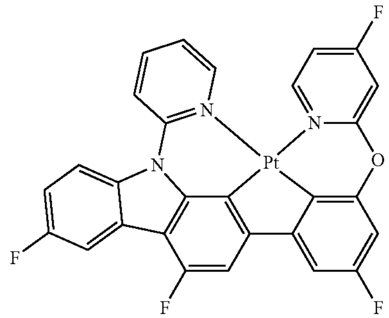
Pt 168
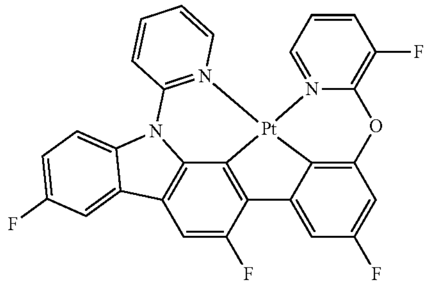
Pt 169
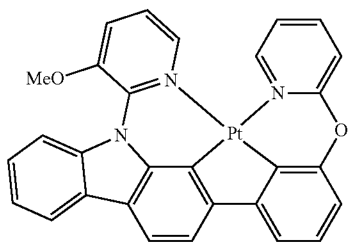
Pt 170
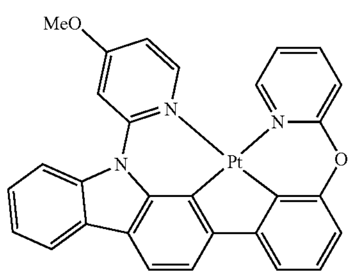
Pt 171
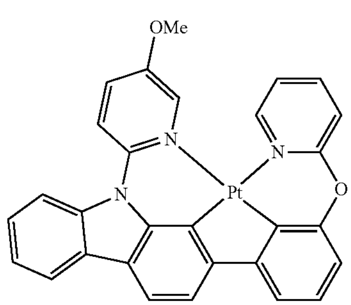
-continued
Pt 172
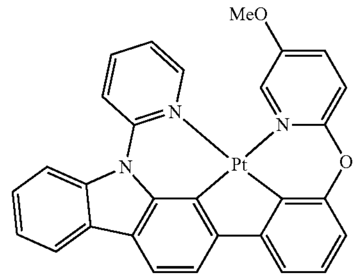
Pt 173
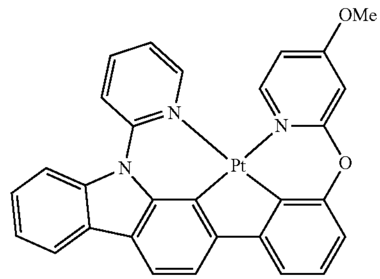
Pt 174
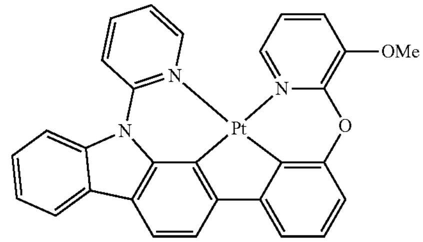
Pt 175
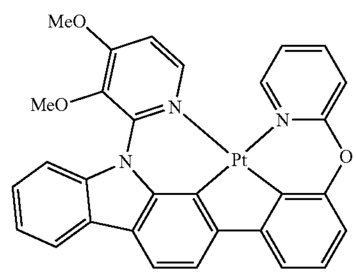
Pt 176
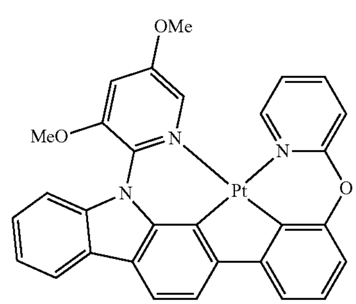

-continued
Pt 177
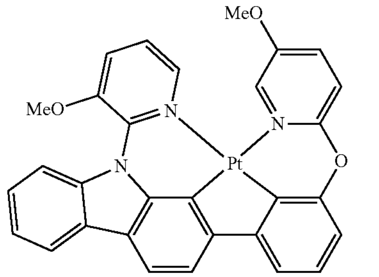
Pt 178
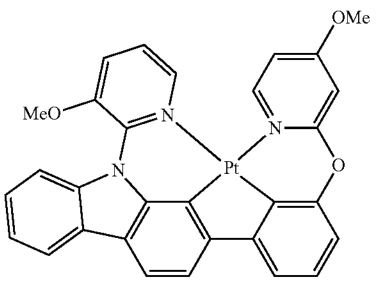
Pt 179
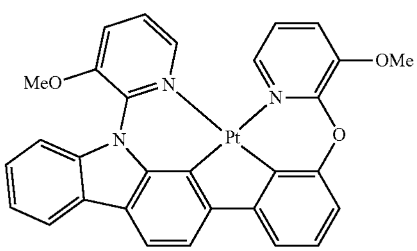
Pt 180
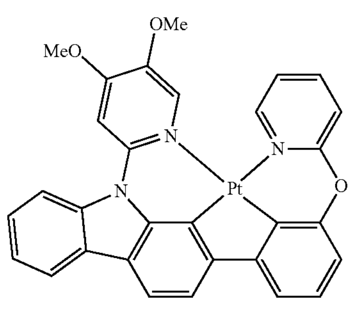
Pt 181
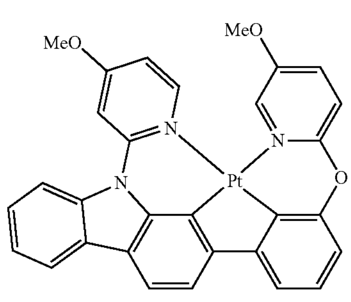
-continued
Pt 182
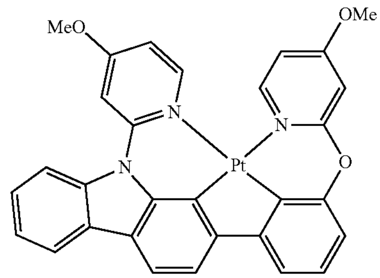
Pt 183
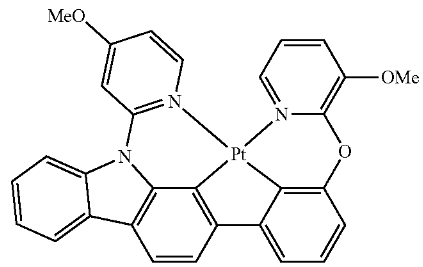
Pt 184
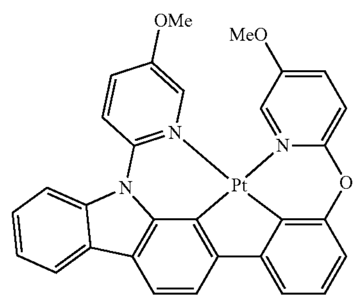
Pt 185
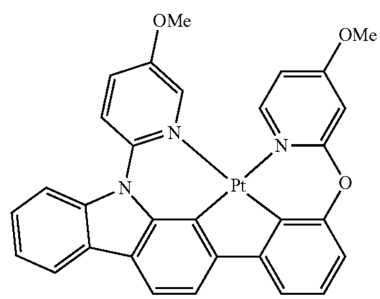
Pt 186
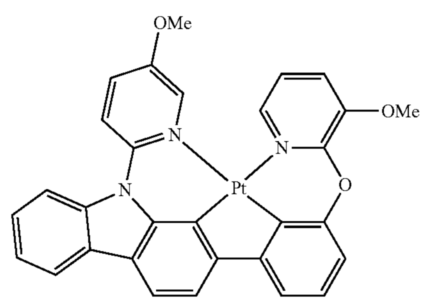

-continued
Pt 187
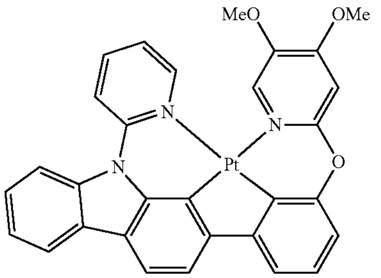
Pt 188
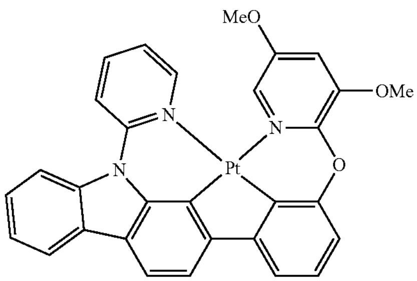
Pt 189
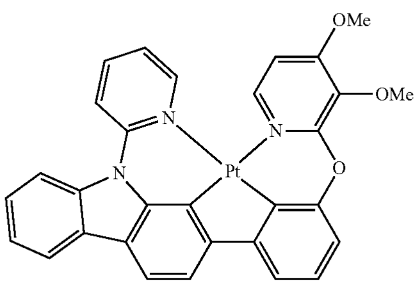
Pt 190
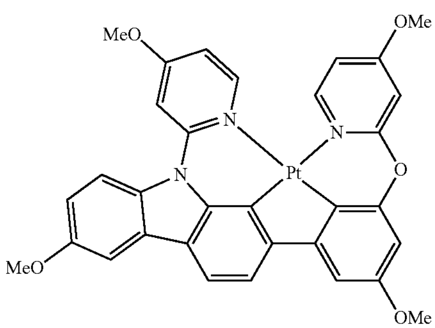
Pt 191
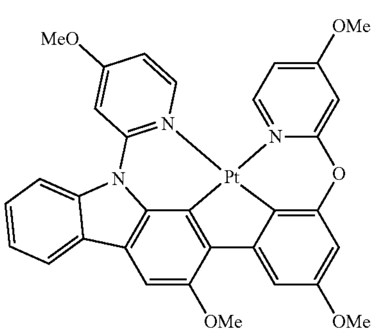
-continued
Pt 192
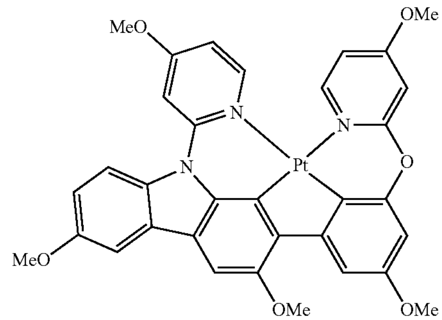
Pt 193
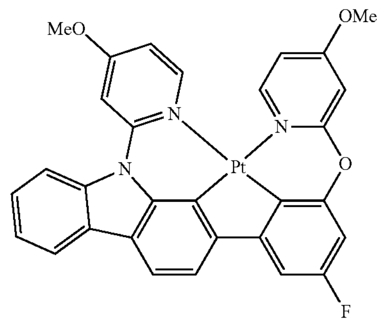
Pt 194
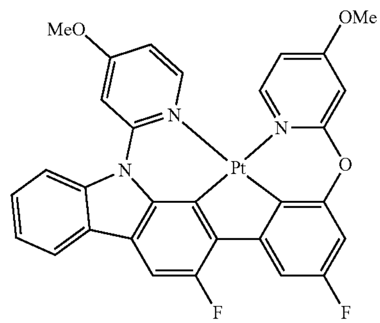
Pt 195
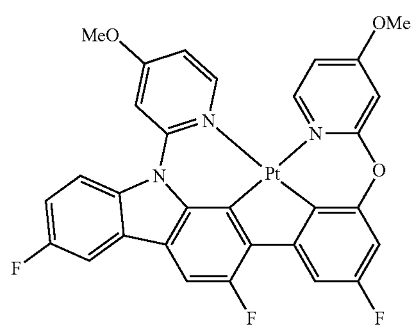
Pt 196
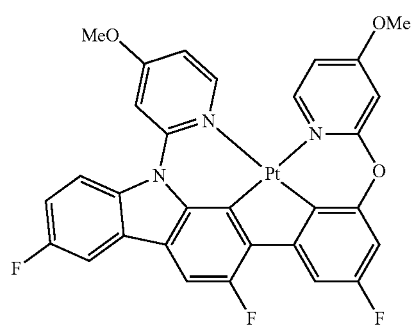

Pt 197
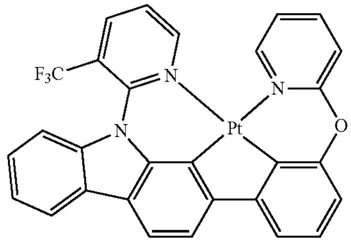
Pt 198
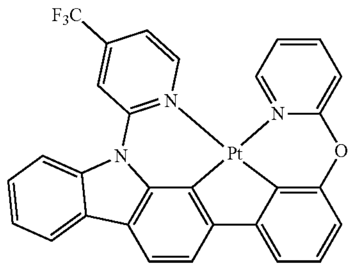
Pt 199
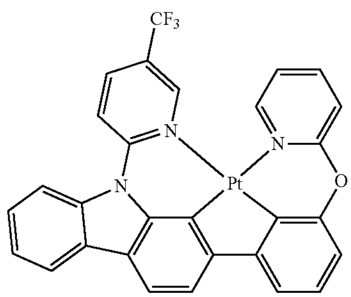
Pt 200
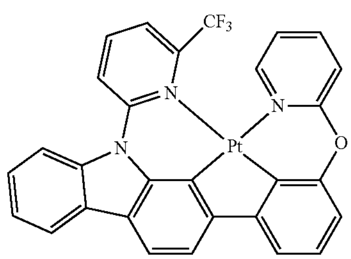
Pt 201
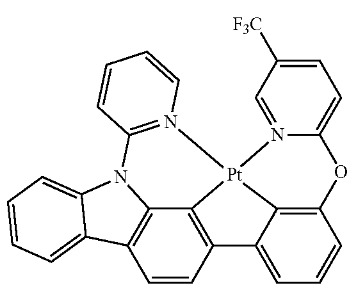
Pt 202
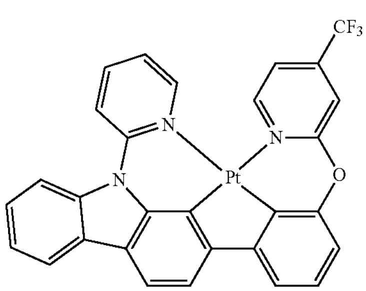
Pt 203
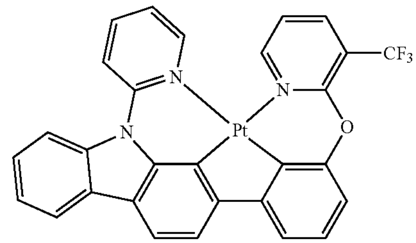
Pt 204
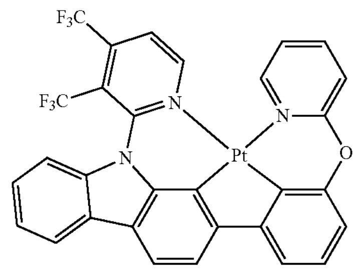
Pt 205
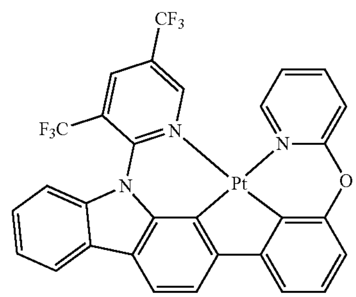
Pt 206
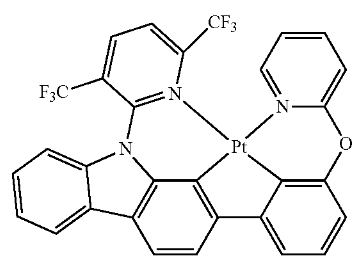
Pt 207
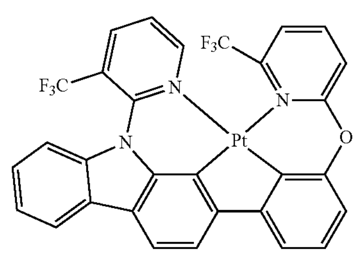
Pt 208
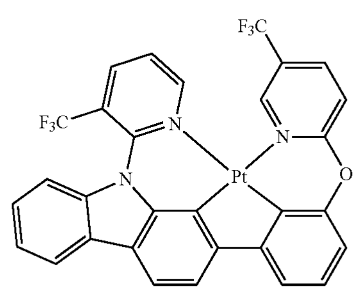

-continued
Pt 209
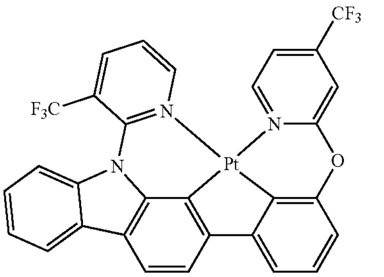
Pt 210
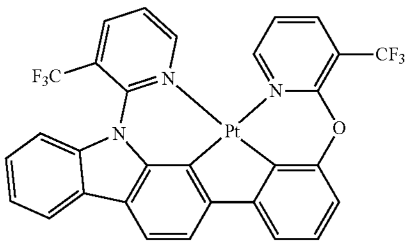
Pt 211
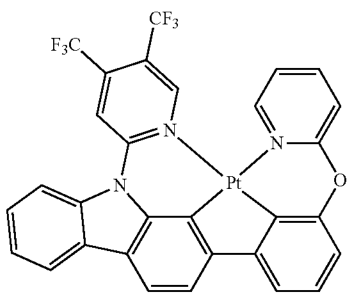
Pt 212
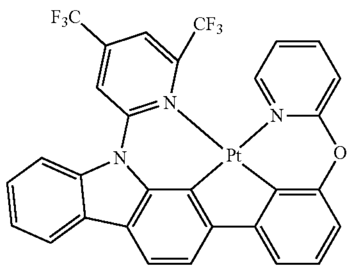
Pt 213
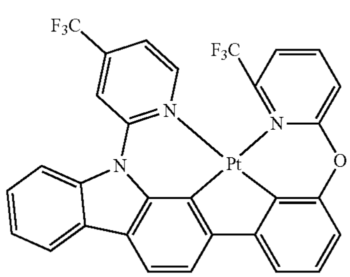
Pt 214
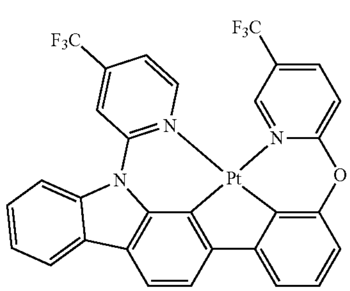
-continued
Pt 215
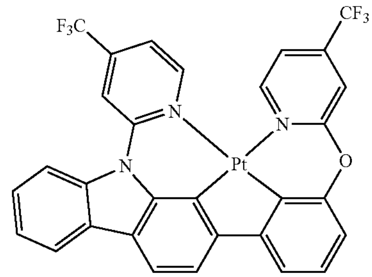
Pt 216
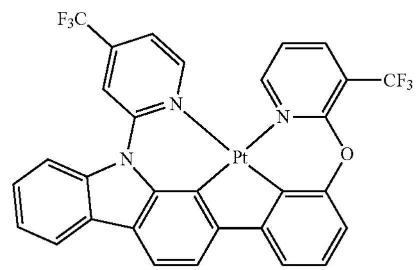
Pt 217
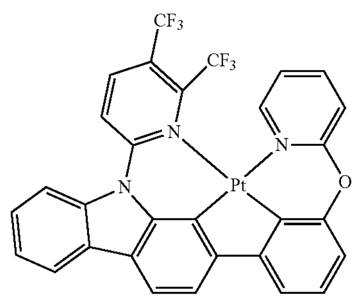
Pt 218
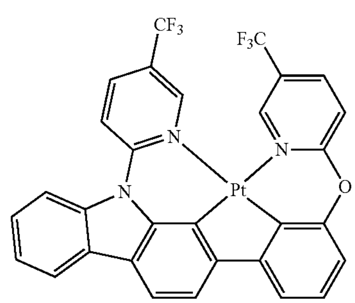
Pt 219
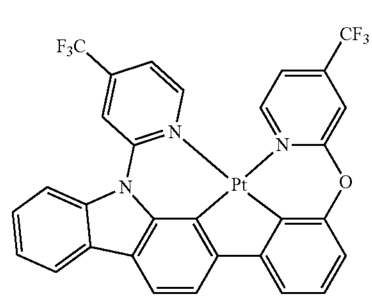

-continued
Pt 220
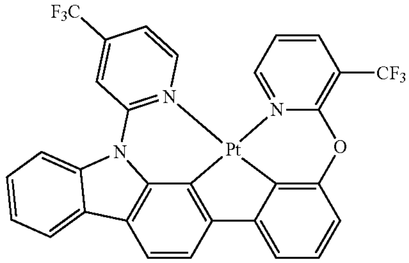
Pt 221
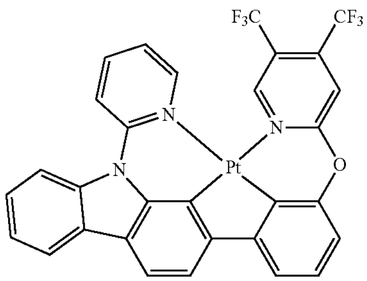
Pt 222
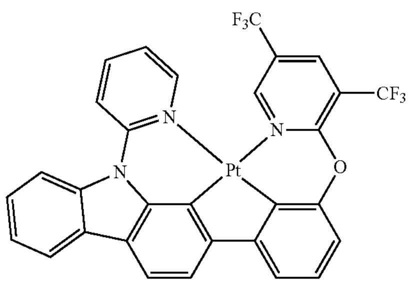
Pt 223
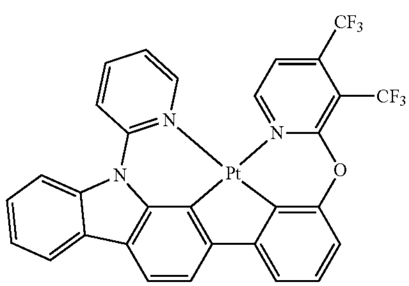
Pt 224
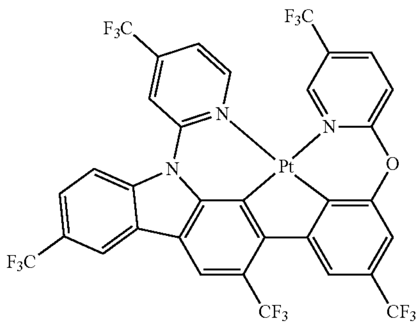
-continued
Pt 225
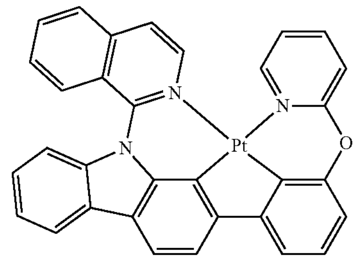
Pt 226
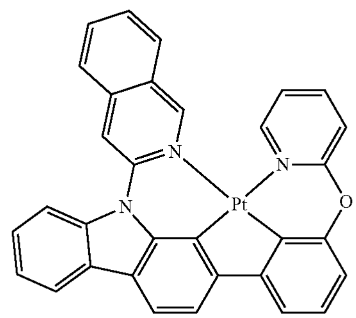
Pt 227
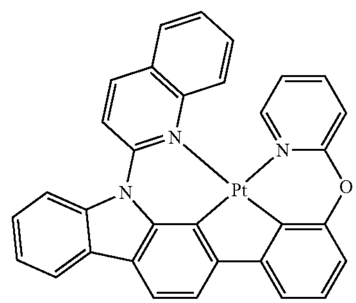
Pt 228
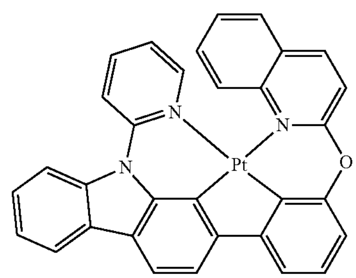
Pt 229
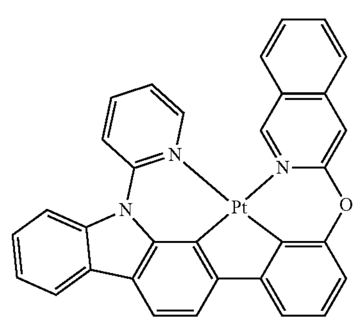

-continued
Pt 230
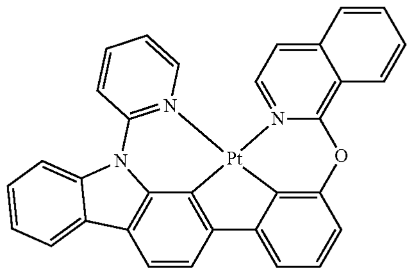
Pt 231
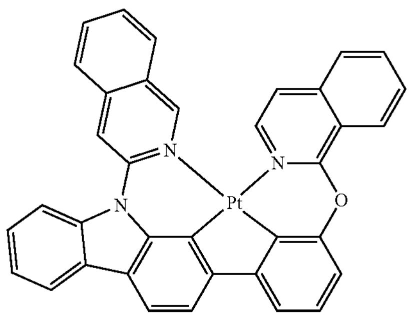
Pt 232
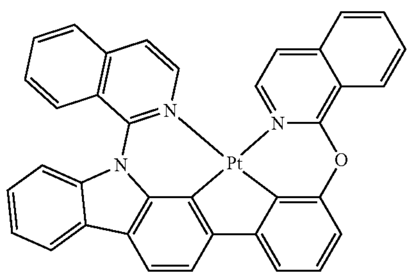
Pt 233
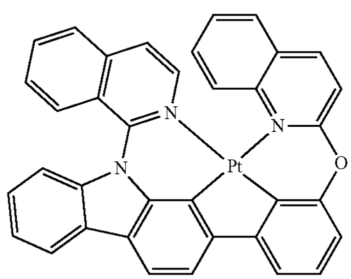
Pt 234
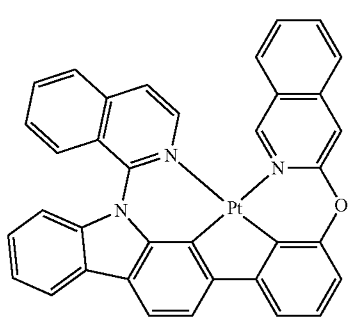
-continued
Pt 235
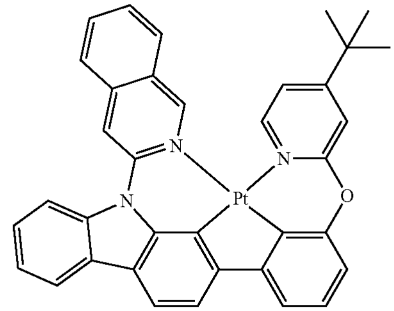
Pt 236
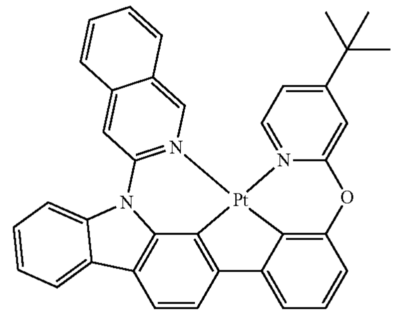
Pt 237
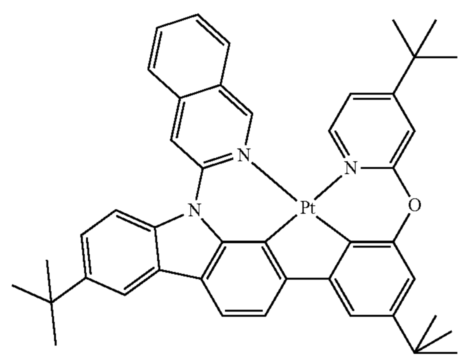
Pt 238
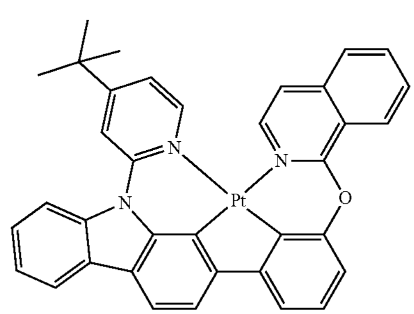

-continued
Pt 239
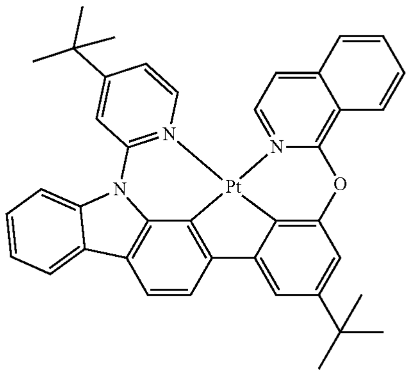
Pt 240
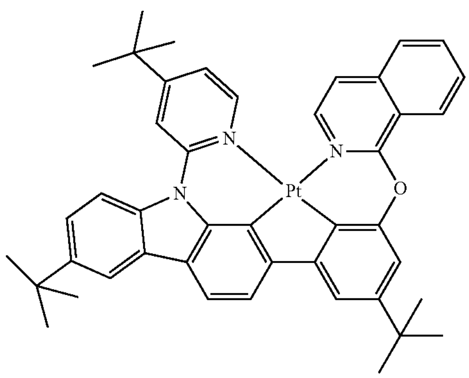
Pt 241
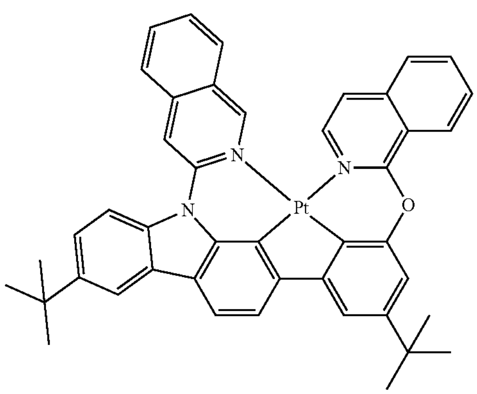
Pt 242
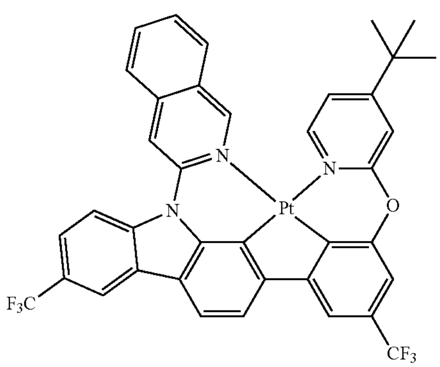
-continued
Pt 243
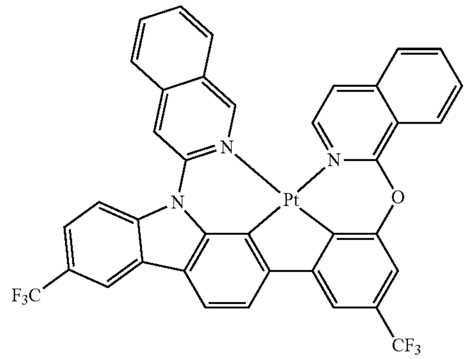
Pt 244
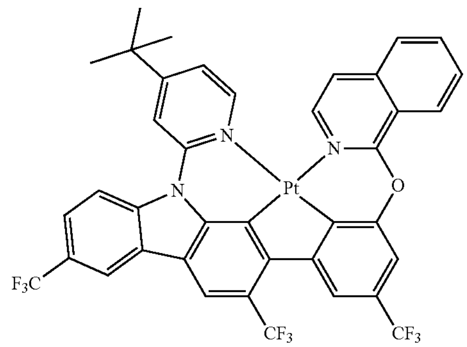
Pt 245
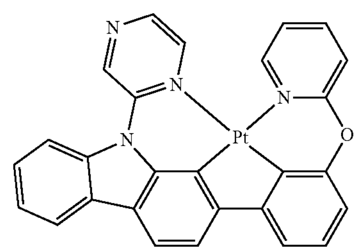
Pt 246
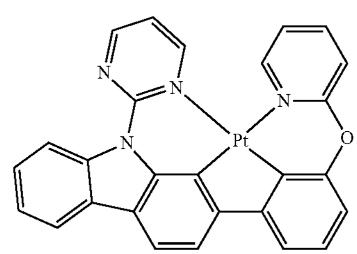
Pt 247
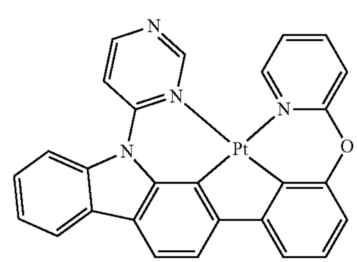

-continued
Pt 248
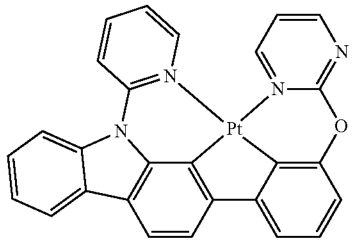
Pt 249
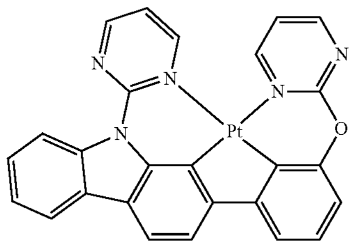
Pt 250
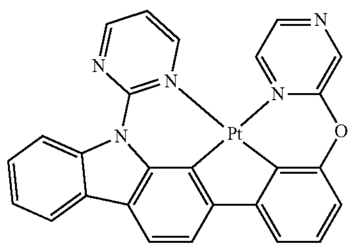
Pt 251
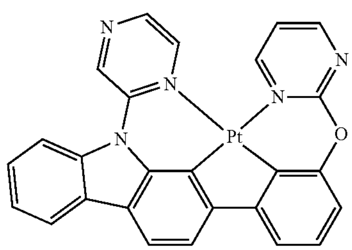
Pt 252
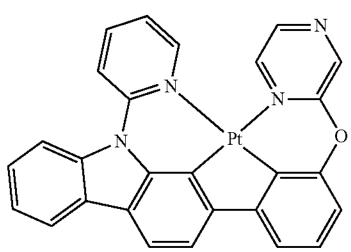
Pt 253
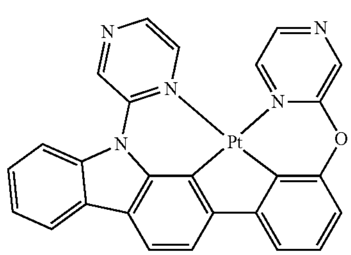
-continued
Pt 254
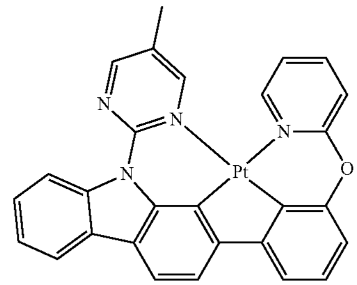
Pt 255
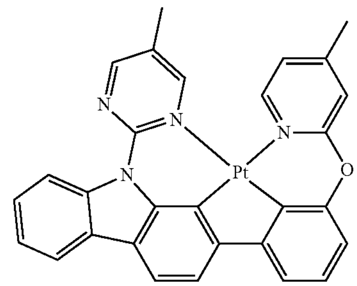
Pt 256
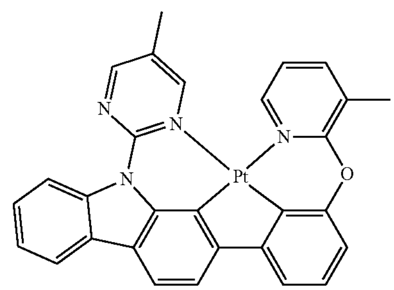
Pt 257
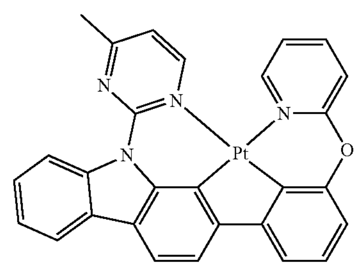
Pt 258
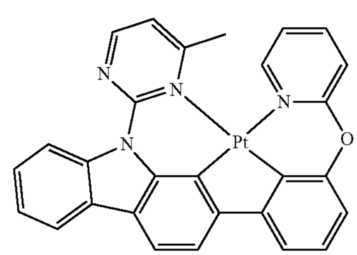

-continued
Pt 259
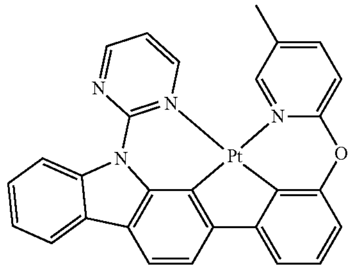
Pt 260
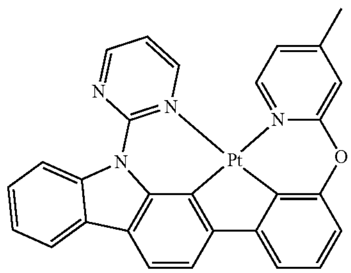
Pt 261
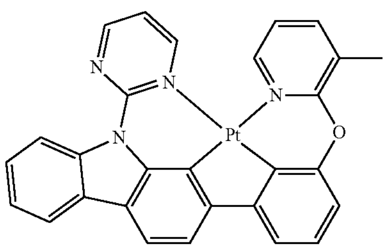
Pt 262
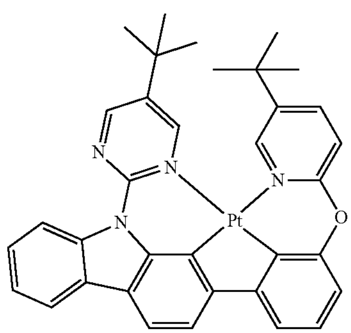
Pt 263
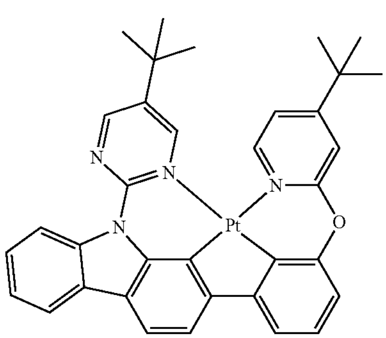
-continued
Pt 264
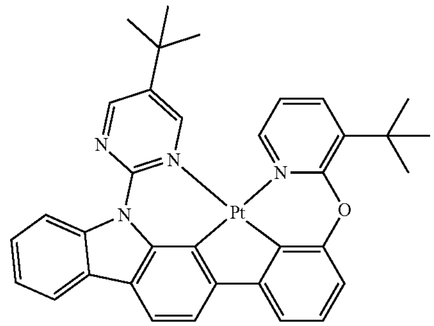
Pt 265
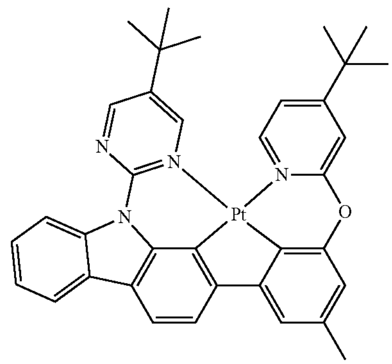
Pt 266
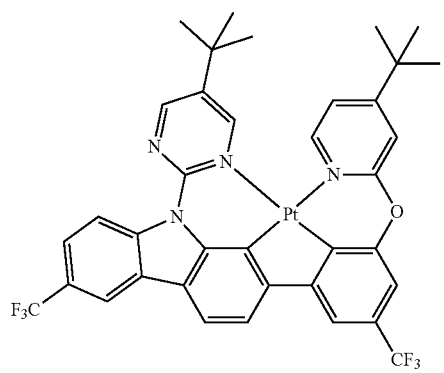
Pt 267
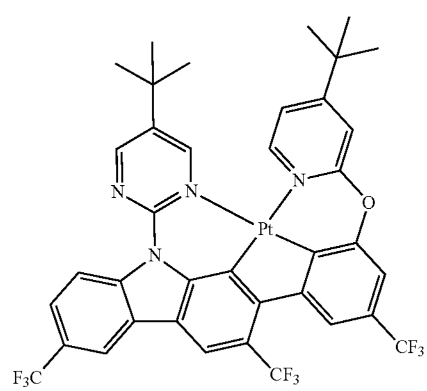

-continued
Pt 268
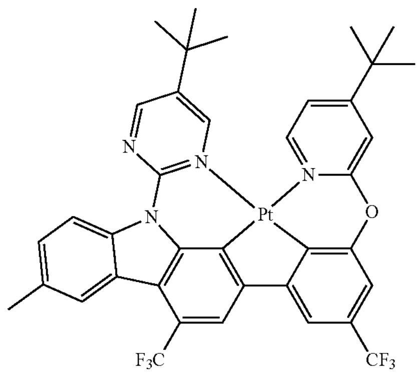
Pt 269
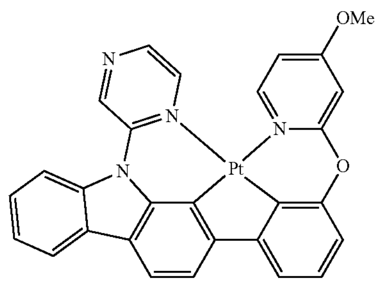
Pt 270
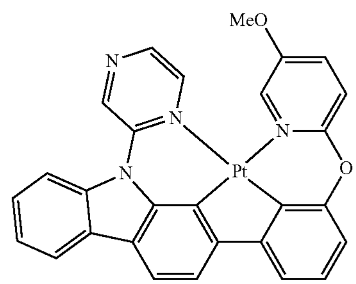
Pt 271
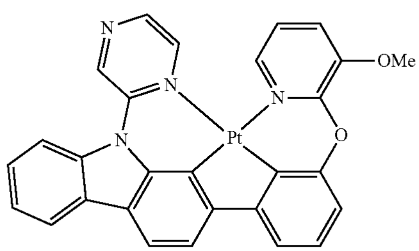
Pt 272
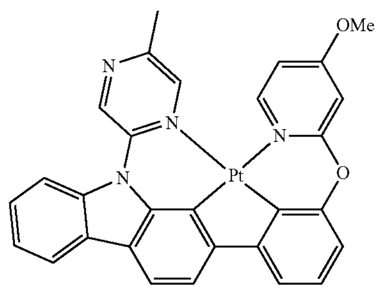
-continued
Pt 273
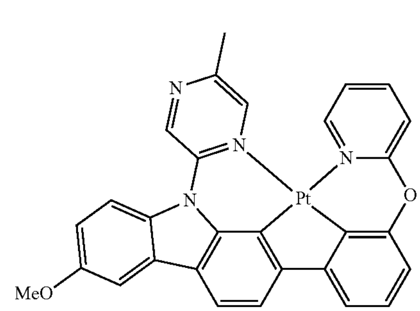
Pt 274
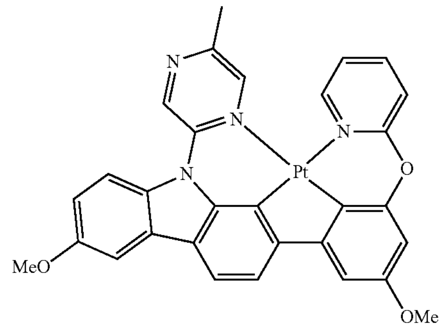
Pt 275
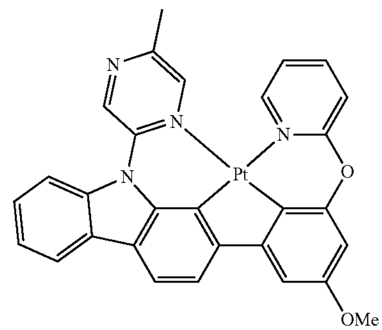
Pt 276
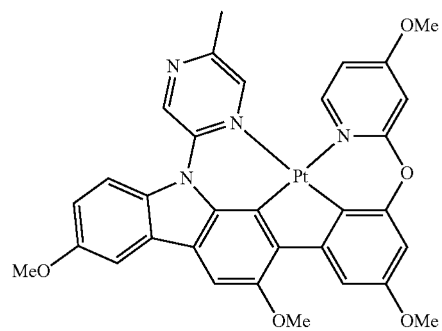
Pt 277
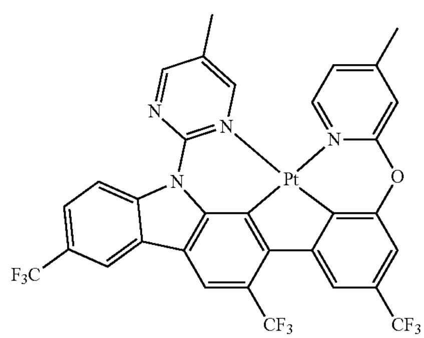

-continued
Pt 278
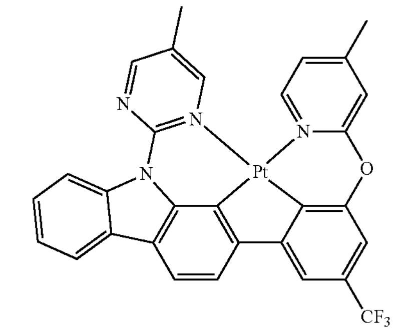
Pt 279
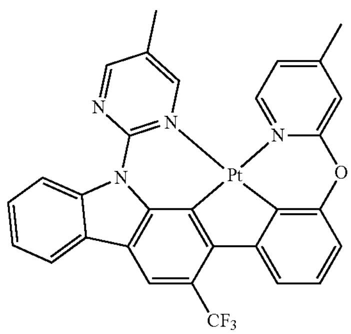
Pt 280
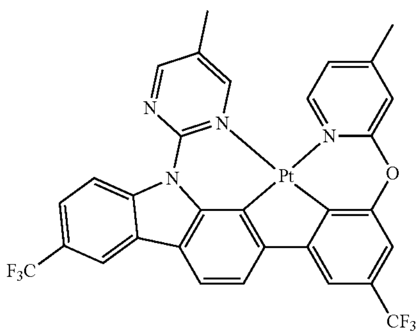
Pt 281
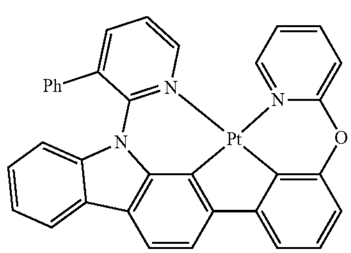
Pt 282
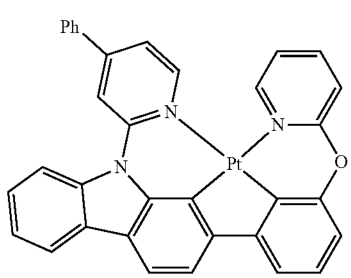
-continued
Pt 283
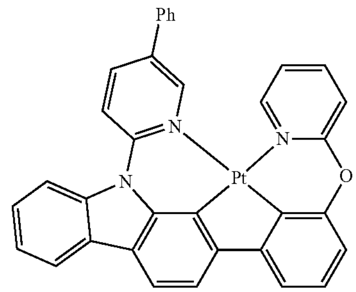
Pt 284
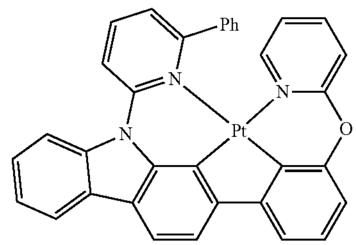
Pt 285
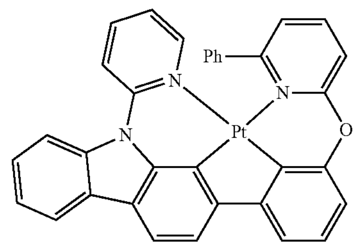
Pt 286
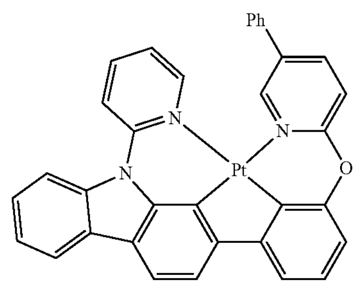
Pt 287
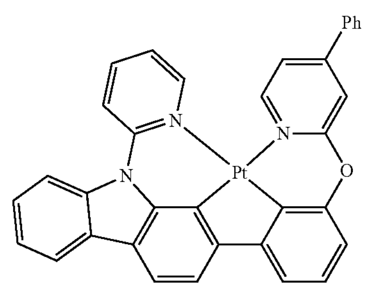
Pt 288
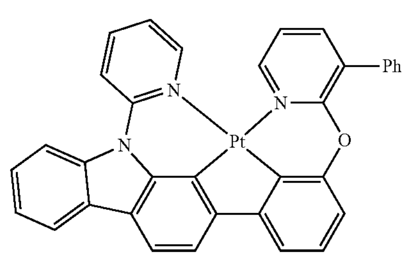

-continued
Pt 289
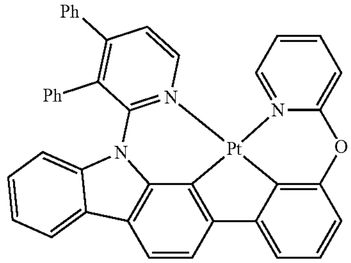
Pt 290
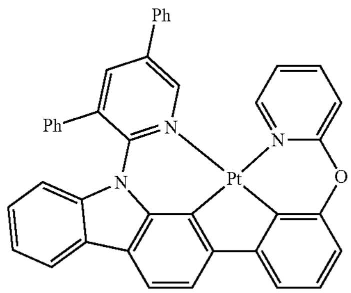
Pt 291
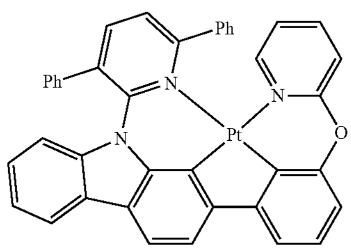
Pt 292
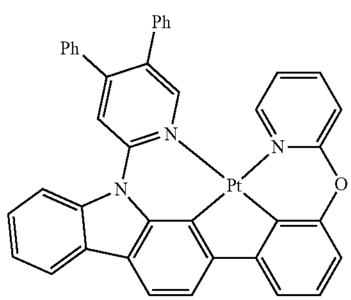
Pt 293
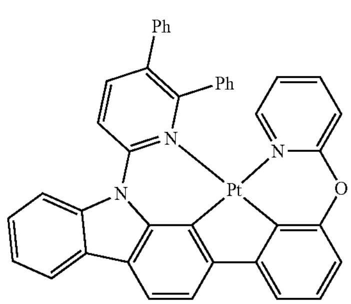
-continued
Pt 294
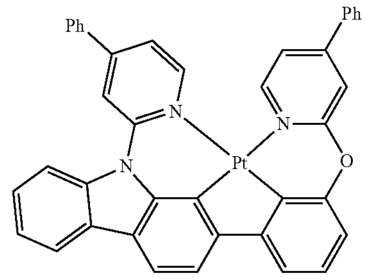
Pt 295
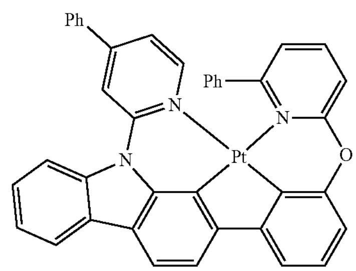
Pt 296
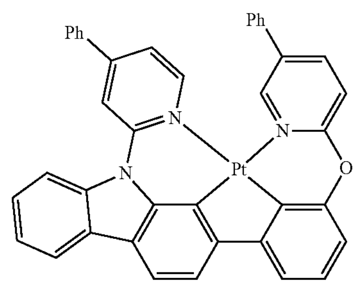
Pt 297
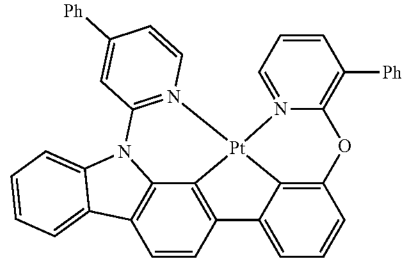
Pt 298
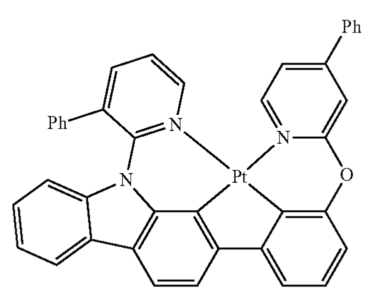

-continued
Pt 299
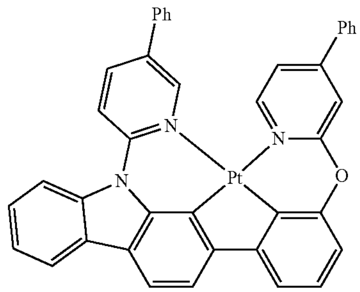
Pt 300
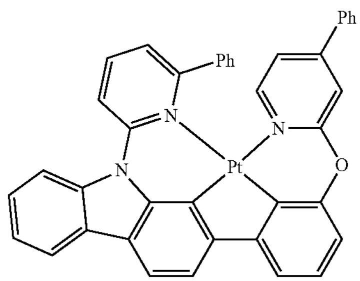
Pt 301
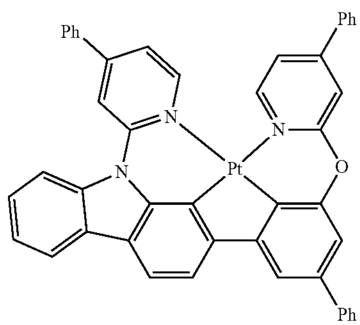
Pt 302
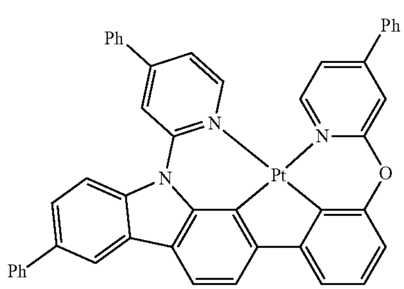
Pt 303
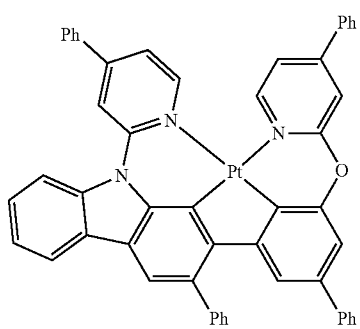
-continued
Pt 304
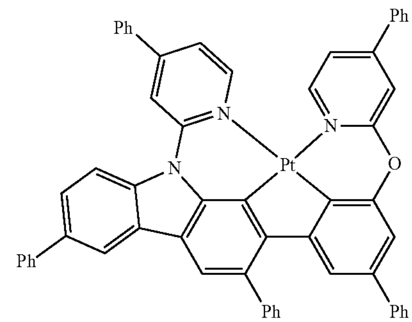
Pt 305
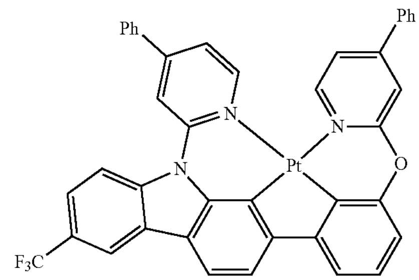
Pt 306
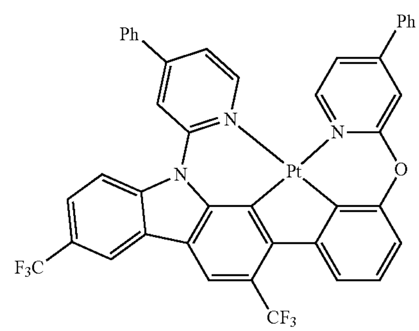
Pt 307
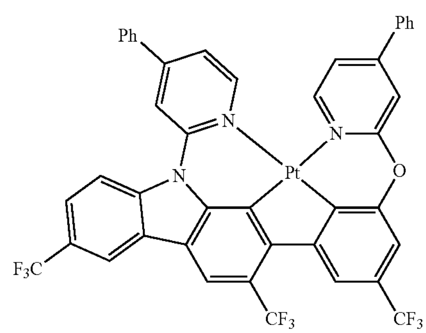
Pt 308
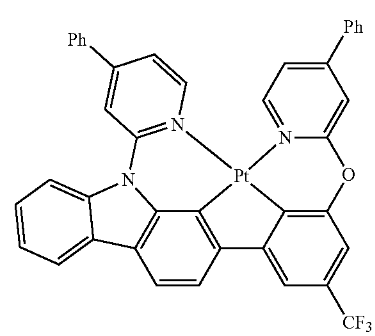

-continued
Pt 309
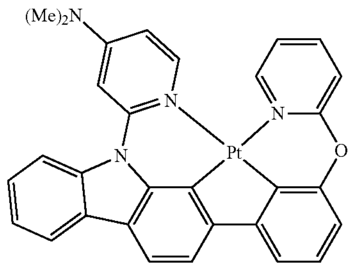
Pt 310
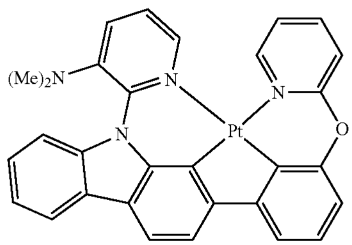
Pt 311
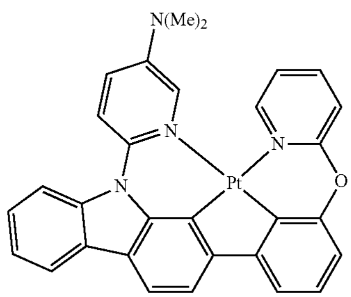
Pt 312
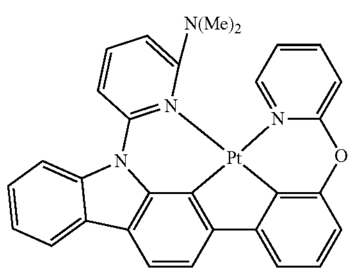
Pt 313
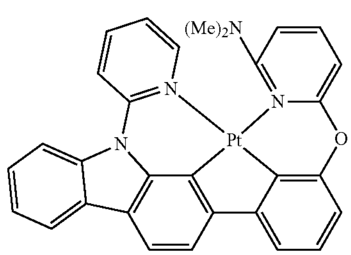
Pt 314
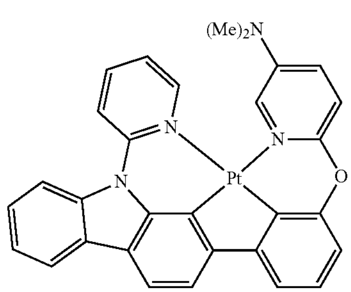
-continued
Pt 315
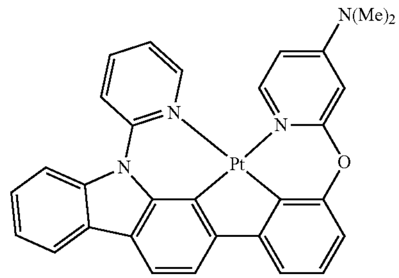
Pt 316
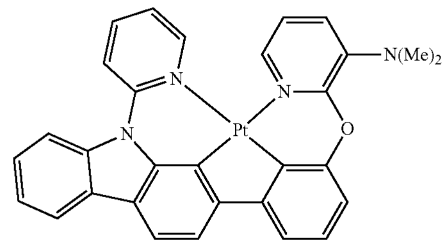
Pt 317
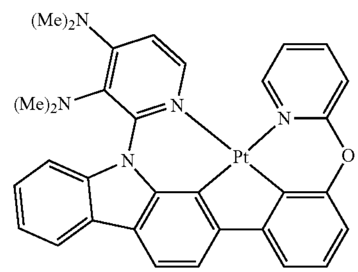
Pt 318
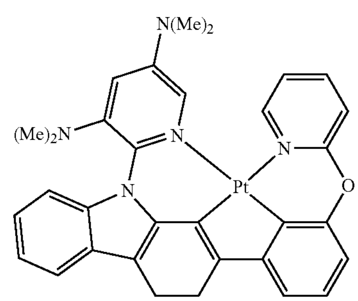
Pt 319
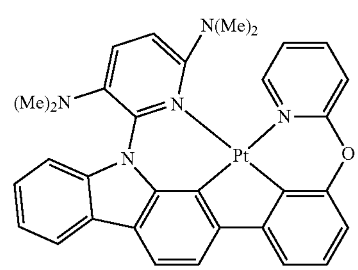
Pt 320
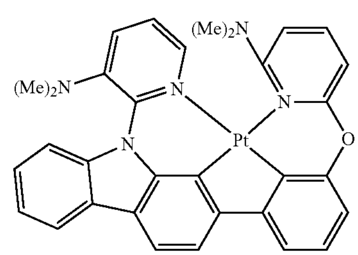

-continued
Pt 321
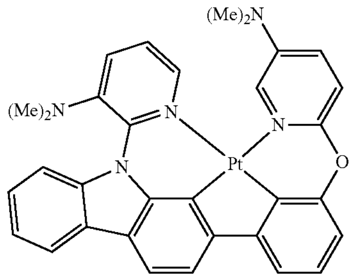
Pt 322
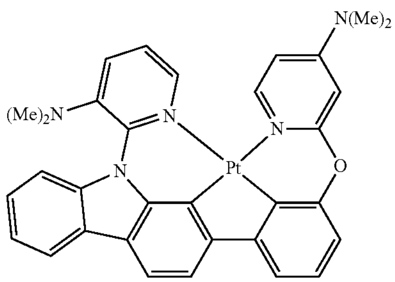
Pt 323
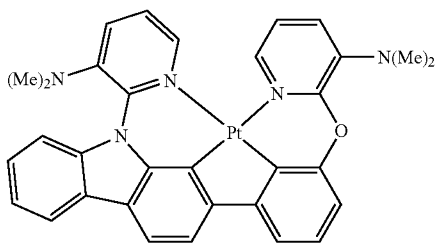
Pt 324
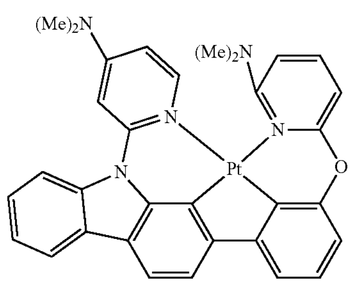
Pt 325
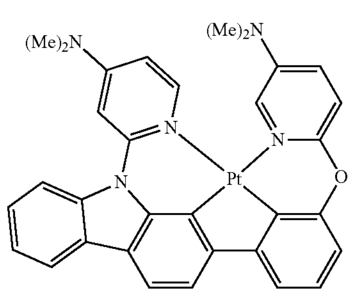
-continued
Pt 326
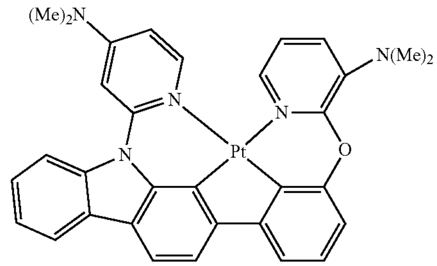
Pt 327
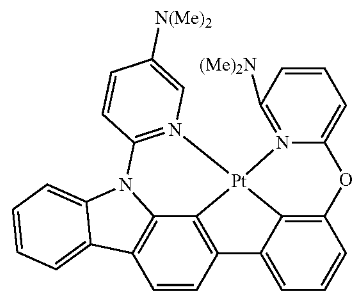
Pt 328
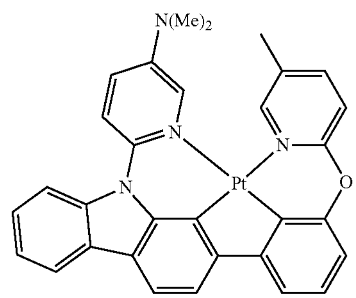
Pt 329
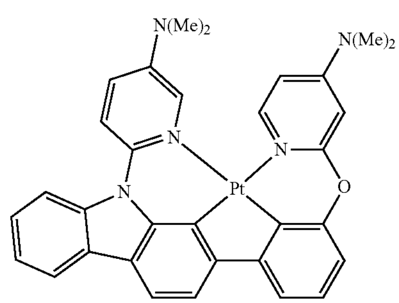
Pt 330
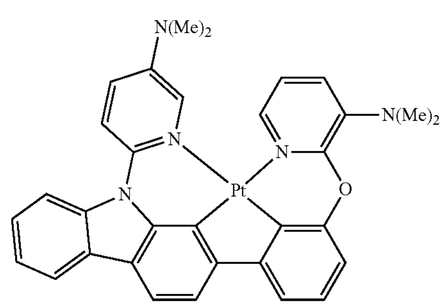

-continued
Pt 331
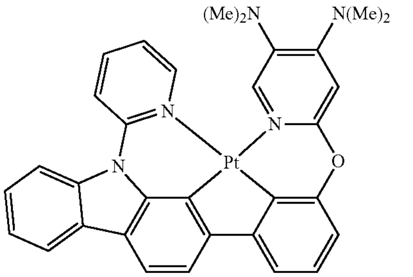
Pt 332
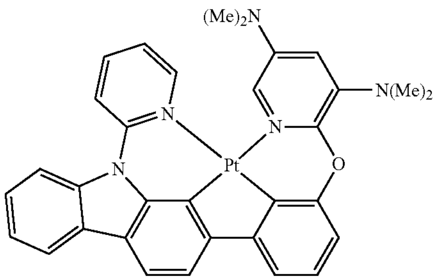
Pt 333
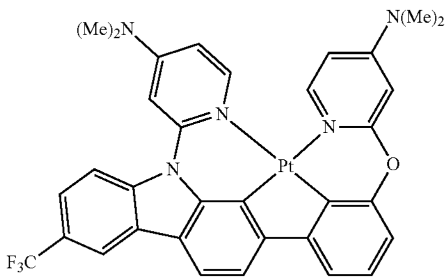
Pt 334
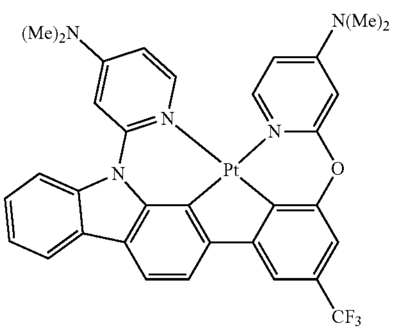
Pt 335
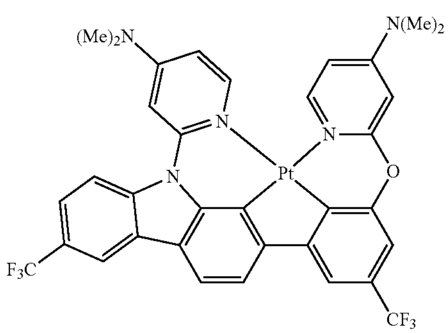
-continued
Pt 336
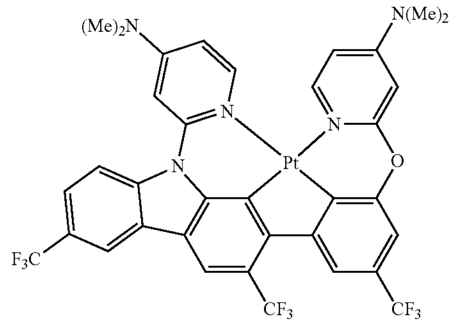
Pt 337
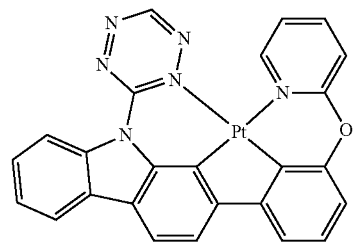
Pt 338
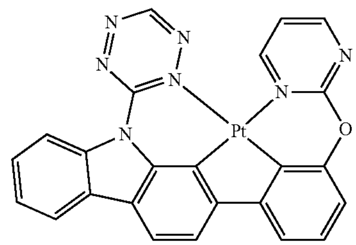
Pt 339
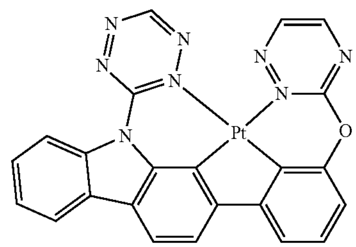
Pt 340
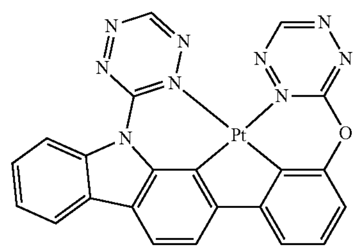
Pt341
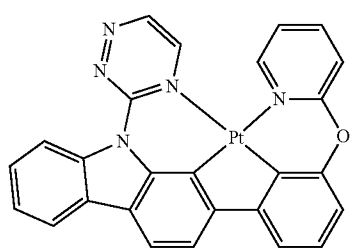

-continued
Pt 342
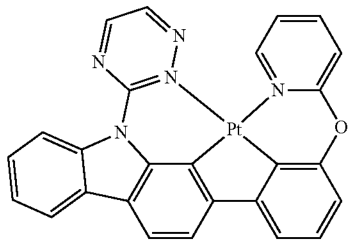
Pt 343
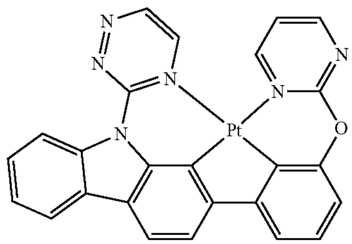
Pt 344
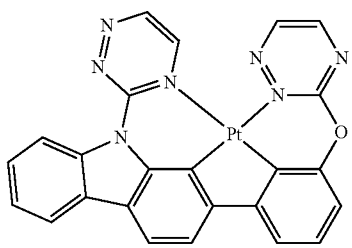
Pt 345
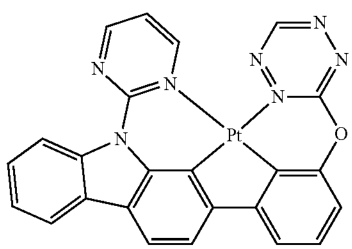
Pt 346
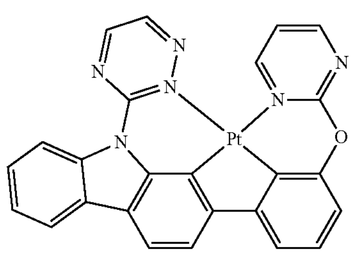
Pt 347
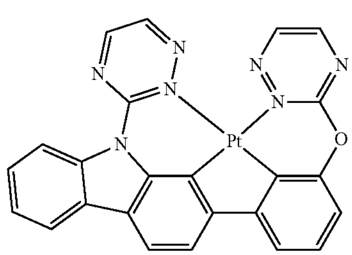
-continued
Pt 348
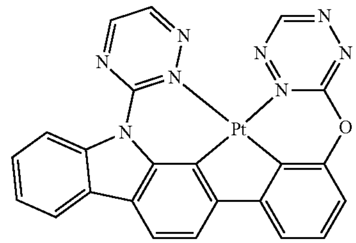
Pt 349
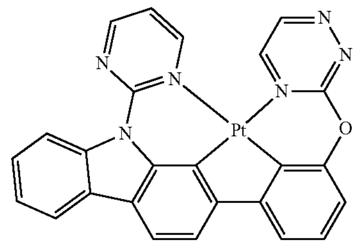
Pt 350
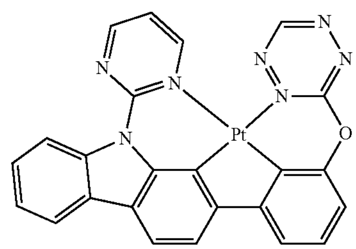
Pt 351
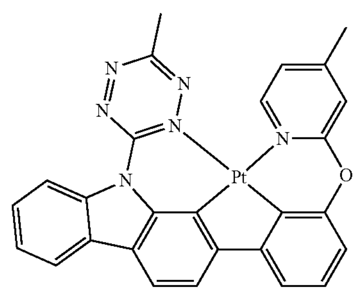
Pt 352
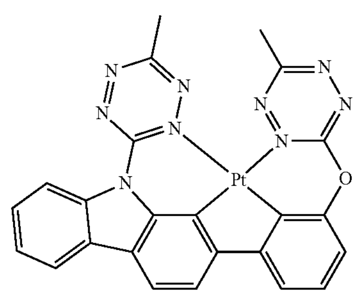
Pt 353
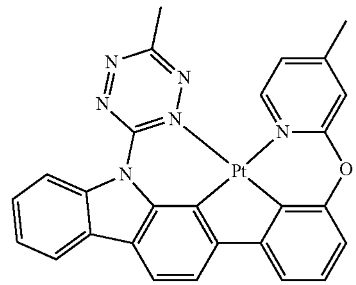

Pt 354
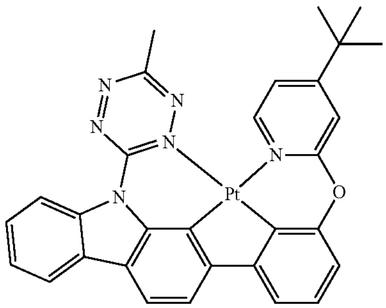
Pt 355
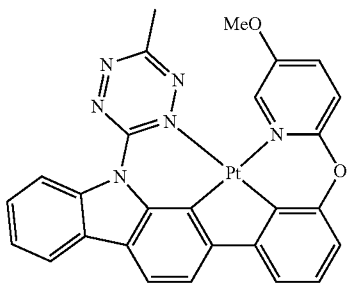
Pt 356
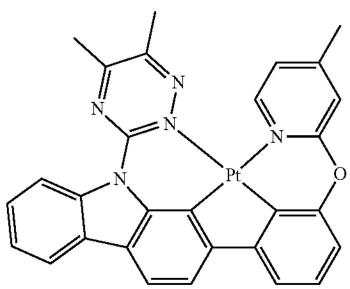
Pt 357
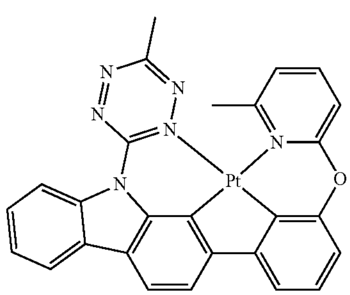
Pt 358
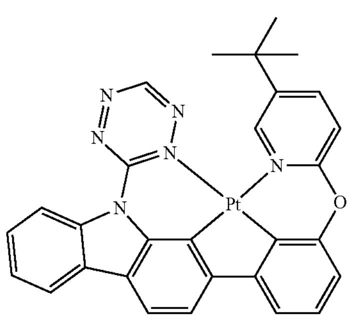
Pt 359
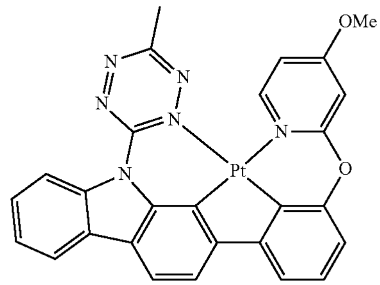
Pt 360
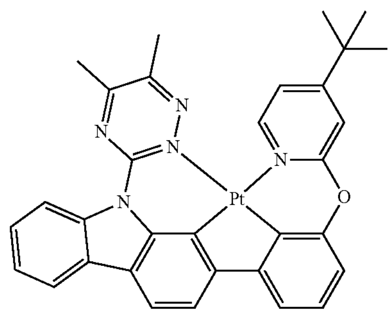
Pt 361
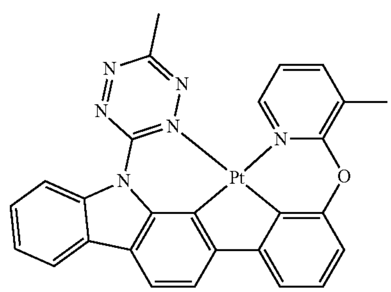
Pt 362
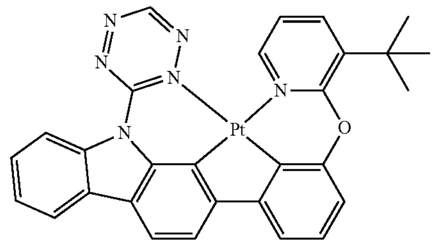
Pt 363
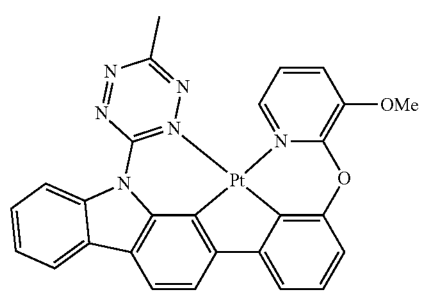

-continued
Pt 364
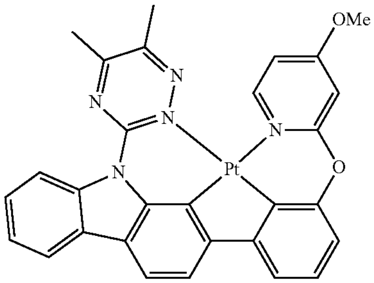
Pt 365
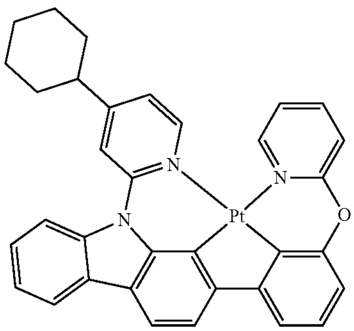
Pt 366
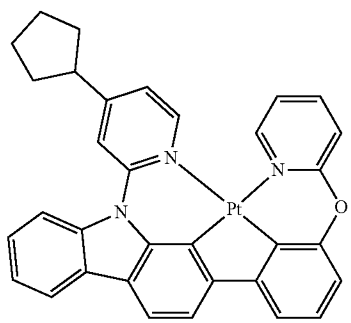
Pt 367
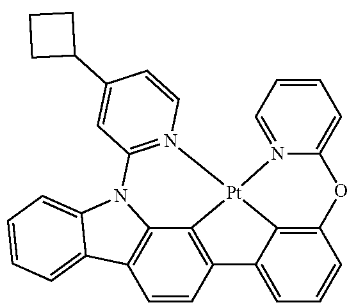
Pt 368
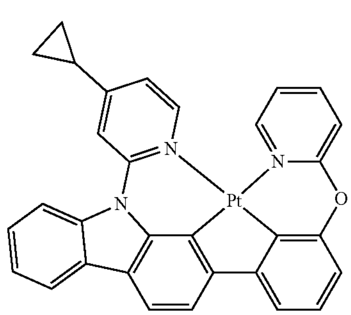
-continued
Pt 369
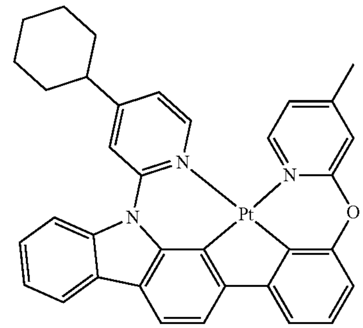
Pt 370
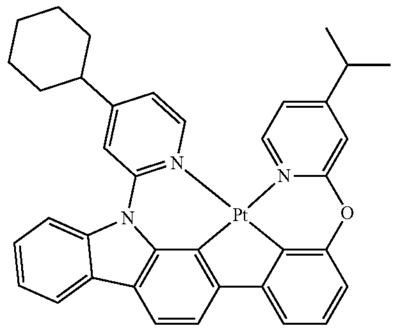
Pt 371
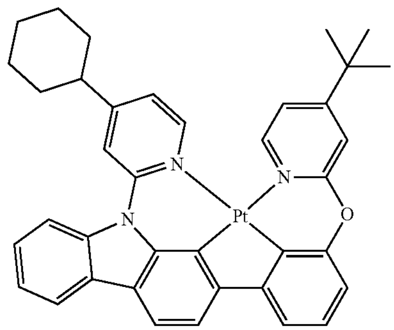
Pt 372
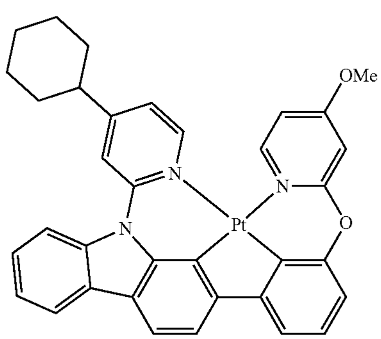
Pt 373
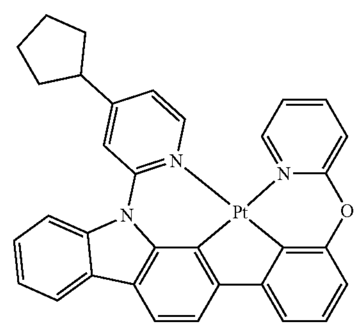

-continued
Pt 374
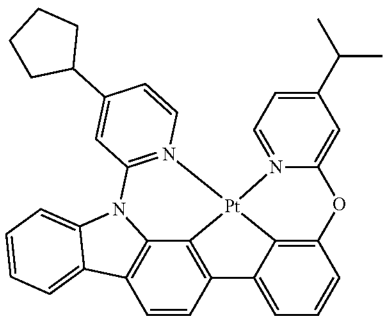
Pt 375
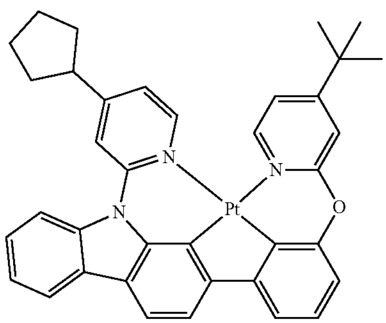
Pt 376
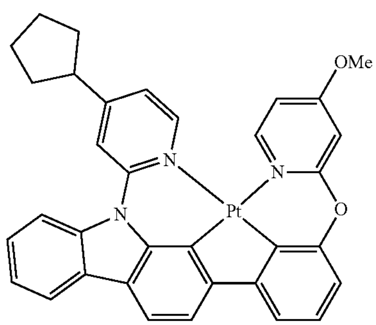
Pt 377
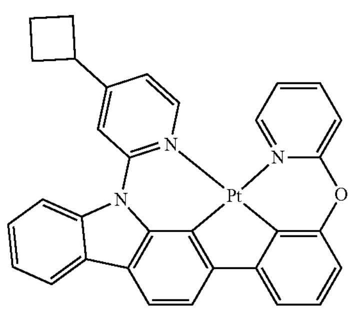
Pt 378
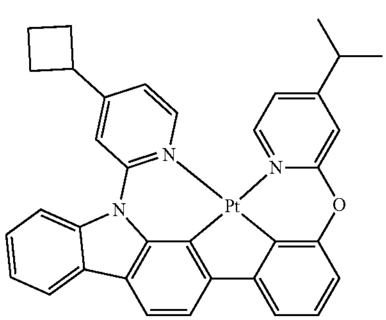
-continued
Pt 379
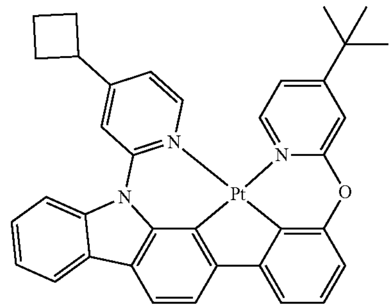
Pt 380
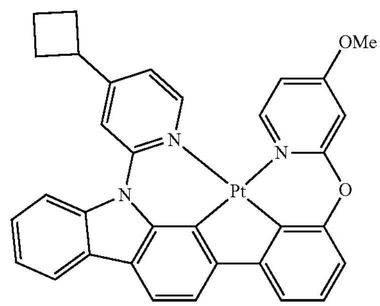
Pt 381
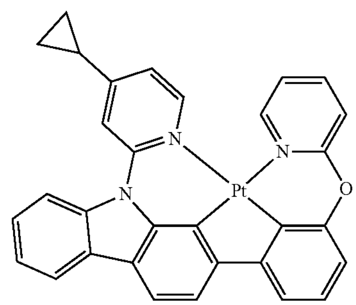
Pt 382
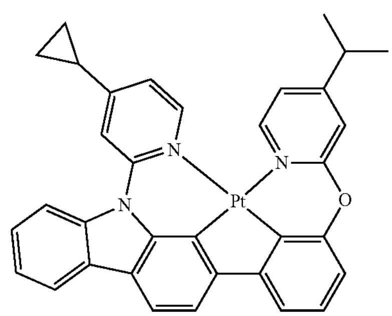
Pt 383
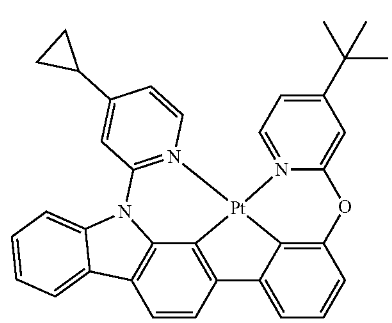

-continued
Pt 384
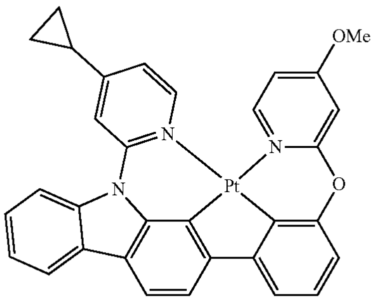
Pt 385
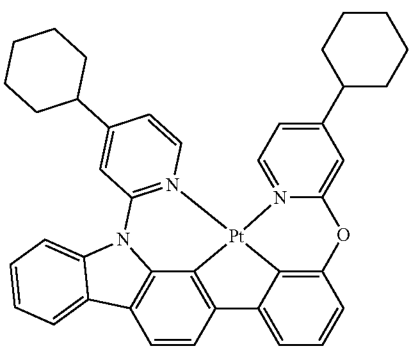
Pt 386
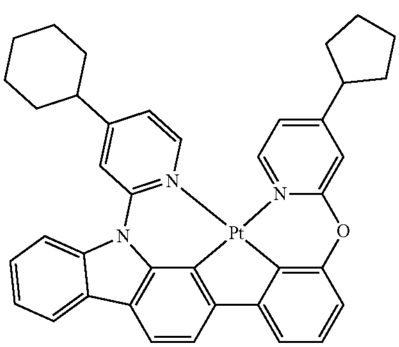
Pt 387
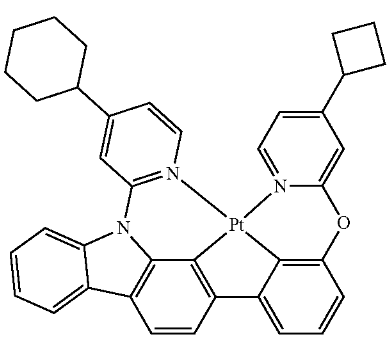
-continued
Pt 388
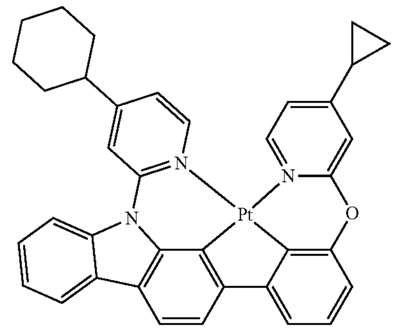
Pt 389
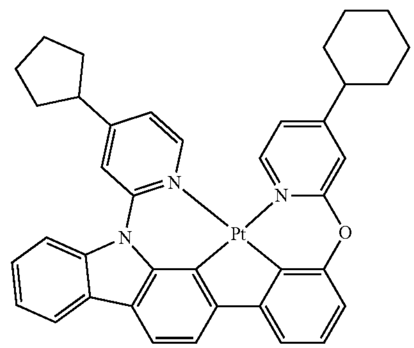
Pt 390
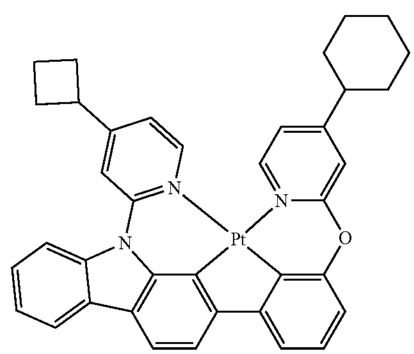
Pt 391
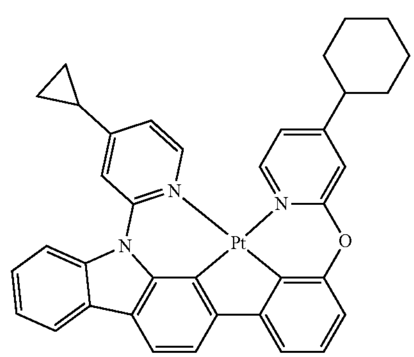

-continued
Pt 392
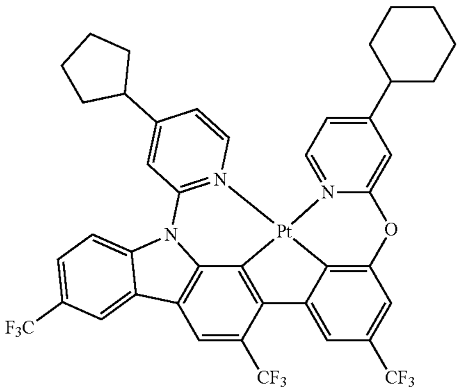
Pt 393
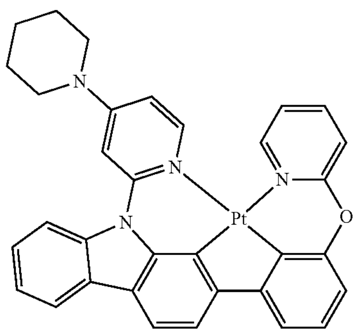
Pt 394
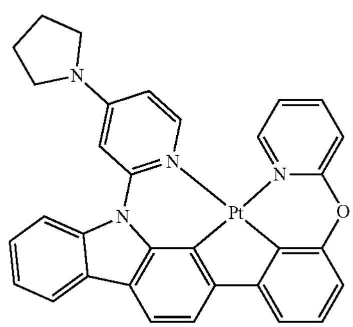
Pt 395
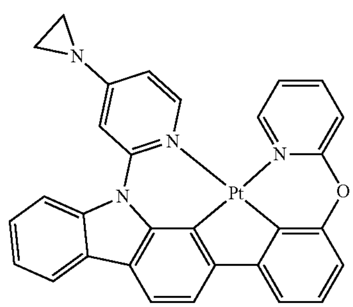
Pt 396
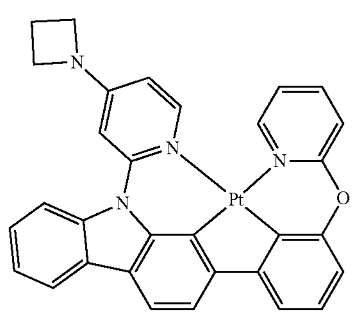
-continued
Pt 397
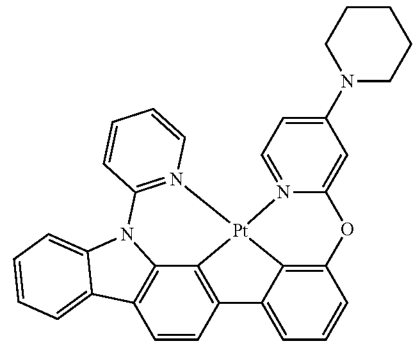
Pt 398
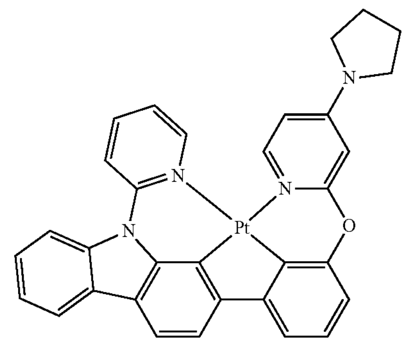
Pt 399
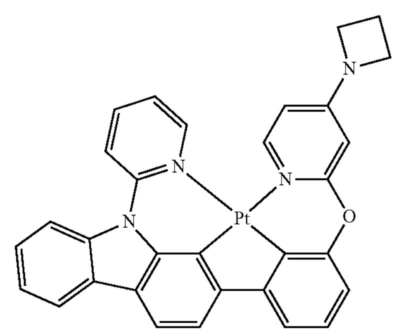
Pt 400
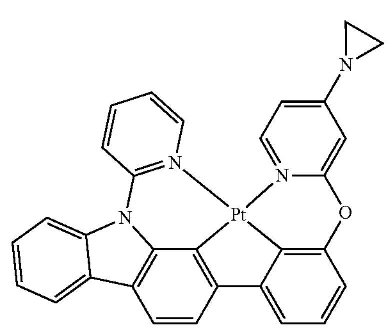

-continued
Pt 401
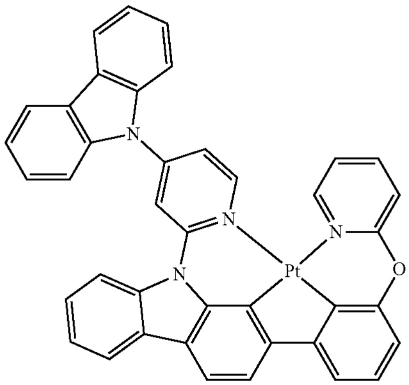
Pt 402
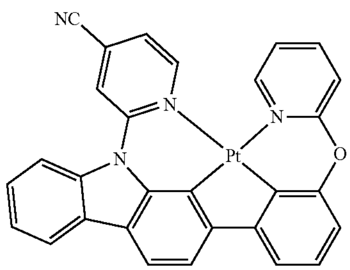
Pt 403
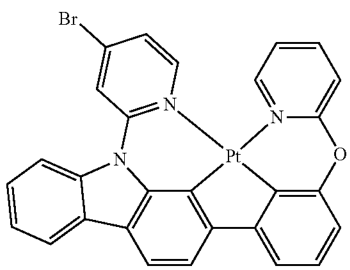
Pt 404
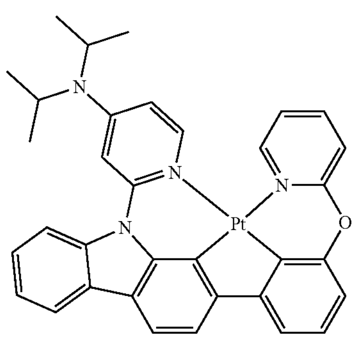
Pt 405
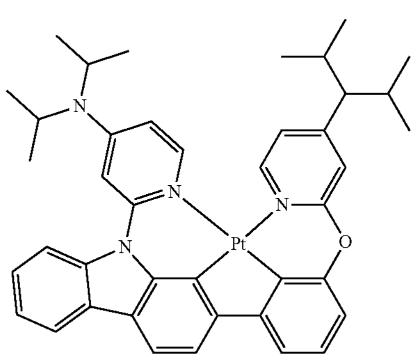
-continued
Pt 406
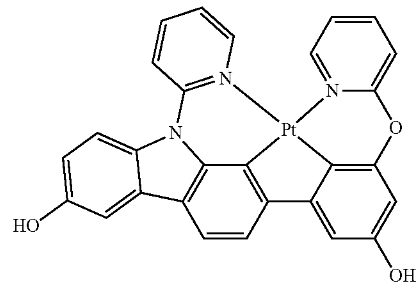
Pt 407
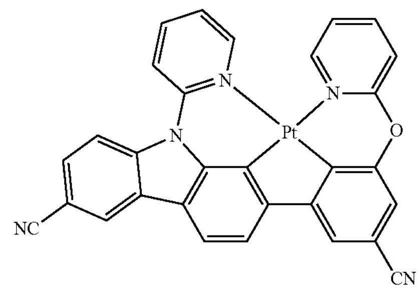
Pt 408
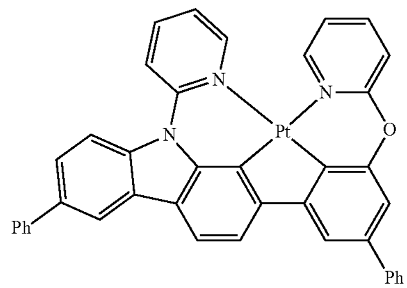
Pt 409
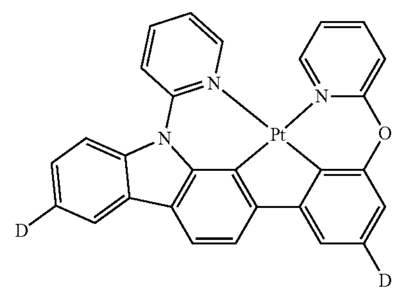
Pt 410
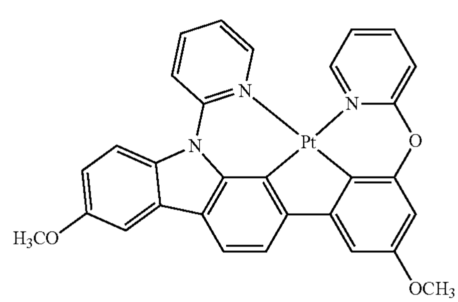

Pt 411
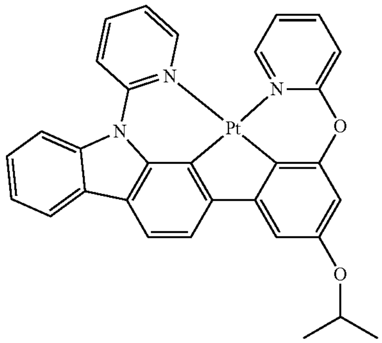
Pt 412
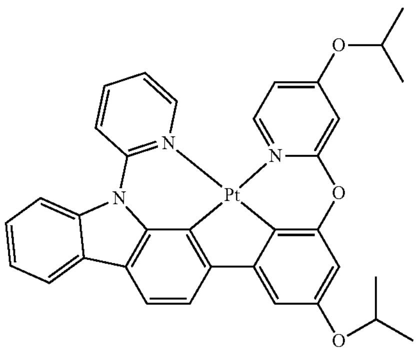
Pt 413
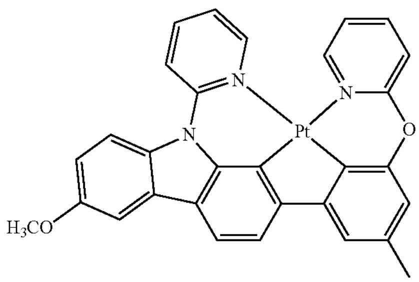
Pt 414
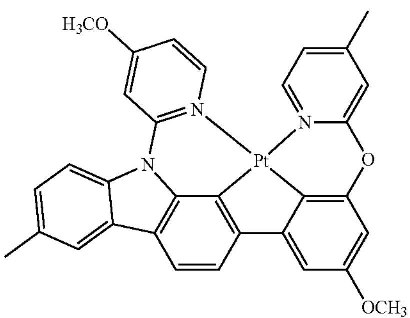
Pt 415
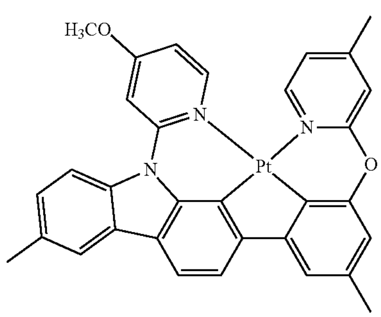
Pt 416
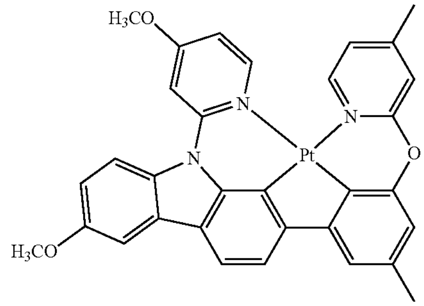
Pt 417
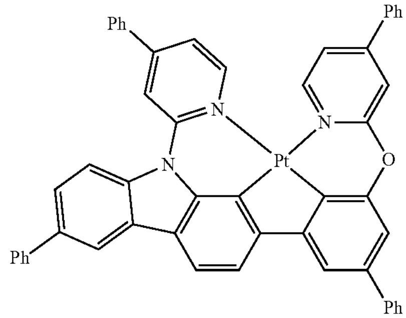
Pt 418
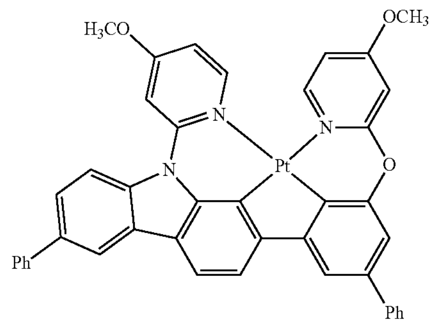
Pt 419
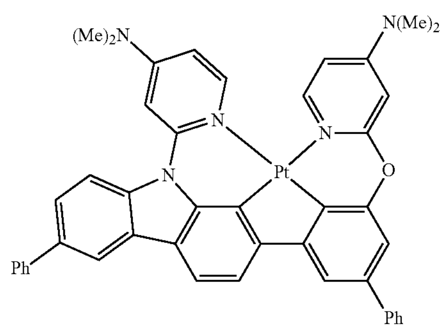
Pt 420
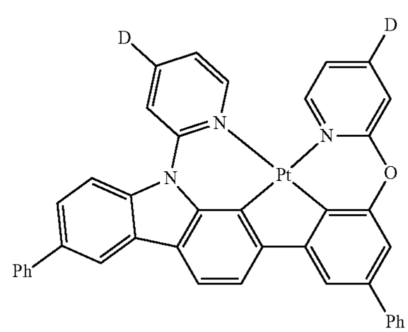

-continued
Pt 421
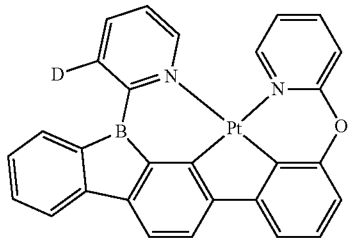
Pt 422
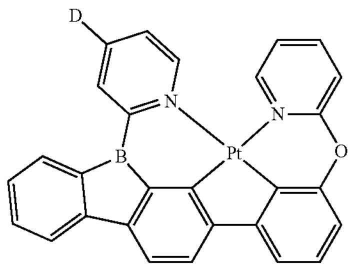
Pt 423
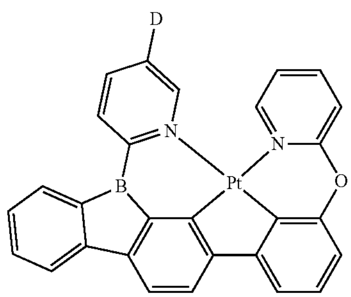
Pt 424
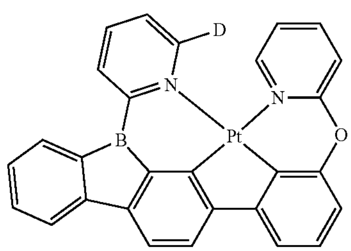
Pt 425
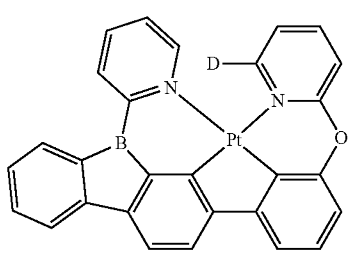
Pt 426
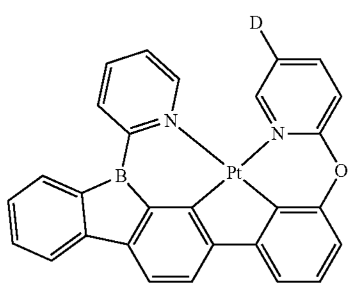
-continued
Pt 427
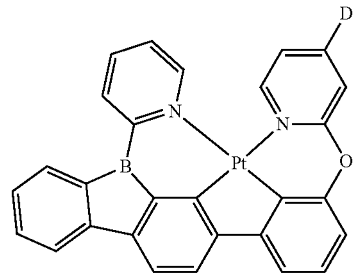
Pt 428
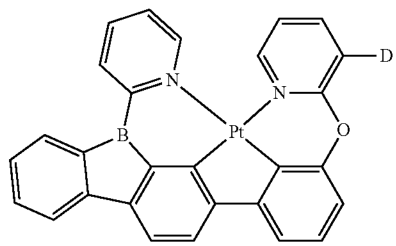
Pt 429
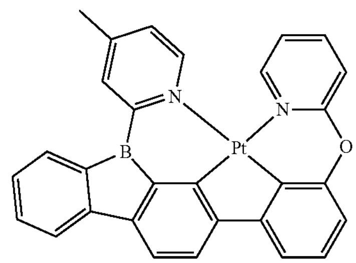
Pt 430
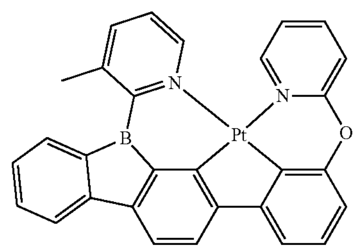
Pt 431
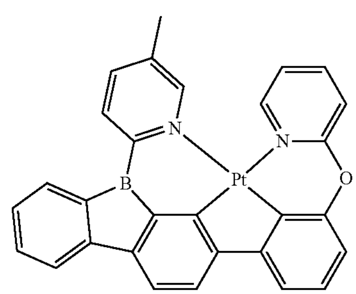
Pt 432
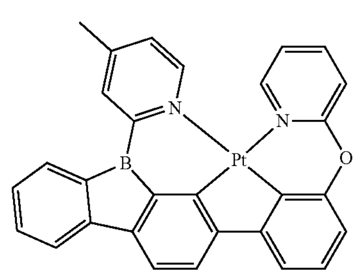

Pt 433
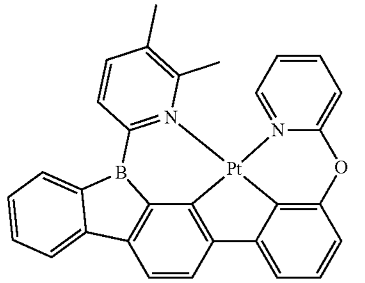
Pt 434
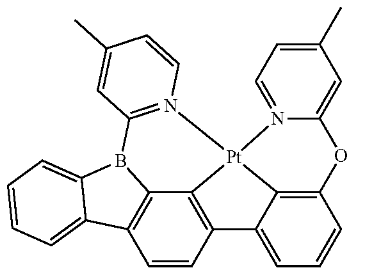
Pt 435
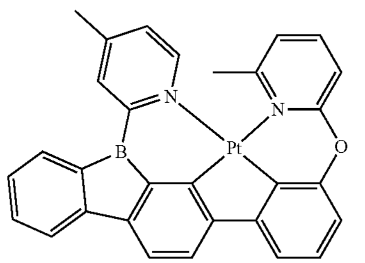
Pt 436
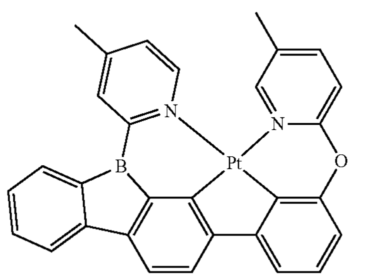
Pt 437
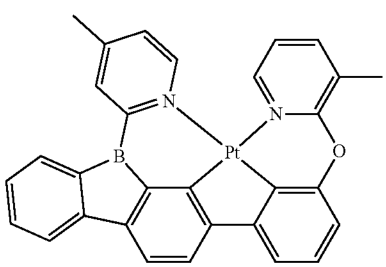
Pt 438
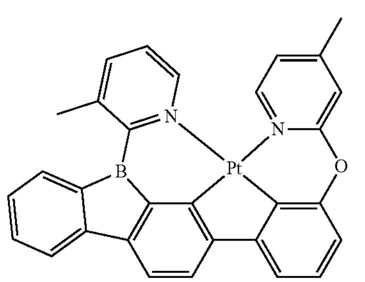
Pt 439
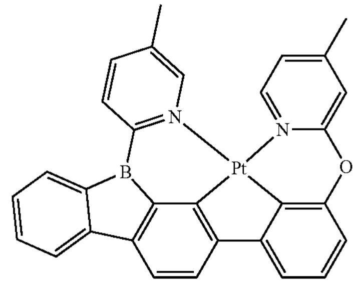
Pt 440
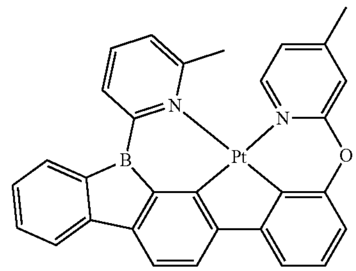
Pt 441
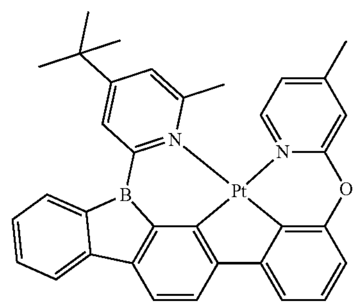
Pt 442
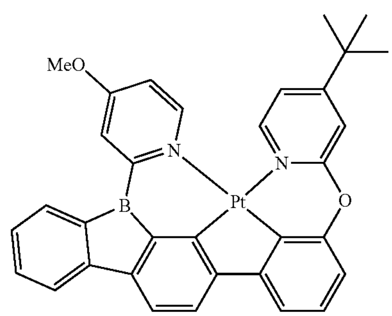
Pt 443
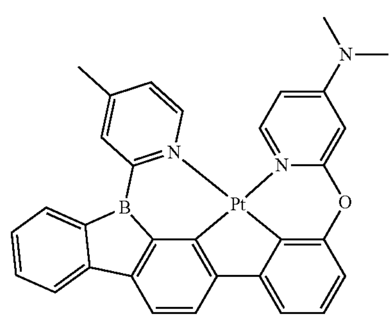

-continued
Pt 444
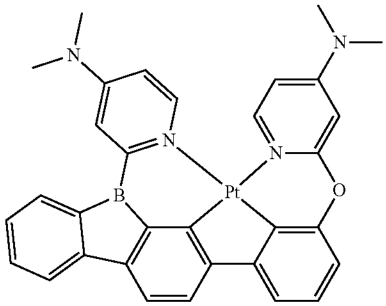
Pt 445
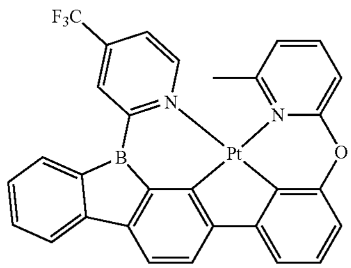
Pt 446
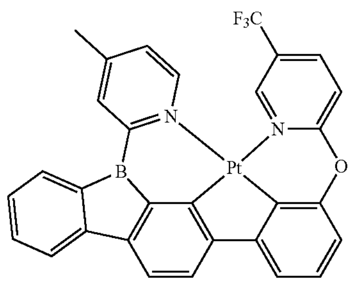
Pt 447
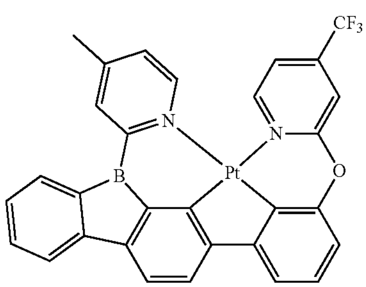
Pt 448
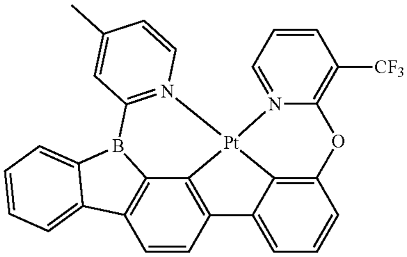
-continued
Pt 449
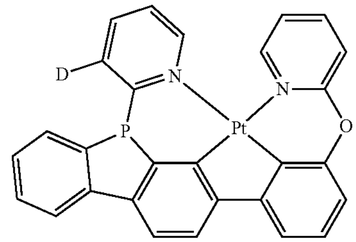
Pt 450
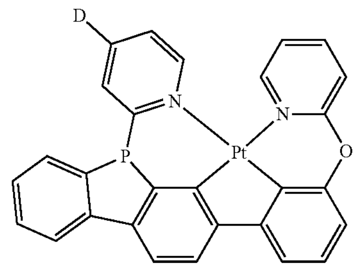
Pt 451
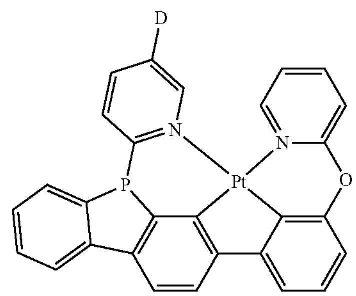
Pt 452
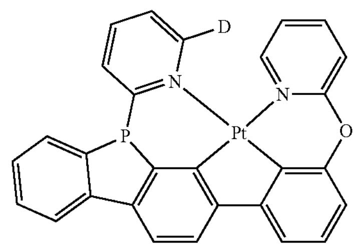
Pt 453
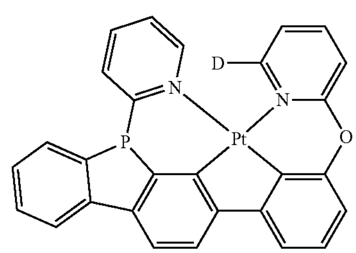
Pt 454
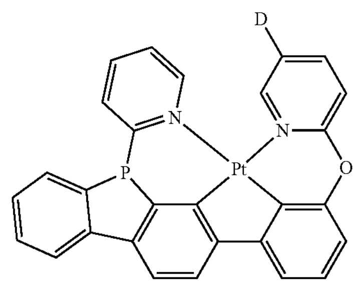

-continued
Pt 455
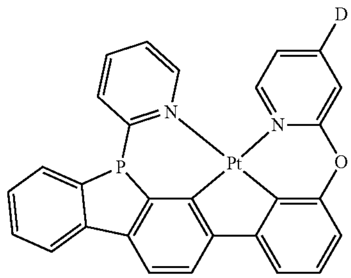
Pt 456
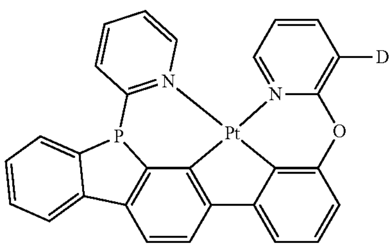
Pt 457
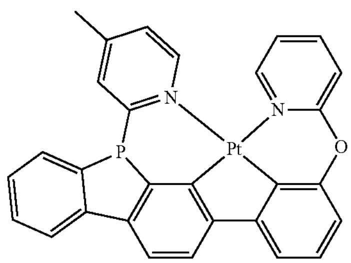
Pt 458
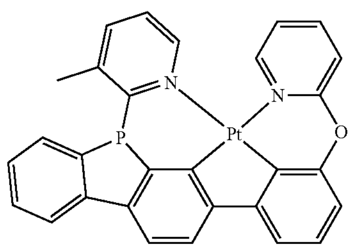
Pt 459
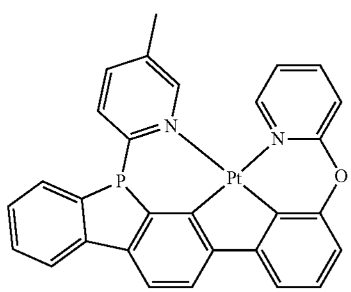
Pt 460
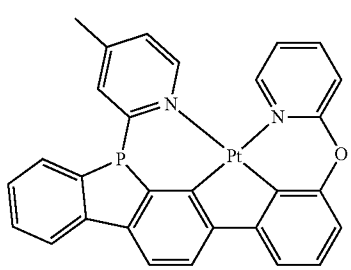
-continued
Pt 461
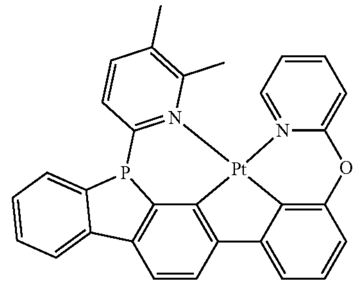
Pt 462
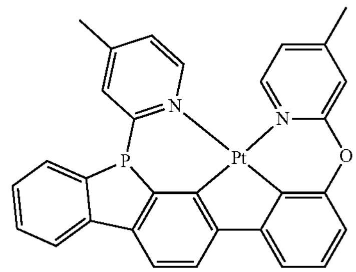
Pt 463
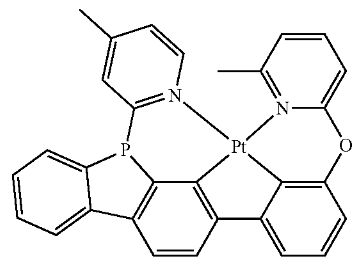
Pt 464
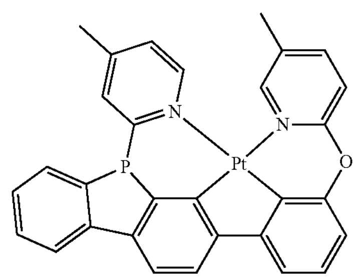
Pt 465
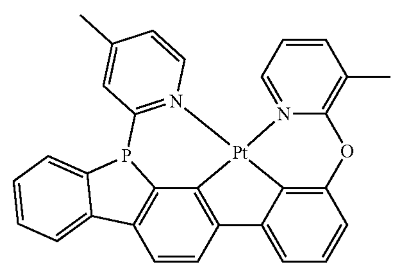
Pt 466
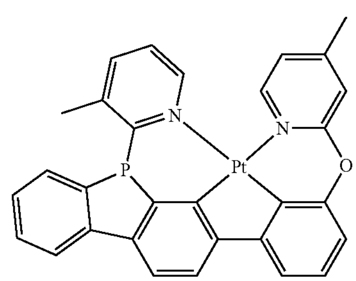

-continued
Pt 467
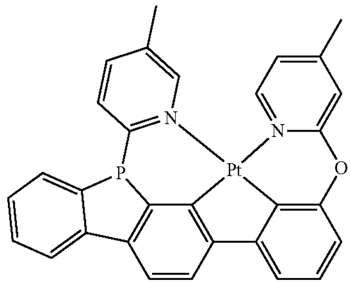
Pt 468
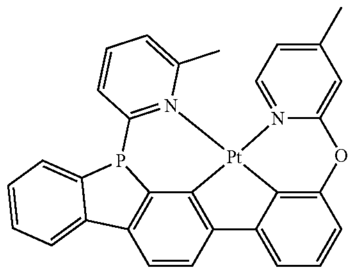
Pt 469
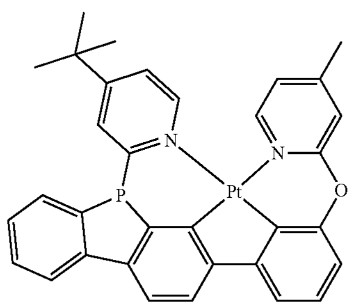
Pt 470
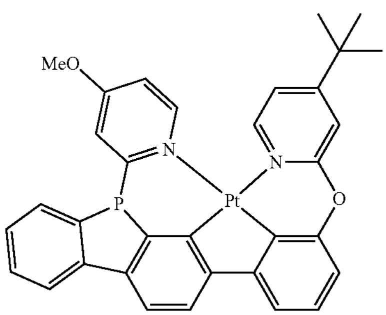
Pt 471
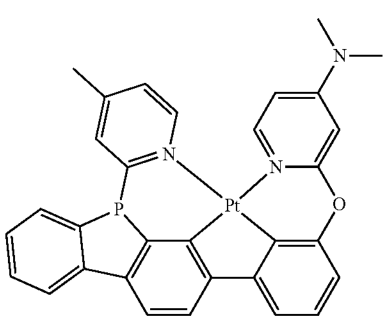
-continued
Pt 472
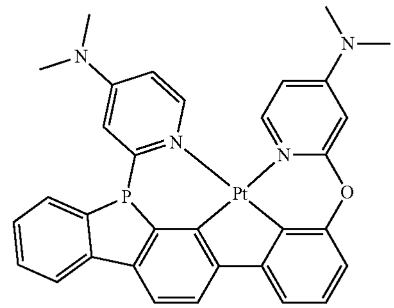
Pt 473
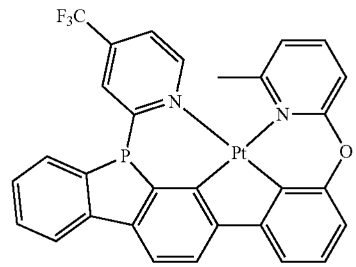
Pt 474
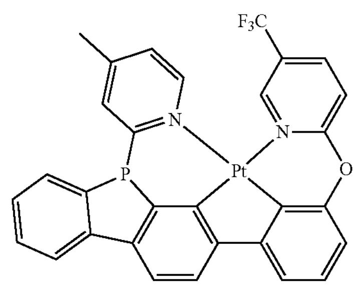
Pt 475
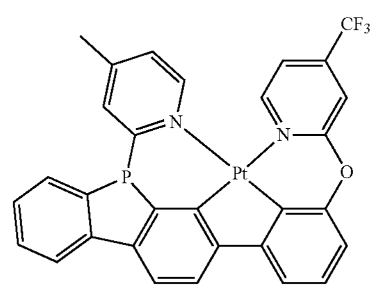
Pt 476
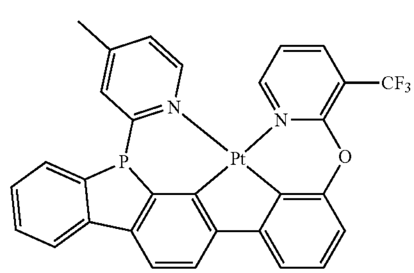

-continued
Pt 477
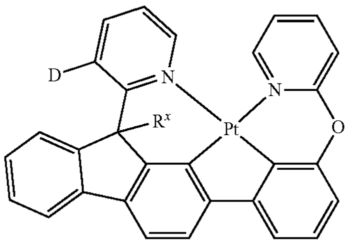
Pt 478
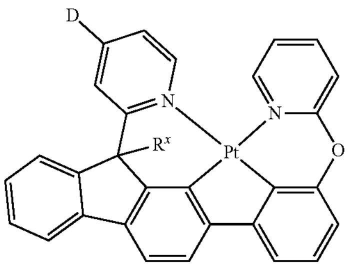
Pt 479
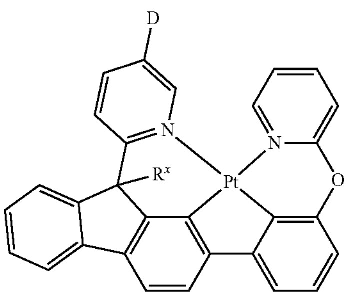
Pt 480
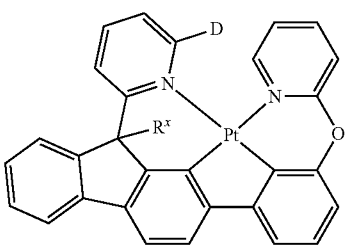
Pt 481
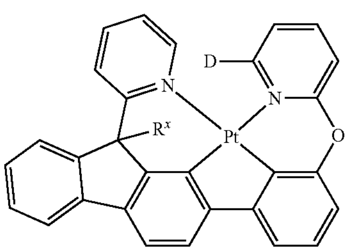
Pt 482
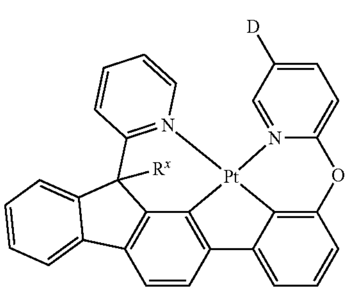
-continued
Pt 483
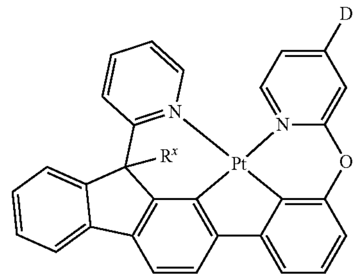
Pt 484
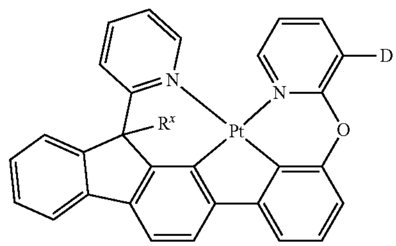
Pt 485
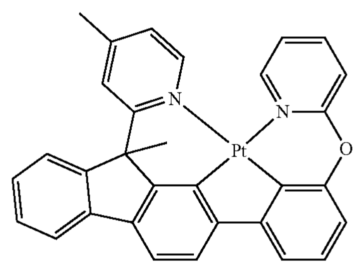
Pt 486
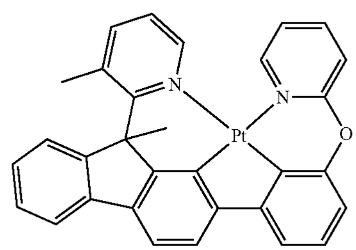
Pt 487
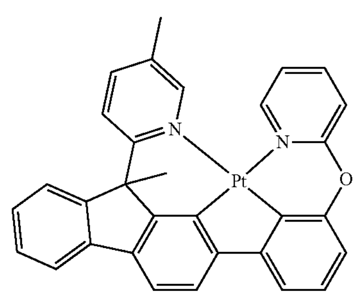
Pt 488
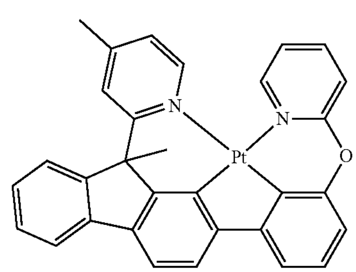

-continued
Pt 489
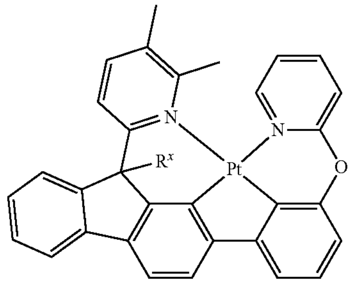
Pt 490
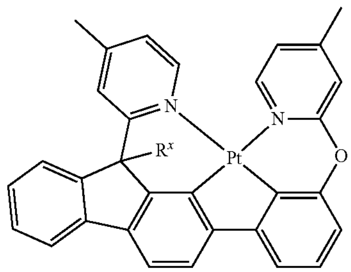
Pt 491
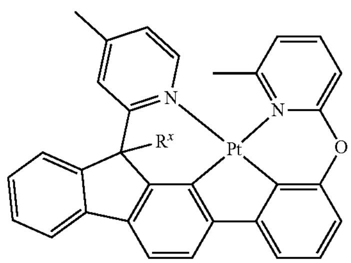
Pt 492
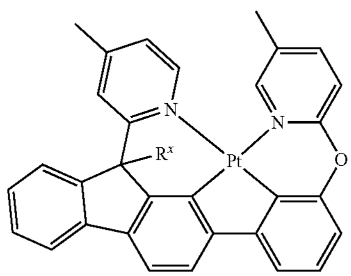
Pt 493
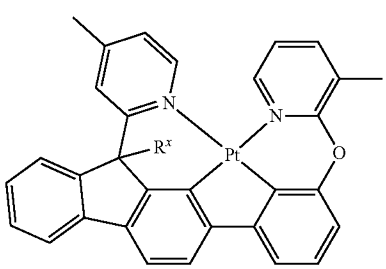
Pt 494
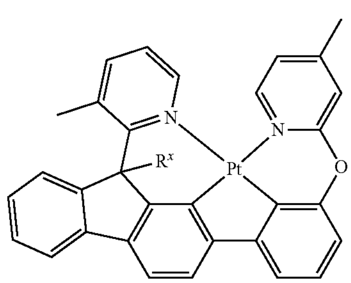
-continued
Pt 495
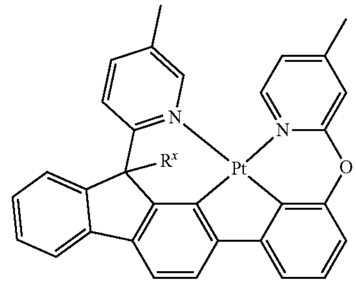
Pt 496
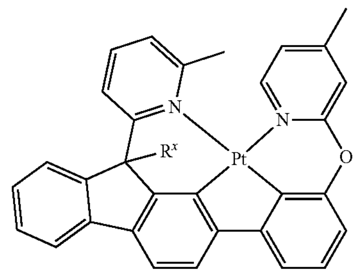
Pt 497
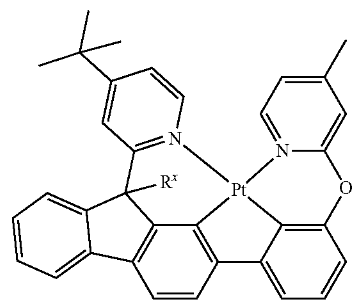
Pt 498
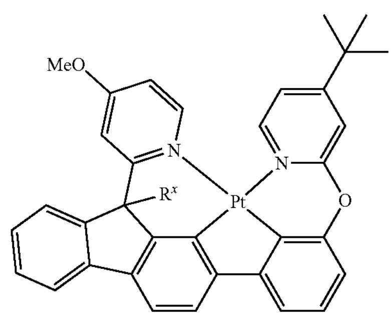
Pt 499
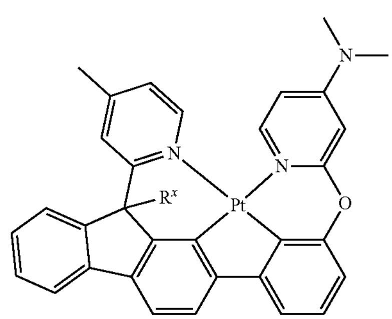

Pt 500
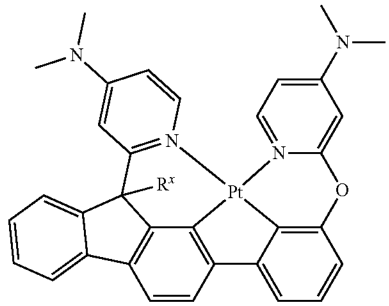
Pt 501
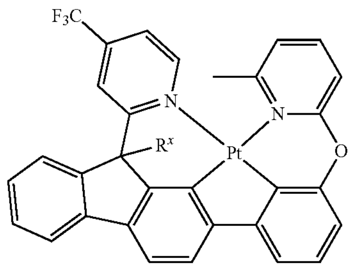
Pt 502
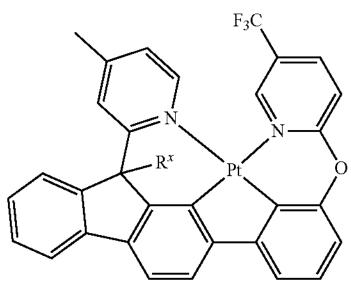
Pt 503
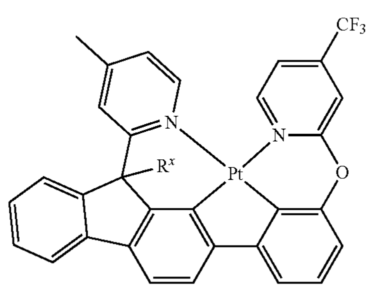
Pt 504
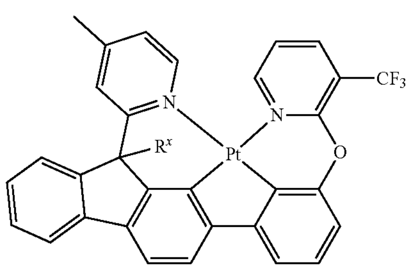
Pt 505
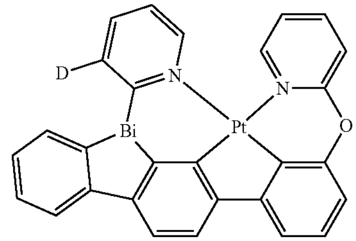
Pt 506
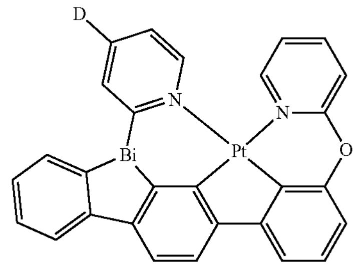
Pt 507
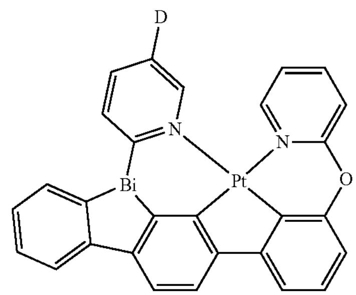
Pt 508
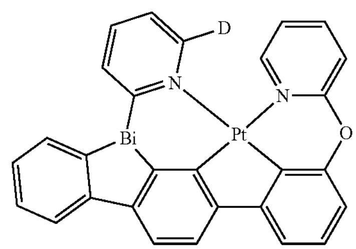
Pt 509
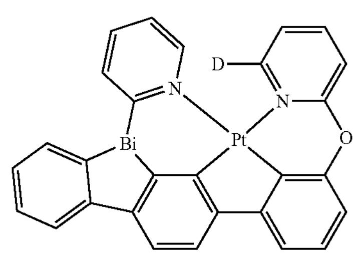
Pt 510
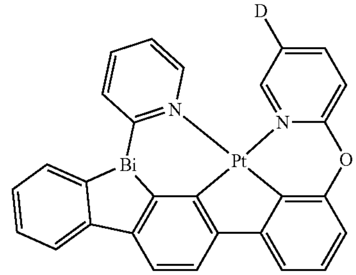

-continued
Pt 511
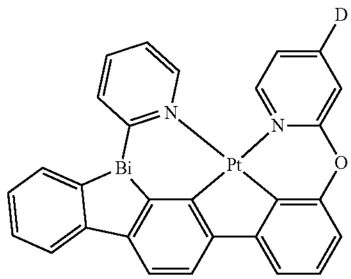
Pt 512
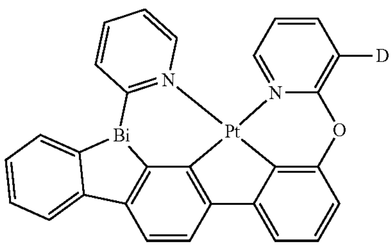
Pt 513
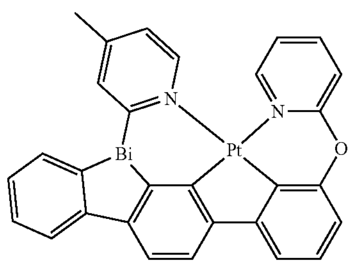
Pt 514
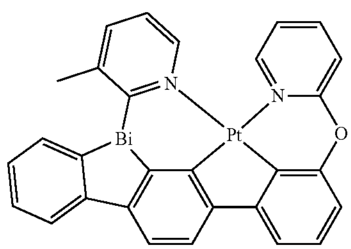
Pt 515
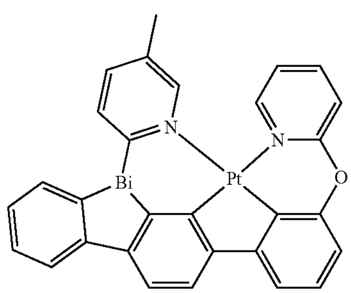
Pt 516
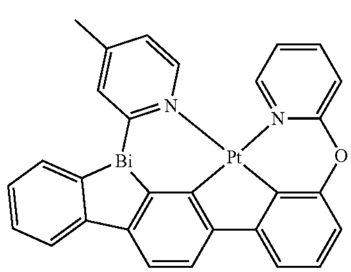
-continued
Pt 517
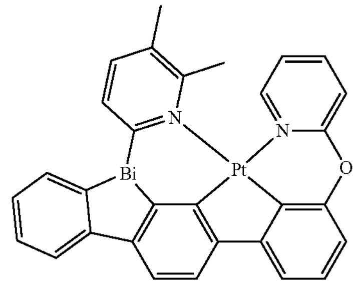
Pt 518
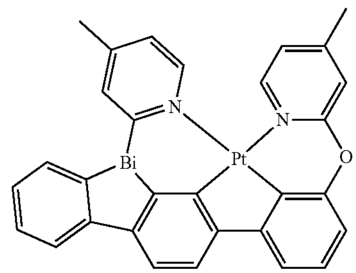
Pt 519
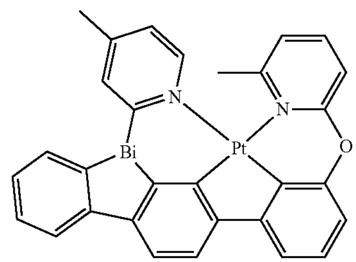
Pt 520
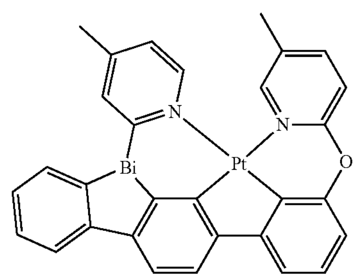
Pt 521
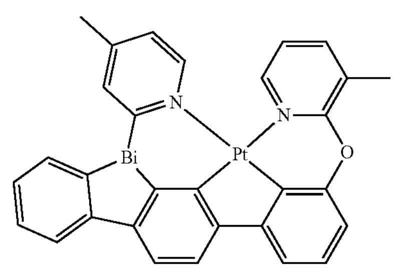
Pt 522
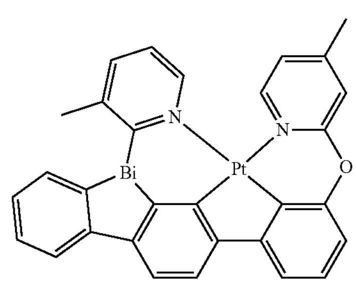

-continued
Pt 523
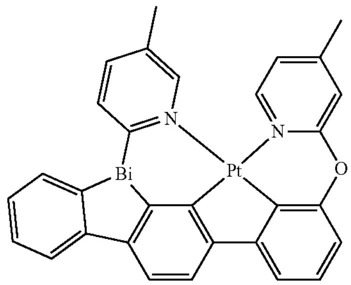
Pt 524
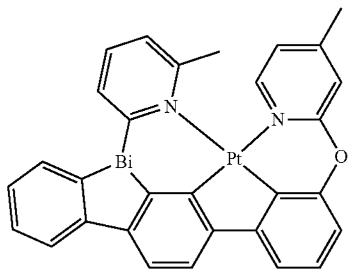
Pt 525
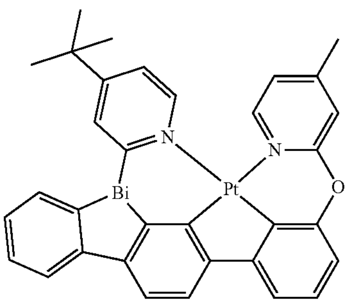
Pt 526
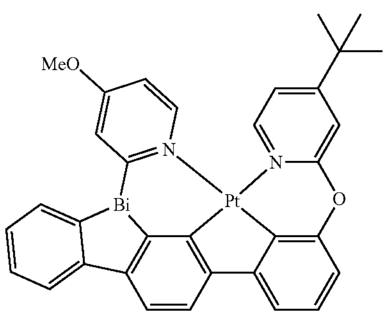
Pt 527
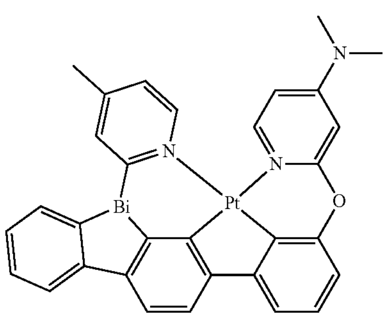
-continued
Pt 528
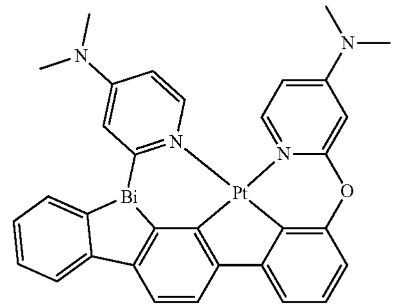
Pt 529
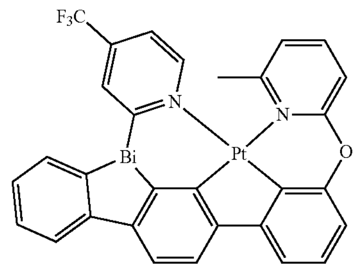
Pt 530
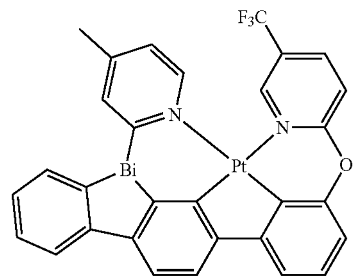
Pt 531
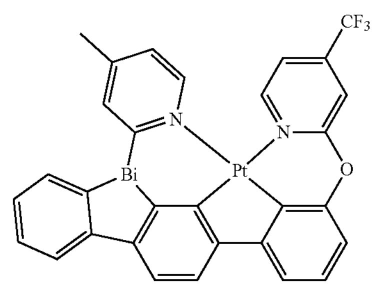
Pt 532
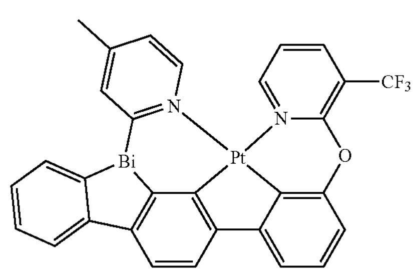

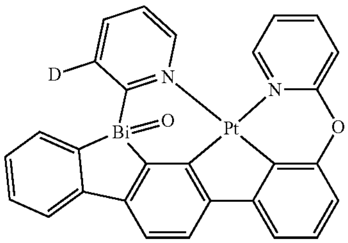
Pt 533
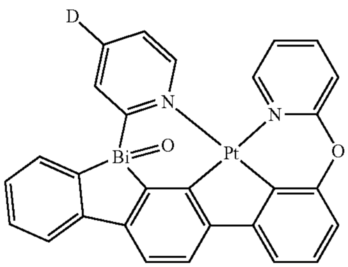
Pt 534
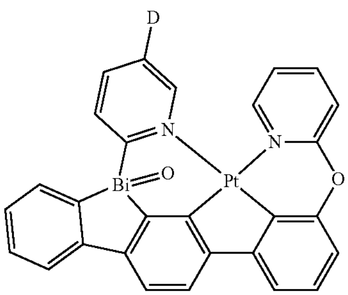
Pt 535
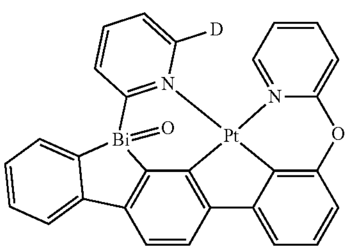
Pt 536
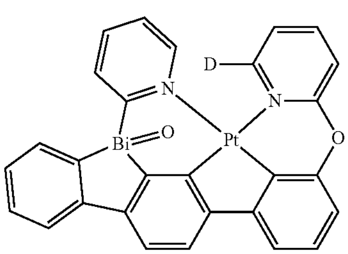
Pt 537
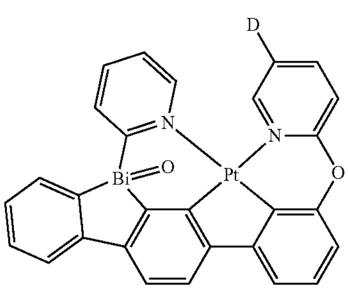
Pt 538
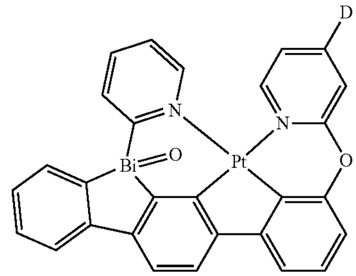
Pt 539
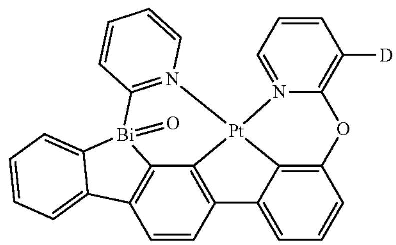
Pt 540
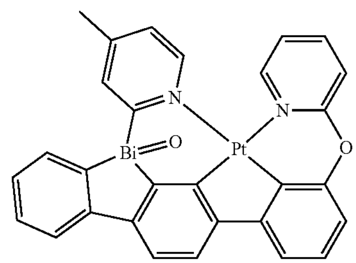
Pt 541
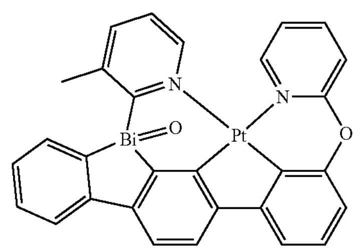
Pt 542
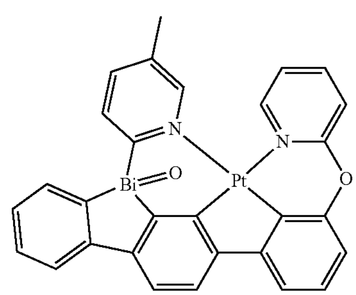
Pt 543
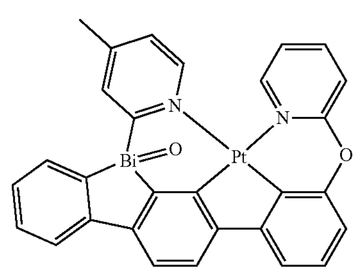
Pt 544

-continued
Pt 545
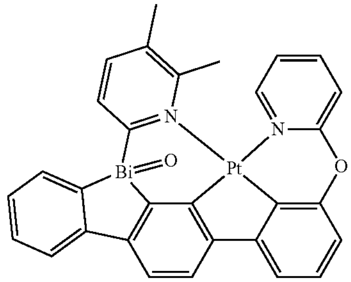
Pt 546
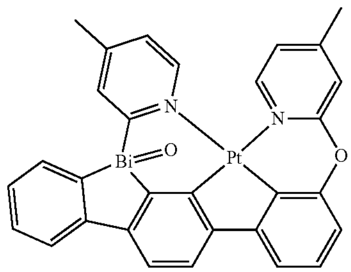
Pt 547
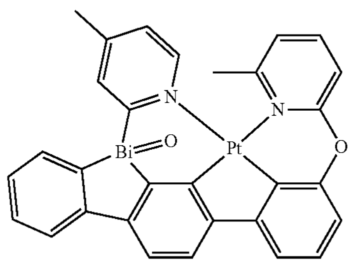
Pt 548
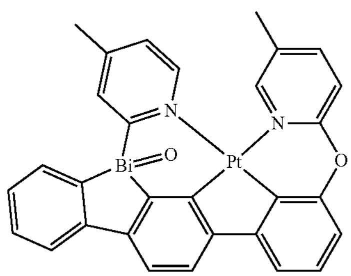
Pt 549
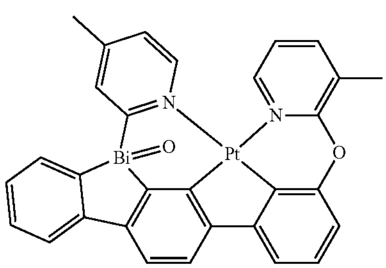
Pt 550
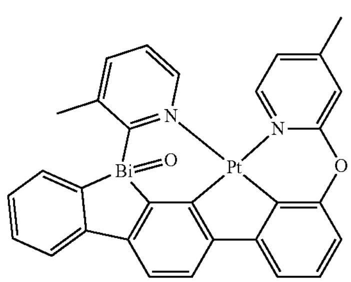
-continued
Pt 551
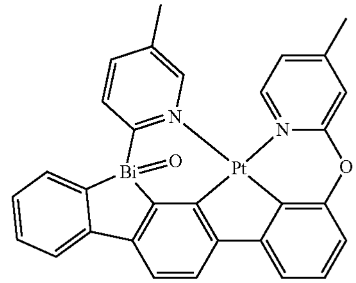
Pt 552
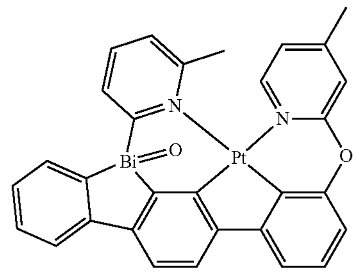
Pt 553
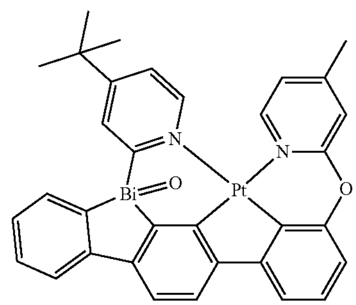
Pt 554
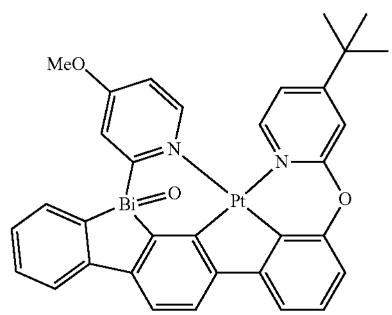
Pt 555
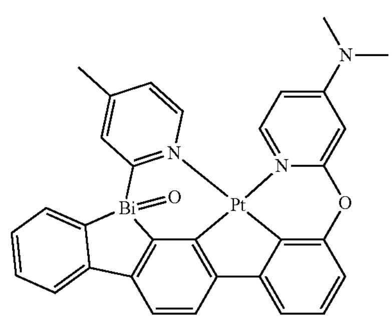

-continued
Pt 556
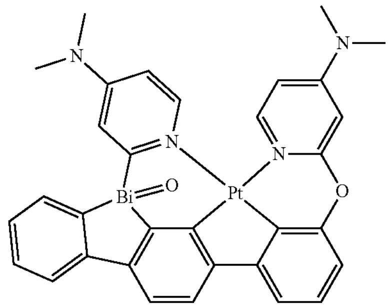
Pt 557
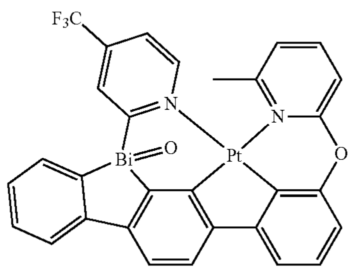
Pt 558
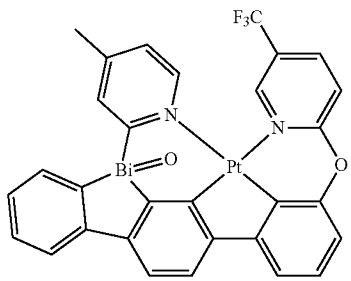
Pt 559
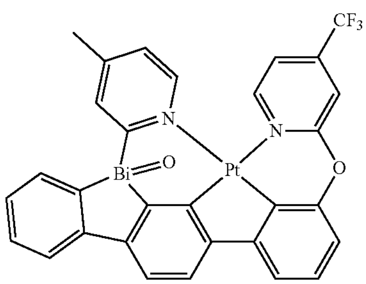
Pt 560
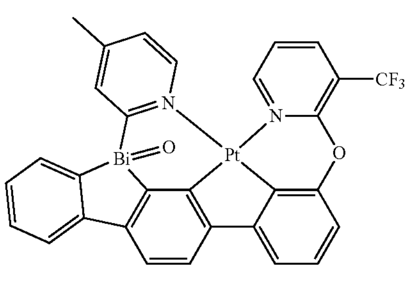
Pt 561
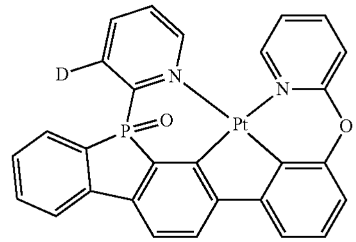
Pt 562
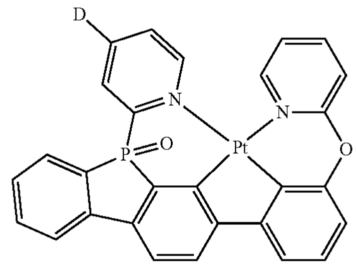
Pt 563
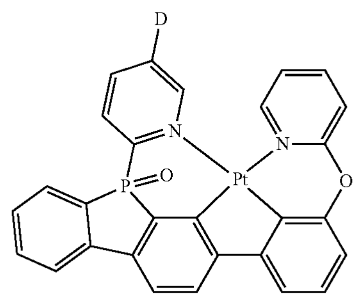
Pt 564
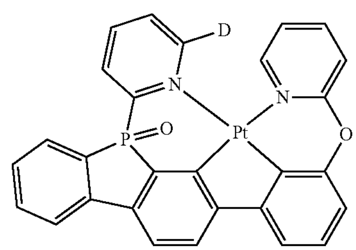
Pt 565
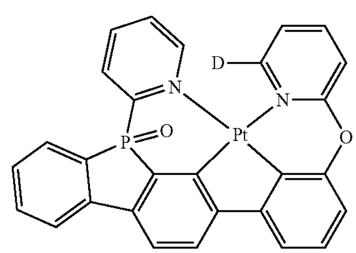
Pt 566
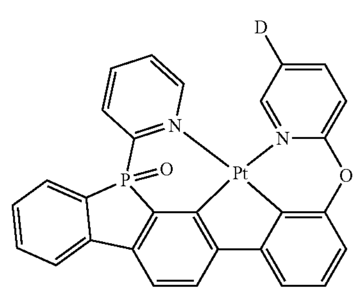

-continued
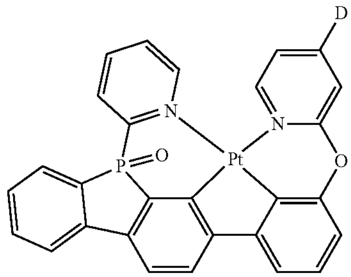
Pt 567
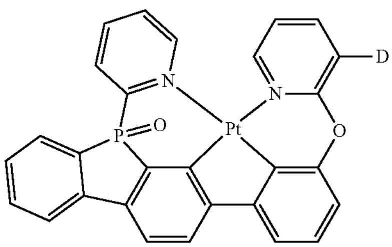
Pt 568
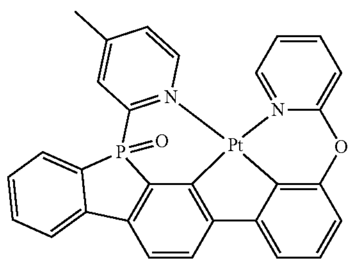
Pt 569
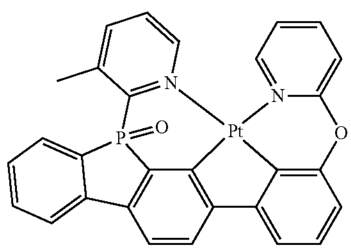
Pt 570
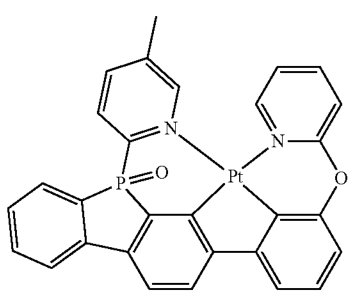
Pt 571
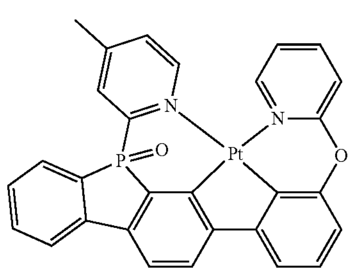
Pt 572
-continued
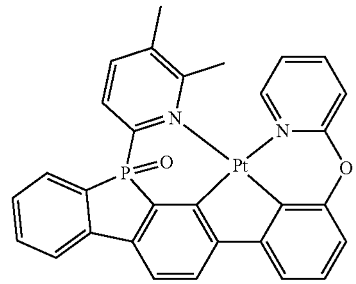
Pt 573
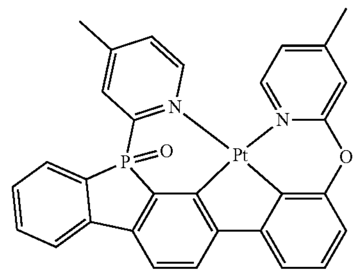
Pt 574
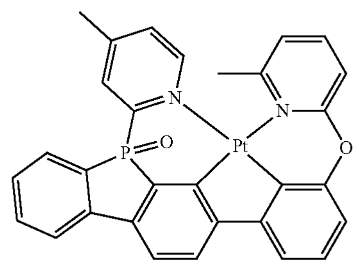
Pt 575
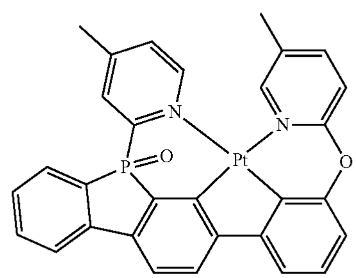
Pt 576
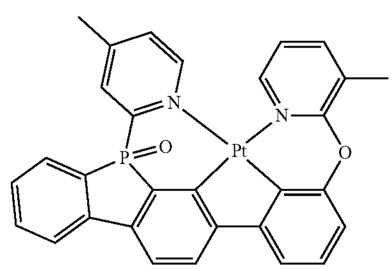
Pt 577
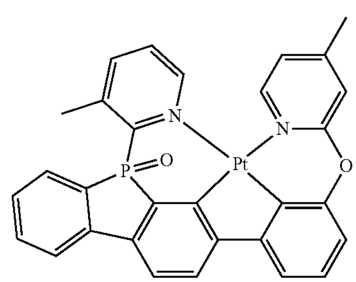
Pt 578

-continued
Pt 579
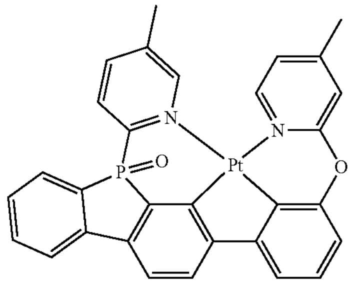
Pt 580
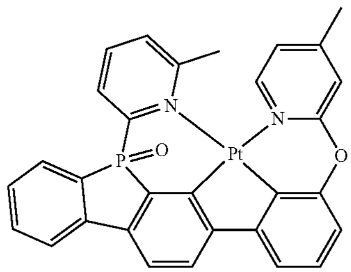
Pt 581
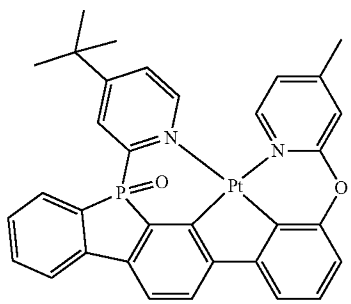
Pt 582
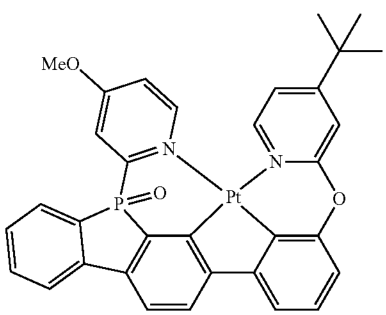
Pt 583
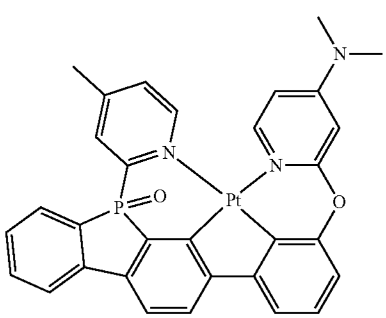
-continued
Pt 584
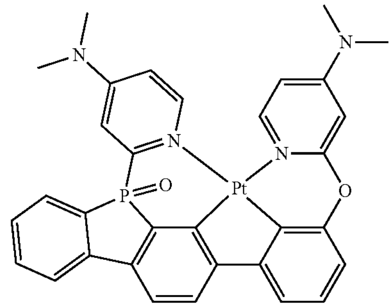
Pt 585
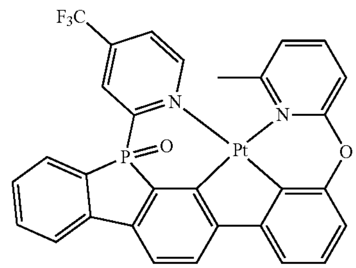
Pt 586
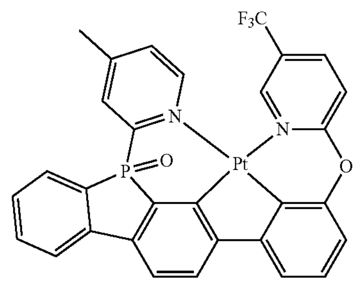
Pt 587
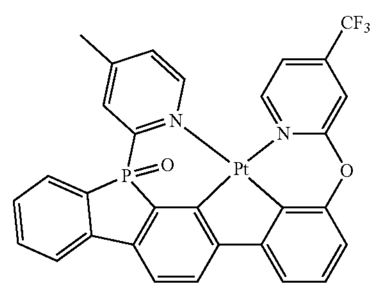
Pt 588
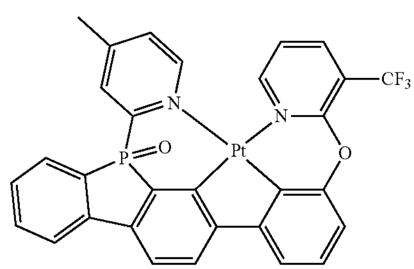

-continued
Pt 589
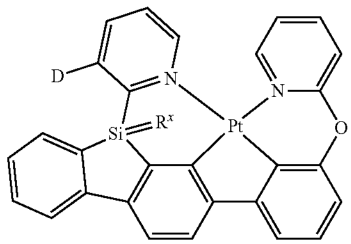
Pt 590
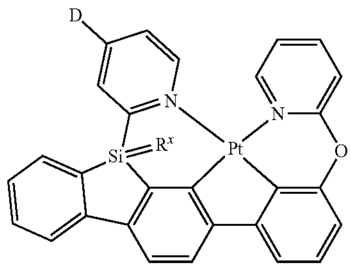
Pt 591
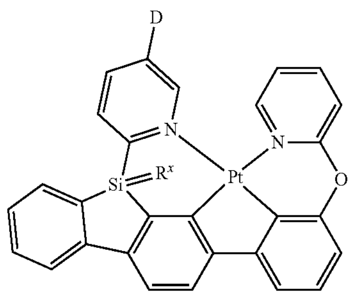
Pt 592
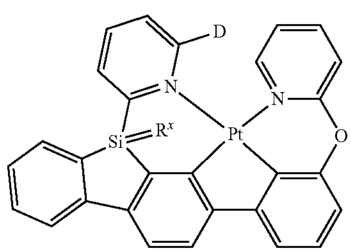
Pt 593
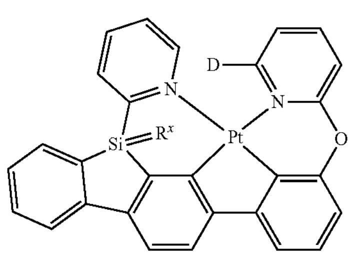
Pt 594
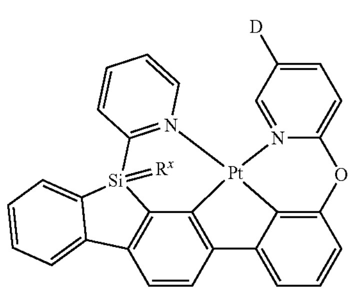
-continued
Pt 595
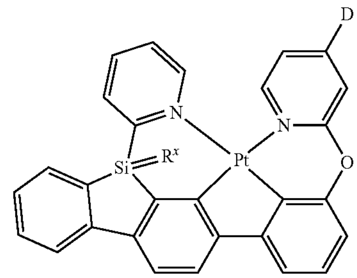
Pt 596
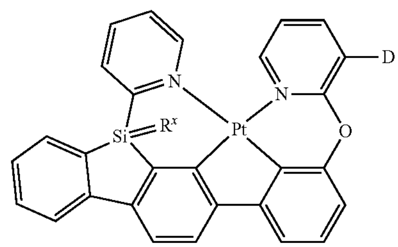
Pt 597
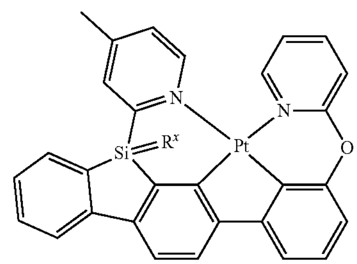
Pt 598
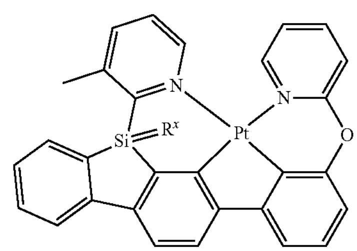
Pt 599
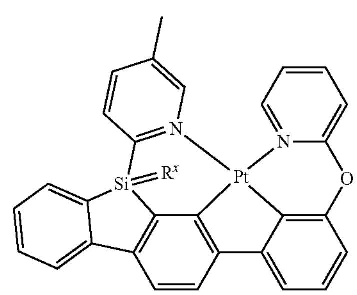
Pt 600
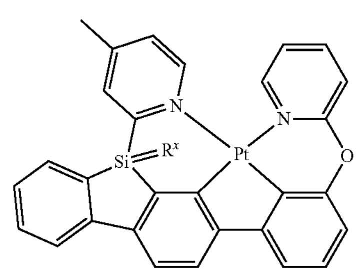

-continued
Pt 601
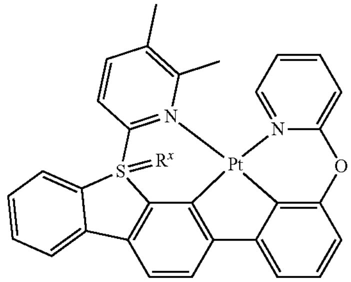
Pt 602
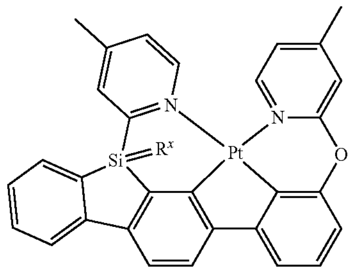
Pt 603
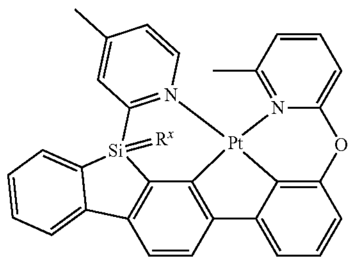
Pt 604
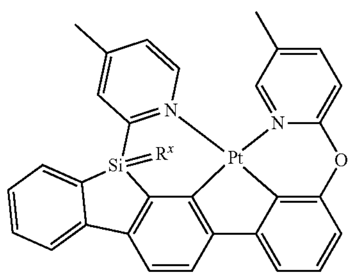
Pt 605
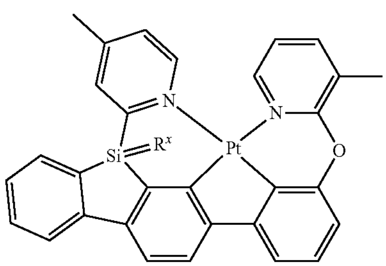
Pt 606
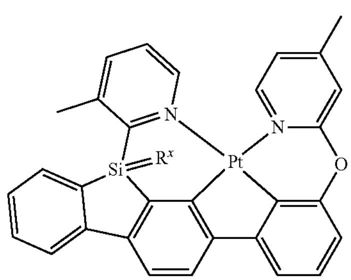
-continued
Pt 607
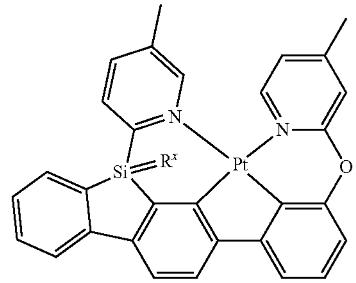
Pt 608
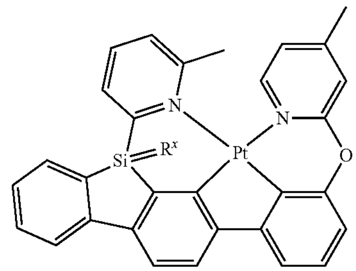
Pt 609
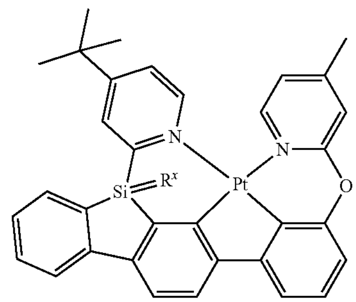
Pt 610
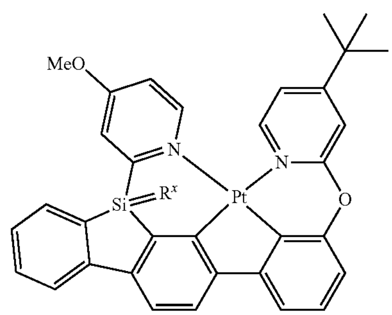
Pt 611
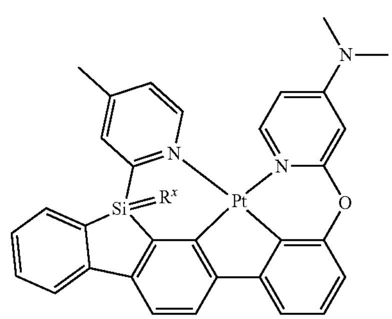

Pt 612
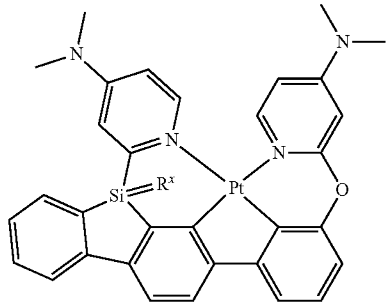
Pt 613
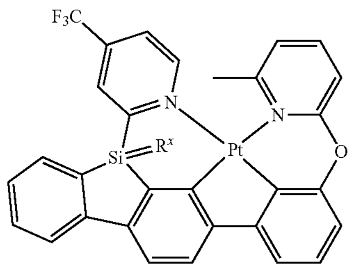
Pt 614
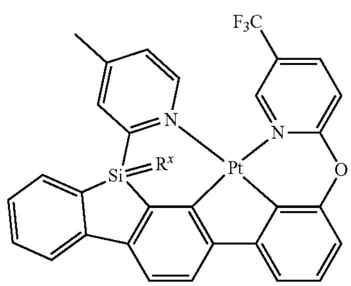
Pt 615
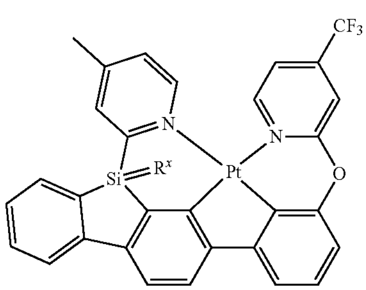
Pt 616
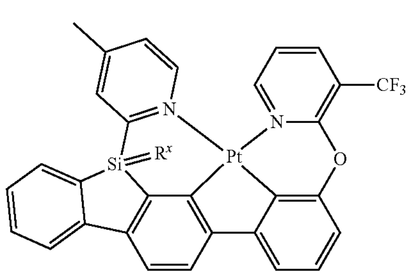
Pt 617
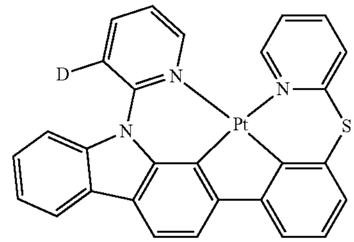
Pt 618
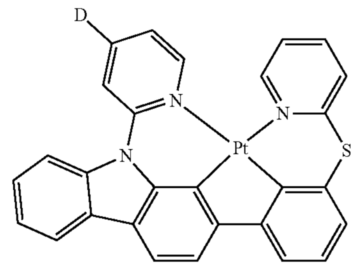
Pt 619
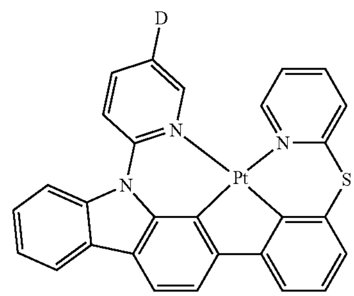
Pt 620
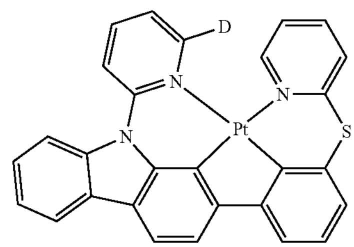
Pt 621
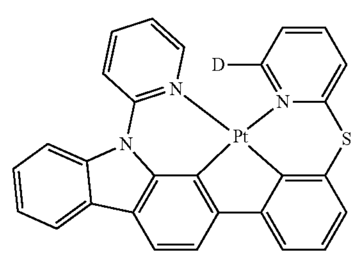
Pt 622
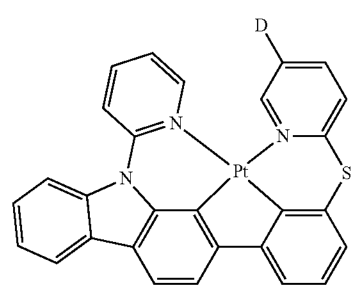

-continued
Pt 623
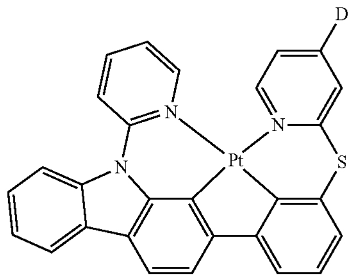
Pt 624
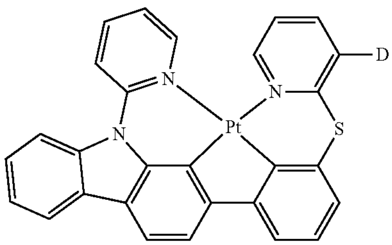
Pt 625
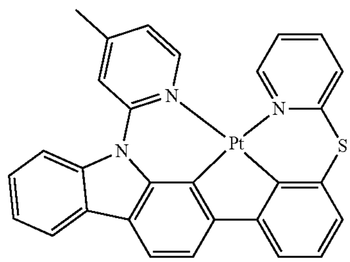
Pt 626
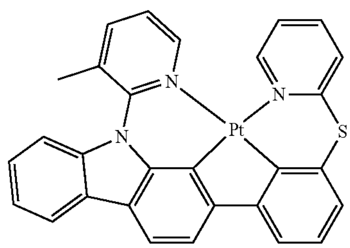
Pt 627
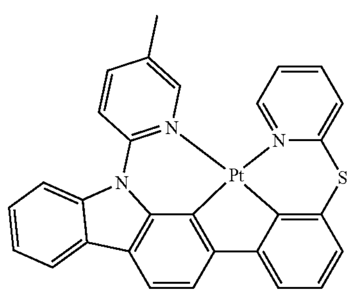
Pt 628
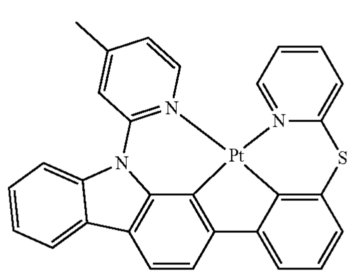
-continued
Pt 629
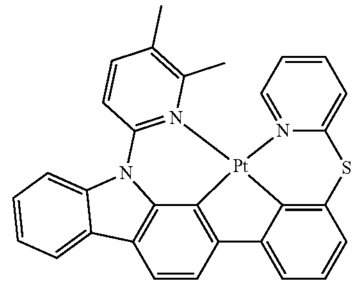
Pt 630
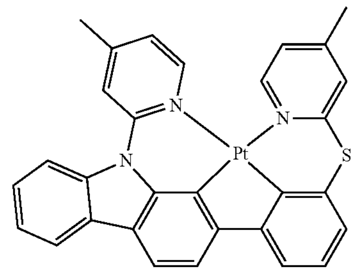
Pt 631
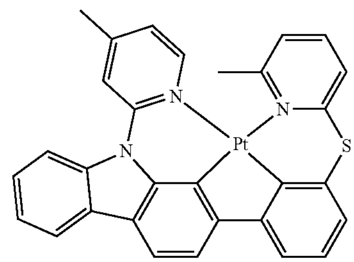
Pt 632
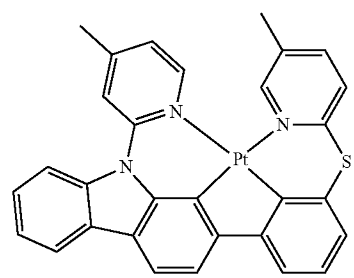
Pt 633
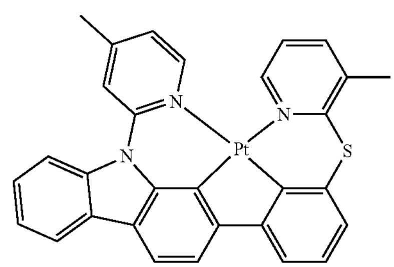
Pt 634
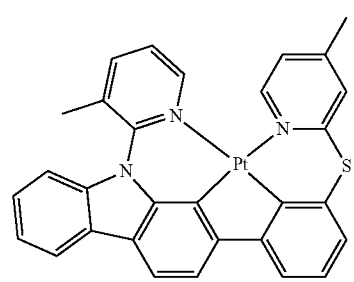

Pt 635
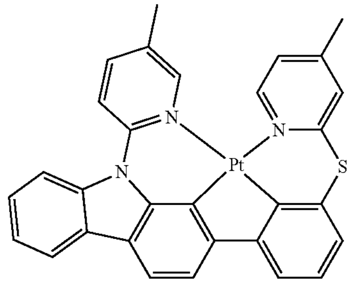
Pt 636
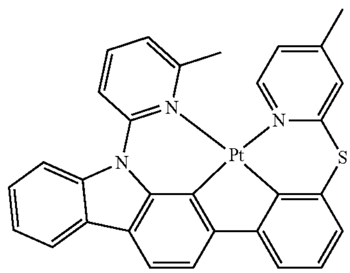
Pt 637
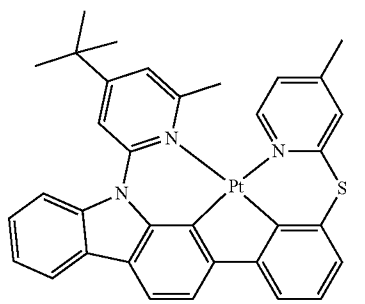
Pt 638
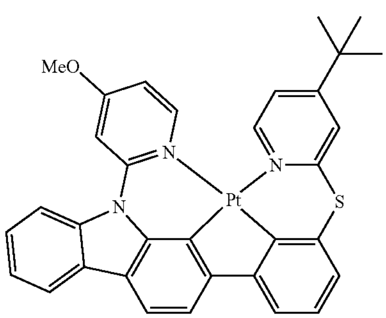
Pt 639
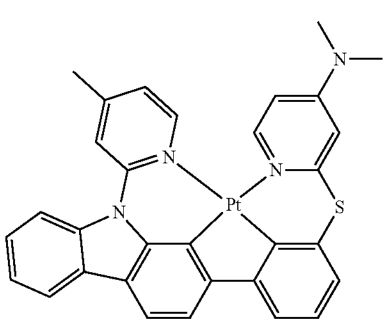
Pt 640
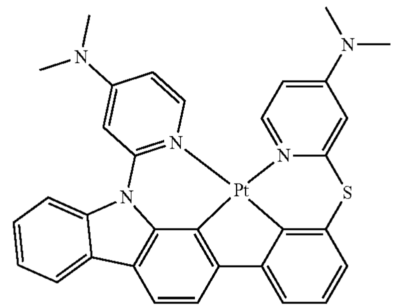
Pt 641
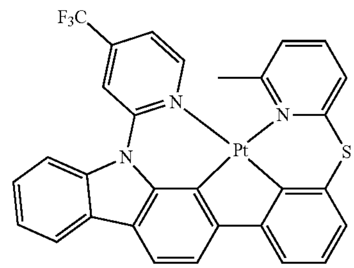
Pt 642
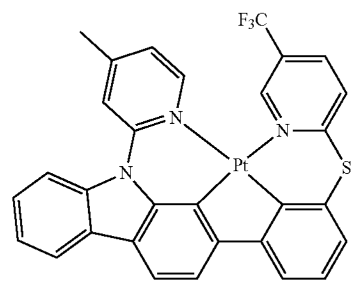
Pt 643
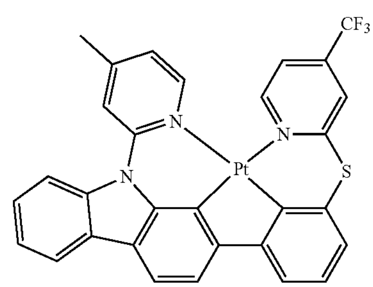
Pt 644
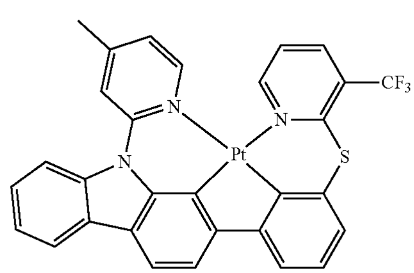

-continued
Pt 645
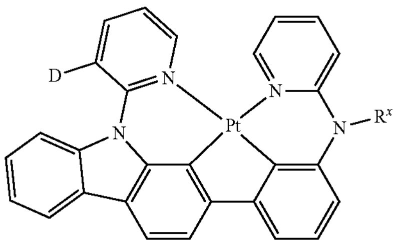
Pt 646
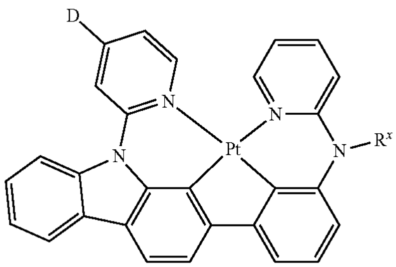
Pt 647
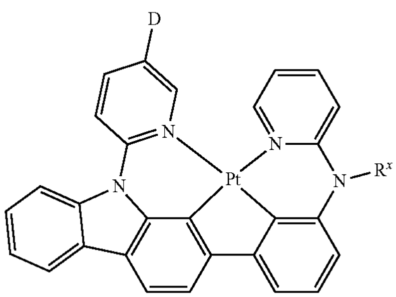
Pt 648
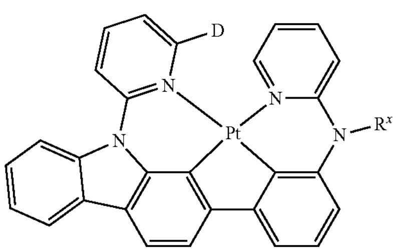
Pt 649
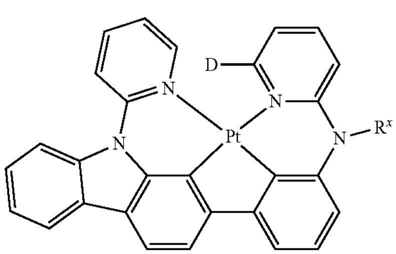
Pt 650
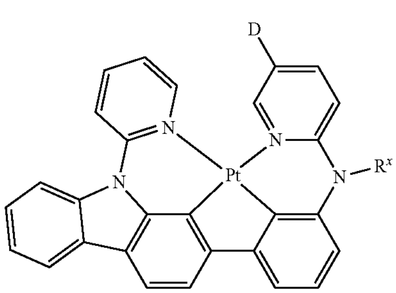
-continued
Pt 651
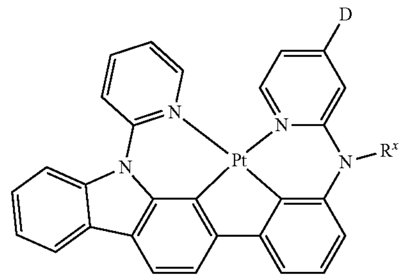
Pt 652
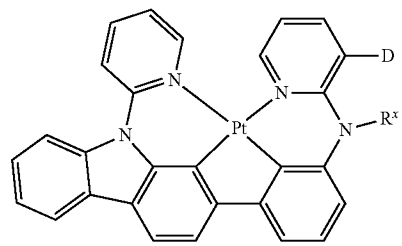
Pt 653
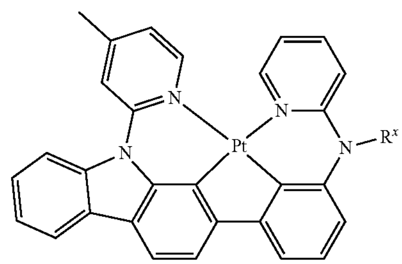
Pt 654
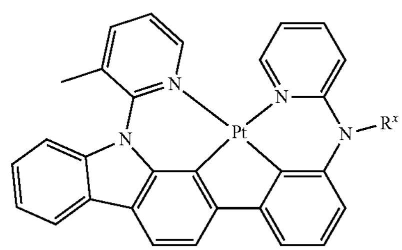
Pt 655
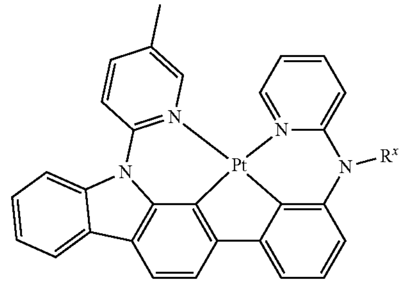
Pt 656
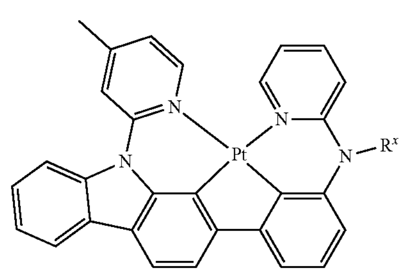

-continued
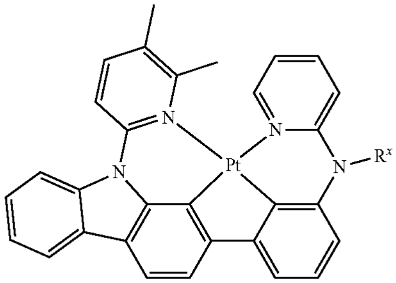
Pt 657
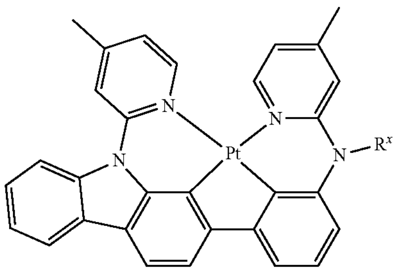
Pt 658
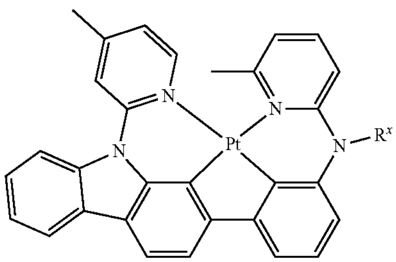
Pt 659
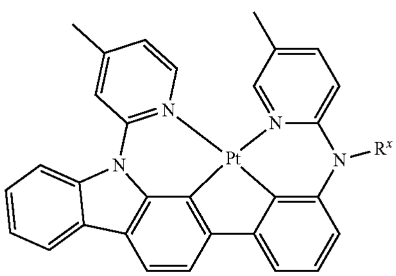
Pt 660
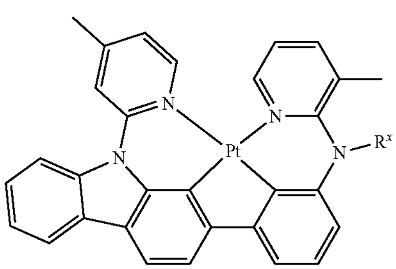
Pt 661
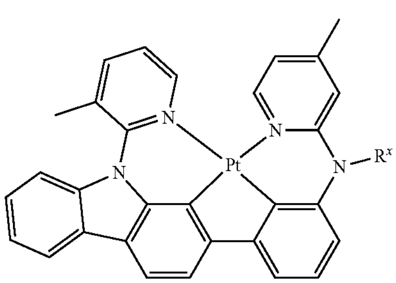
Pt 662
-continued
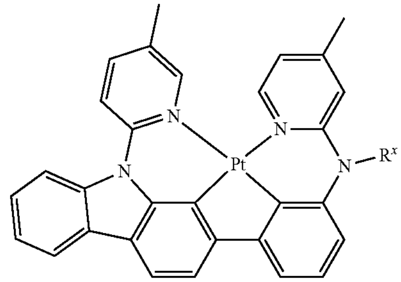
Pt 663
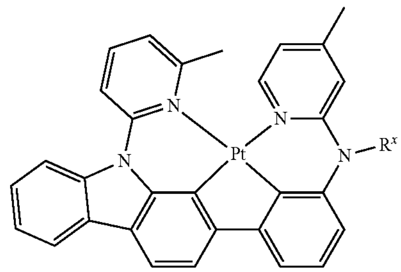
Pt 664
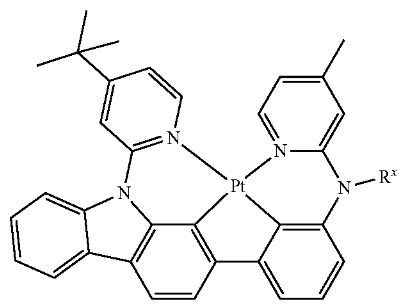
Pt 665
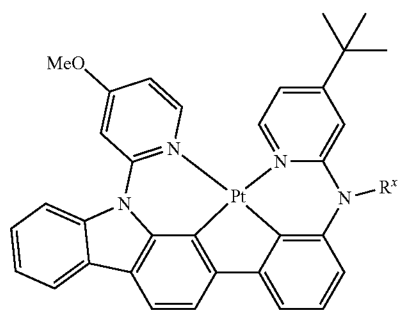
Pt 666
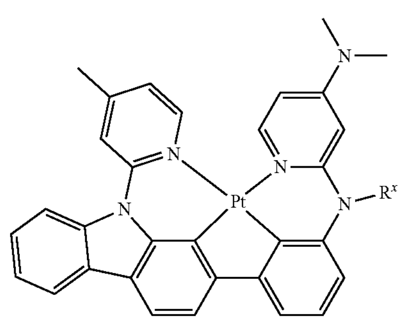
Pt 667

-continued
Pt 668
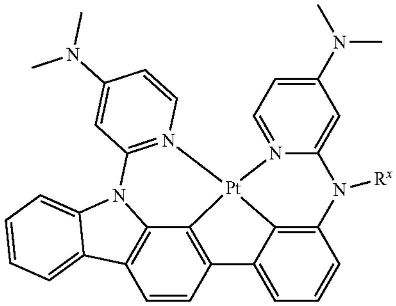
Pt 669
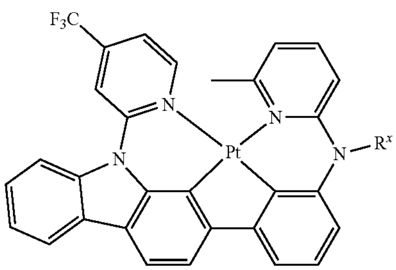
Pt 670
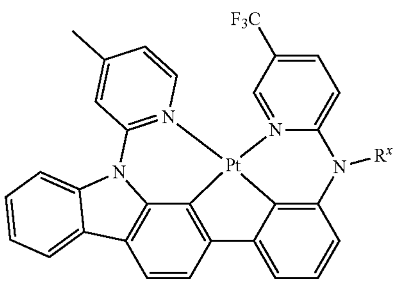
Pt 671
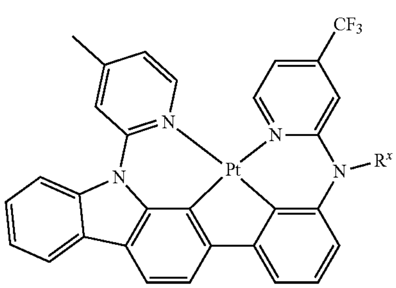
Pt 672
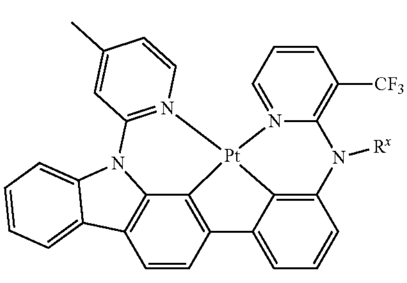
-continued
Pt 673
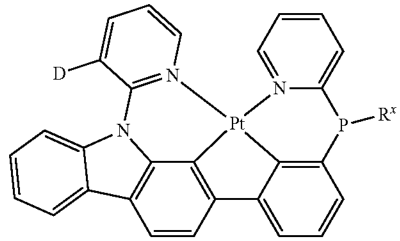
Pt 674
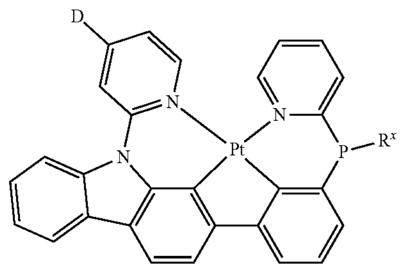
Pt 675
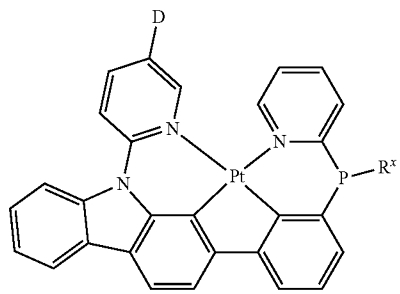
Pt 676
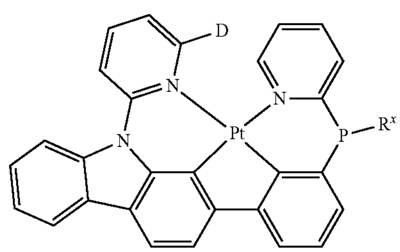
Pt 677
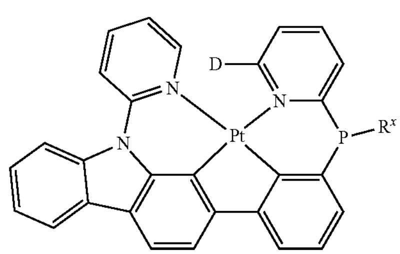
Pt 678
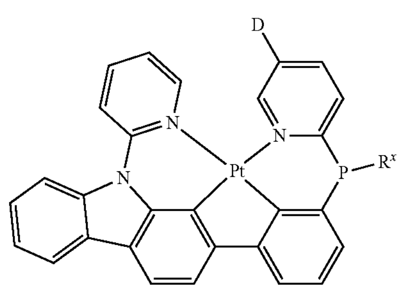

-continued
Pt 679
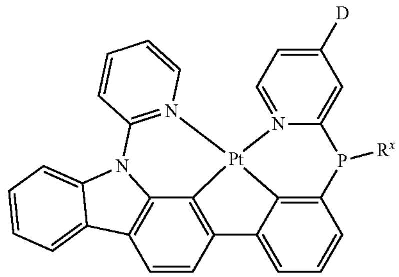
Pt 680
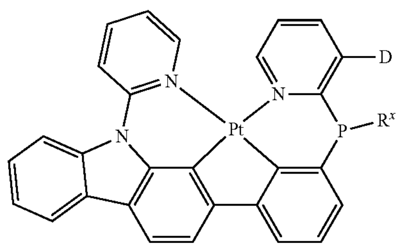
Pt 681
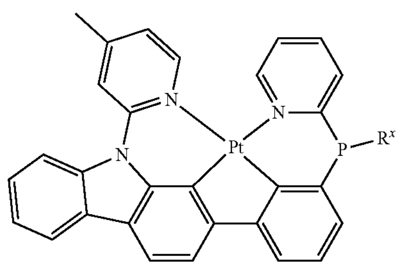
Pt 682
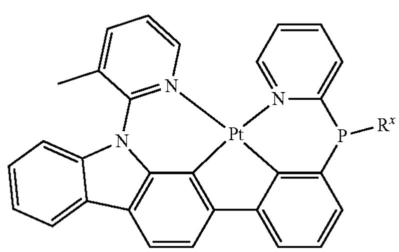
Pt 683
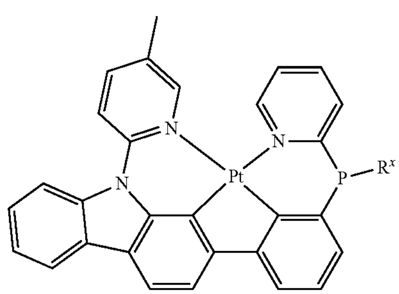
Pt 684
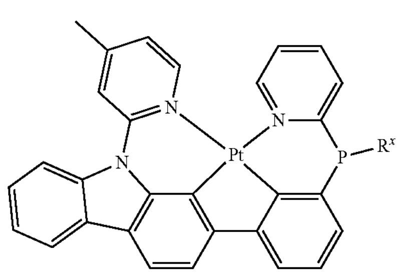
-continued
Pt 685
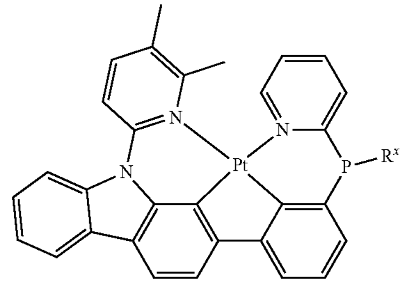
Pt 686
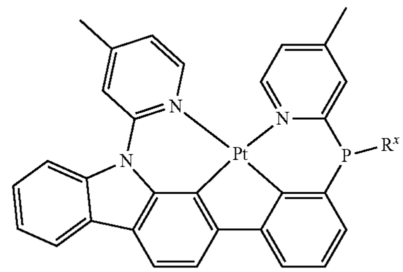
Pt 689
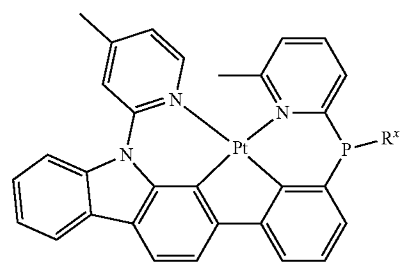
Pt 690
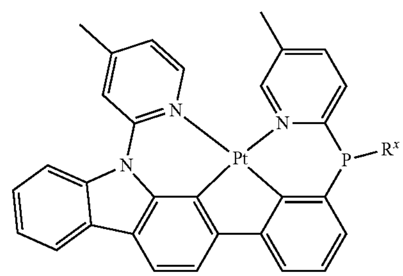
Pt 691
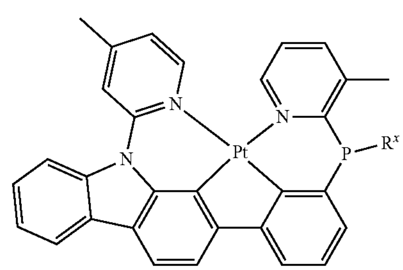
Pt 692
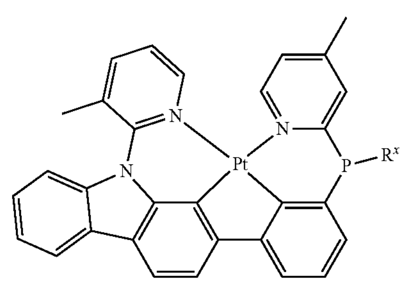

Pt 693
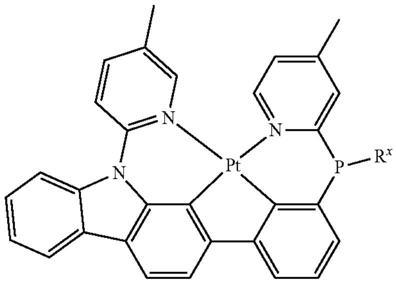
Pt 694
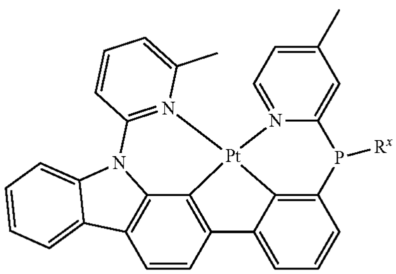
Pt 695
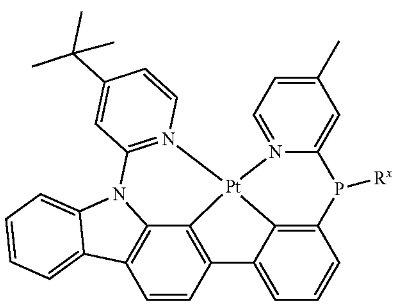
Pt 696
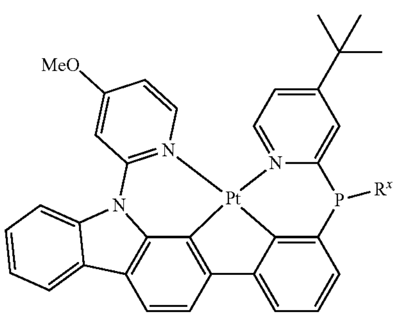
Pt 697
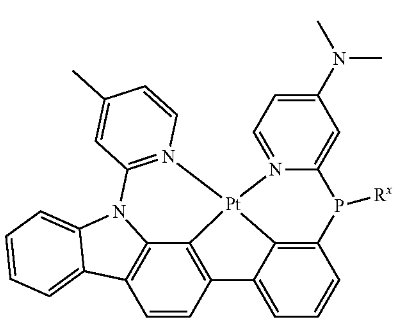
Pt 698
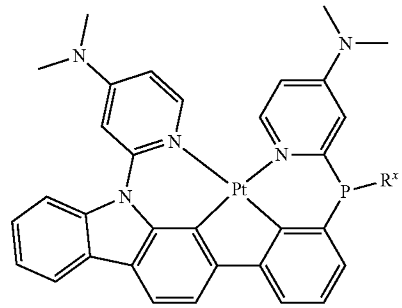
Pt 699
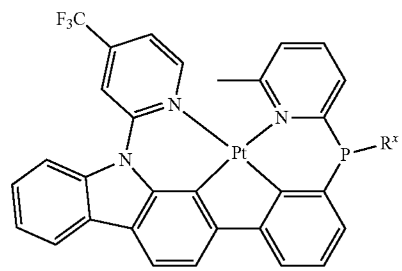
Pt 700
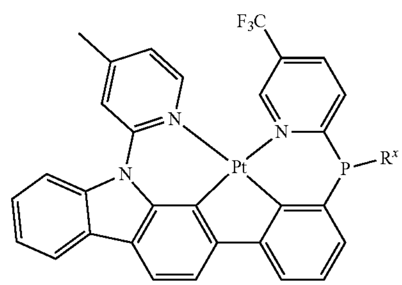
Pt 701
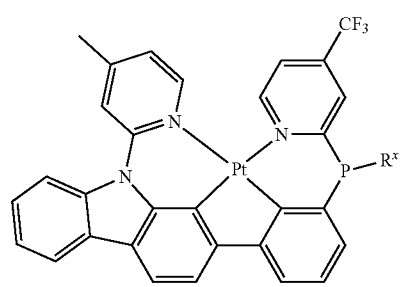
Pt 702
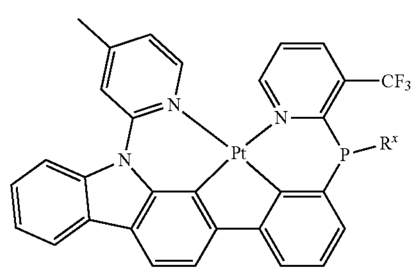

-continued
Pt 703
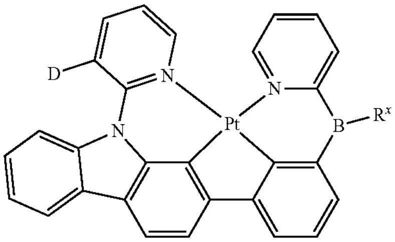
Pt 704
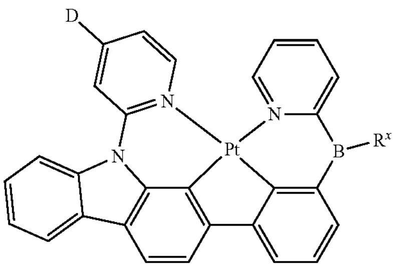
Pt 705
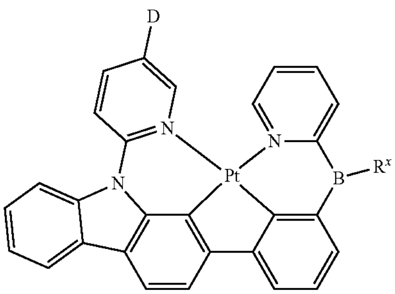
Pt 706
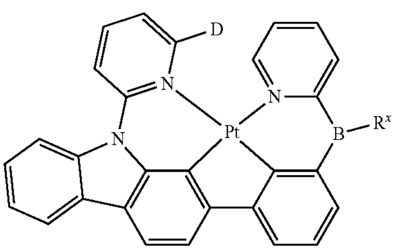
Pt 707
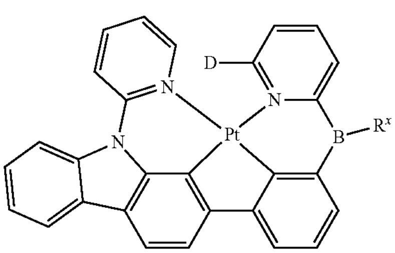
Pt 708
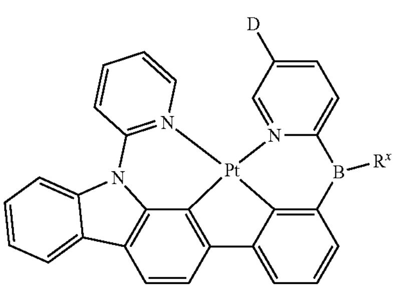
-continued
Pt 709
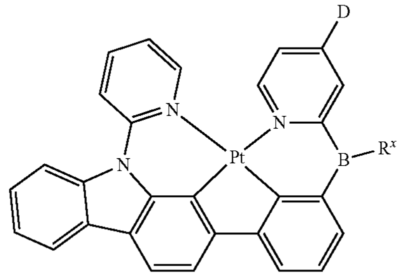
Pt 710
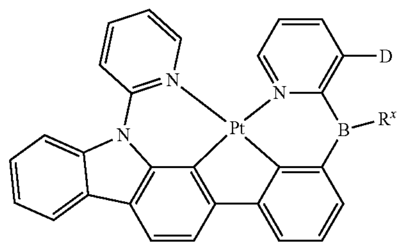
Pt 711
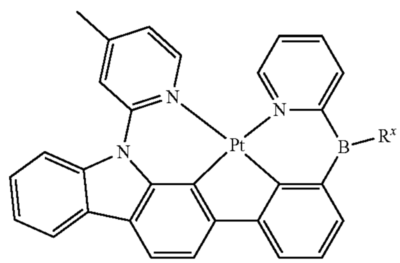
Pt 712
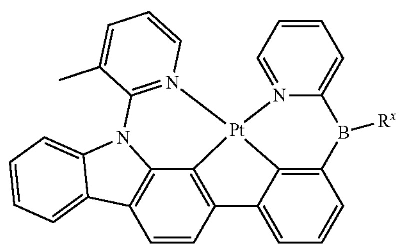
Pt 713
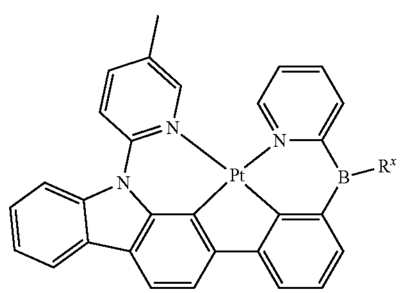
Pt 714
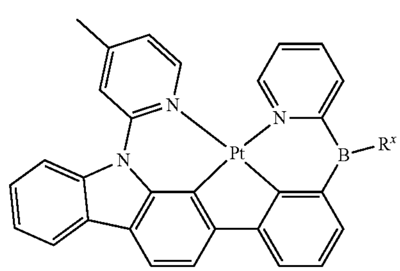

Pt 715
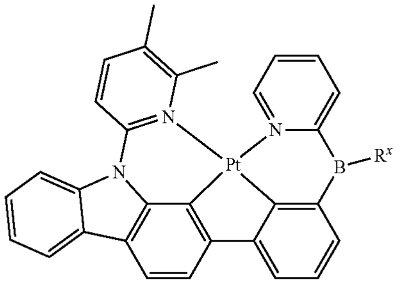
Pt 716
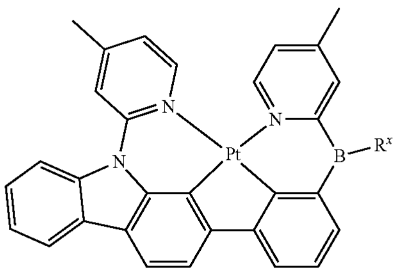
Pt 717
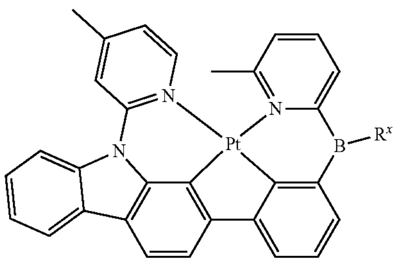
Pt 718
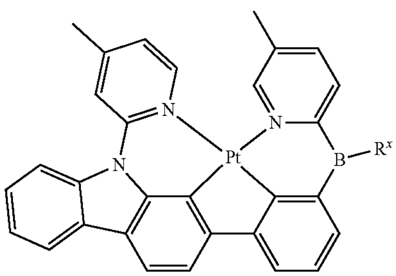
Pt 719
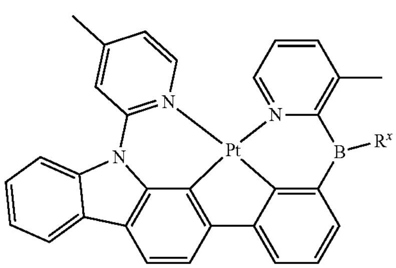
Pt 720
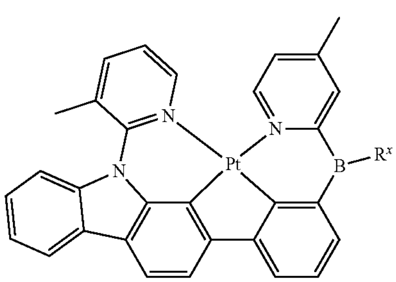
Pt 721
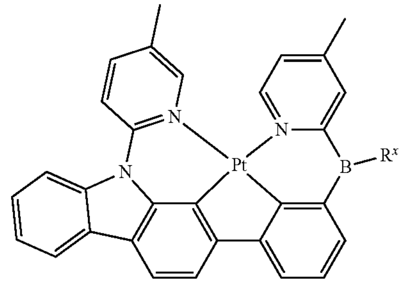
Pt 722
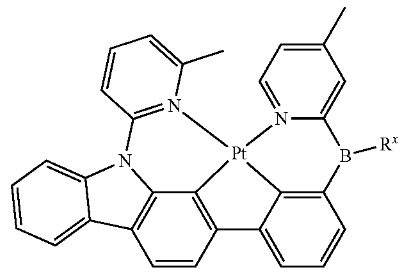
Pt 723
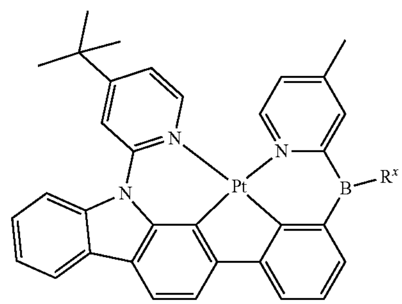
Pt 724
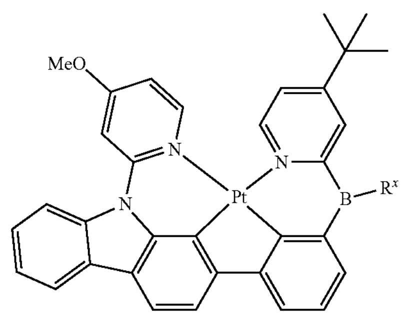
Pt 725
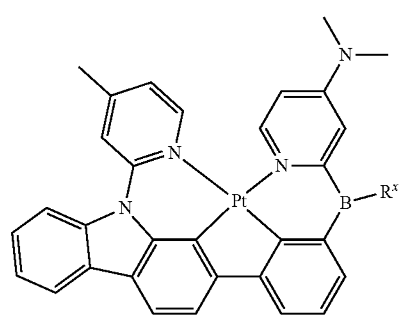

-continued
Pt 726
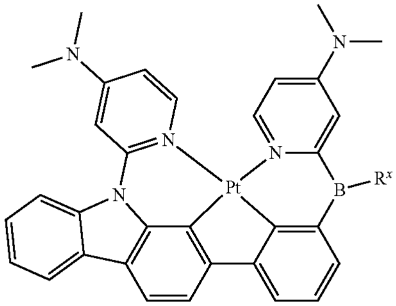
Pt 727
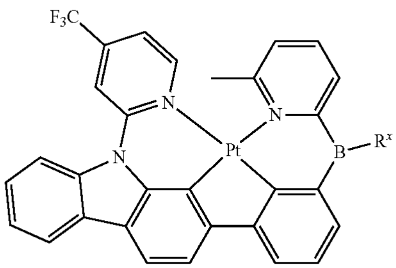
Pt 728
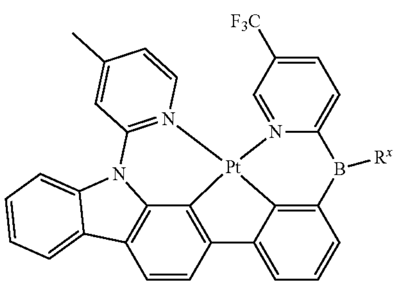
Pt 729
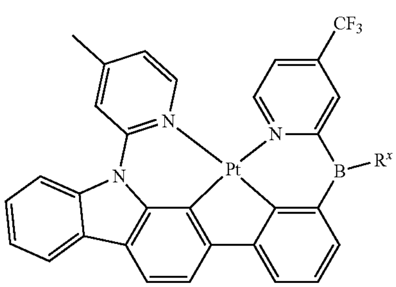
Pt 730
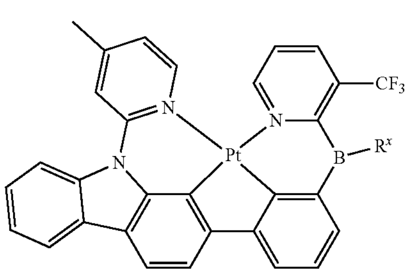
-continued
Pt 731
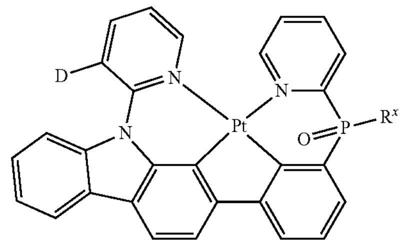
Pt 732
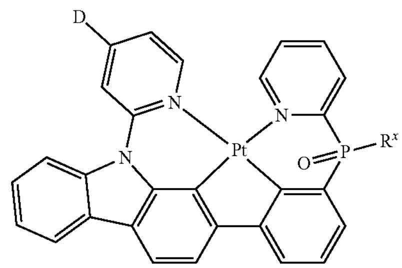
Pt 733
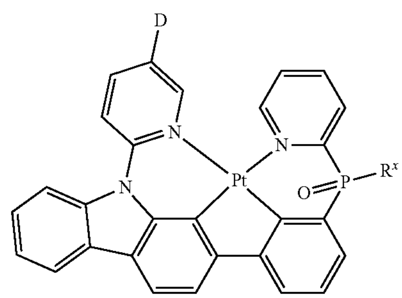
Pt 734
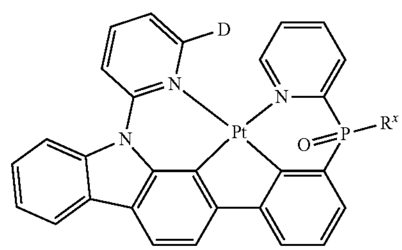
Pt 735
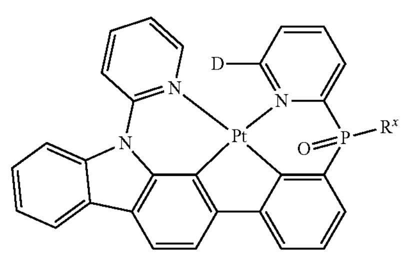
Pt 736
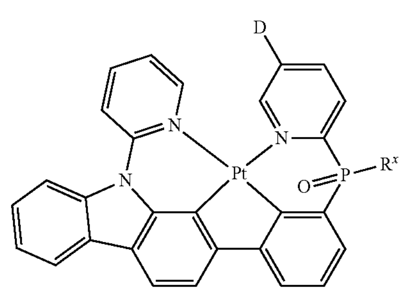

-continued
Pt 737
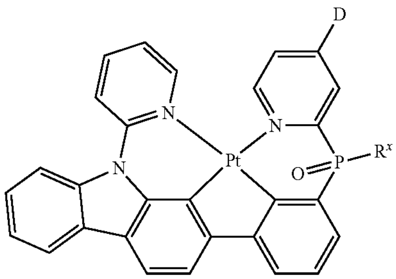
Pt 738
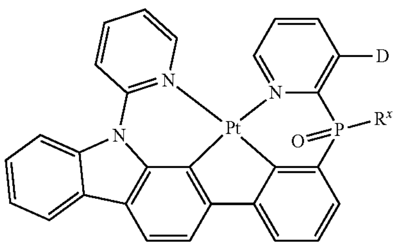
Pt 739
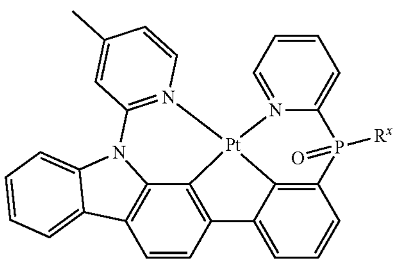
Pt 740
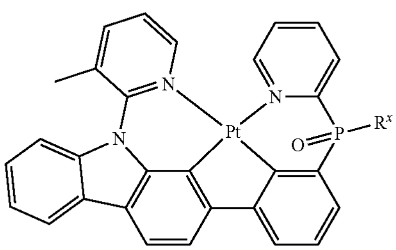
Pt 741
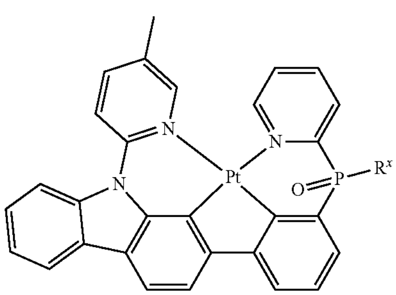
Pt 742
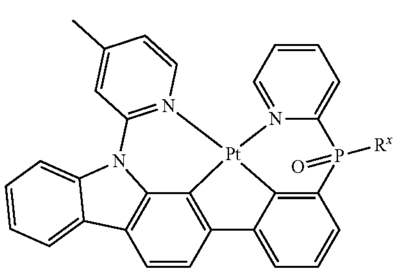
-continued
Pt 743
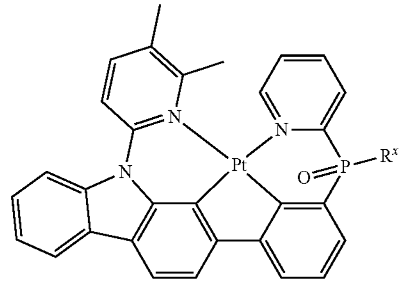
Pt 744
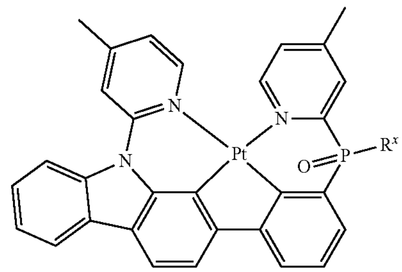
Pt 745
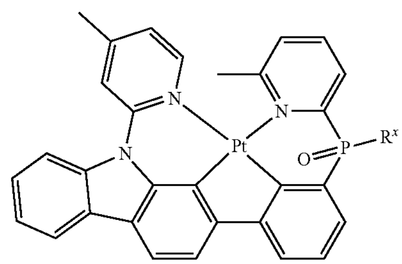
Pt 746
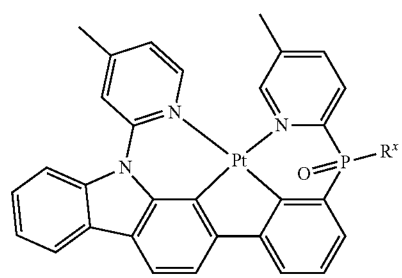
Pt 747
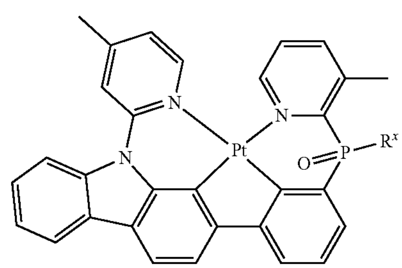
Pt 748
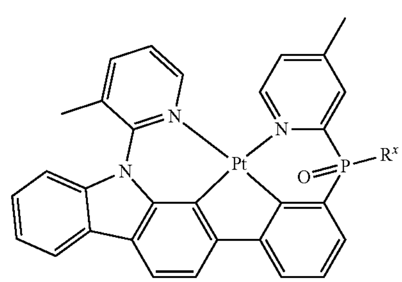

Pt 749
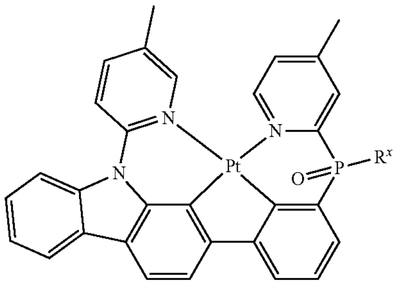
Pt 750
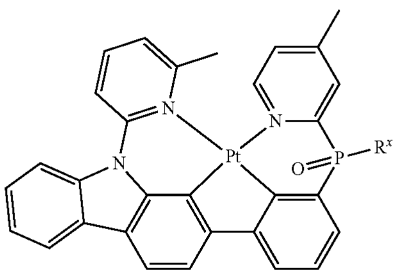
Pt 751
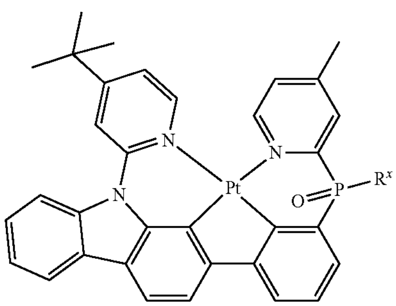
Pt 752
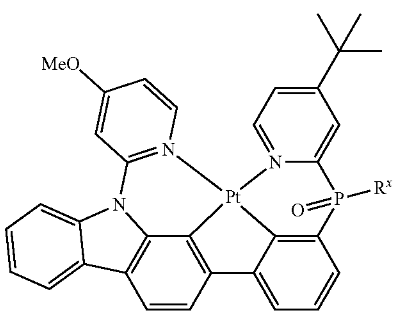
Pt 753
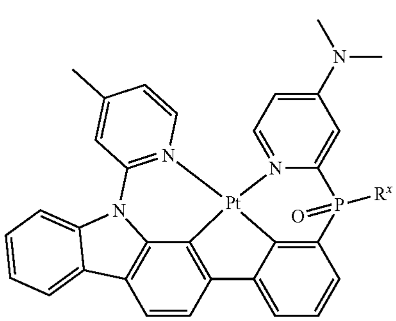
Pt 754
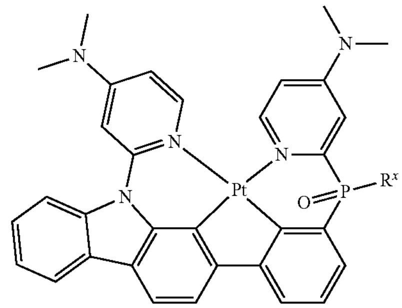
Pt 755
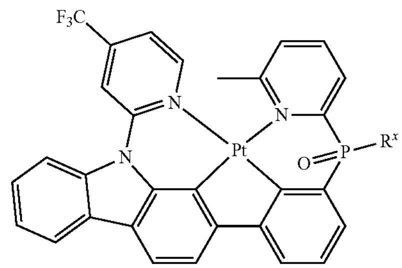
Pt 756
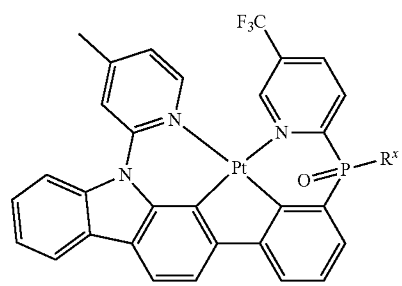
Pt 757
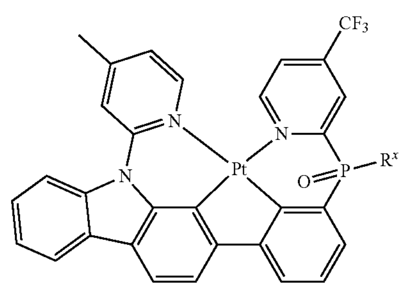
Pt 758
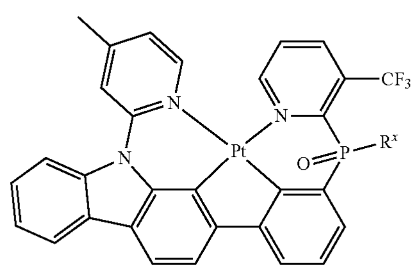

-continued
Pt 759
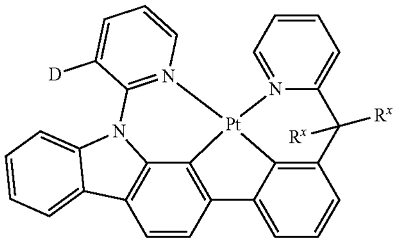
Pt 760
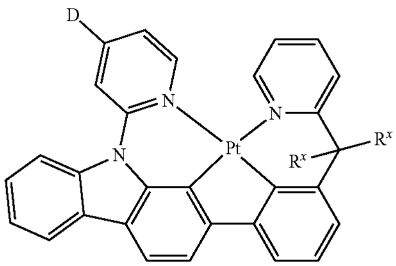
Pt 761
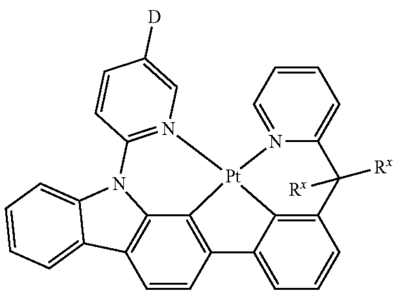
Pt 762
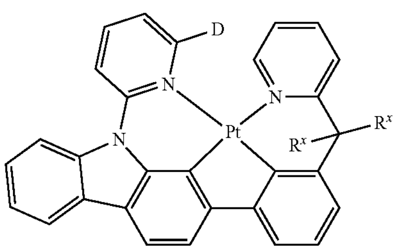
Pt 763
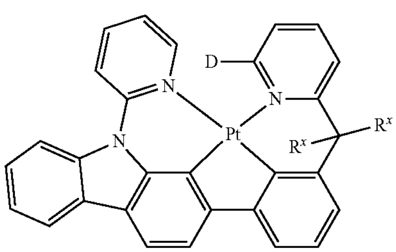
Pt 764
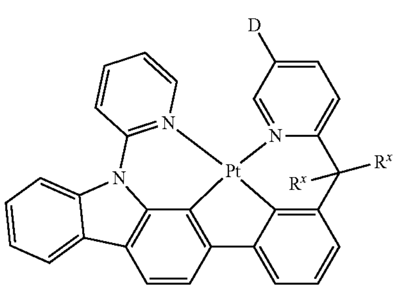
-continued
Pt 765
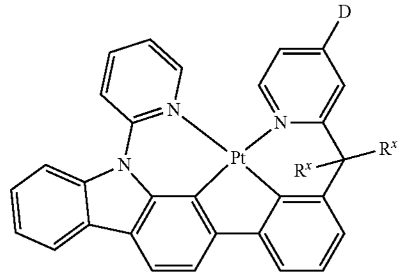
Pt 766
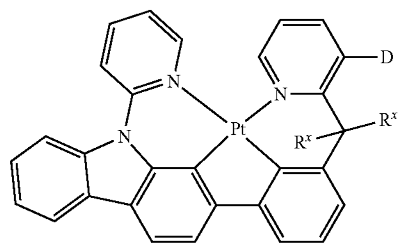
Pt 767
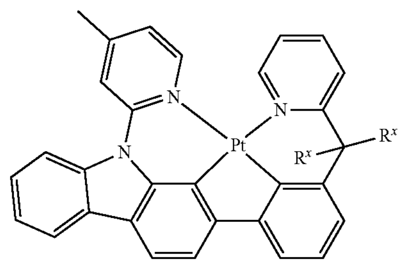
Pt 768
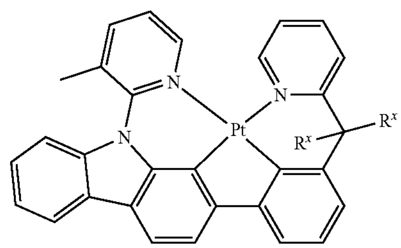
Pt 769
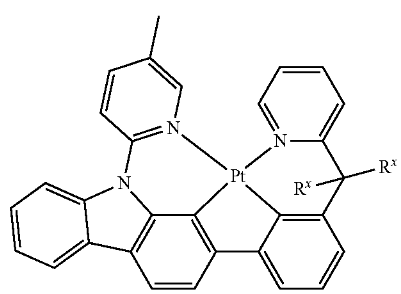
Pt 770
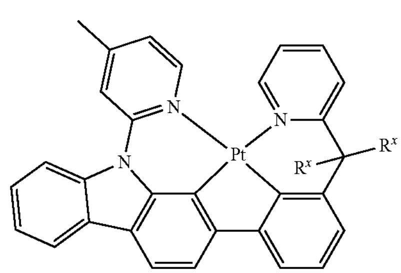

-continued
Pt 771
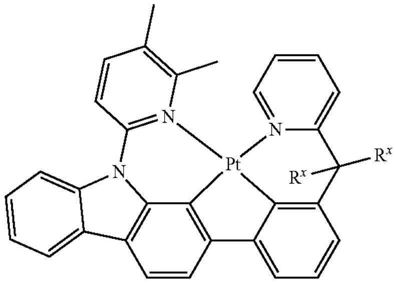
Pt 772
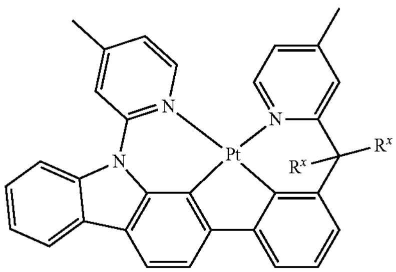
Pt 773
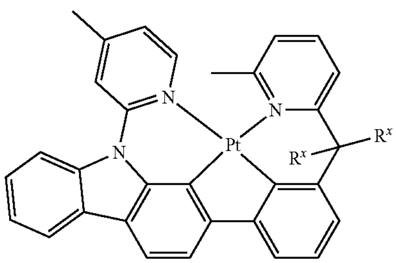
Pt 774
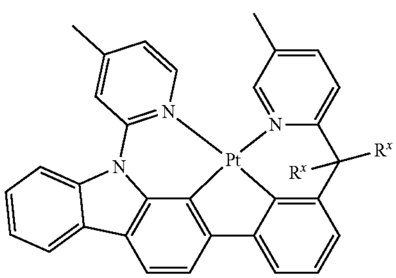
Pt 775
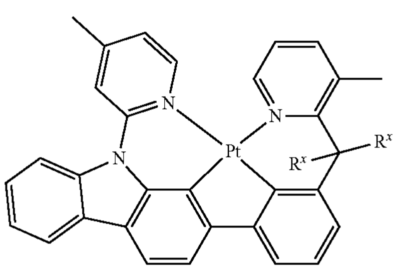
Pt 776
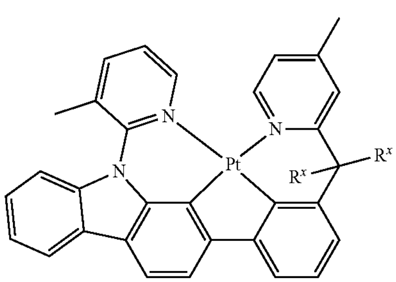
-continued
Pt 777
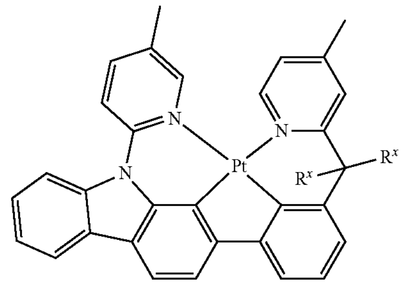
Pt 778
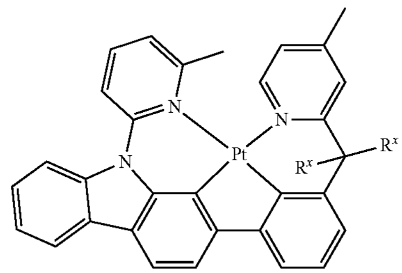
Pt 779
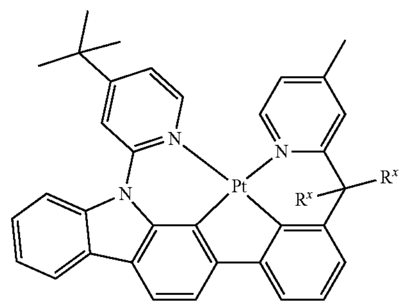
Pt 780
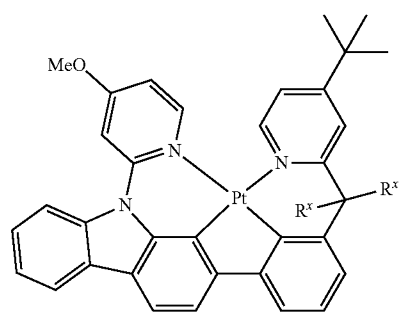
Pt 781
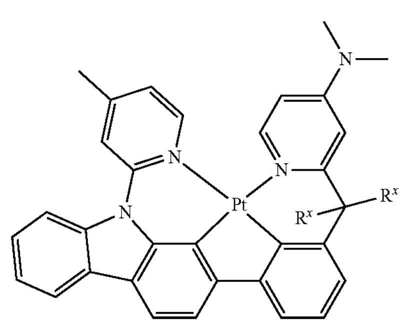

Pt 782
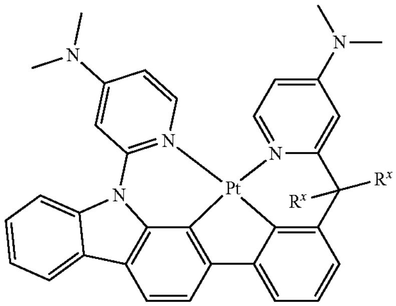
Pt 783
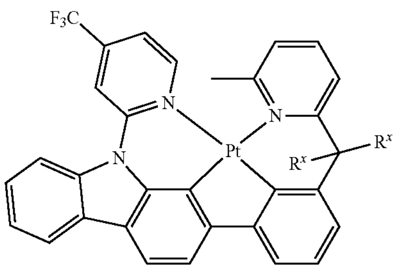
Pt 784
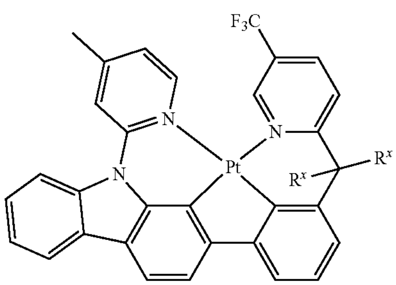
Pt 785
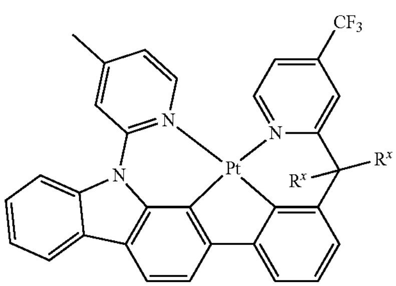
Pt 786
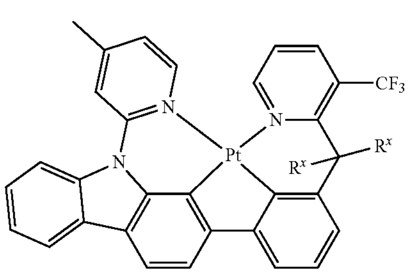
Pt 787
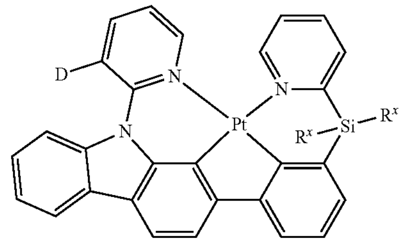
Pt 788
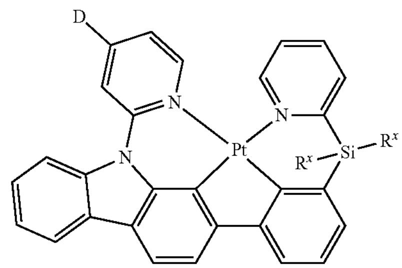
Pt 789
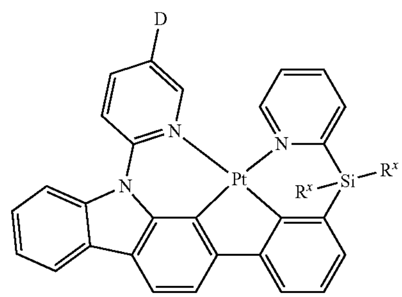
Pt 790
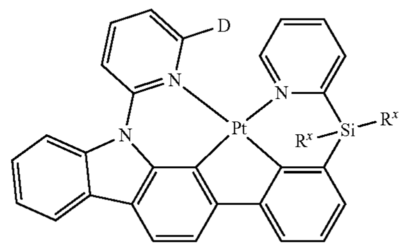
Pt 791
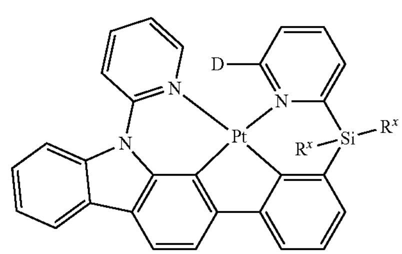
Pt 792
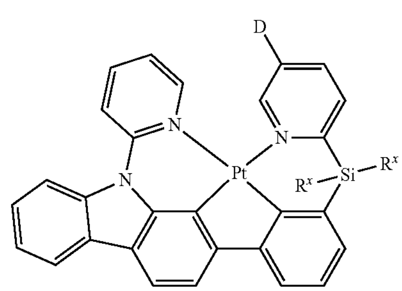

-continued
Pt 793
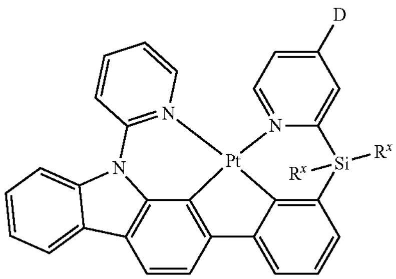
Pt 794
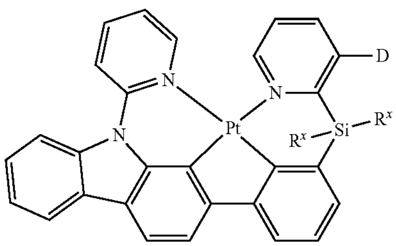
Pt 795
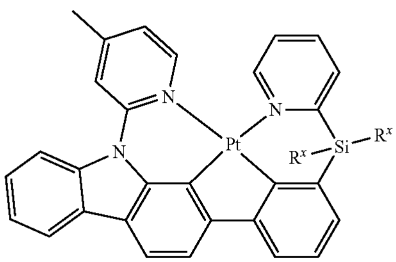
Pt 796
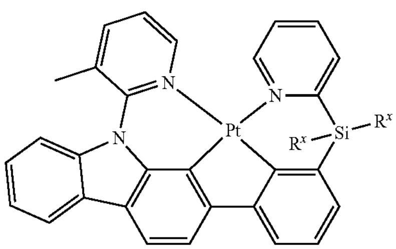
Pt 797
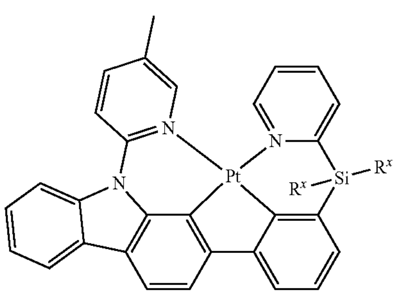
Pt 798
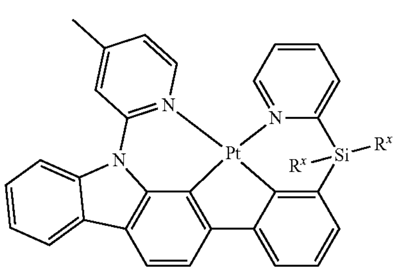
-continued
Pt 799
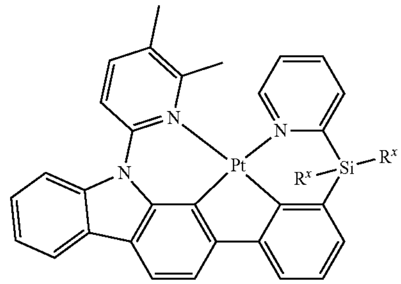
Pt 800
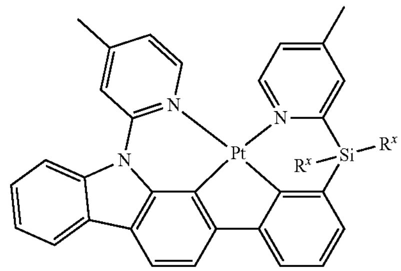
Pt 801
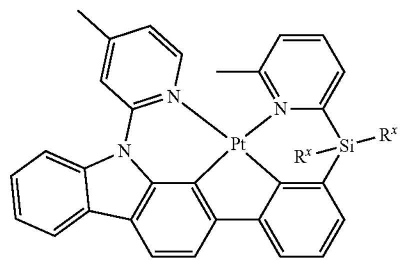
Pt 802
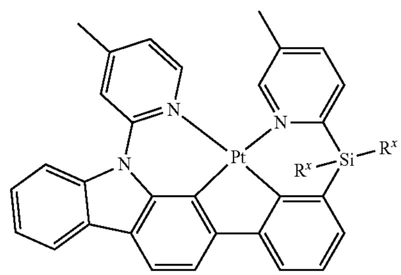
Pt 803
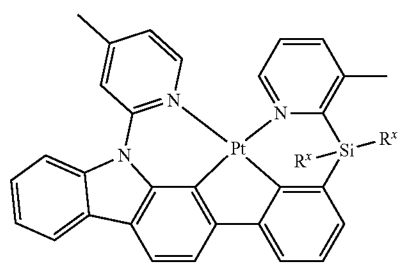
Pt 804
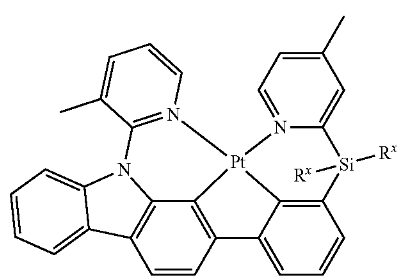

-continued
Pt 805
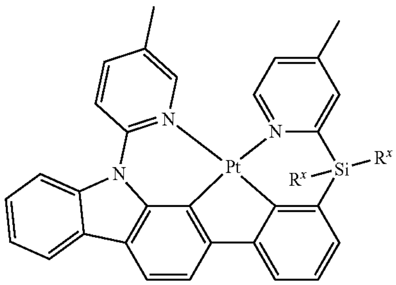
Pt 806
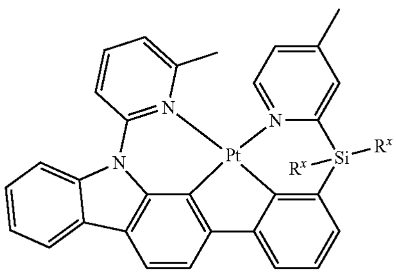
Pt 807
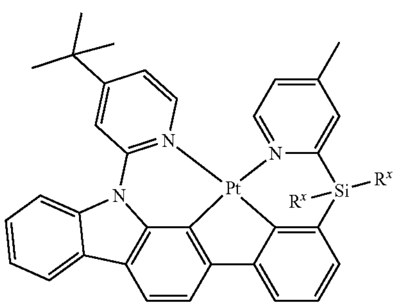
Pt 808
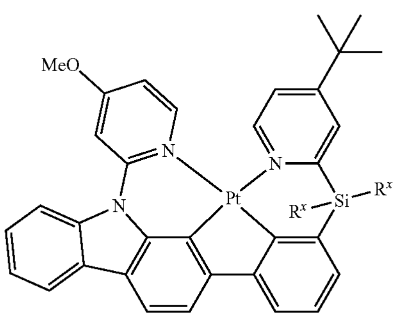
Pt 809
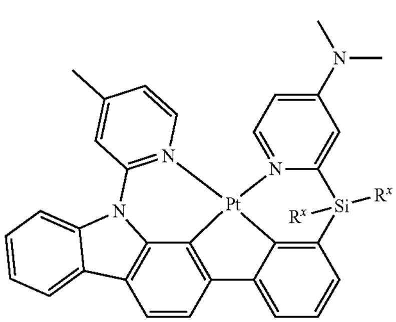
-continued
Pt 810
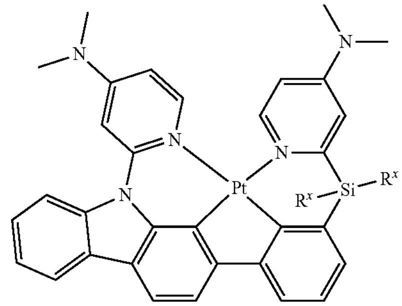
Pt 811
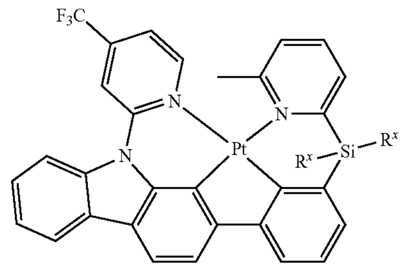
Pt 812
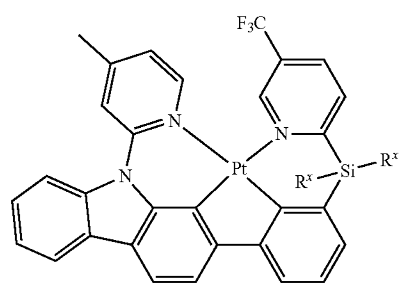
Pt 813
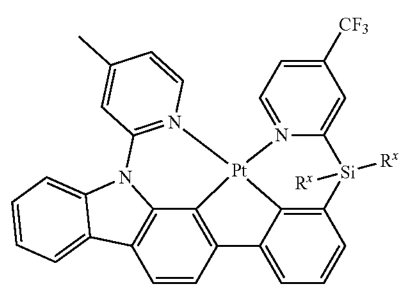
Pt 814
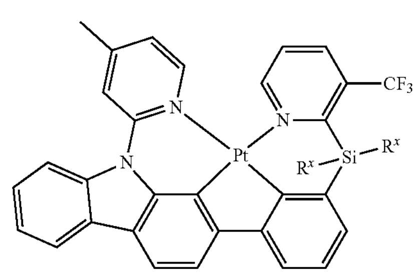

-continued
Pt 815
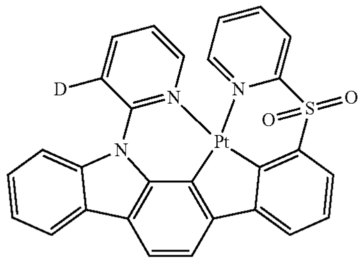
Pt 816
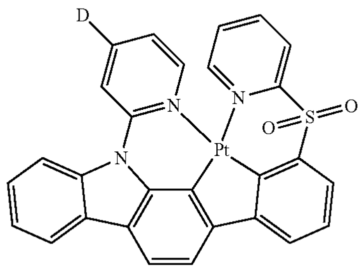
Pt 817
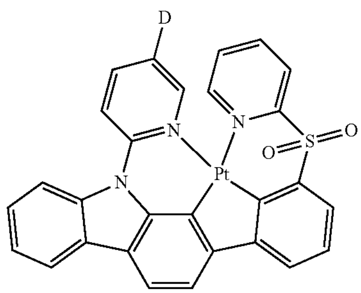
Pt 818
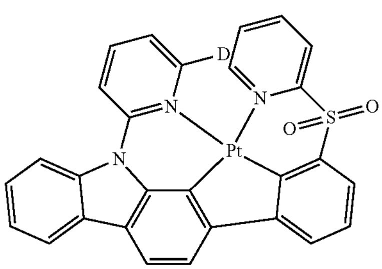
Pt 819
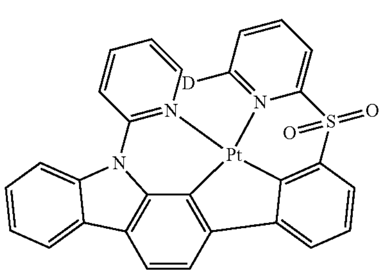
Pt 820
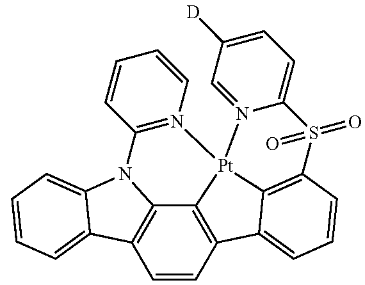
Pt 821
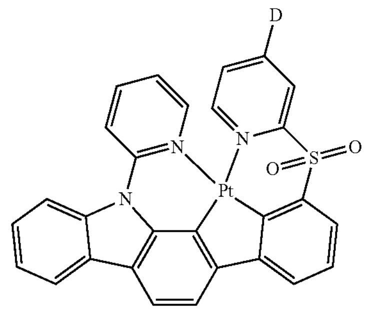
Pt 822
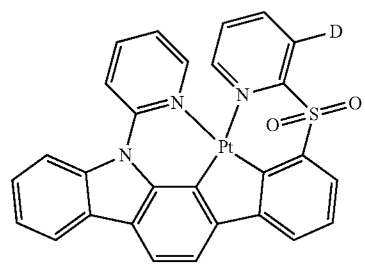
Pt 823
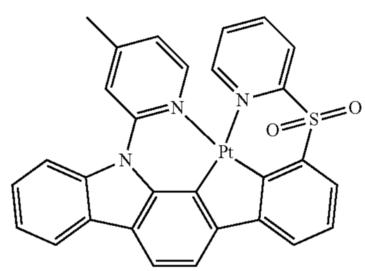
Pt 824
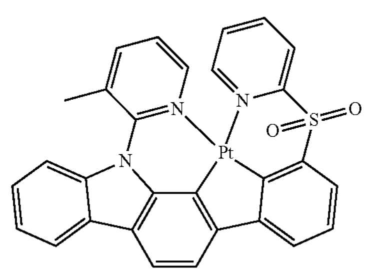

-continued
Pt 825
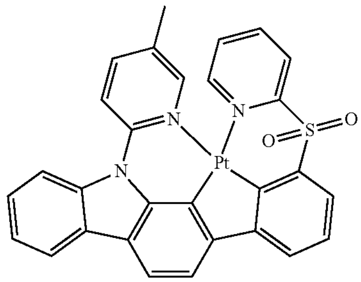
Pt 826
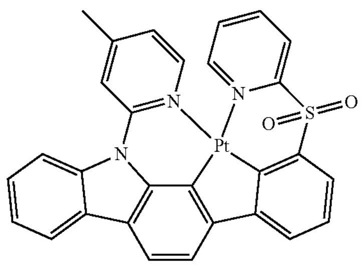
Pt 827
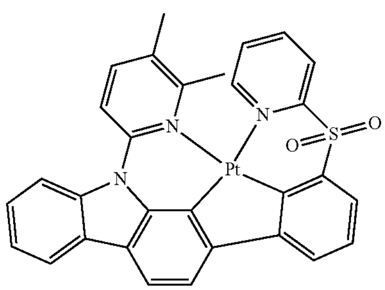
Pt 828
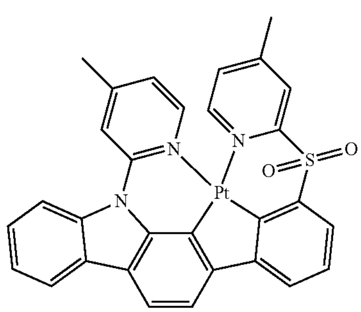
Pt 829
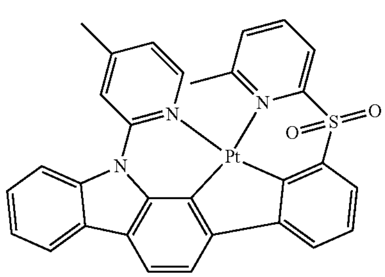
-continued
Pt 830
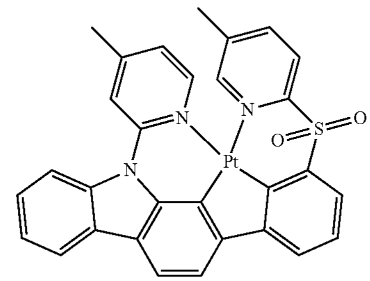
Pt 831
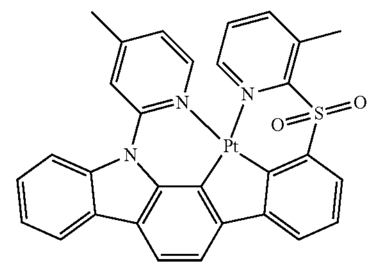
Pt 832
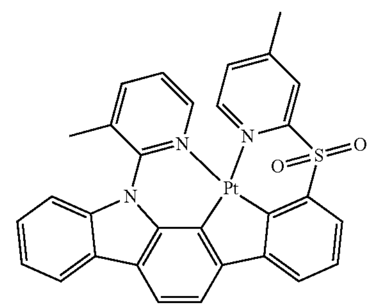
Pt 833
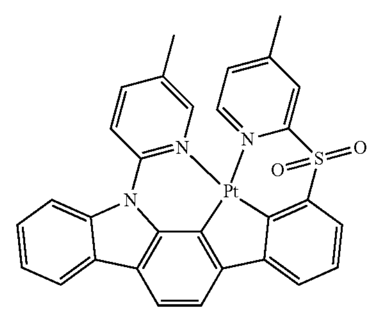
Pt 834
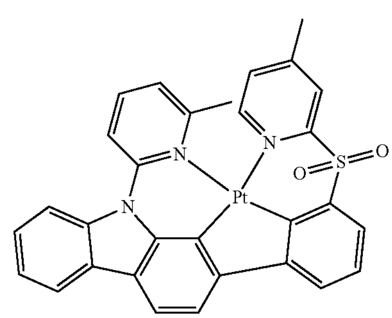

-continued
Pt 835
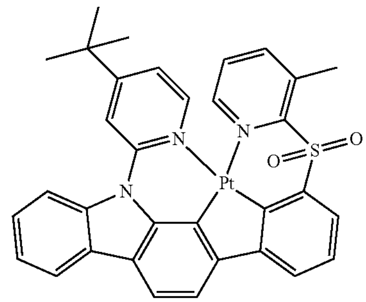
Pt 836
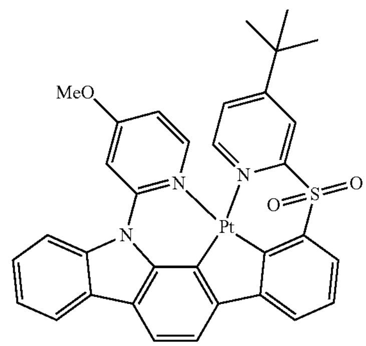
Pt 837
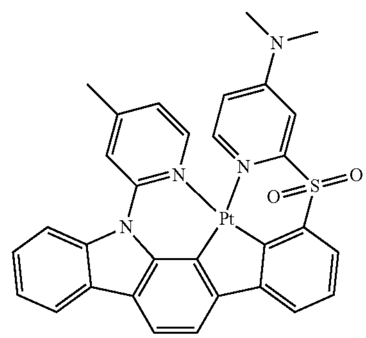
Pt 838
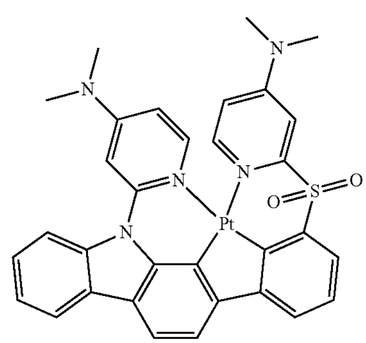
Pt 839
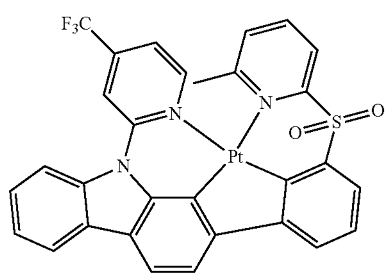
-continued
Pt 840
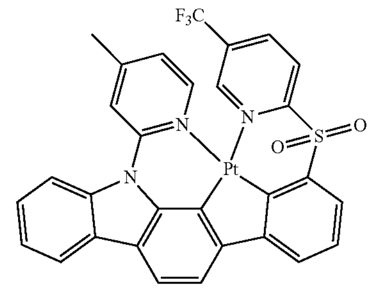
Pt 841
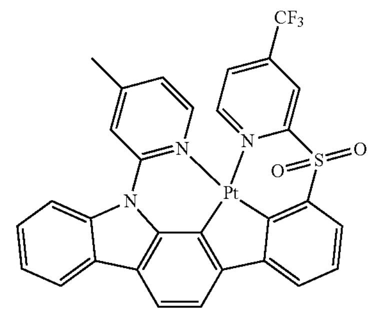
Pt 842
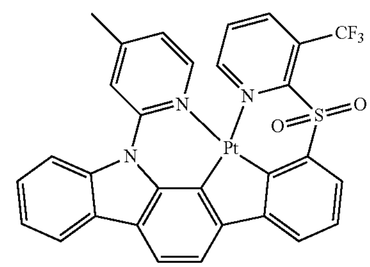
Pt 843
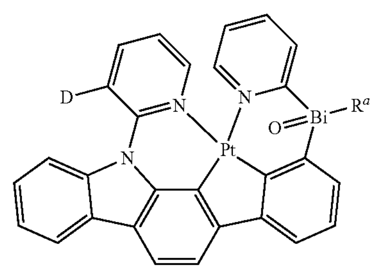
Pt 844
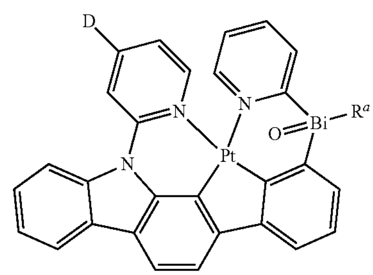

Pt 845
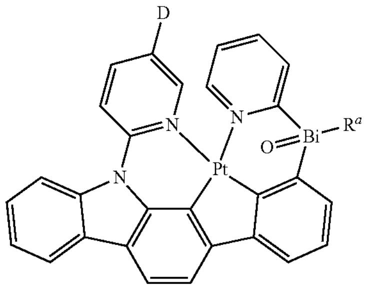
Pt 846
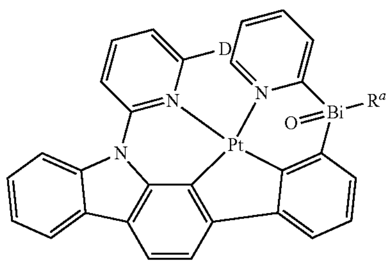
Pt 847
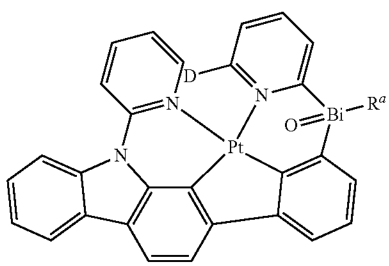
Pt 848
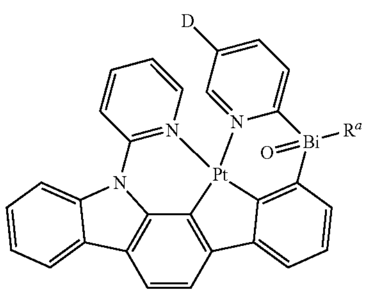
Pt 849
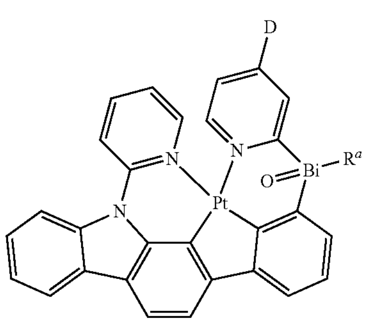
Pt 850
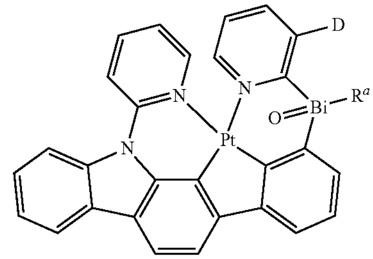
Pt 851
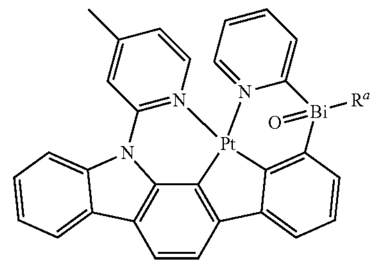
Pt 852
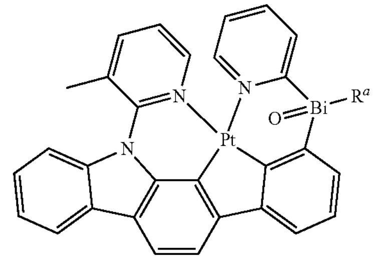
Pt 853
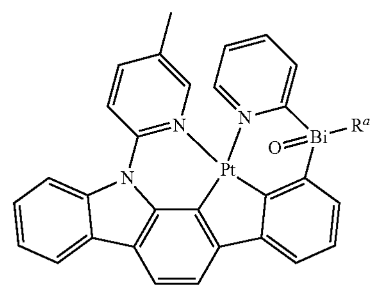
Pt 854
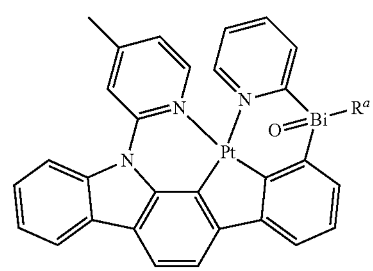
Pt 855
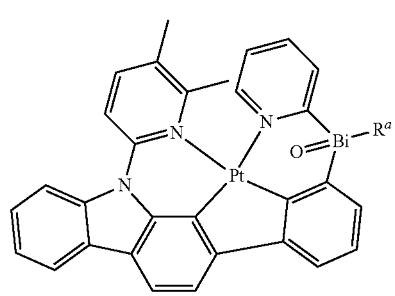

-continued
Pt 856
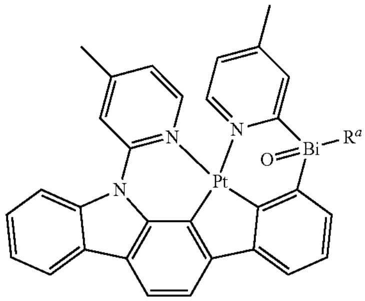
Pt 857
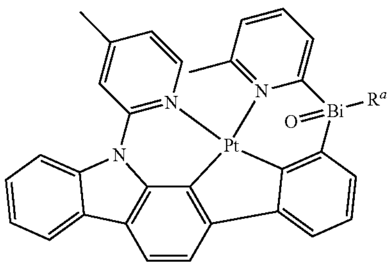
Pt 858
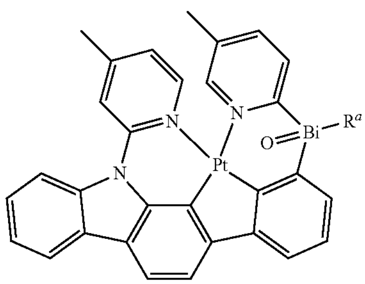
Pt 859
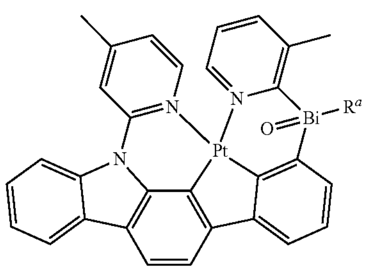
Pt 860
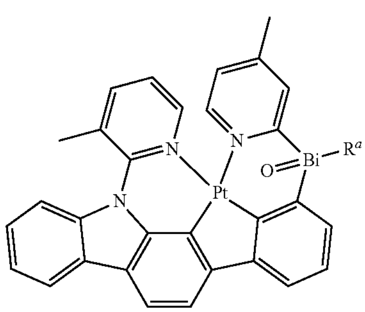
-continued
Pt 861
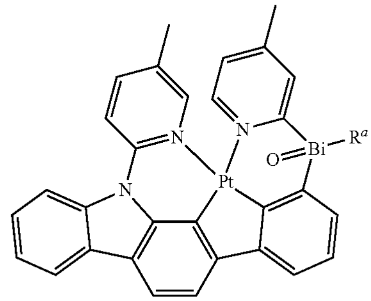
Pt 862
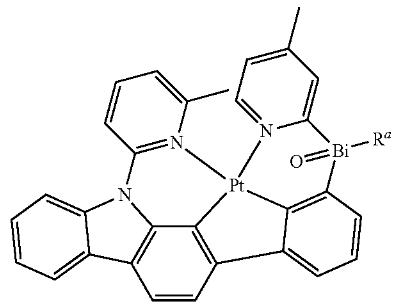
Pt 863
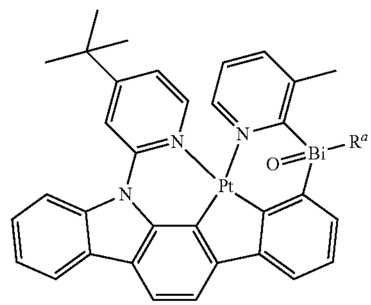
Pt 864
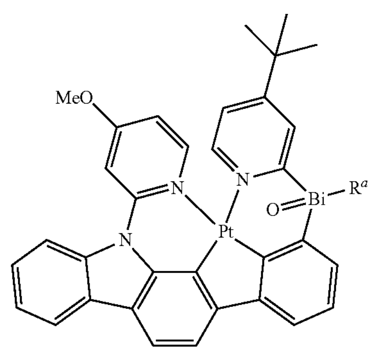
Pt 865
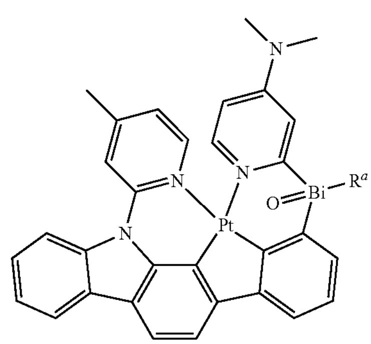

-continued
Pt 866
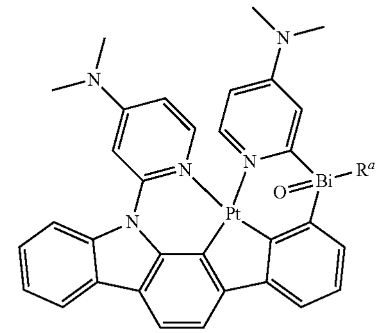
Pt 867
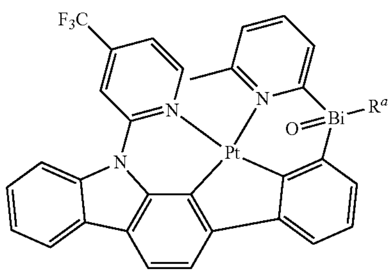
Pt 868
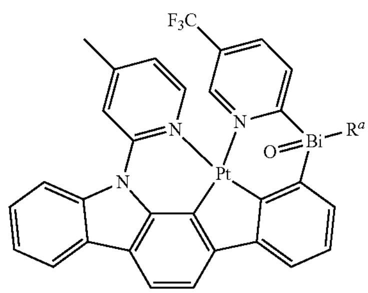
Pt 869
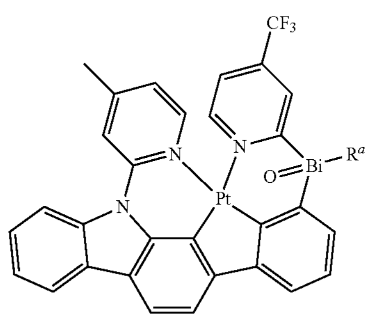
Pt 870
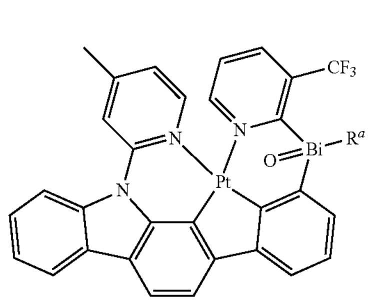
-continued
Pt 871
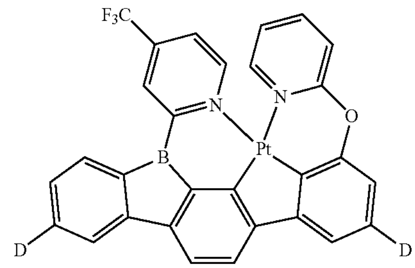
Pt 872
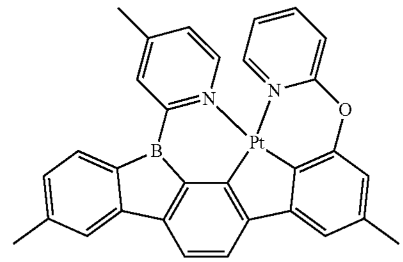
Pt 873
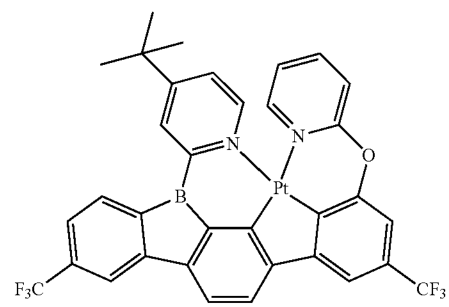
Pt 874
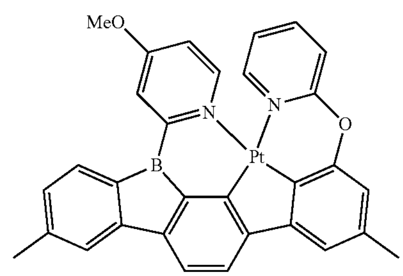
Pt 87
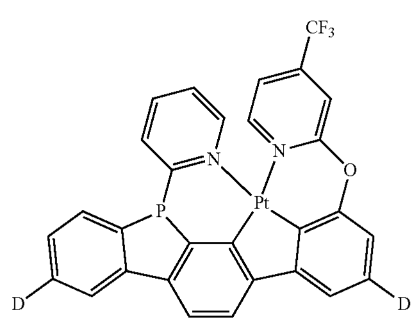

-continued
Pt 876
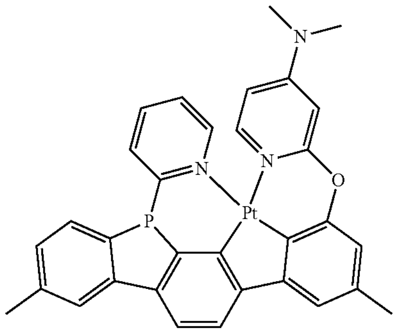
Pt 877
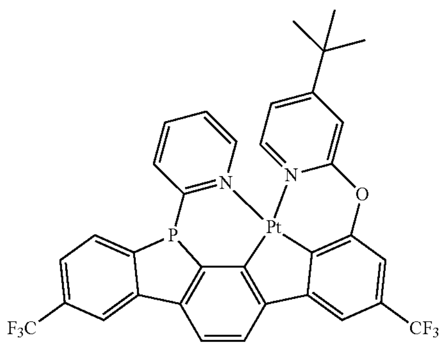
Pt 878
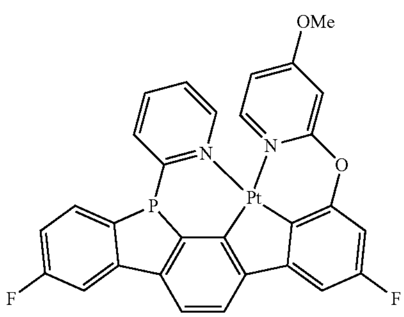
Pt 879
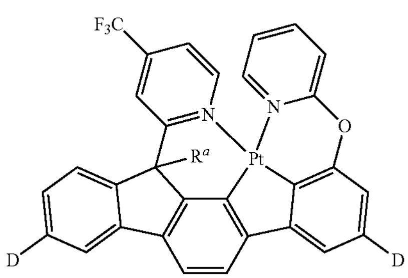
Pt 880
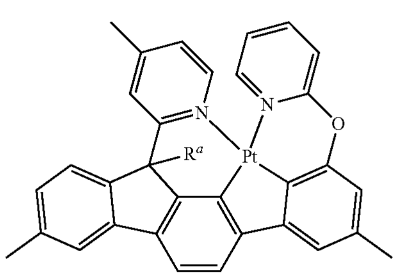
-continued
Pt 881
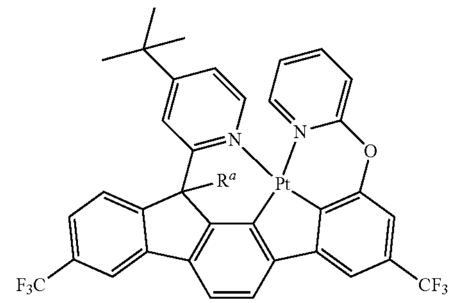
Pt 882
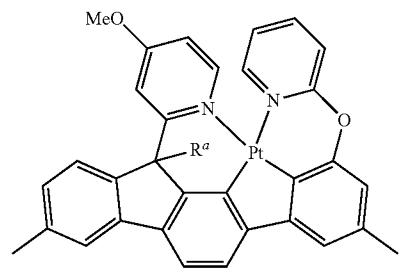
Pt 883
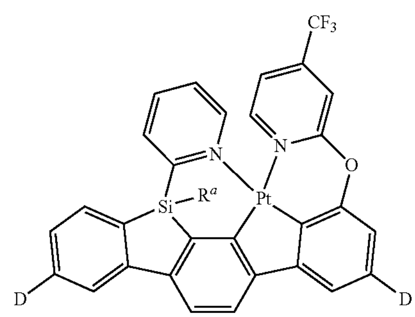
Pt 884
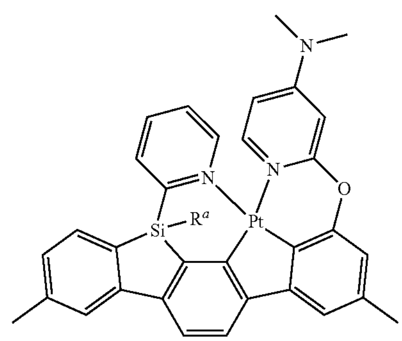
Pt 885
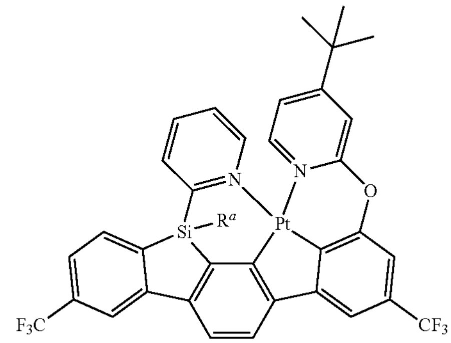

-continued
Pt 886
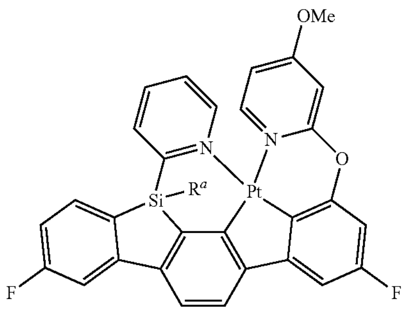
Pt 887
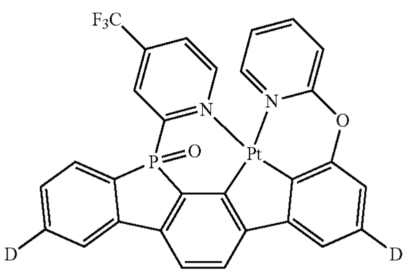
Pt 888
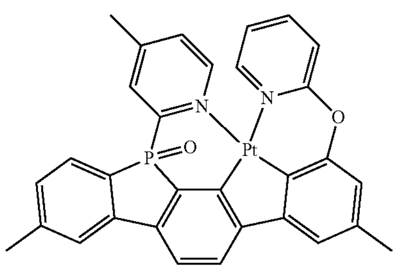
Pt 889
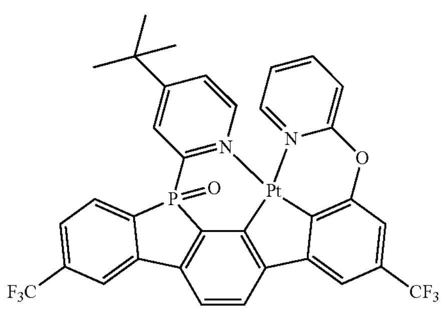
Pt 890
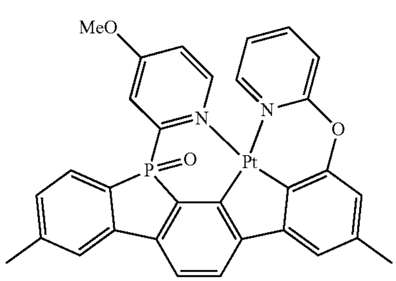
-continued
Pt 891
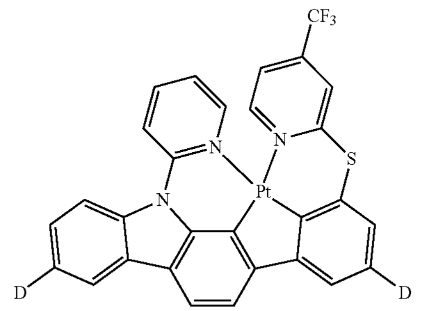
Pt 892
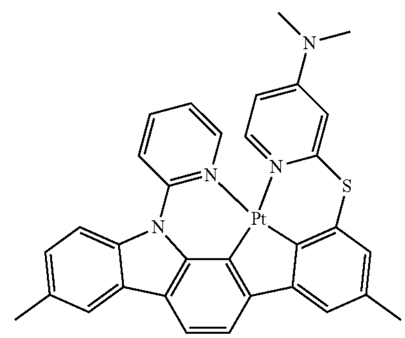
Pt 893
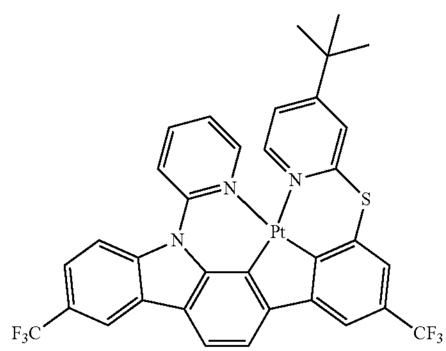
Pt 894
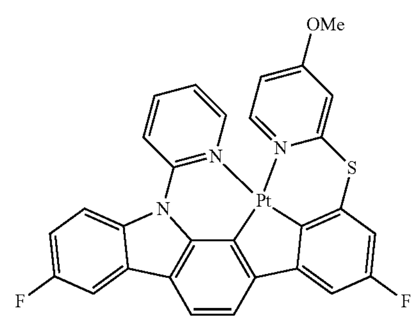
Pt 895
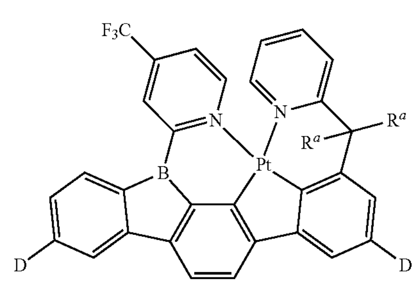

-continued
Pt 896
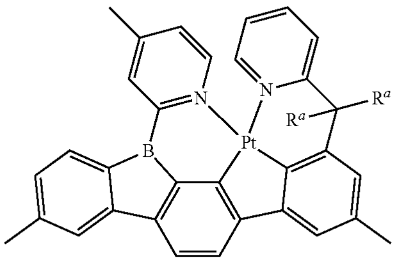
Pt 897
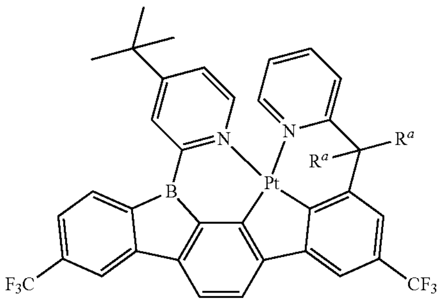
Pt 898
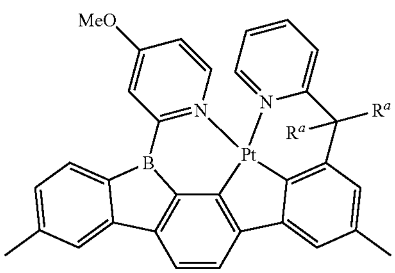
Pt 899
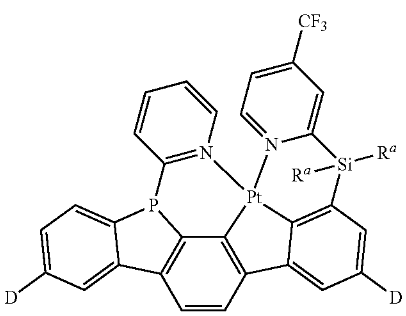
Pt 900
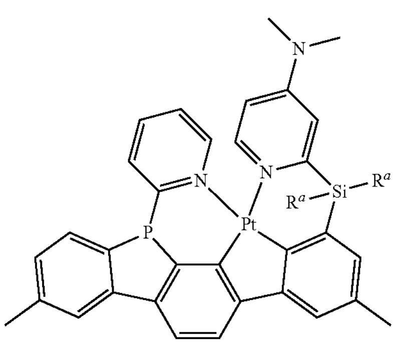
-continued
Pt 901
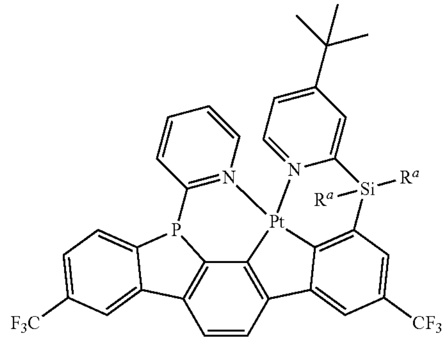
Pt 902
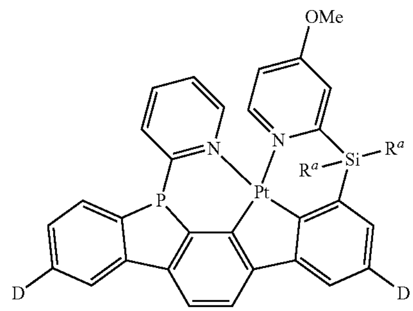
Pt 903
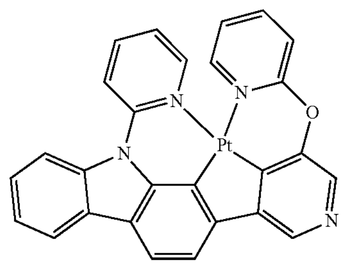
Pt 904
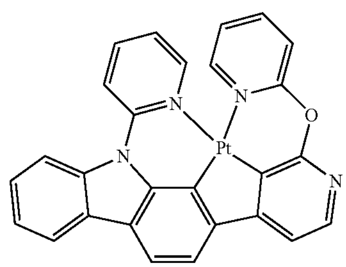
Pt 905
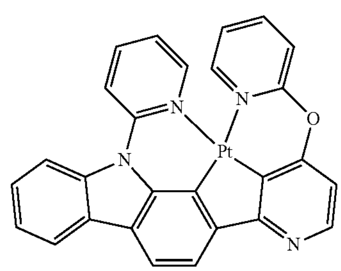

-continued
Pt 906
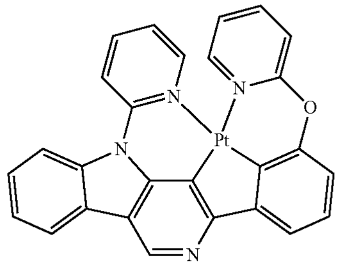
Pt 907
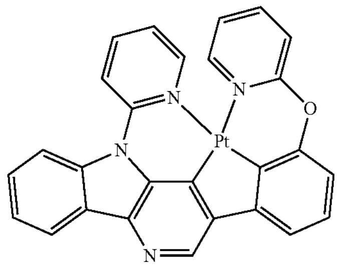
Pt 908
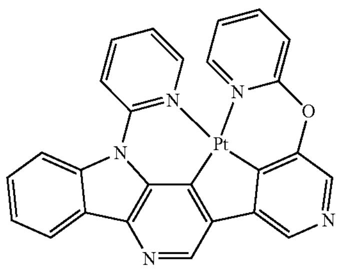
Pt 908
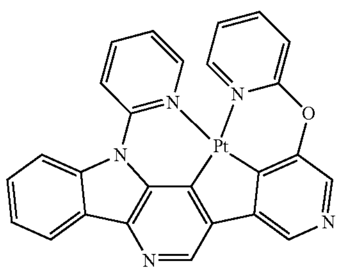
Pt 909
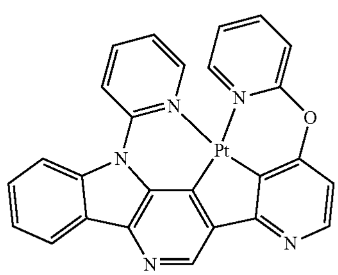
Pt 910
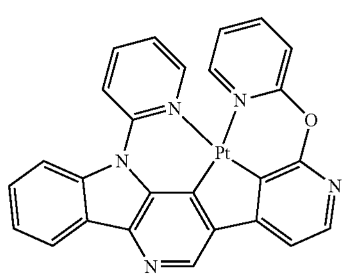
-continued
Pt 911
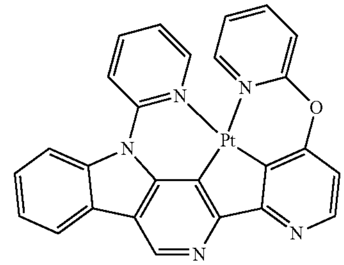
Pt 912
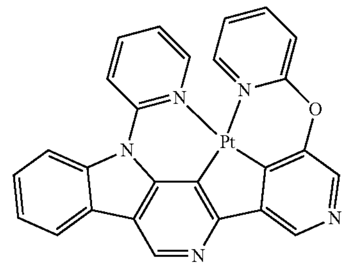
Pt 913
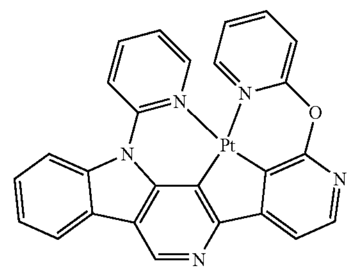
Pt 914
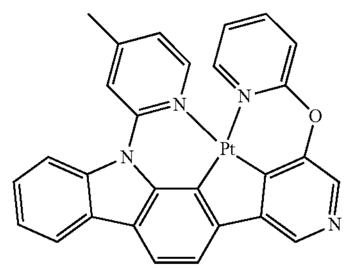
Pt 915
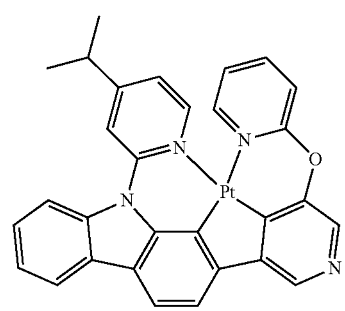

-continued
Pt 916
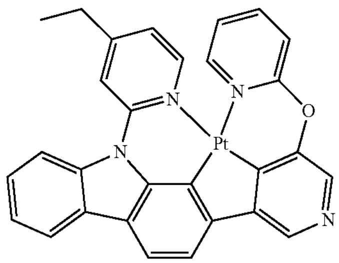
Pt 917
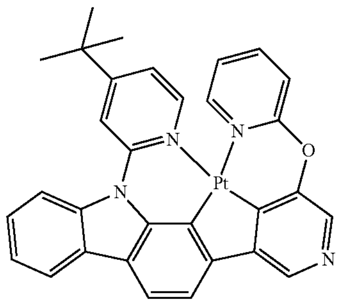
Pt 918
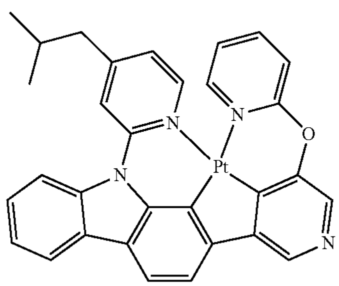
Pt 919
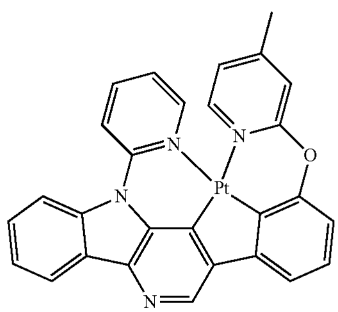
Pt 920
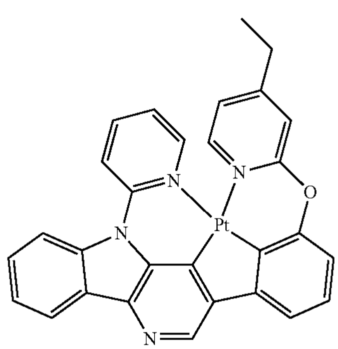
-continued
Pt 921
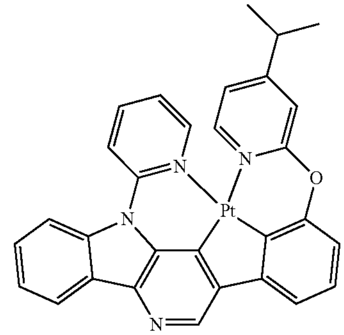
Pt 922
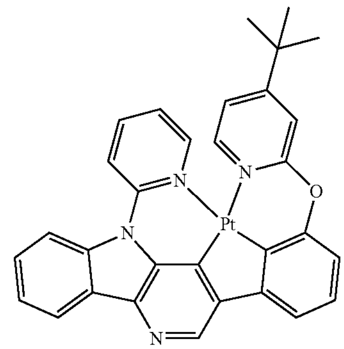
Pt 923
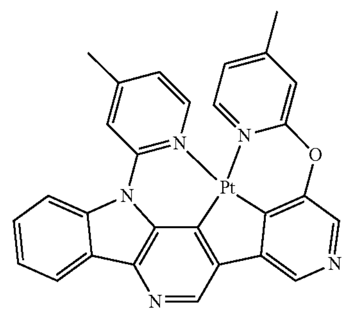
Pt 924
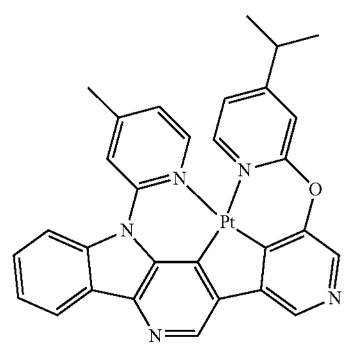

-continued

Pt 925

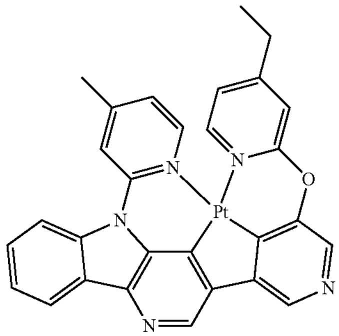

Pt 926

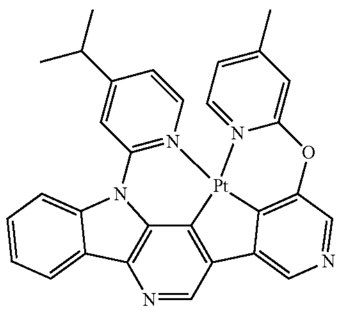

Pt 927

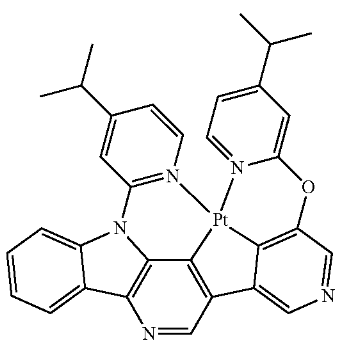

Pt 928

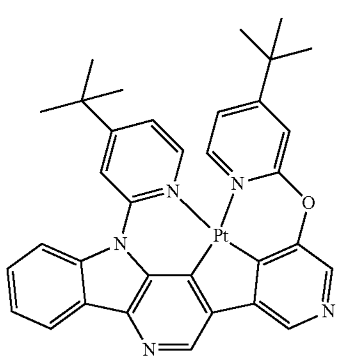

-continued

Pt 929

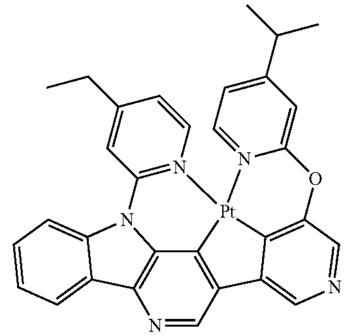

Pt 930

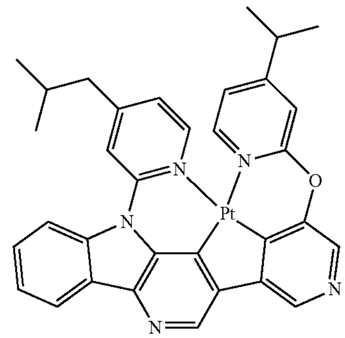

Wherein, $R^x$ may be selected from hydrogen, deuterium, aryl, cycloalkyl, cycloalkenyl, heterocyclyl, heteroaryl, alkyl, alkenyl, alkynyl, halogen, hydroxyl, sulfydryl, nitro, cyano, amino, monoalkylamino or dialkylamino, monoarylamino or diarylamino, alkoxy, aryloxy, haloalkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, urea, phosphoramido, imino, sulfo, carboxy, thiol, substituted silyl, polymeric groups or a combination thereof.

The present disclosure also provides a device comprising one or more of the compounds disclosed herein.

The compounds disclosed in the present disclosure are applicable to a wide variety of optical and electro-optical devices, including but not limited to light absorbing devices such as solar and photo-sensitive devices, organic light emitting diodes (OLEDs), light emitting devices or devices that are compatible with light absorption and emission and markers used for biological applications.

The compounds described in the present disclosure can be used in a light emitting device such as an OLED. FIG. 1 illustrates a structure diagram of a light emitting device 100. The light emitting device 10 comprises an anode 11, a hole transporting layer 13, a light emitting layer 15, an electron transporting layer 17, and a cathode 19 which are sequentially deposited and formed. Wherein, the hole transporting layer 13, the light emitting layer 15 and the electron transporting layer 17 are all organic layers, and the anode 11 and the cathode 19 are electrically connected.

EMBODIMENTS

The following examples regarding compound synthesis, compositions, articles, devices or methods are provided merely to provide a general method to the industrial field and are not intended to limit the protection scope of the patent. The data (quantity, temperature, etc.) mentioned in the patent is guaranteed to be as accurate as possible, but there may also be some errors and mistakes. Unless otherwise specified, they are all weighed separately. The temperature is ° C. or room temperature, and the pressure is near normal pressure.

The following examples provide preparation method of new compounds, but the preparation of such kind of compounds is not limited to this method. In the field of professional skill, since the protected compounds in the present patent are easily modified and prepared, they can be prepared by the methods listed below or by other methods. The following examples are merely embodiments and are not intended to limit the protection scope of this patent. Temperatures, catalysts, concentrations, reactants and reaction processes can all be varied and used to prepare the compound under different conditions for different reactants.

$^{1}$H spectra were measured at 500 MHz, and $^{13}$C NMR spectra were measured at 126 MHz on ANANCE III (500M) NMR instruments; unless otherwise specified, NMR all use DMSO-$d_6$ or $CDCl_3$ containing 0.1% TMS as a solvent, in which $^{1}$H NMR spectrum were recorded with TMS (δ=0.00 ppm) as internal mark if $CDCl_3$ was used as solvent; when DMSO-d was used as solvent, TMS (δ=0.00 ppm) or residual DMSO peak (δ=2.50 ppm) or residual water peak (δ=3.33 ppm) were used as internal mark. In $^{13}$C NMR spectrum, $CDCl_3$ (δ=77.00 ppm) or DMSO-$d_6$ (δ=39.52 ppm) was used as internal mark. HPLC-MS spectrum were measured on Agilent 6210 TOF LC/MS mass spectrometer; HRMS spectrum were measured on Agilent 6210 TOF LC/MS liquid chromatography—time-of-flight mass spectrometer. In $^{1}$H NMR spectrum data: s=singlet, d=doublet, t=triplet, q=quartet, p=quintet, m=multiplet, and br=broad.

Synthetic Route

The general synthesis steps were as follows:

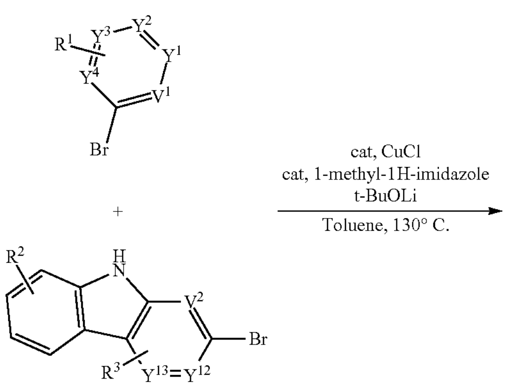

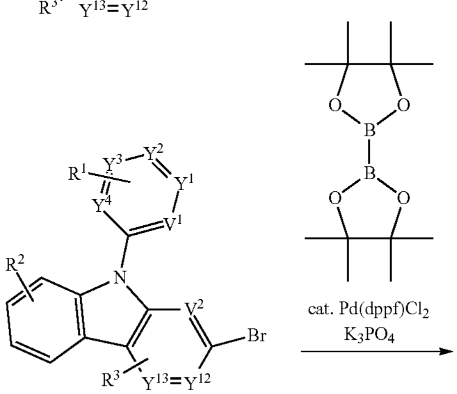

1-Br

-continued

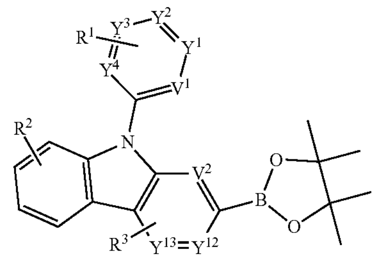

1-B(OR)2

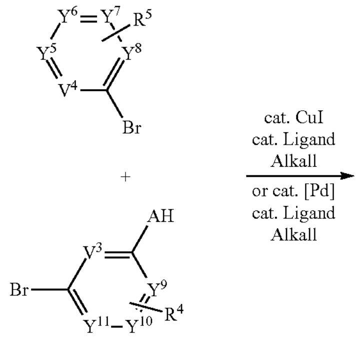

A = O, S, NH

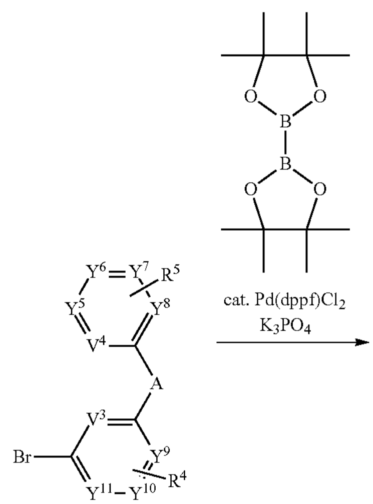

2-Br

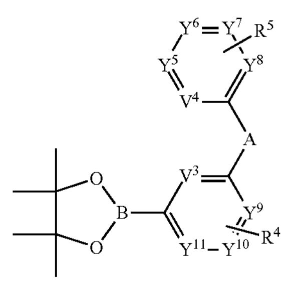

2-B(OR)2

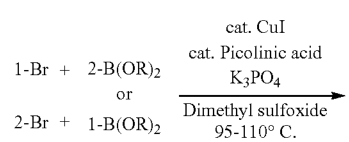

-continued

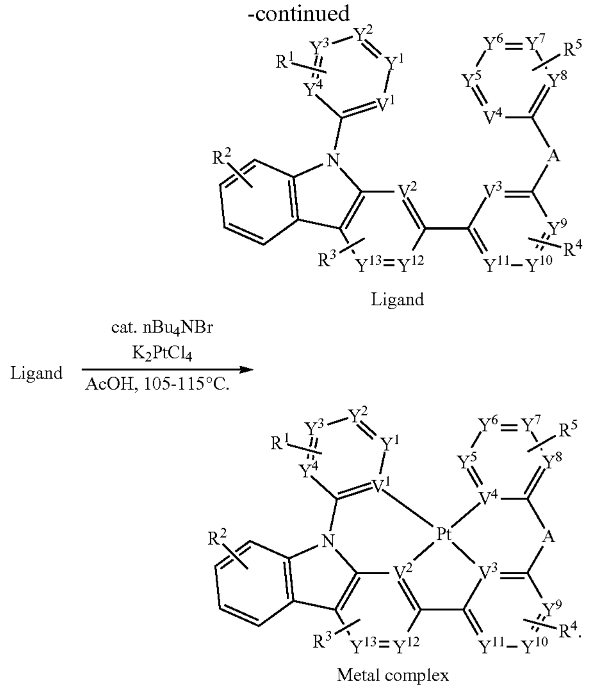

Embodiment 1

Pt 1 can be prepared according to the following method

1) Synthesis of 2-(2-(4,4,5,5-tetramethyl-1,3,2-dioxyboropentyl))-9-(2-pyridyl)-9H-carbazole (A)

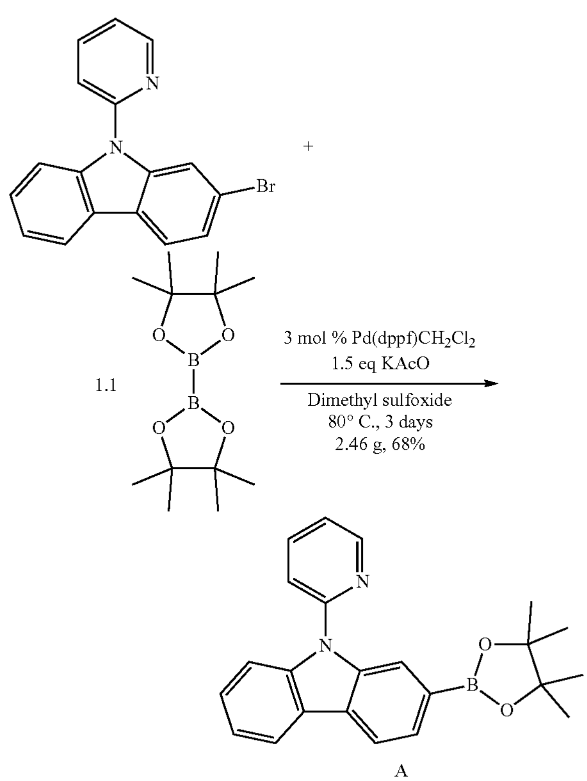

2-bromo-9-(2-pyridine)-9H-carbazole (3.20 g, 10.0 mmol, 1.0 eq), bisdiboron (2.60 g, 11.0 mmol, 1.1 eq), $PdCl_2(dppf).CH_2Cl_2$ (245.0 mg, 0.30 mmol, 0.03 eq) and potassium acetate (2.94 g, 30.0 mmol, 3.0 eq) were sequentially added into a 100 mL dry three-necked flask with a magnetic rotor and a condenser. The mixture was purged with nitrogen for three times and then added with dimethyl sulfoxide (20 mL). The mixture was then placed in an oil bath at 80° C. for 3 days, cooled to a room temperature, added with 200 mL ethyl acetate for dilution and filter by suction, then 50 mL water was added and a liquid was separated, aqueous phases were extracted with ethyl acetate for three times, organic phases were combined and dried over anhydrous sodium sulfate, then the residue was filtered, and a solvent was distilled off under reduced pressure. A obtaining crude product was purified by silica gel column chromatography using petroleum ether and ethyl acetate (10:1-4:1) as eluent to obtain a white solid, then 1.0 mL ethyl acetate and 20 mL petroleum ether were added and pulp-beaten at the room temperature for 24 hours and filtered to obtain a white solid (2.46 g in 68% yield). $^1H$ NMR (500 MHz, DMSO-$d_6$): δ 1.31 (s, 12H), 7.33-7.36 (m, 1H), 7.49-7.54 (m, 2H), 7.65 (dd, J=8.0, 1.0 Hz, 1H), 7.74 (d, J=8.0 Hz, 1H), 7.79 (d, J=8.0 Hz, 1H), 8.05 (s, 1H), 8.17 (td, J=8.0, 2.0 Hz, 1H), 8.26 (dd, J=7.5, 0.5 Hz, 1H), 8.29 (d, J=7.5 Hz, 1H), 8.78 (ddd, J=4.5, 1.5, 0.5 Hz, 1H).

2) Synthesis of 2-(3-bromophenoxy)-pyridine (B)

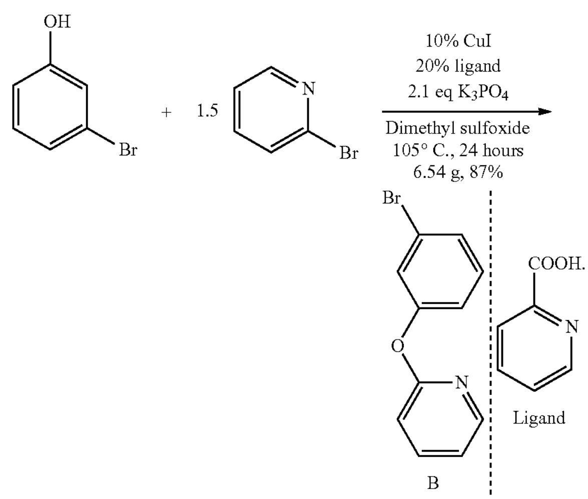

Cuprous *iodide* (571.4 mg, 3.0 mmol, 0.1 eq), ligand 2-picolinic acid (738.7 mg, 6.0 mmol, 0.2 eq) and potassium phosphate (13.4 g, 63.0 mmol, 2.1 eq) were sequentially added into a 100 mL dry three-necked flask with a magnetic rotor and a condenser. The mixture was purged by nitrogen for three times, and then added with 3-bromo-phenol (3.18 mL, 30.0 mmol, 1.0 eq), 2-bromopyridine (4.30 mL, 45.0 mmol, 1.5 eq), and dimethyl sulfoxide (30 mL). The mixture was then placed in an oil bath at 105° C. for 1 day, cooled to the room temperature, added with 200 mL ethyl acetate for dilution and filter by suction to obtain a clear yellow solution, then 100 mL water was added and a liquid was separated, aqueous phases were extracted with ethyl acetate for three times, organic phases were combined and dried over anhydrous sodium sulfate, then 100 mL ethyl acetate and 20 mL aqueous solution of sodium carbonate were added to remove a small number of 3-bromo-phenol to separate a liquid, organic phases were dried over anhydrous sodium sulfate, the residue was filtered, and a solvent was distilled off under reduced pressure. A obtaining crude product was purified by silica gel column chromatography using petroleum ether and ethyl acetate (20:1-10:1) as eluent to obtain a white solid (6.54 g in 87% yield). $^1$H NMR (500 MHz, DMSO-$d_6$): δ 7.08 (d, J=8.5 Hz, 1H), 7.14-7.18 (m, 2H), 7.36-7.43 (m, 3H), 7.86-7.90 (m, 1H), 7.08 (ddd, J=4.5, 2.0, 0.5 Hz, 1H).

3) Synthesis of 2-(3-(2-oxopyridyl)phenyl)-9-(2-pyridyl)-9H-carbazole

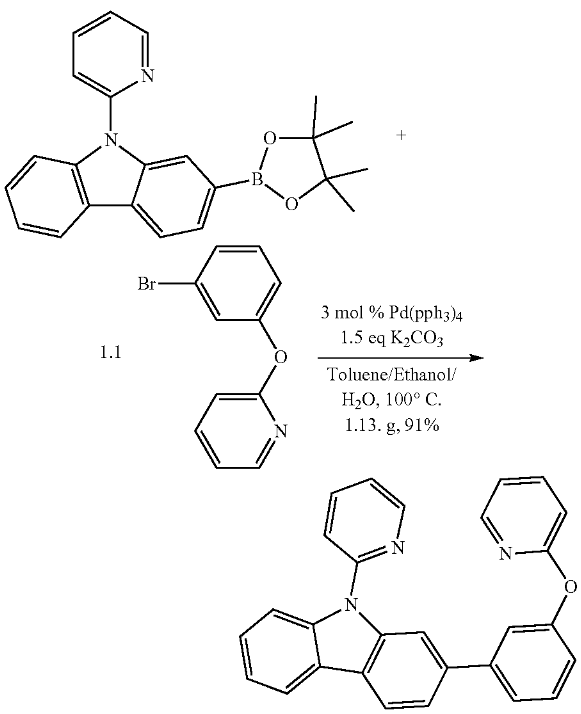

C 2-(2-(4,4,5,5-tetramethyl-1,3,2-dioxyboropentyl))-9-(2-pyridyl)-9H-carbazole (1.11 g, 3.0 mmol, 1.0 eq), 2-(3-bromophenoxy)-pyridine (825.3 mg, 3.3 mmol, 1.1 eq), $Pd(PPh_3)_4$ (104.0 mg, 0.09 mmol, 0.03 eq), and $K_2CO_3$ (621.0 mg, 4.5 mmol, 1.5 eq) were sequentially added into a 100 mL dry three-necked flask with a magnetic rotor and a condenser. The mixture was purged for three times and then added with toluene (24.0 mL), ethanol (6.0 mL) and water (6.0 mL). The mixture was bubbled with nitrogen for 15 minutes, and reacted in an oil bath at 100° C. for 5 days, cooled to the room temperature, a solvent was distilled off under reduced pressure, then 10.0 mL water and 40 mL ethyl acetate were added for dilution and liquid separation, aqueous phases were extracted with ethyl acetate for three times, organic phases were combined and dried over anhydrous sodium sulfate, the solvent was distilled off under reduced pressure, and a obtaining crude product was purified by silica gel column chromatography using petroleum ether and ethyl acetate (4:1-1:1) as eluent to obtain a yellow solid (1.13 g in 91% yield). $^1$H NMR (500 MHz, DMSO-$d_6$): δ 7.08 (dd, J=8.0, 1.0 Hz, 1H), 7.12-7.16 (m, 2H), 7.33-7.36 (m, 1H), 7.46-7.53 (m, 4H), 7.58 (ddd, J=7.5, 1.5, 1.5 Hz, 1H), 7.63 (d, J=8.0, 1.5 Hz, 1H), 7.81 (d, J=8.0 Hz, 1H), 7.85-7.89 (m, 2H), 8.01 (d, J=1.0 Hz, 1H), 8.12-8.15 (m, 1H), 8.16 (ddd, J=5.0, 2.0, 0.5 Hz, 1H), 8.27 (d, J=7.5 Hz, 1H), 8.32 (d, J=8.0 Hz, 1H), 8.75 (ddd, J=5.0, 2.0, 0.5 Hz, 1H).

4) Synthesis of Pt 1

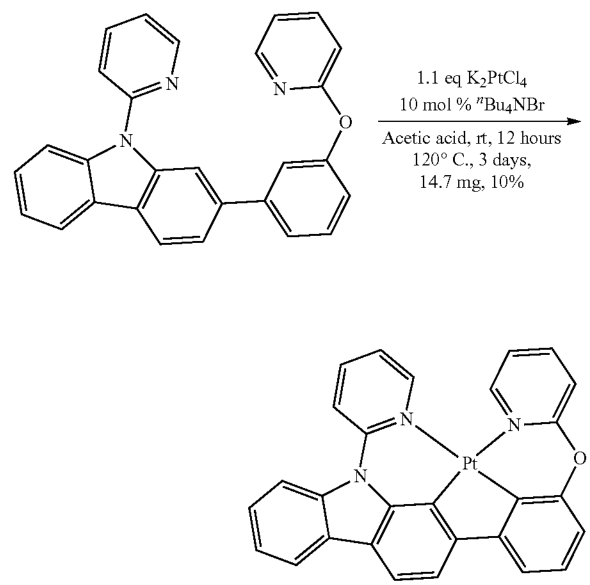

Pt1

Ligand 1 (100.0 mg, 0.24 mmol, 1.0 eq), $K_2PtCl_4$ (110.8 mg, 0.26 mmol, 1.1 eq) and $^nBu_4NBr$ (7.7 mg, 0.02 mmol, 0.1 eq) were successively added to a 100 mL three-necked flask with a magnetic rotor and a condenser. Then the mixture was purged with nitrogen for three times and added with acetic acid (15 mL). After stirring for 12 hours at the room temperature, the mixture was placed in an oil bath at 115° C. for 3 days, cooled to the room temperature, and the solvent was distilled off under reduced pressure. A resulting crude product was separated and purified by silica gel column chromatography using petroleum ether and methylene chloride (3:1-1:1) as eluent to obtain a yellow solid (14.7 mg in 10% yield).

Figure 2:
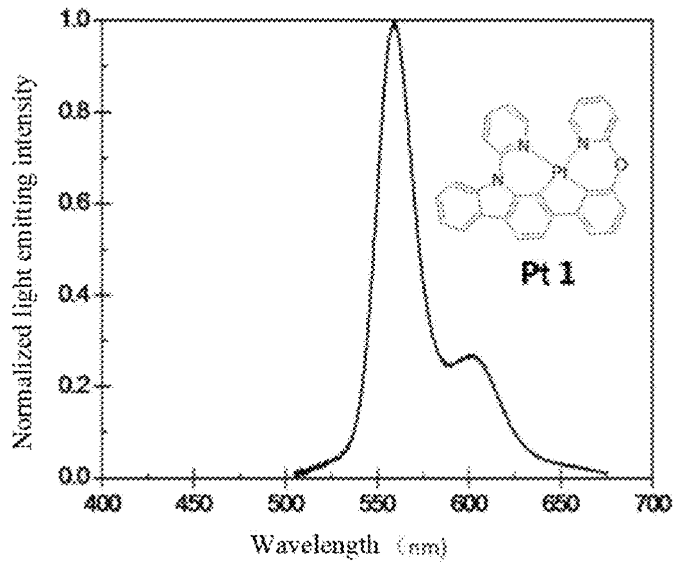
FIG. 2 is a room temperature emission spectrum of a platinum complex Pt 1 in a dichloromethane solution.
Figure 3:
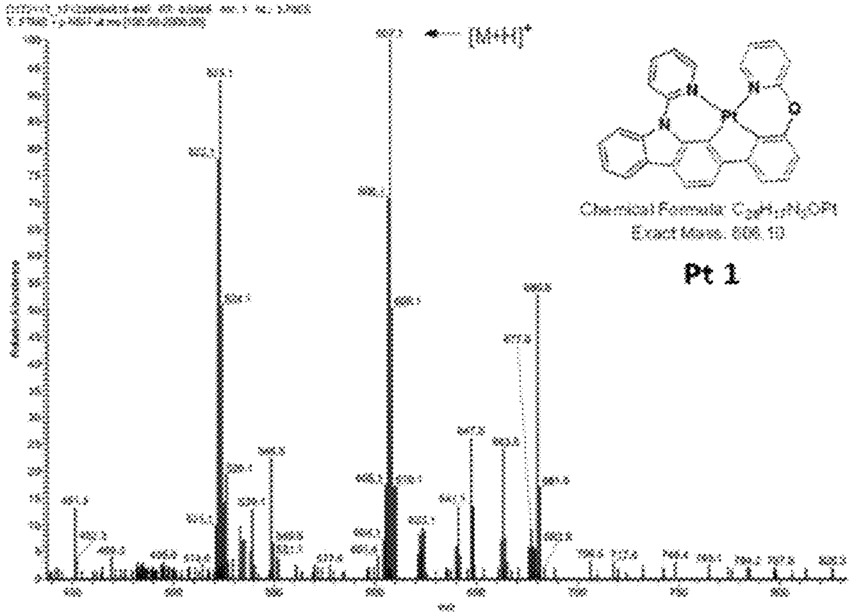
FIG. 3 is a low resolution mass spectrum of the platinum complex Pt 1.

The emission spectra of the platinum complex Pt 1 in dichloromethane solution and at the room temperature was shown in FIG. 2, a low resolution mass spectrum was shown in FIG. 3, and a high resolution mass spectrum analysis report was shown in FIG. 4. $^1$H NMR (500 MHz, DMSO-$d_6$): δ 7.01 (dd, J=7.5, 1.0 Hz, 1H), 7.22 (t, J=8.0 Hz, 1H), 7.44-7.47 (m, 1H), 7.56-7.67 (m, 5H), 7.74 (d, J=8.0 Hz, 1H), 7.88 (d, J=8.0 Hz, 1H), 8.19 (d, J=8.0 Hz, 1H), 8.27-8.34 (m, 3H), 8.44 (d, J=8.5 Hz, 1H), 8.88 (dd, J=5.5, 1.5 Hz, 1H), 8.93 (dd, J=6.0, 1.5 Hz, 1H). HRMS (DART POSITIVE Ion Mode): $C_{28}H_{18}ON_3Pt$, $[M+H]^+$, the calculated value was 607.1092; and the experimental value was 607.1092.

Embodiment 2

Pt 22 can be prepared according to the following method

1) Synthesis of 2-(2-(4,4,5,5-tetramethyl-1,3,2-dioxyboropentyl))-9-(2-(4-methylpyridyl))-9H-carbazole (D)

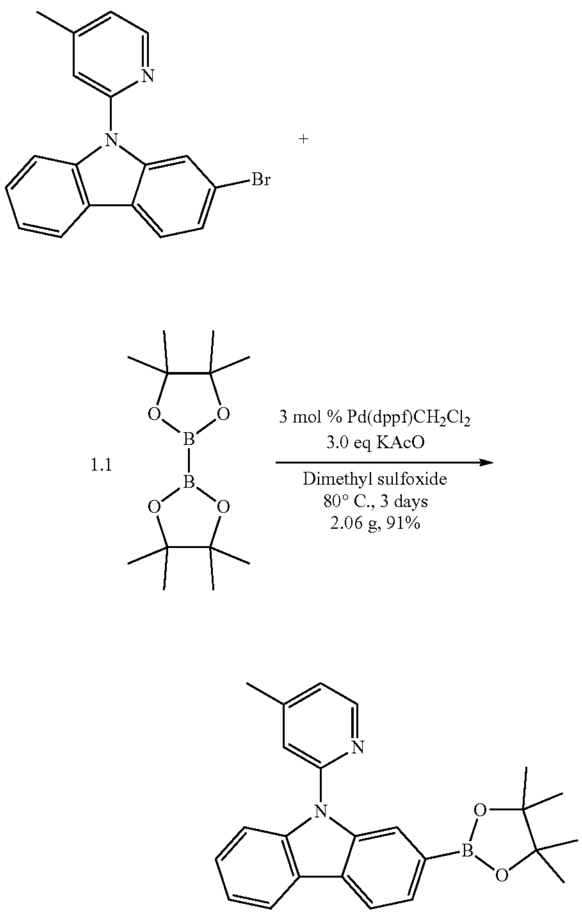

D 2-bromo-9-(2-(4-methylpyridyl))-9H-carbazole (2.0 g, 5.9 mmol, 1.0 eq), bisdiboron (1.65 g, 6.5 mmol, 1.1 eq), $PdCl_2$(dppf).$CH_2Cl_2$ (144.5 mg, 0.18 mmol, 0.03 eq) and potassium acetate (1.74 g, 17.7 mmol, 3.0 eq) were sequentially added into a 100 mL dry three-necked flask with a magnetic rotor and a condenser. Then the mixture was purged with nitrogen for three times and added with dimethyl sulfoxide (10 mL). The mixture was then placed in an oil bath at 80° C. for 3 days, cooled to the room temperature, then 100 ethyl acetate was added for dilution and filter by suction, 50 mL water was added for liquid separation, aqueous phases were extracted with ethyl acetate for three times, organic phases were combined and dried over anhydrous sodium sulfate, the mixture was filtered and a solvent was distilled off under reduced pressure, and a obtaining crude product was purified by silica gel column chromatography using petroleum ether and ethyl acetate (10:1-5:1) as eluent to obtain a white solid (2.06 g in 91% yield).

2) Synthesis of 2-(3-(2-oxopyridyl)phenyl)-9-(2-4-methylpyridyl))-9H-carbazole (E)

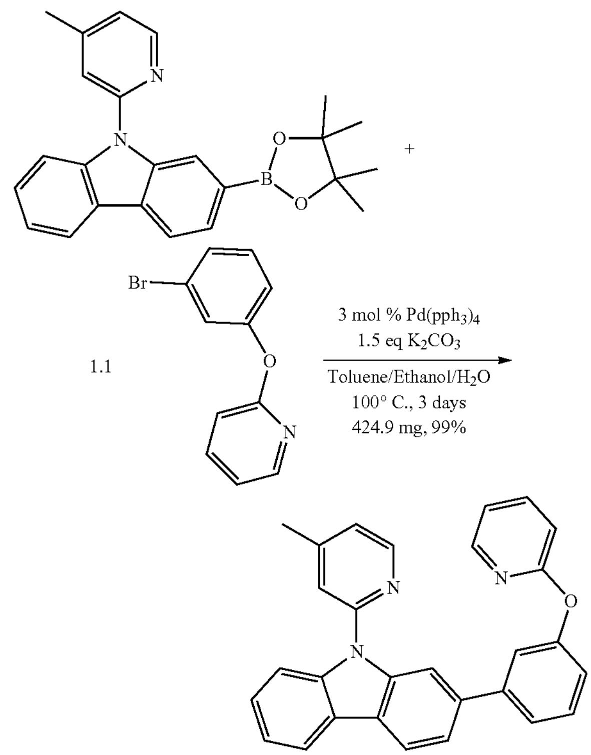

E 2-(2-(4,4,5,5-tetramethyl-1,3,2-dioxyboropentyl))-9-(2-(4-methylpyridyl))-9H-carbazole (384.3 g, 1.0 mmol, 1.0 eq), 2-(3-bromophenoxy)-pyridine (275.0 mg, 1.1 mmol, 1.1 eq), $Pd(PPh_3)_4$ (34.7 mg, 0.03 mmol, 0.03 eq), and $K_2CO_3$ (207.0 mg, 1.5 mmol, 1.5 eq) were sequentially added into a 100 mL dry three-necked flask with a magnetic rotor and a condenser. The mixture was purged for three times and then added with toluene (8.0 mL), ethanol (2.0 mL) and water (2.0 mL). The mixture was bubbled with nitrogen for 15 minutes, and reacted in an oil bath at 100° C. for 3 days, cooled to the room temperature, a solvent was distilled off under reduced pressure, then 10.0 mL water and 40 mL ethyl acetate were added for dilution and liquid separation, aqueous phases were extracted with ethyl acetate for three times, organic phases were combined and dried over anhydrous sodium sulfate, the solvent was distilled off under reduced pressure, and a obtaining crude product was purified by silica gel column chromatography using petroleum ether and ethyl acetate (5:1) as eluent to obtain a yellow solid (424.9 mg in 99% yield). $^1H$ NMR (500 MHz, DMSO-$d_6$): δ 2.48 (s, 3H), 7.09 (d, J=8.5 Hz, 1H), 7.13 (ddd, J=7.5, 2.5, 1.0 Hz, 1H), 7.15 (ddd, J=7.5, 5.0, 1.0 Hz, 1H), 7.33-7.36 (m, 2H), 7.45-7.50 (m, 2H), 7.52 (t, J=8.0 Hz, 1H), 7.57 (dt, J=7.5, 1.5 Hz, 1H), 7.63 (dd, J=8.5, 1.5 Hz, 1H), 7.68 (s, 1H), 7.78 (d, J=8.5 Hz, 1H), 7.87 (ddd, J=8.0, 7.0, 2.0 Hz, 1H), 7.98 (d, J=1.0 Hz, 1H), 8.16 (ddd, J=5.0, 2.0, 0.5 Hz, 1H), 8.27 (d, J=8.0 Hz, 1H), 8.32 (d, J=8.0 Hz, 1H), 8.59 (d, J=5.0 Hz, 1H).

3) Synthesis of Pt 22

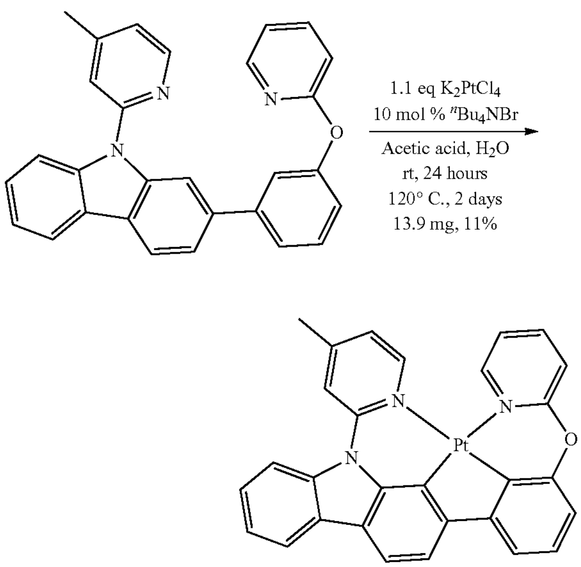

Pt22

Compound E (85.4 mg, 0.20 mmol, 1.0 eq), $K_2PtCl_4$ (91.4 mg, 0.22 mmol, 1.1 eq) and $Bu_4NBr$ (6.4 mg, 0.02 mmol, 0.1 eq) prepared as above step were successively added to a dry reaction tube with a magnetic rotor. Then the mixture was purged with nitrogen for three timesfor and then added with acetic acid (12 mordinary skill in the) and watr (0.4 mt). After stirring for 24 hours at a room temperature, the mixture was placed in an oil bath at 120° C. for 2 days, cooled to room temperature, and the solvent was distilled off under reduced pressure. A resulting crude product was separated and purified by silica gel column chromatography using petroleum ether and methylene chloride (1:1) as eluent to obtain a yellow solid (13.9 mg in 11% yield).

Figure 5:
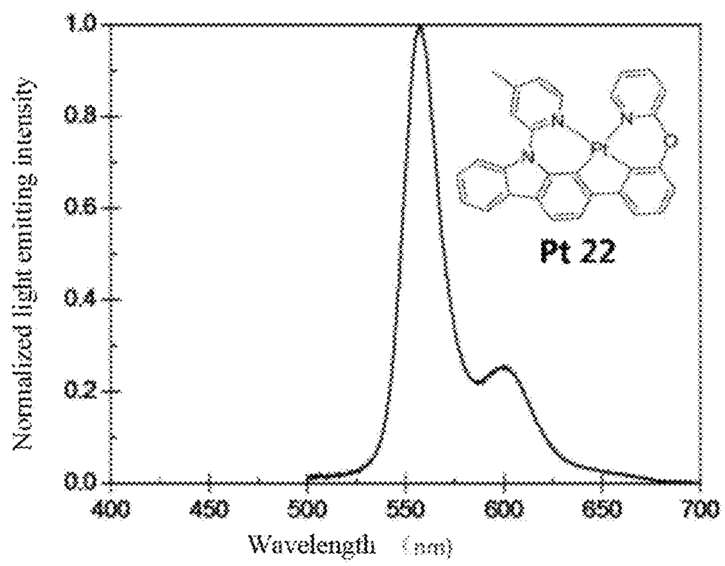
FIG. 5 is a room temperature emission spectrum of a platinum complex Pt 22 in a dichloromethane solution.
Figure 6:
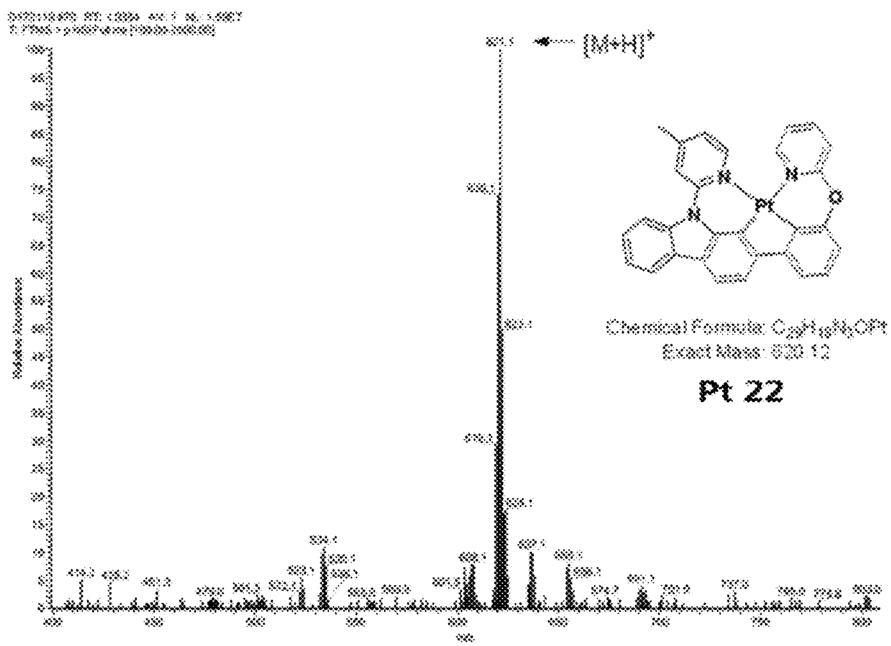
FIG. 6 is a low resolution mass spectrum of the platinum complex Pt 22.

The emission spectrum of the platinum complex Pt 22 in dichloromethane solution and at the room temperature was shown in FIG. 5, a low resolution mass spectrum was shown in FIG. 6, and a high resolution mass spectrum analysis report was shown in FIG. 7. $^1H$ NMR (500 MHz, DMSO-$d_6$): δ 2.56 (s, 3H), 7.00 (dd, J=8.5, 1.0 Hz, 1H), 7.16-7.23 (m, 1H), 7.41-7.47 (m, 2H), 7.58-7.69 (m, 4H), 7.73 (d, J=8.5 Hz, 1H), 7.88 (d, J=8.0 Hz, 1H), 8.23-8.34 (m, 4H), 8.76 (d, J=6.0 Hz, 1H), 8.84-8.86 (m, 1H). HRMS (DART POSITIVE Ion Mode): $C_{29}H_{20}ON_3Pt$, $[M+H]^+$, the calculated value was 621.1249; and the experimental value was 621.1256.

The description above is merely embodiments of the present disclosure, and it should be pointed out that, for a person of ordinary skill in the art, improvements can be made without departing from the concept of the disclosure, but these all belong to the protection scope of the present disclosure.

What is claimed is:

1. A tetradentate cyclometalated platinum complex, wherein the tetradentate cyclometalated platinum complex is selected from a compound as shown in formula I:

(I)

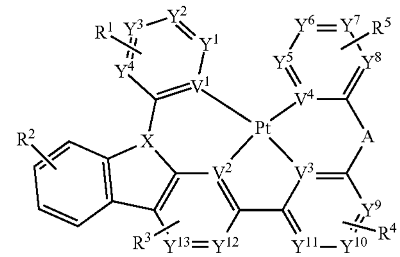

wherein:

each of $V^1$, $V^2$, $V^3$ and $V^4$ is an atom connected with Pt and independently selected from N atoms or C atoms, and $V^1$, $V^2$, $V^3$ and $V^4$ at least comprise two N atoms;

each of $Y^1$, $Y^2$, $Y^3$, $Y^4$, $Y^5$, $Y^6$, $Y^7$, $Y^8$, $Y^9$, $Y^{10}$, $Y^{11}$, $Y^{12}$ and $Y^{13}$ is independently selected from N atoms or CH groups;

A represents O, S, $CH^2$, $CD^2$, $CR^aR^b$, C═O, $SiR^aR^b$, $GeH_2$, $GeR^aR^b$, NH, $NR^c$, PH, $PR^c$, $R^cP$═O, $AsR^c$, $R^cAs$═O, S═O, $SO_2$, Se, Se═O, $SeO_2$, BH, BRc, $R^cBi$═O, BiH, or $BiR^c$;

X represents N, B, CH, CD, $CR^a$, SiH, SiD, $SiR^a$, GeH, GeD, $GeR^d$, P, P═O, As, As═O, Bi or Bi═O;

each of $R^1$, $R^2$, $R^3$, $R^4$ and $R^5$ independently represents mono-, di-, tri-, tetra-substitutions or unsubstitutions, and each of $R^1$, $R^2$, $R^3$, $R^4$ and $R^5$ is independently hydrogen, deuterium, aryl, cycloalkyl, cycloalkenyl, heterocyclyl, heteroaryl, alkyl, alkenyl, alkynyl, halogen, hydroxyl, sulfydryl, nitro, cyano, amino, monoalkylamino or dialkylamino, monoarylamino or diarylamino, alkoxy, aryloxy, haloalkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramido, imino, sulfo, carboxyl, thiol, substituted silyl, polymeric groups or a combination thereof; and two or more adjacent $R^1$, $R^2$, $R^3$, $R^4$ and $R^5$ can be optionally connected to form a fused ring.

2. The tetradentate cyclometalated platinum complex according to claim 1, wherein the platinum complex has a structure selected from one of the following:

Pt 1

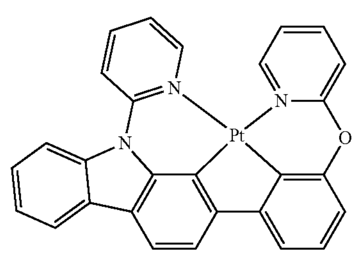

Pt 2

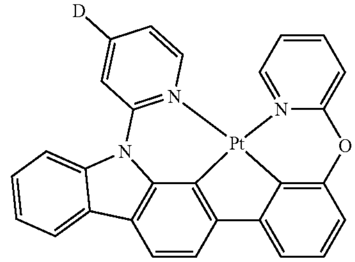

-continued
Pt 3
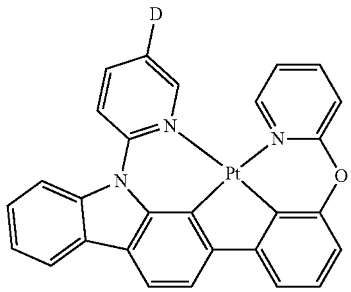
Pt 4
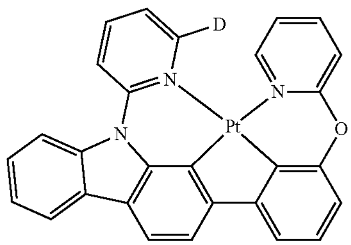
Pt 5
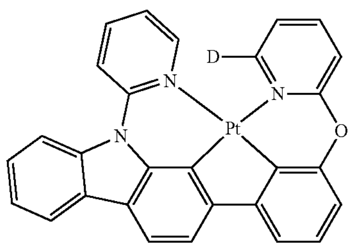
Pt 6
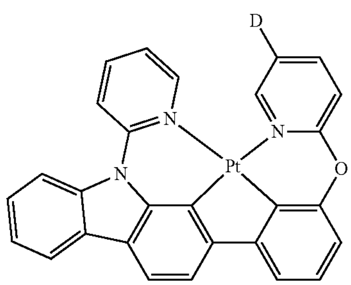
Pt 7
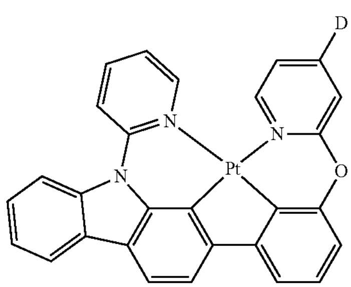
Pt 8
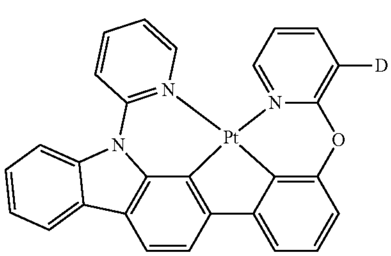
-continued
Pt 9
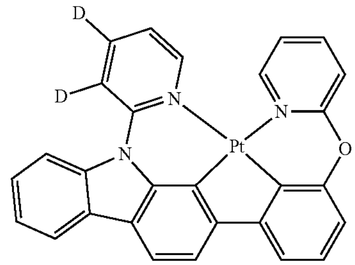
Pt 10
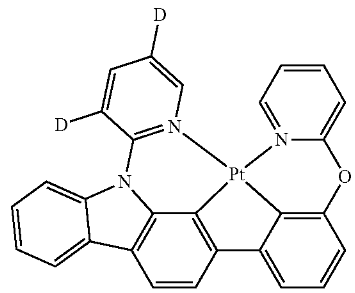
Pt 11
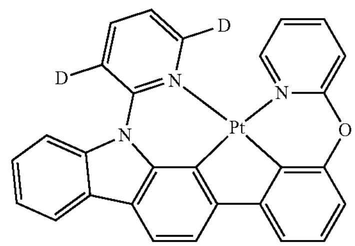
Pt 12
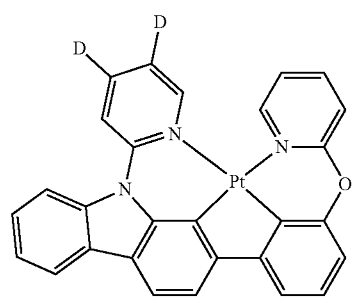
Pt 13
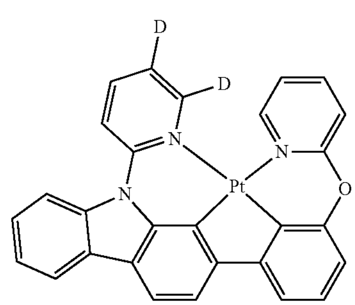

-continued
Pt 14
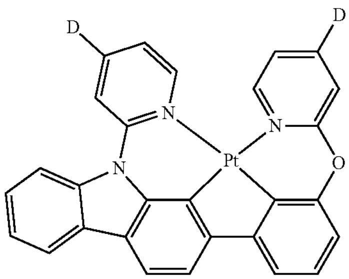
Pt 15
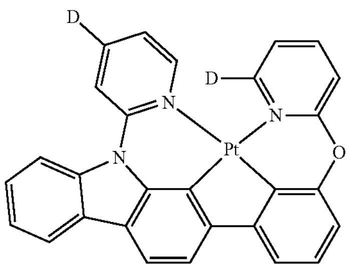
Pt 16
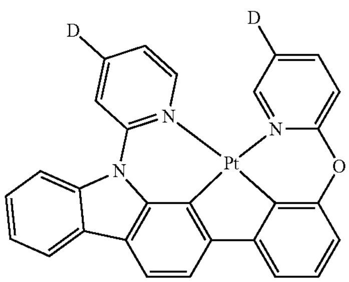
Pt 17
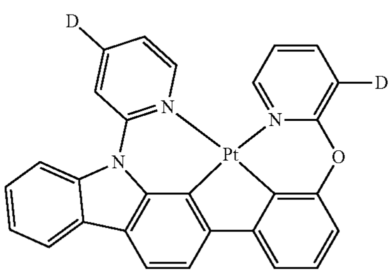
Pt 18
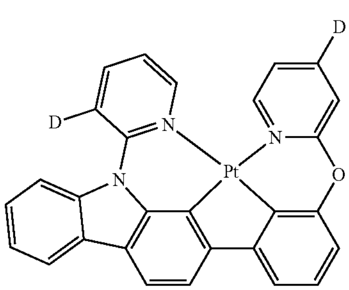
-continued
Pt 19
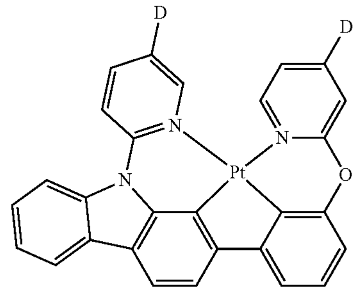
Pt 20
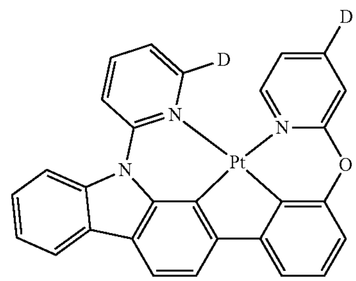
Pt 21
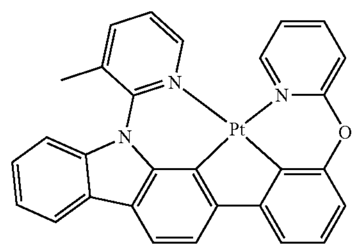
Pt 22
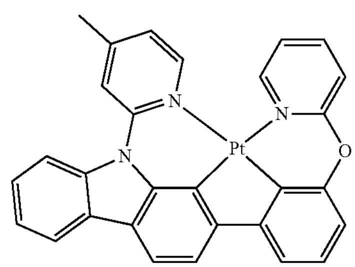
Pt 23
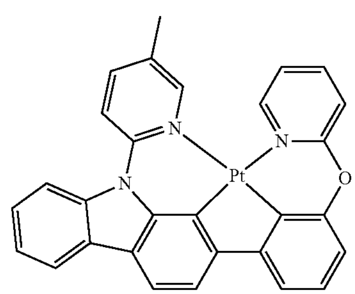
Pt 24
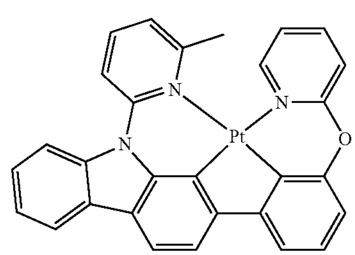

-continued
Pt 25
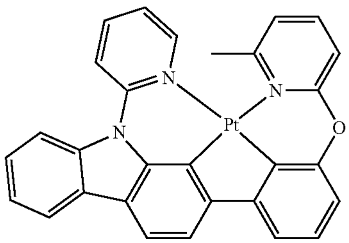
Pt 26
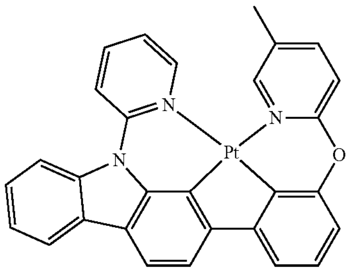
Pt 27
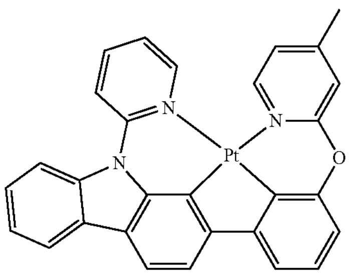
Pt 28
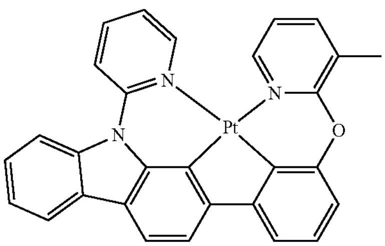
Pt 29
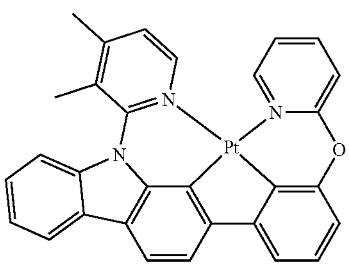
Pt 30
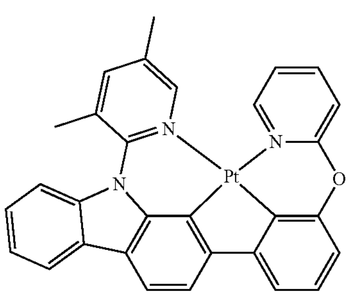
-continued
Pt 31
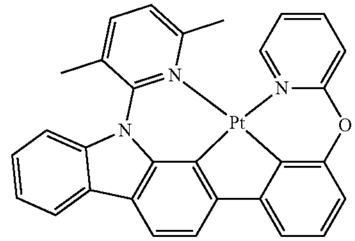
Pt 32
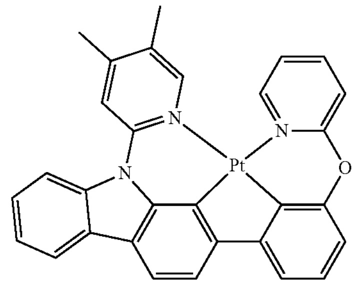
Pt 33
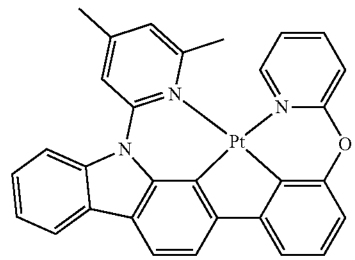
Pt 34
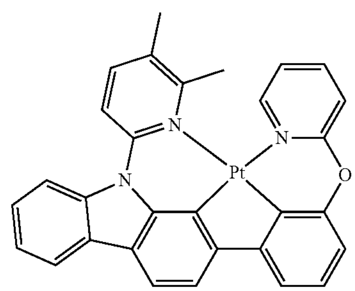
Pt 35
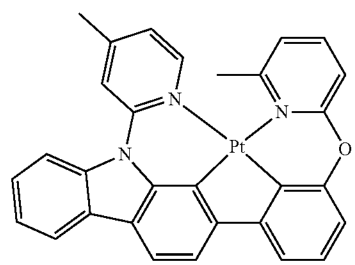
Pt 36
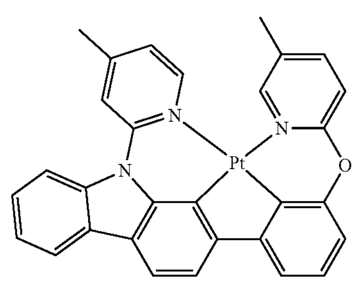

-continued
Pt 37
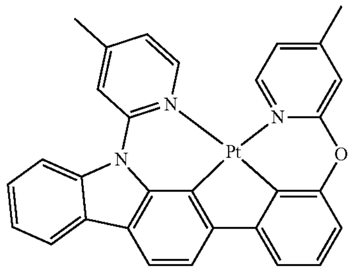
Pt 38
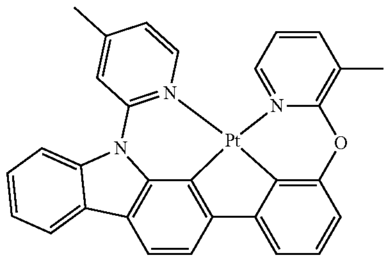
Pt 39
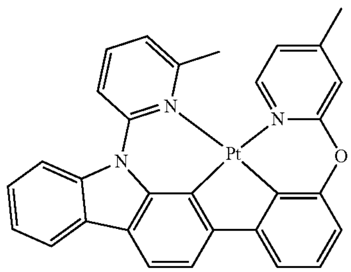
Pt 40
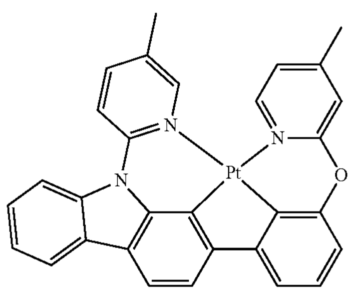
Pt 41
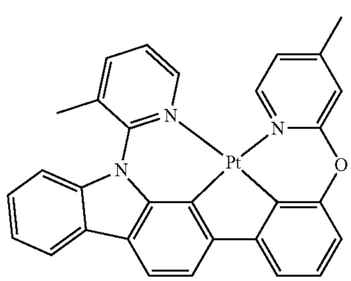
-continued
Pt 42
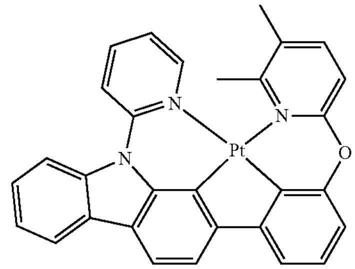
Pt 43
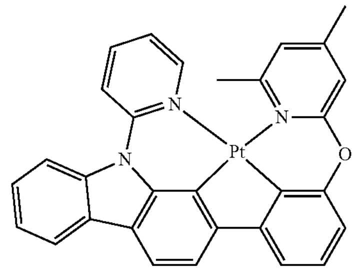
Pt 44
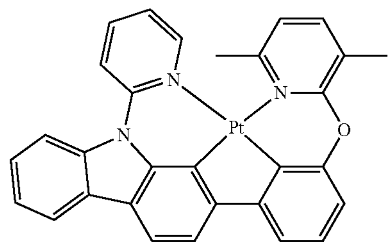
Pt 45
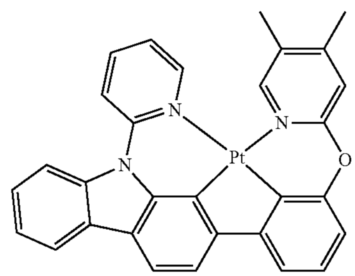
Pt 46
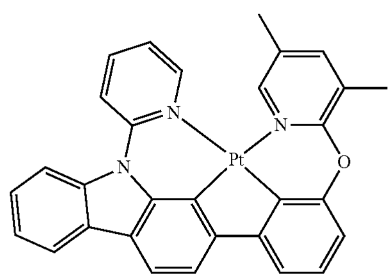
Pt 47
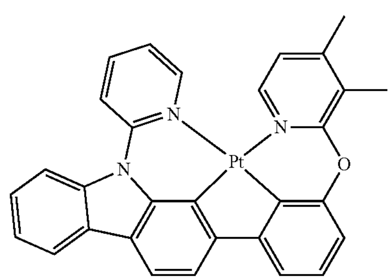

-continued
Pt 48
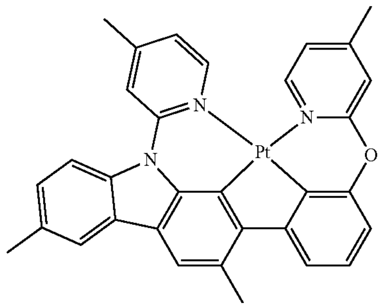
Pt 49
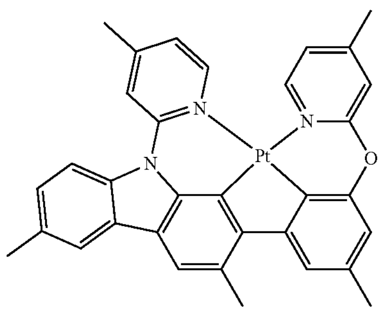
Pt 50
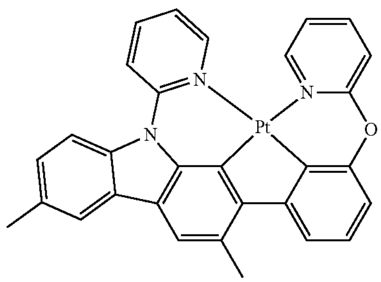
Pt 51
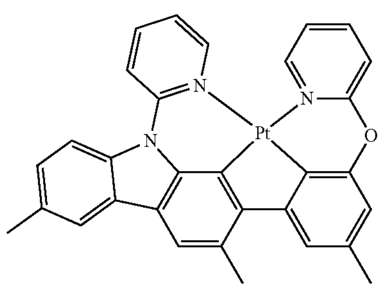
Pt 52
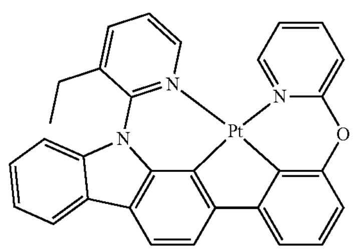
-continued
Pt 53
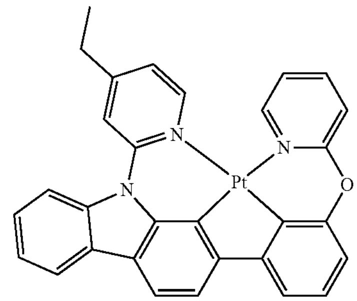
Pt 54
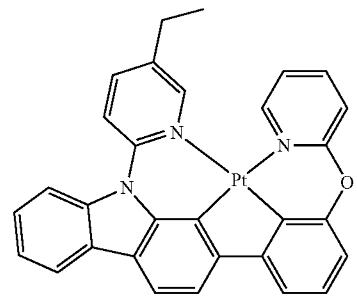
Pt 55
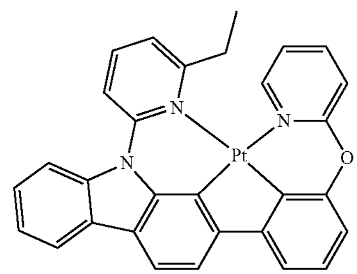
Pt 56
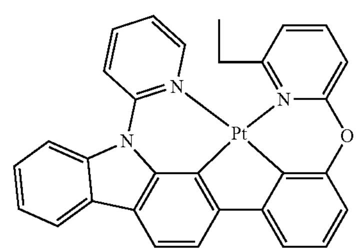
Pt 57
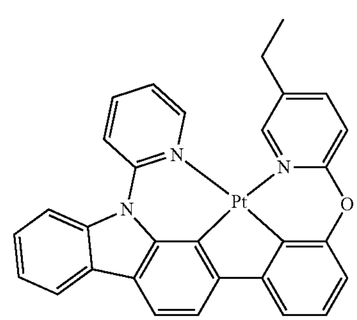

-continued
Pt 58
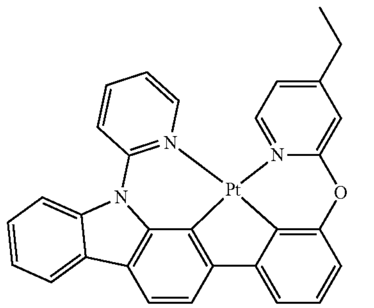
Pt 59
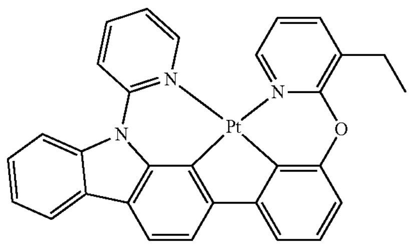
Pt 60
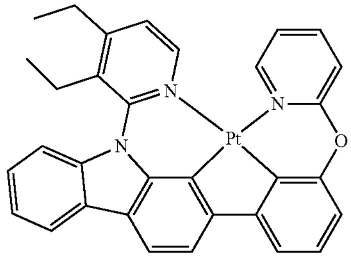
Pt 61
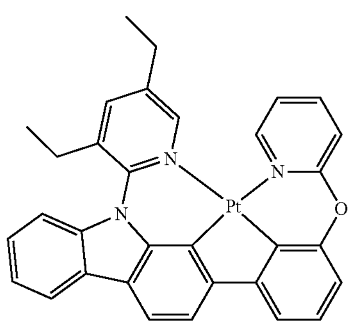
Pt 62
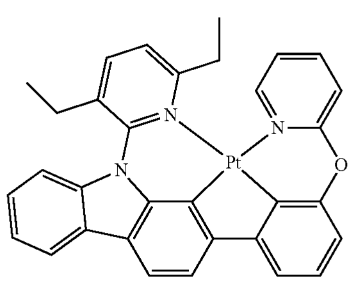
-continued
Pt 63
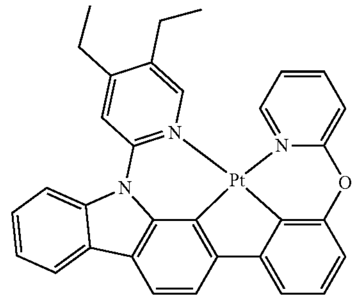
Pt 64
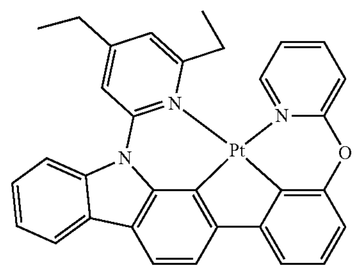
Pt 65
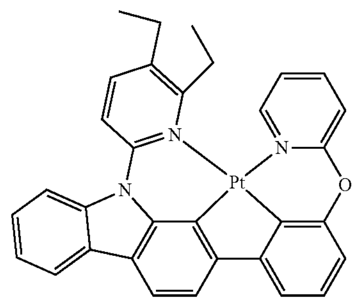
Pt 66
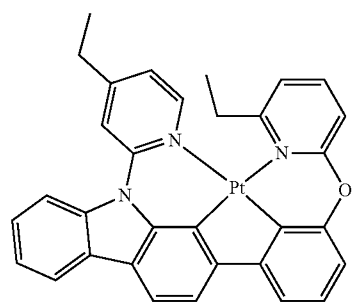
Pt 67
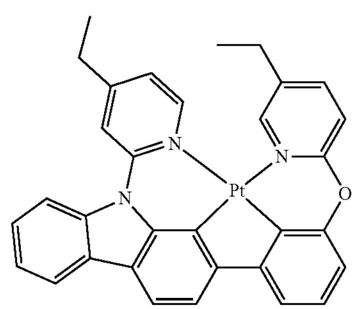

-continued
Pt 68
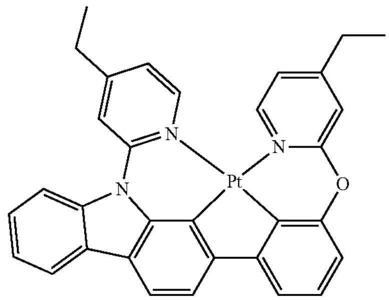
Pt 69
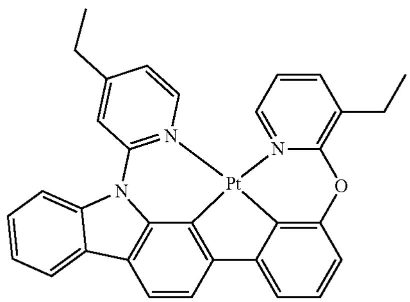
Pt 70
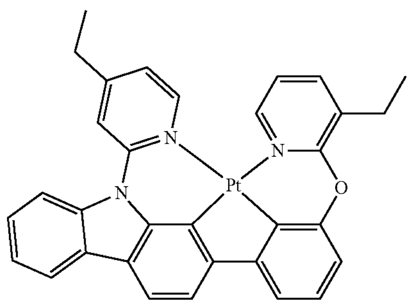
Pt 71
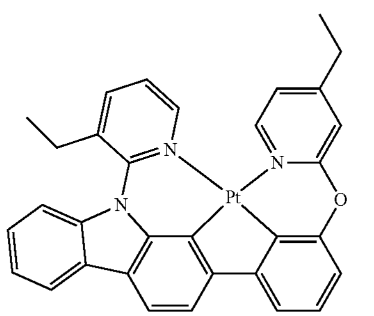
Pt 72
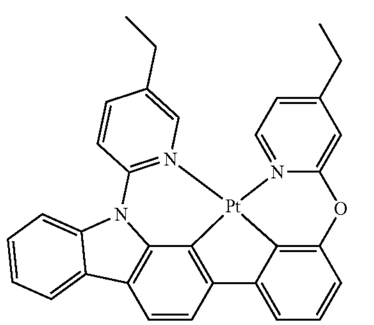
-continued
Pt 73
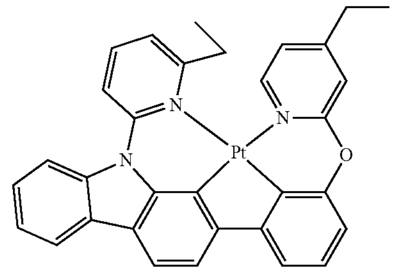
Pt 74
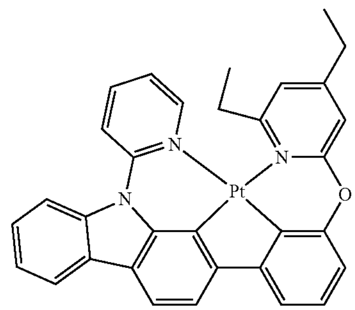
Pt 75
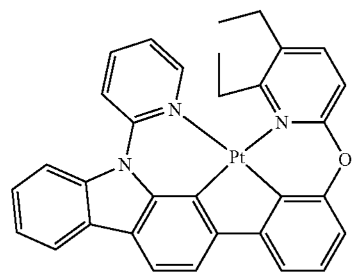
Pt 76
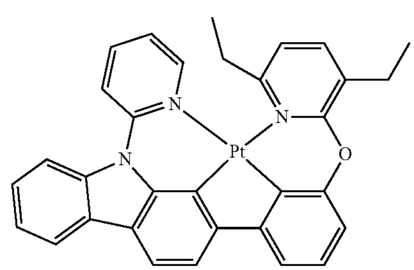
Pt 77
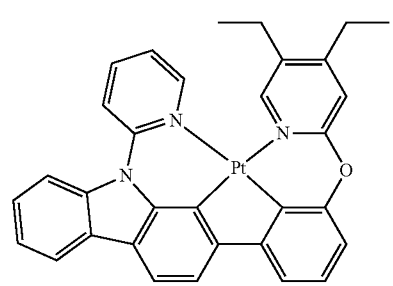

-continued
Pt 78
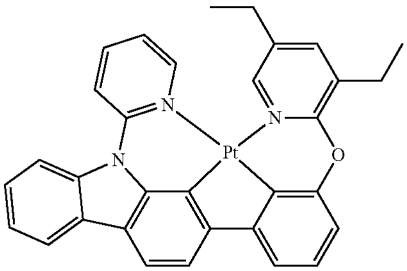
Pt 79
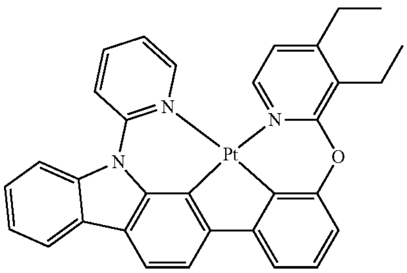
Pt 80
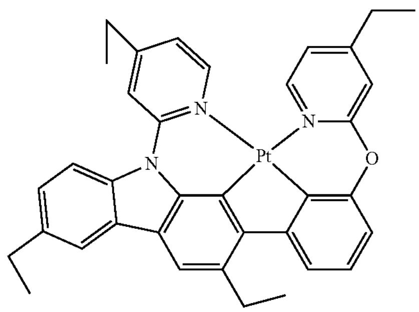
Pt 81
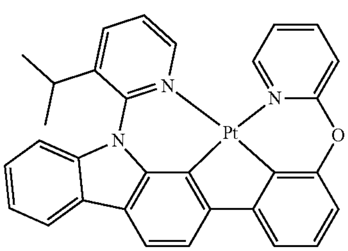
Pt 82
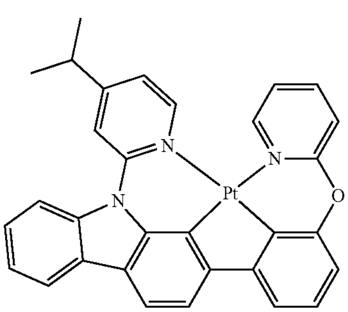
-continued
Pt 83
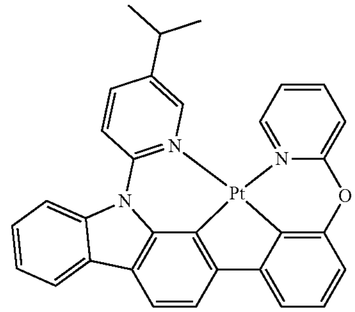
Pt 84
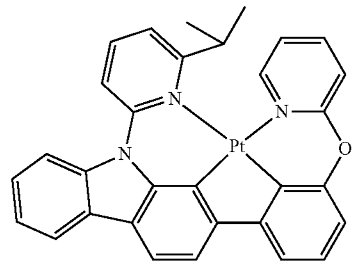
Pt 85
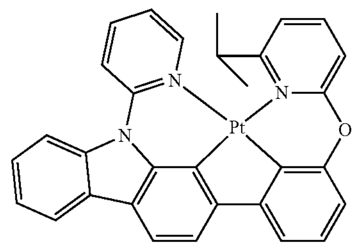
Pt 86
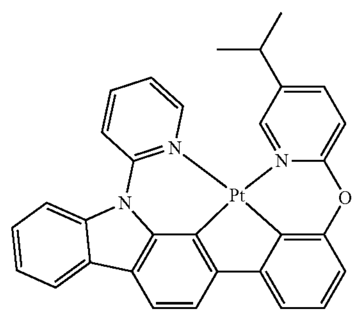
Pt 87
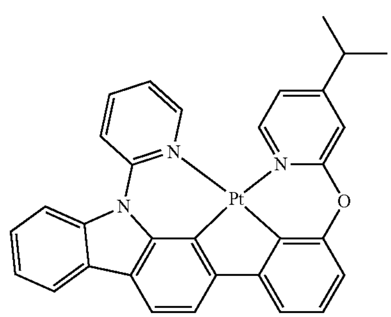

-continued
Pt 88
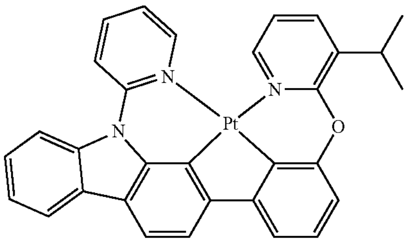
Pt 89
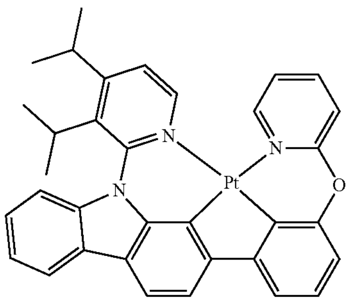
Pt 90
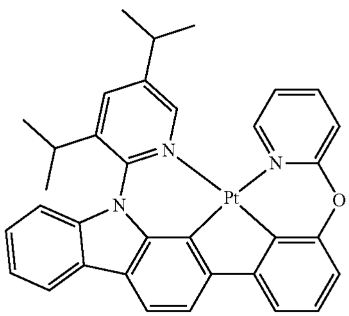
Pt 91
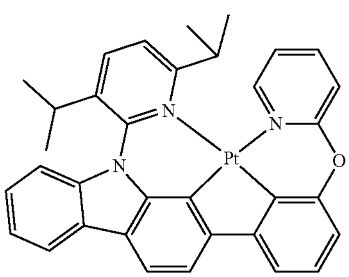
Pt 92
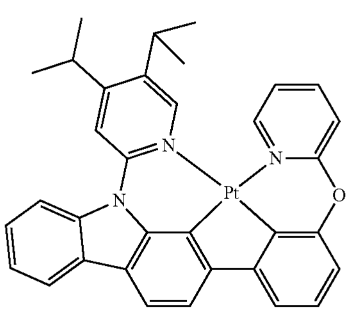
-continued
Pt 93
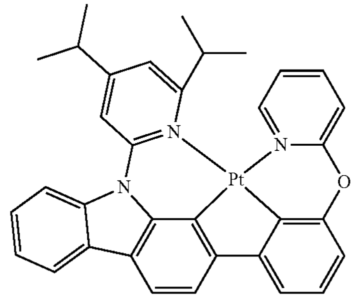
Pt 94
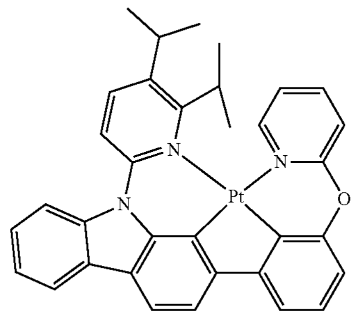
Pt 95
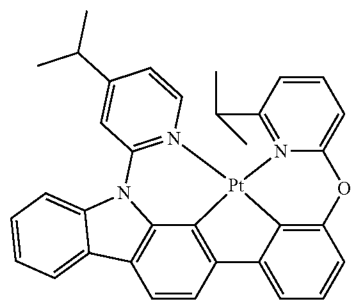
Pt 96
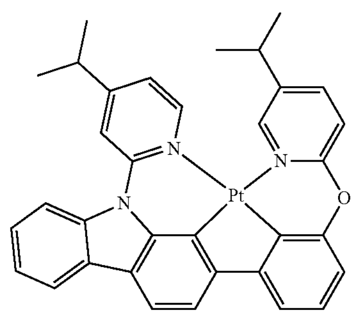
Pt 97
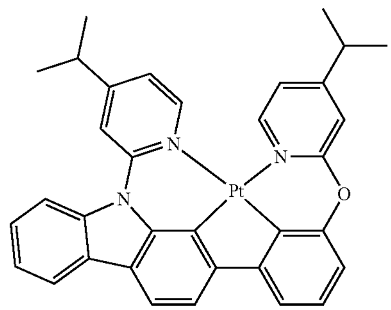

-continued
Pt 98
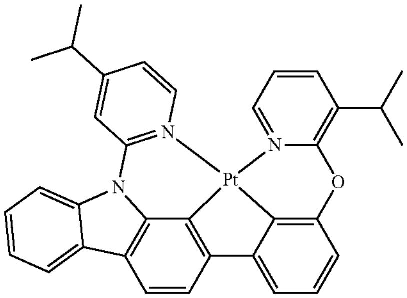
Pt 99
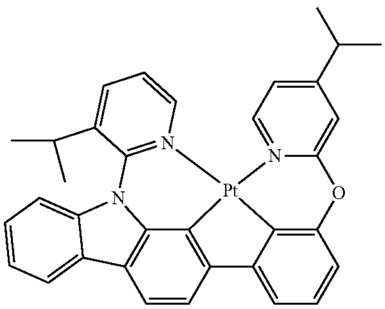
Pt 100
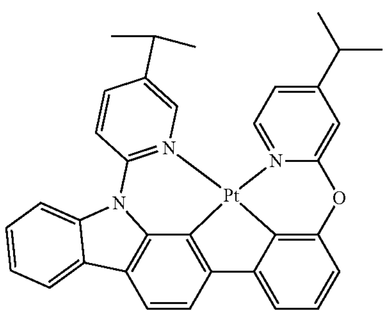
Pt 101
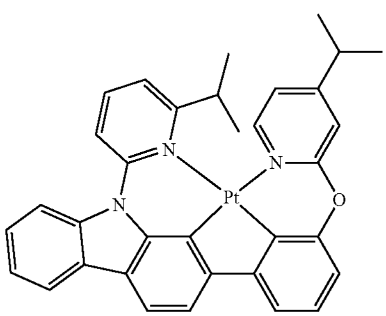
Pt 102
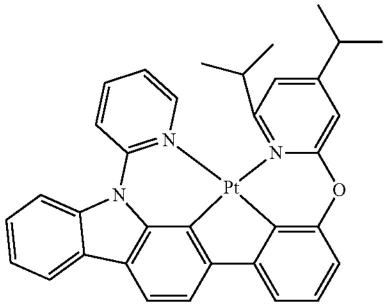
-continued
Pt 103
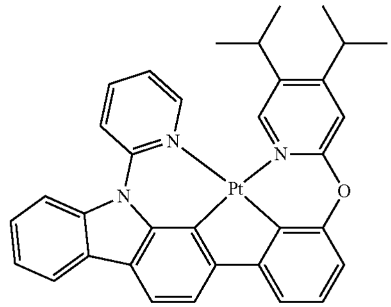
Pt 104
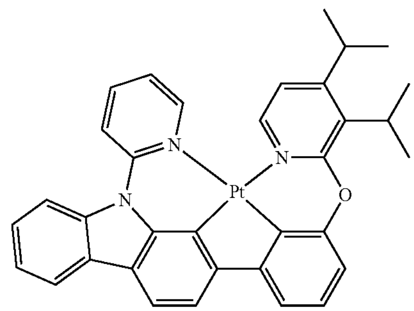
Pt 105
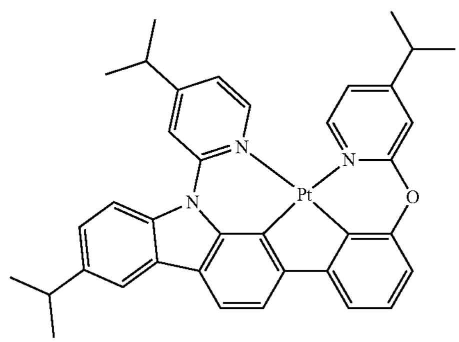
Pt 106
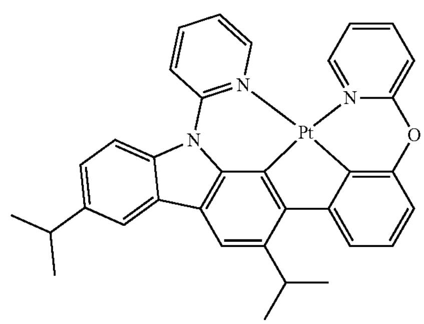

-continued
Pt 107
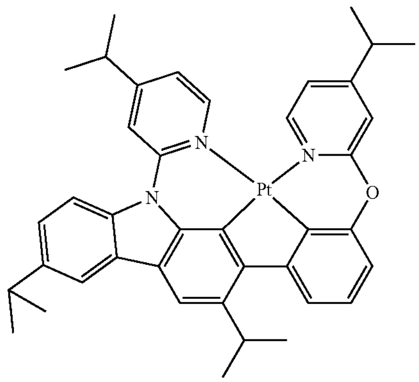
Pt 108
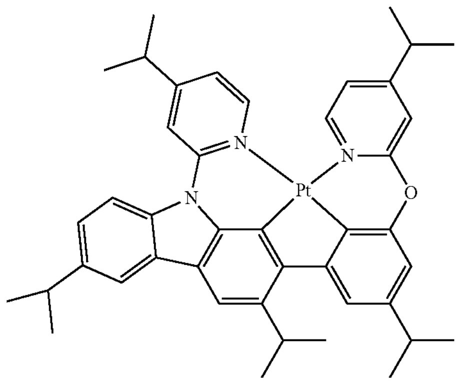
Pt 109
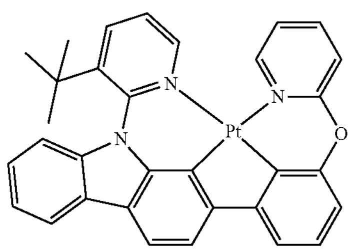
Pt 110
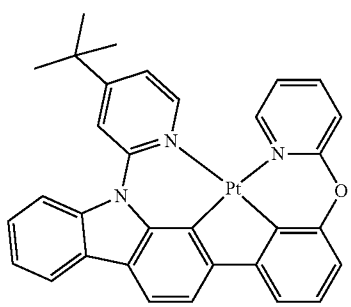
Pt 111
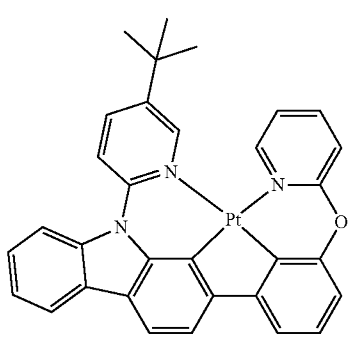
-continued
Pt 112
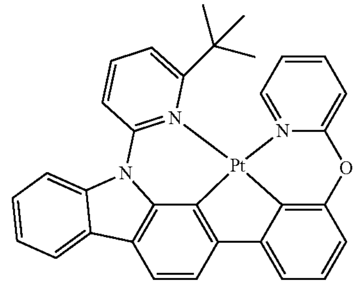
Pt 113
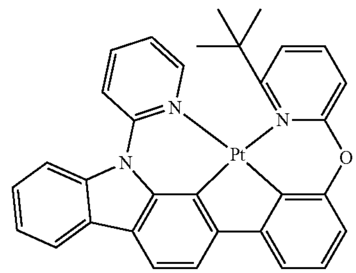
Pt 114
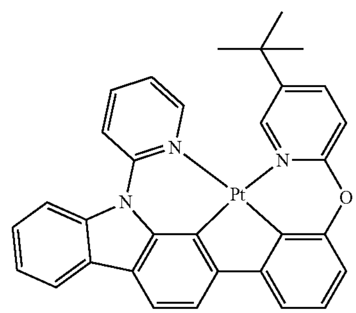
Pt 115
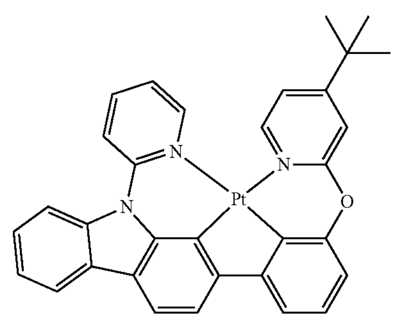
Pt 116
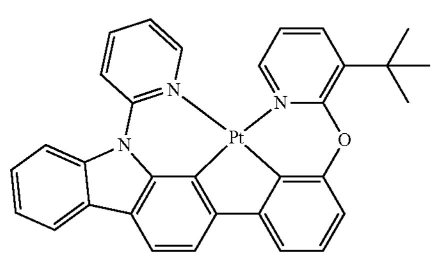

-continued
Pt 117
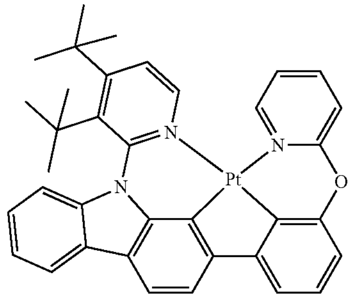
Pt 118
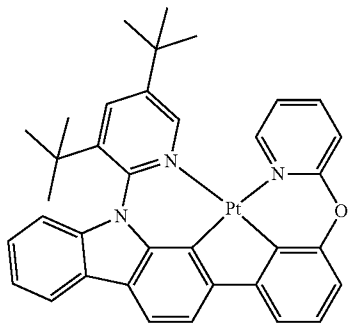
Pt 119
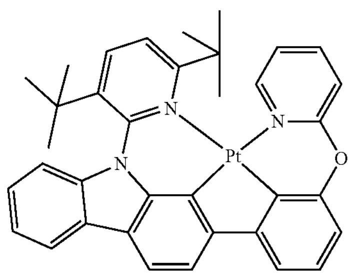
Pt 120
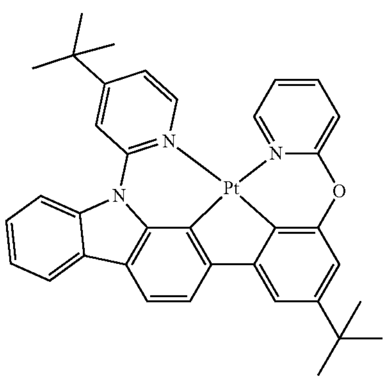
Pt 121
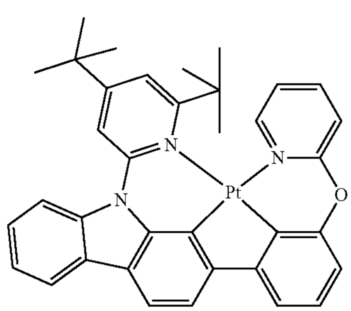
-continued
Pt 122
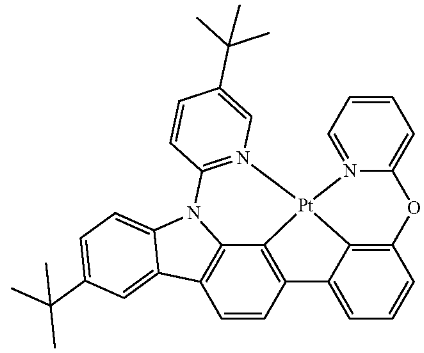
Pt 123
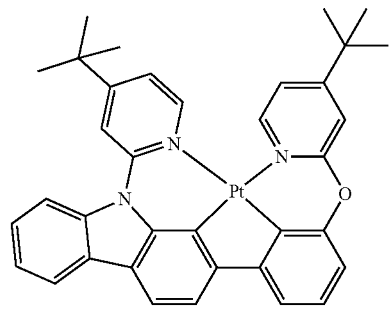
Pt 124
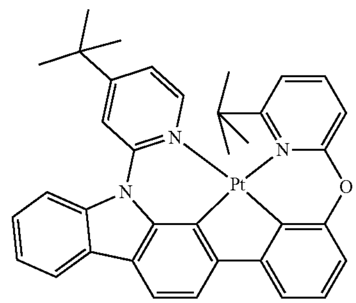
Pt 125
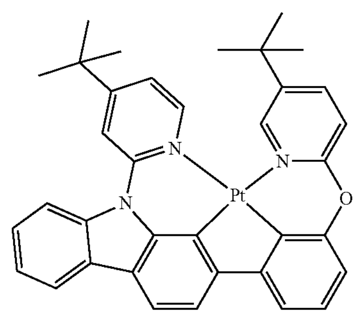
Pt 126
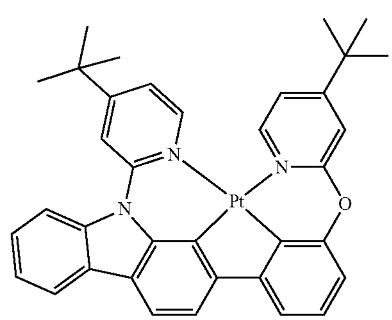

-continued
Pt 127
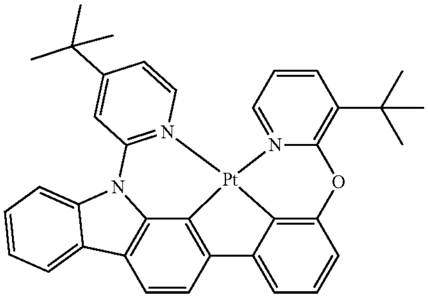
Pt 128
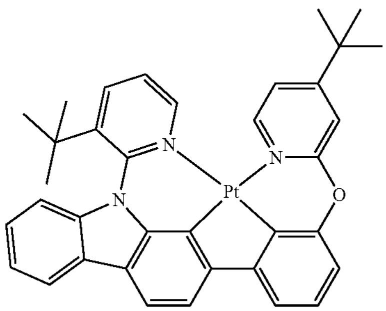
Pt 129
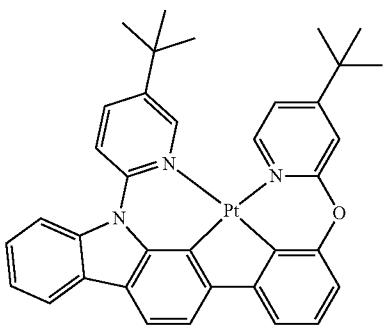
Pt 130
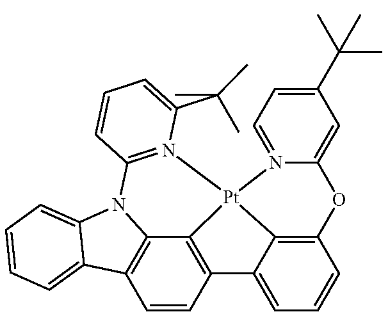
Pt 131
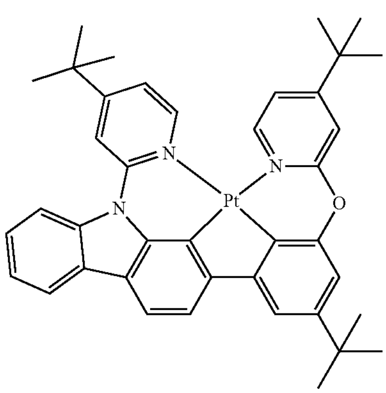
-continued
Pt 132
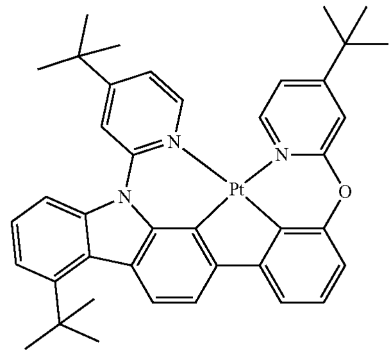
Pt 133
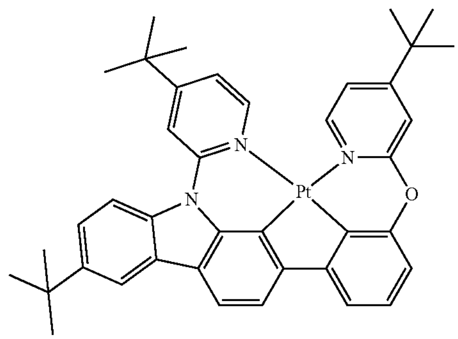
Pt 134
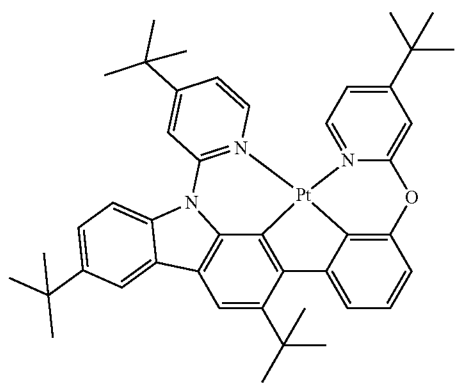
Pt 135
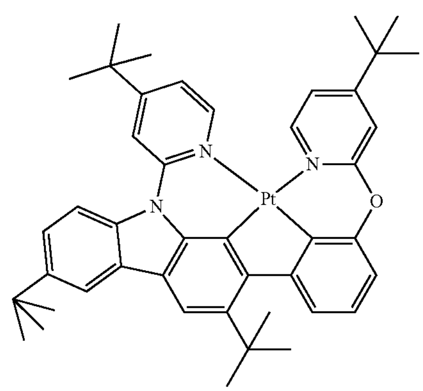

-continued
Pt 136
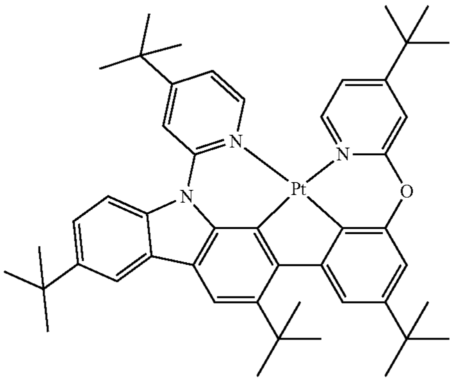
Pt 137
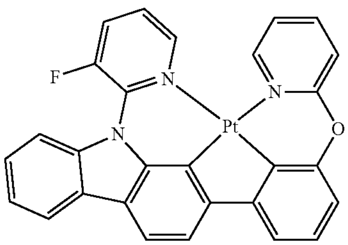
Pt 138
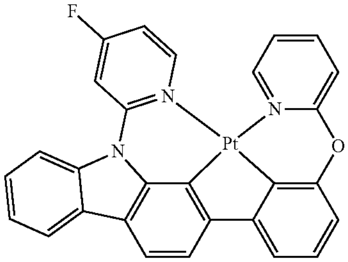
Pt 139
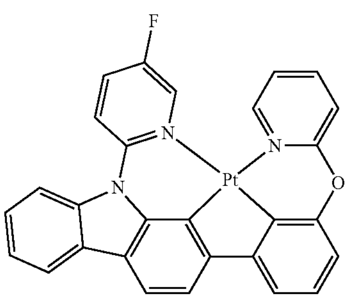
Pt 140
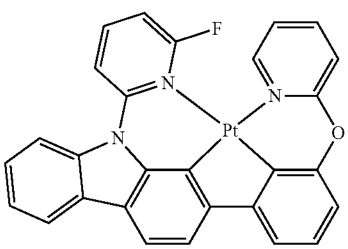
-continued
Pt 141
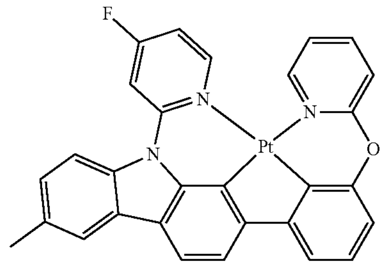
Pt 142
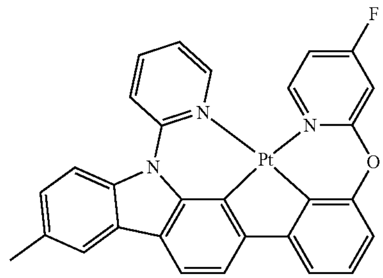
Pt 143
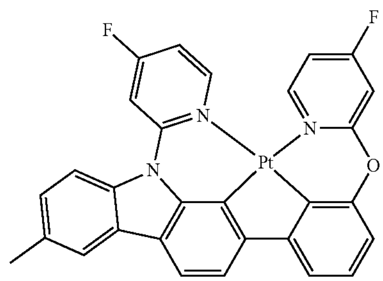
Pt 144
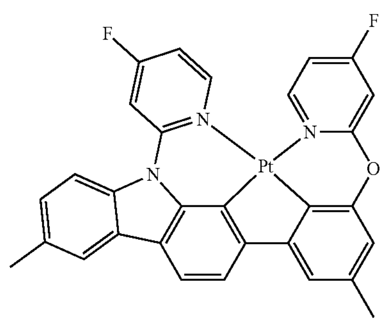
Pt 145
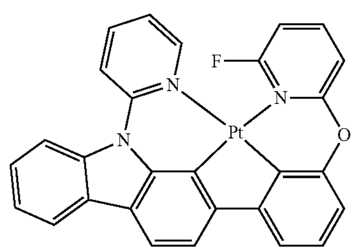

-continued
Pt 146
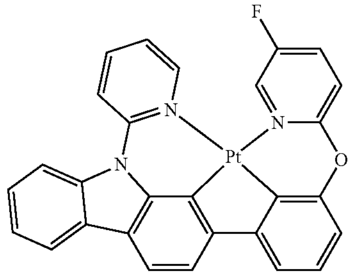
Pt 147
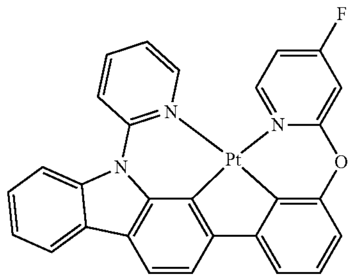
Pt 148
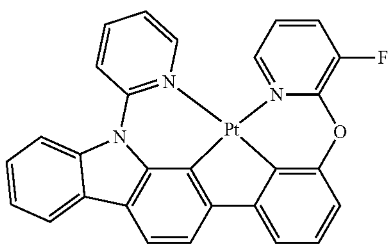
Pt 149
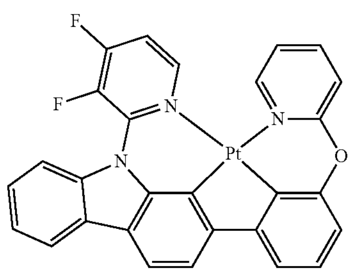
Pt 150
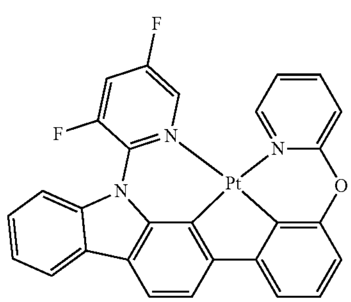
Pt 151
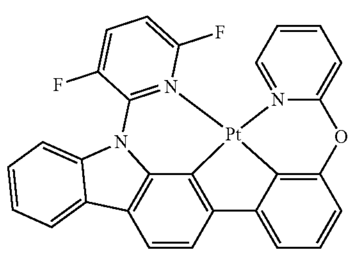
-continued
Pt 152
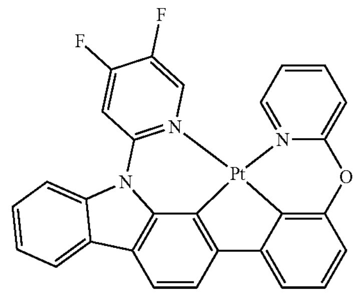
Pt 153
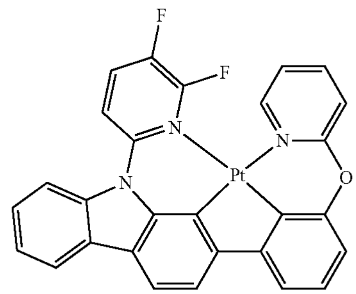
Pt 154
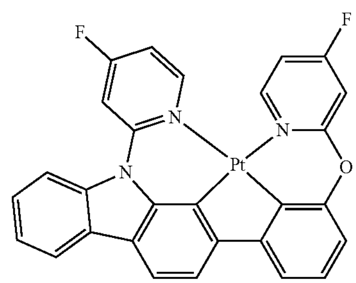
Pt 155
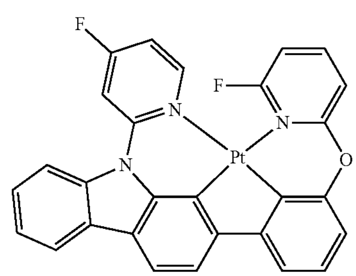
Pt 156
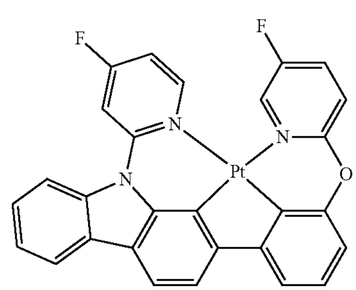

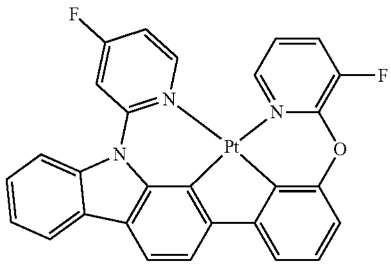
Pt 157
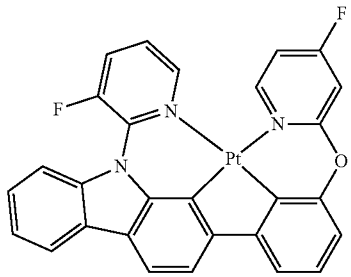
Pt 158
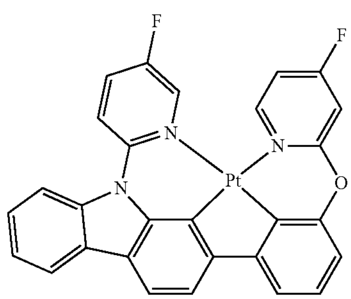
Pt 159
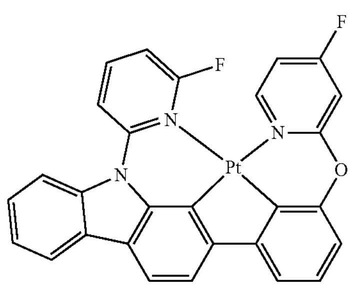
Pt 160
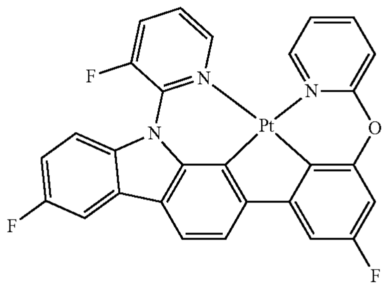
Pt 161
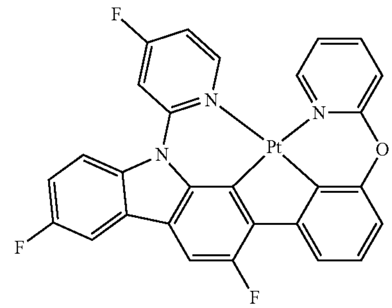
Pt 162
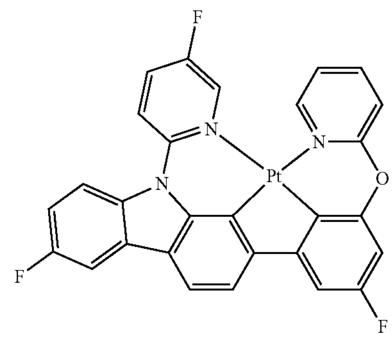
Pt 163
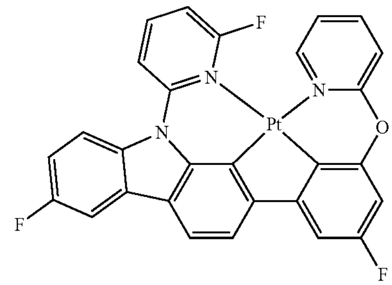
Pt 164
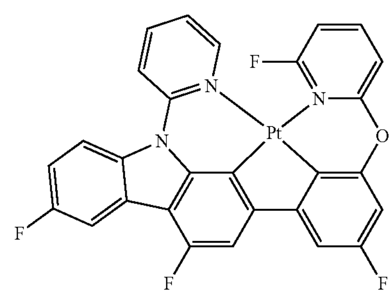
Pt 165
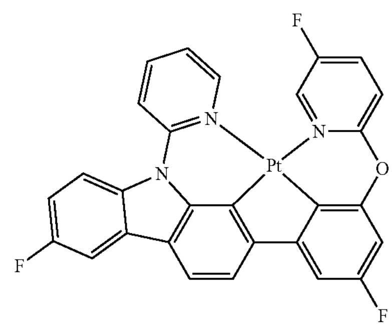
Pt 166

Pt 167
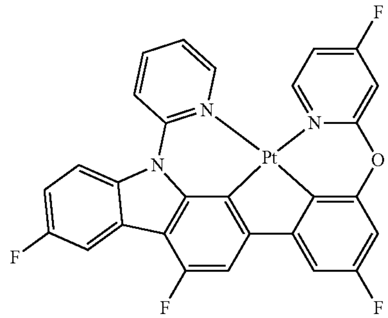
Pt 168
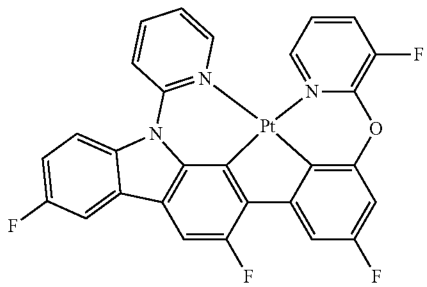
Pt 169
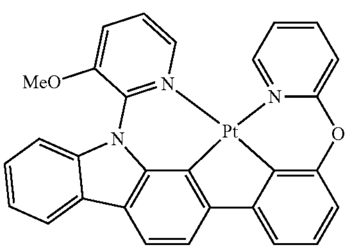
Pt 170
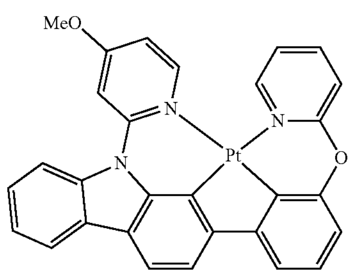
Pt 171
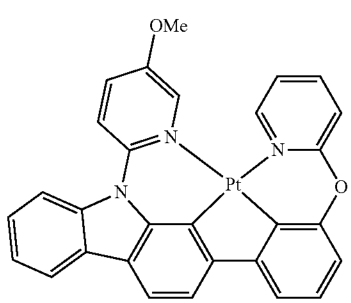
Pt 172
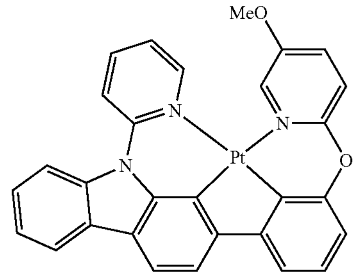
Pt 173
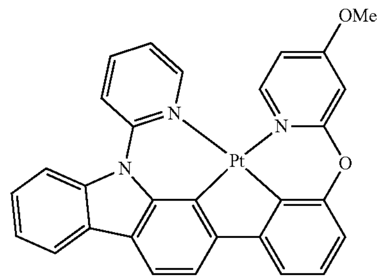
Pt 174
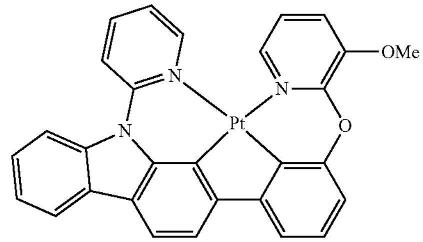
Pt 175
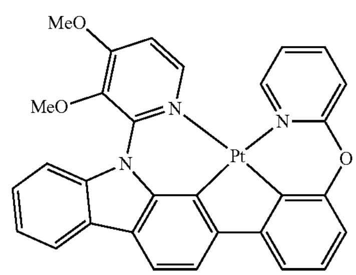
Pt 176
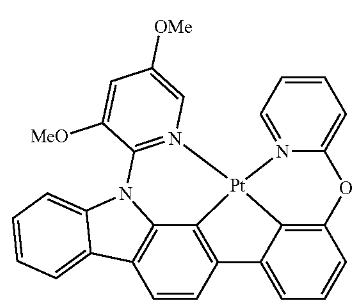

-continued
Pt 177
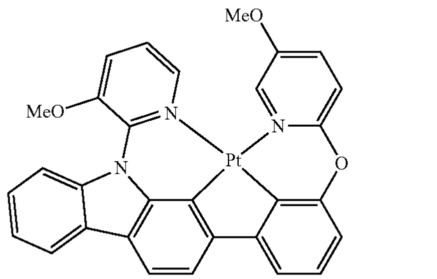
Pt 178
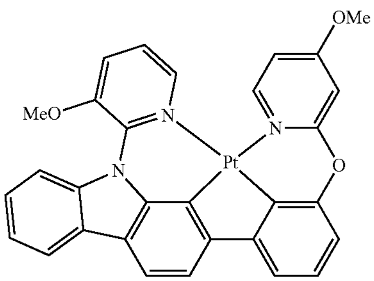
Pt 179
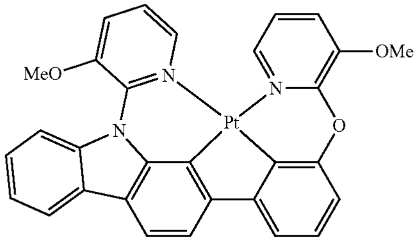
Pt 180
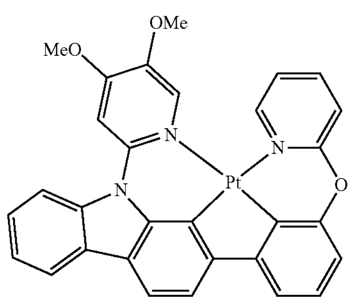
Pt 181
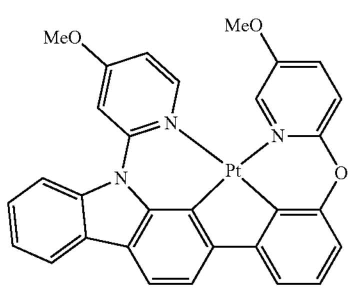
-continued
Pt 182
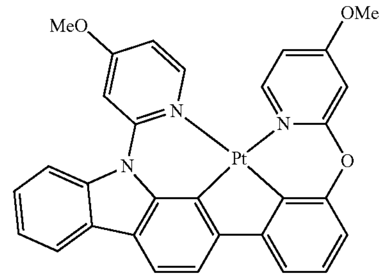
Pt 183
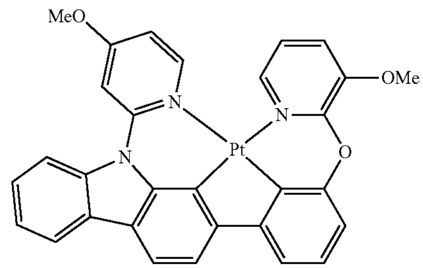
Pt 184
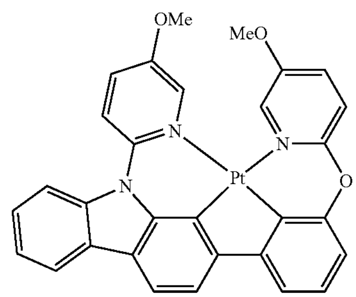
Pt 185
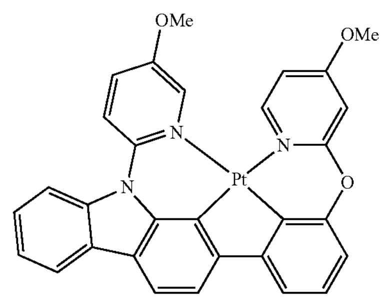
Pt 186
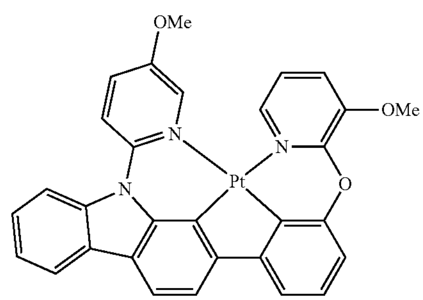

-continued
Pt 187
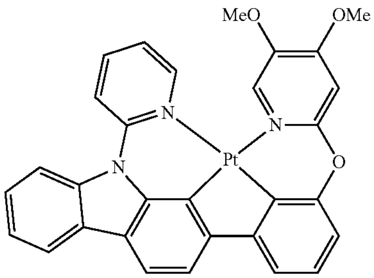
Pt 188
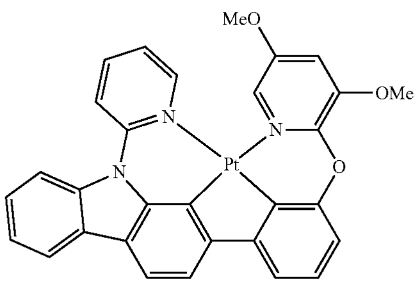
Pt 189
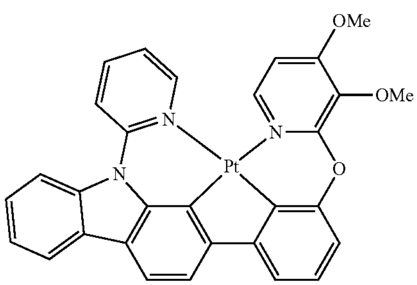
Pt 190
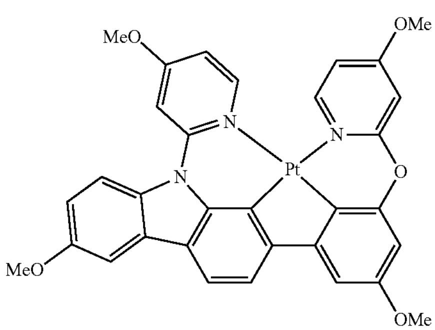
Pt 191
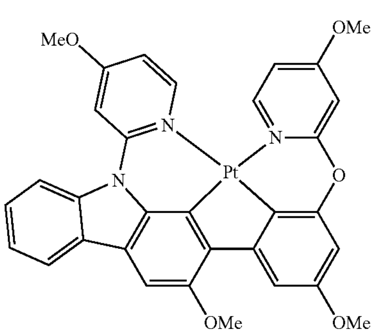
-continued
Pt 192
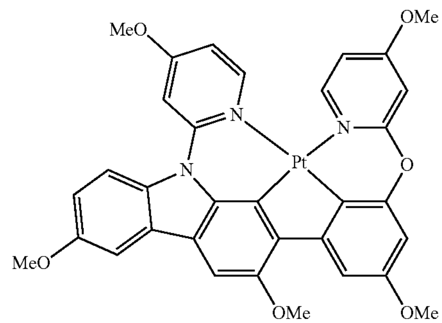
Pt 193
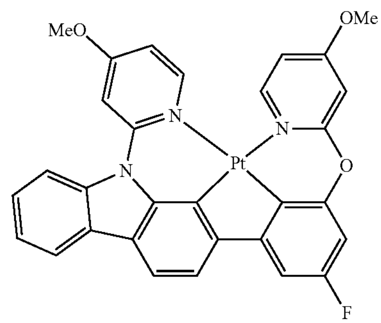
Pt 194
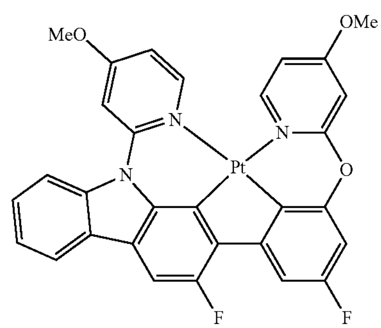
Pt 195
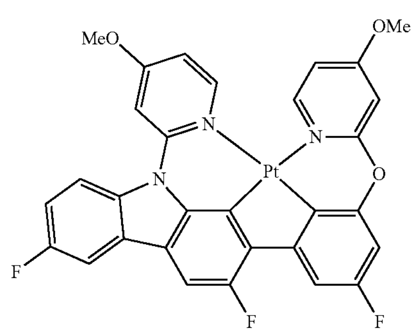
Pt 196
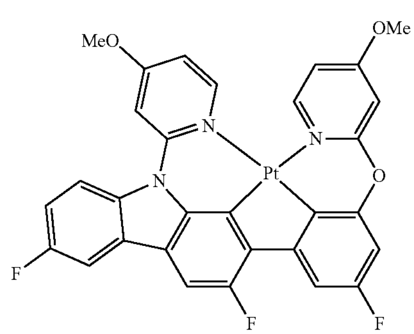

-continued
Pt 197
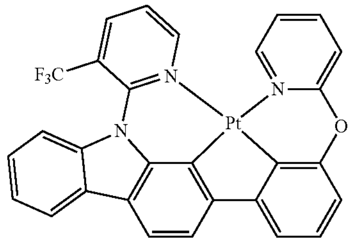
Pt 198
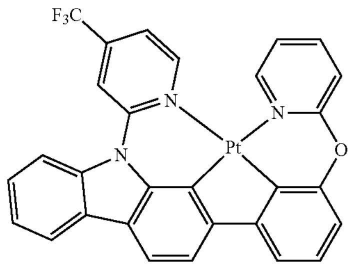
Pt 199
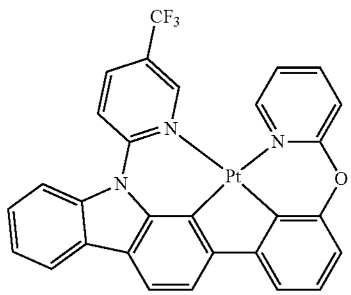
Pt 200
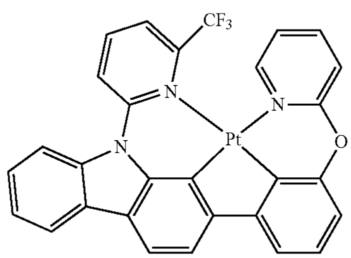
Pt 201
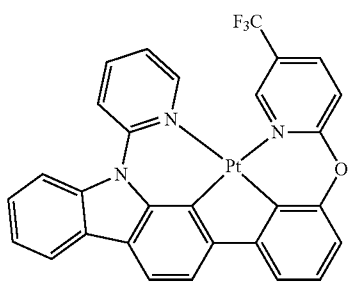
Pt 202
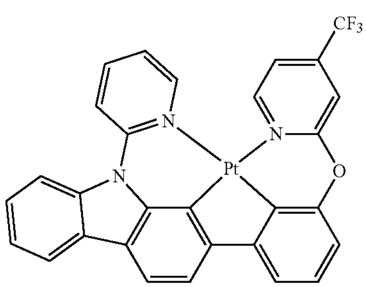
-continued
Pt 203
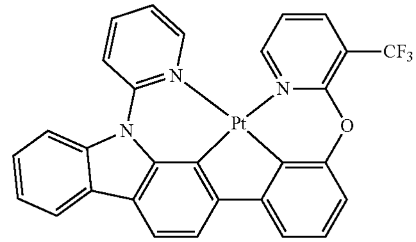
Pt 204
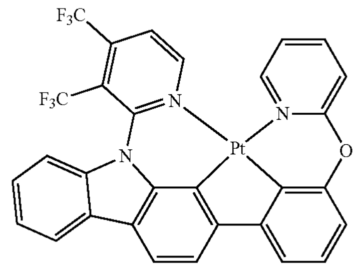
Pt 205
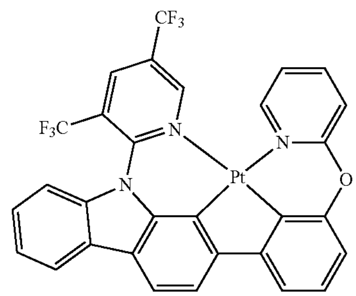
Pt 206
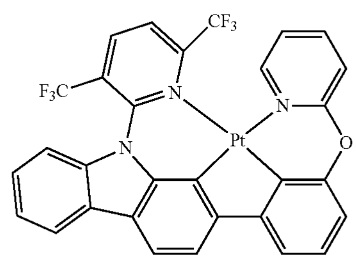
Pt 207
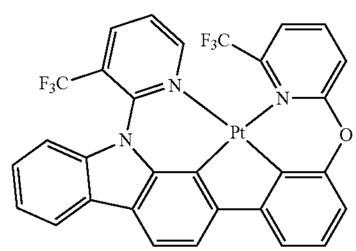
Pt 208
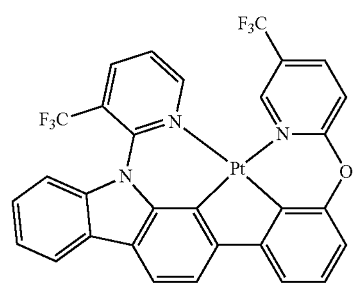

-continued
Pt 209
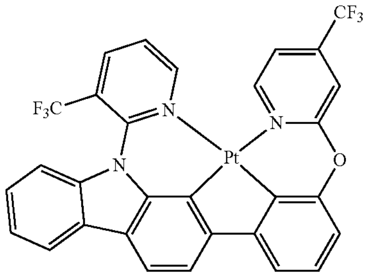
Pt 210
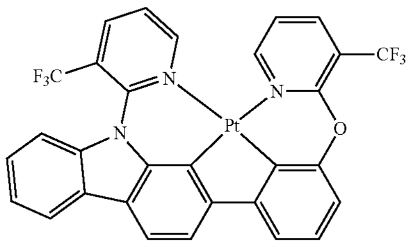
Pt 211
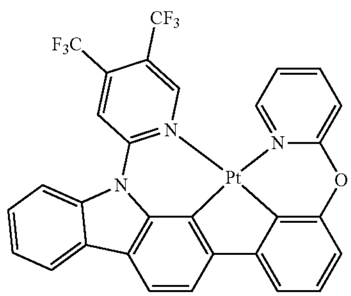
Pt 212
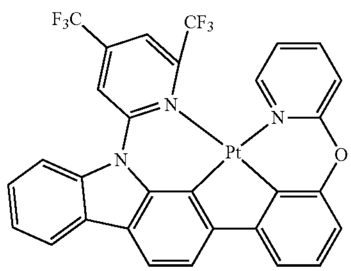
Pt 213
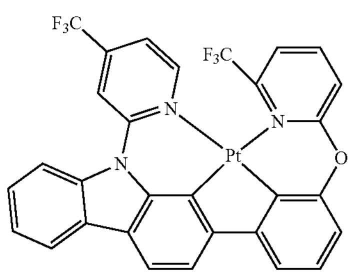
Pt 214
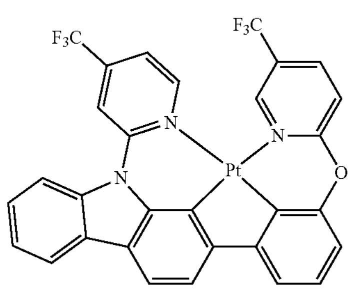
-continued
Pt 215
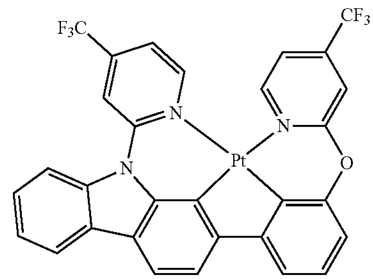
Pt 216
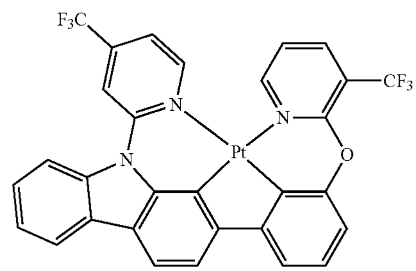
Pt 217
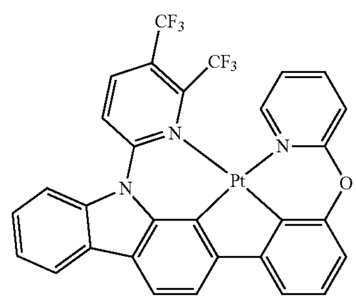
Pt 218
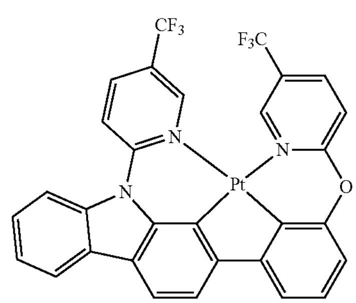
Pt 219
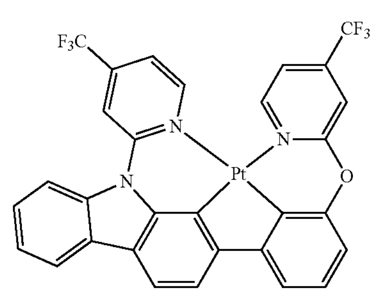

Pt 220
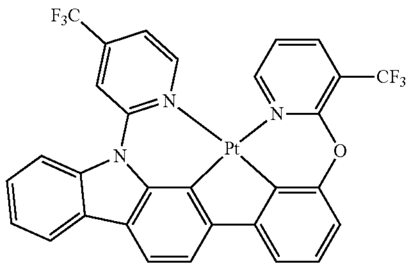
Pt 221
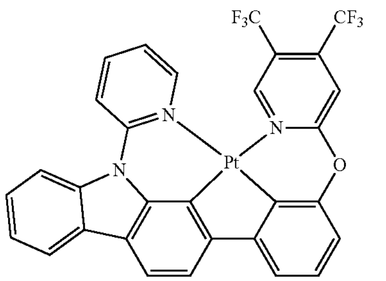
Pt 222
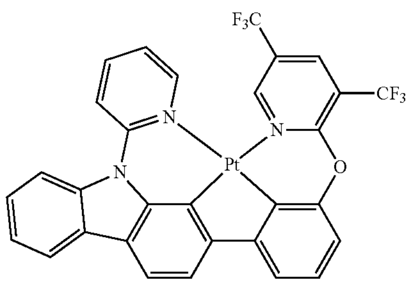
Pt 223
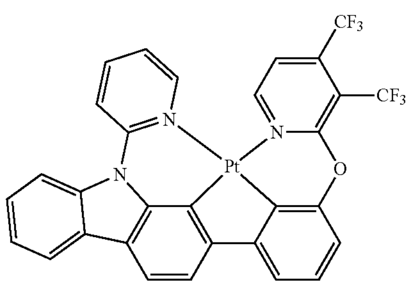
Pt 224
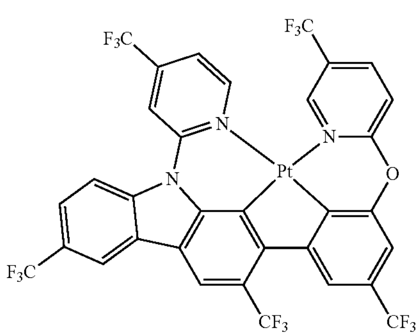
Pt 225
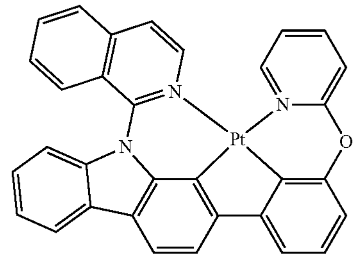
Pt 226
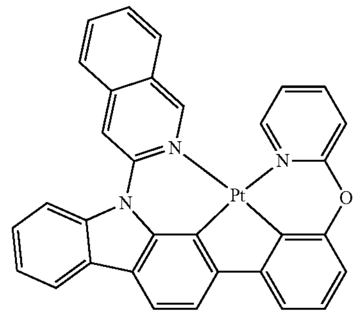
Pt 227
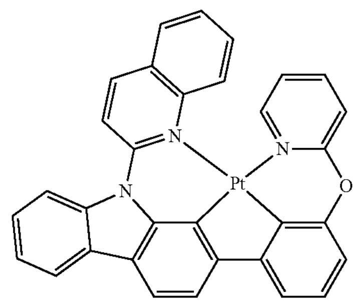
Pt 228
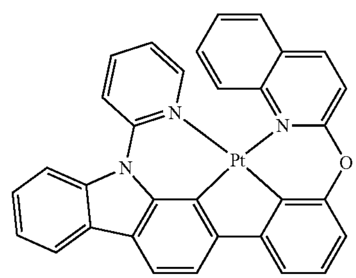
Pt 229
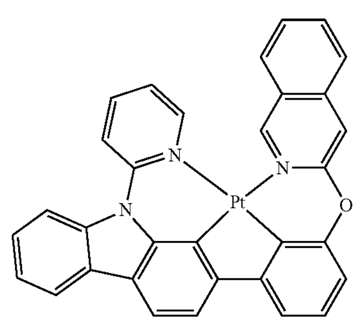

Pt 230
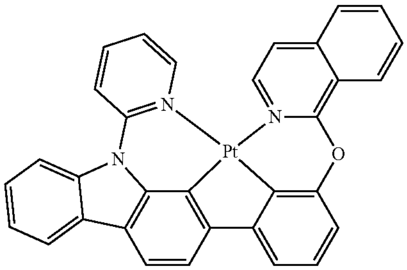
Pt 231
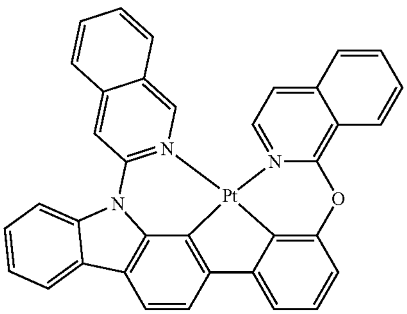
Pt 232
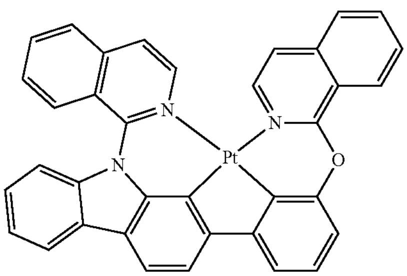
Pt 233
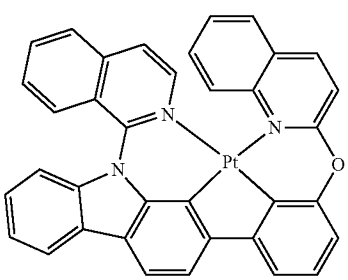
Pt 234
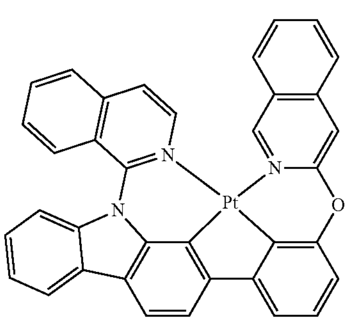
Pt 235
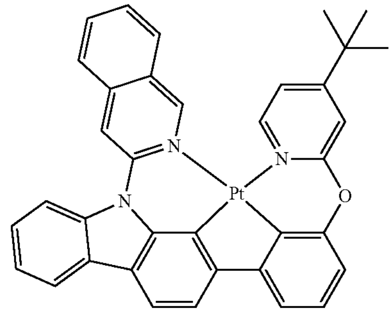
Pt 236
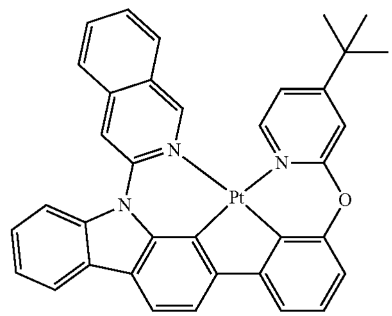
Pt 237
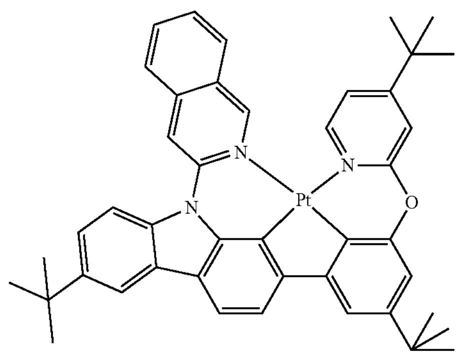
Pt 238
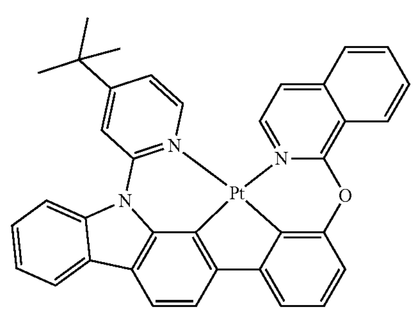

-continued
Pt 239
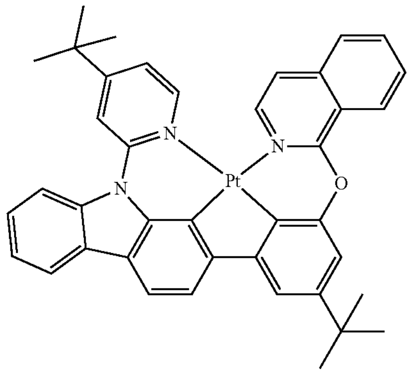
Pt 240
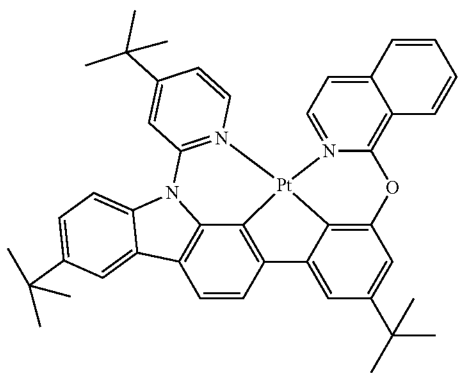
Pt 241
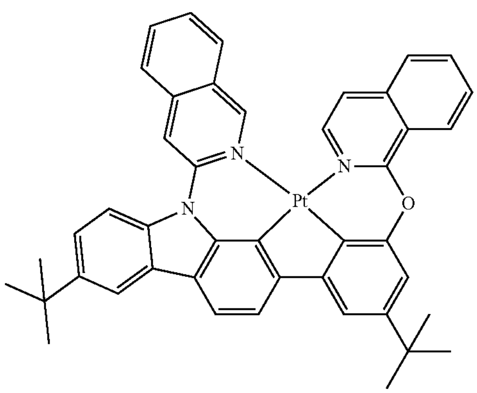
Pt 242
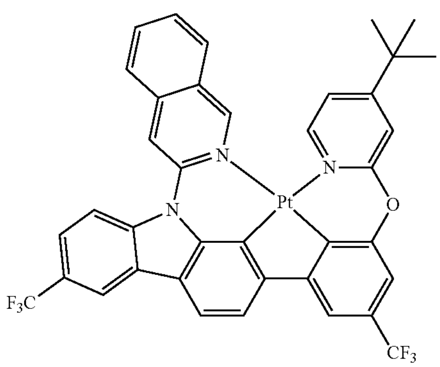
-continued
Pt 243
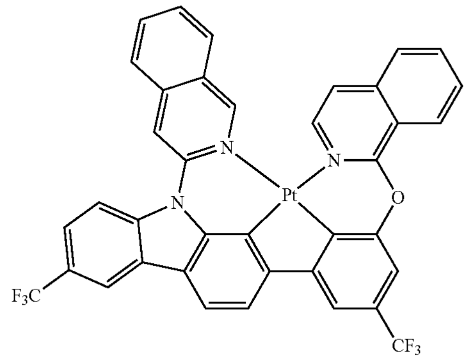
Pt 244
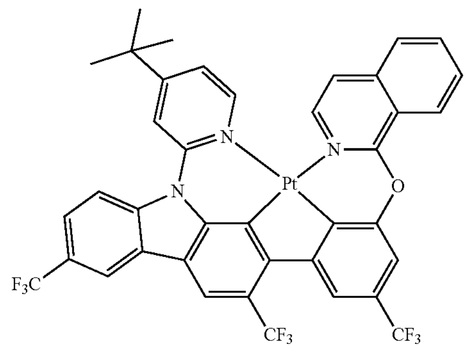
Pt 245
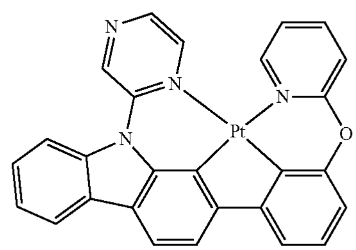
Pr 146
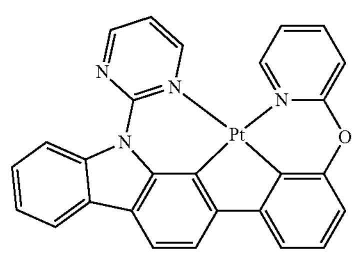
Pt 247
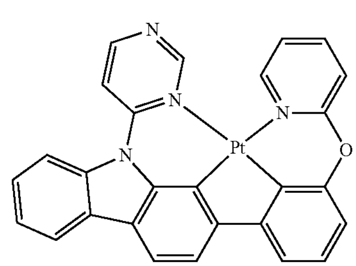

-continued
Pt 248
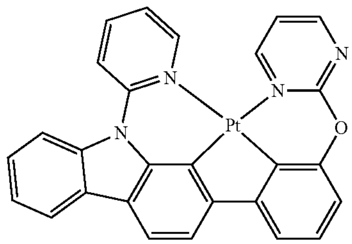
Pt 249
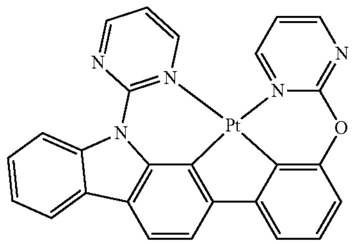
Pt 250
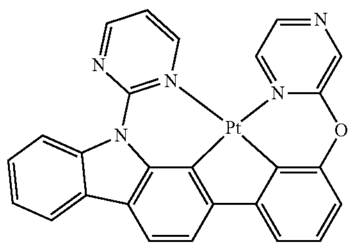
Pt 251
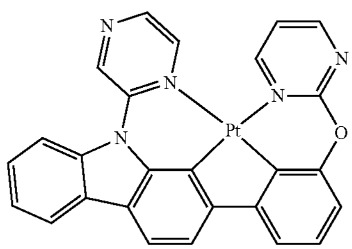
Pt 252
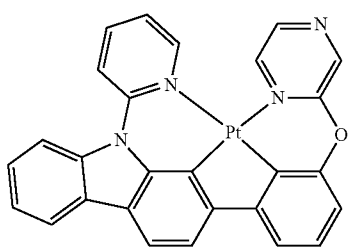
Pt 253
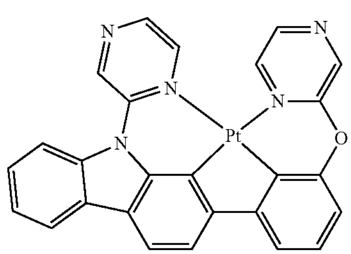
-continued
Pt 254
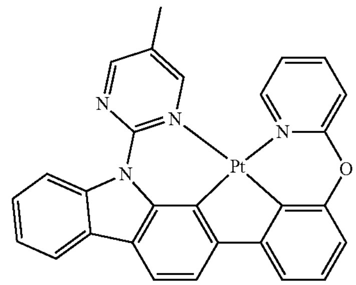
Pt 255
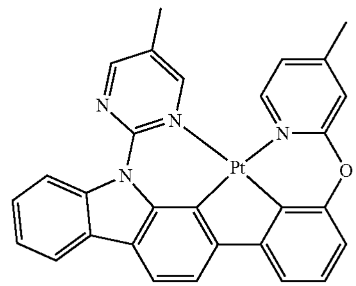
Pt 256
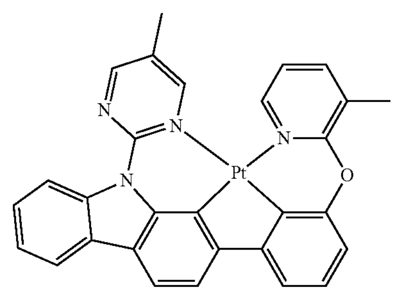
Pt 257
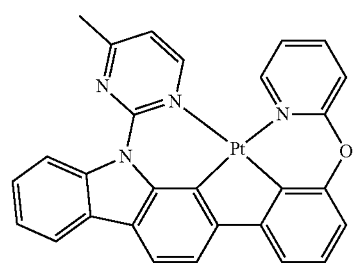
Pt 258
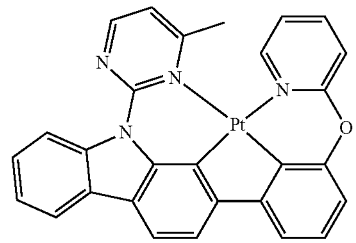

-continued
Pt 259
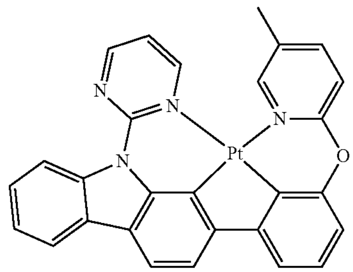
Pt 260
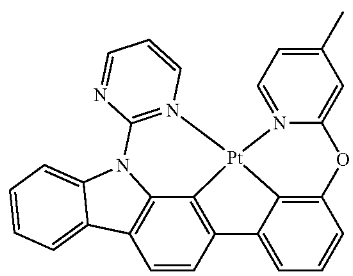
Pt 261
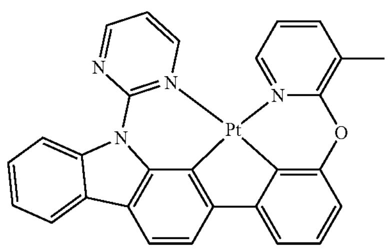
Pt 262
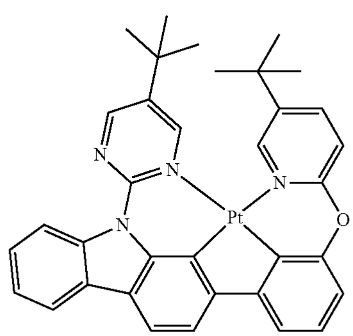
Pt 263
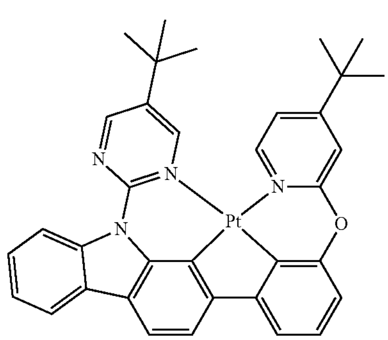
-continued
Pt 264
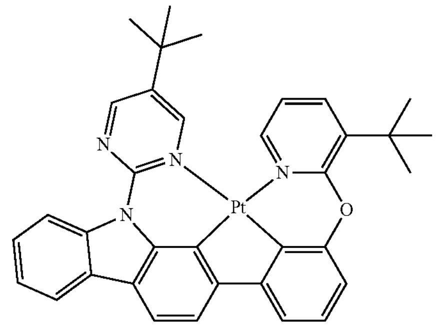
Pt 265
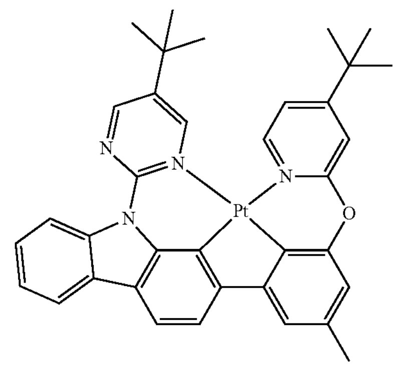
Pt 266
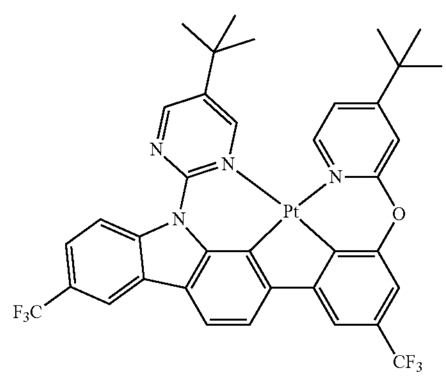
Pt 267
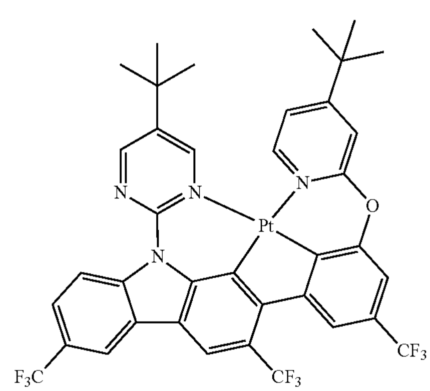

Pt 268
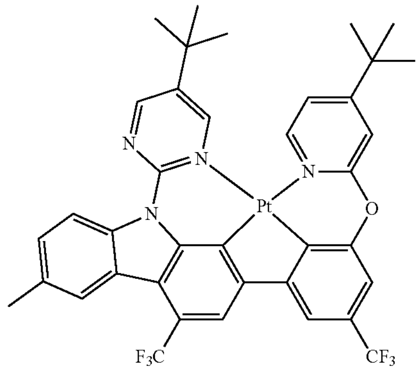
Pt 269
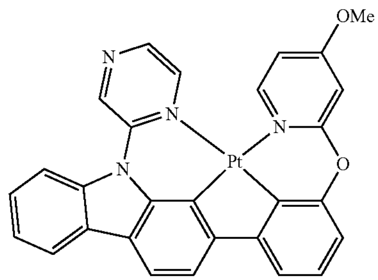
Pt 270
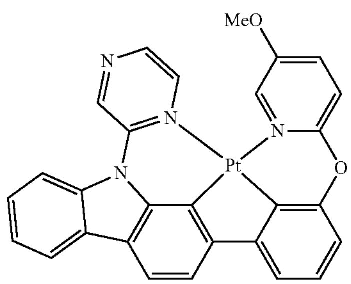
Pt 271
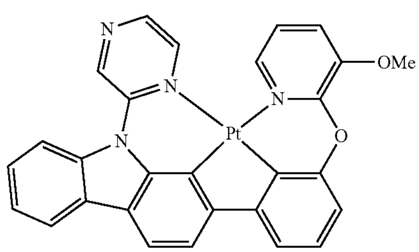
Pt 272
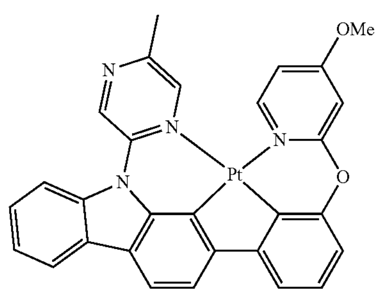
Pt 273
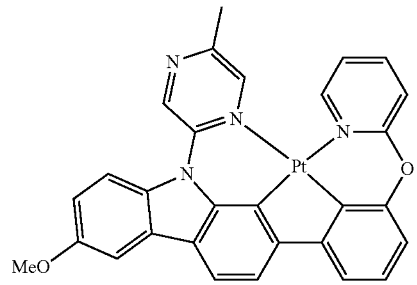
Pt 274
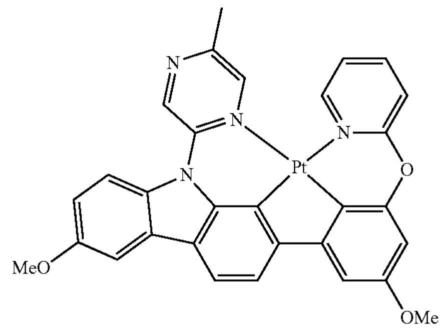
Pt 275
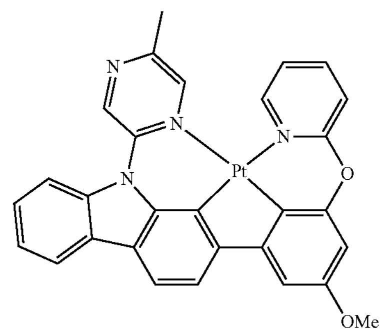
Pt 276
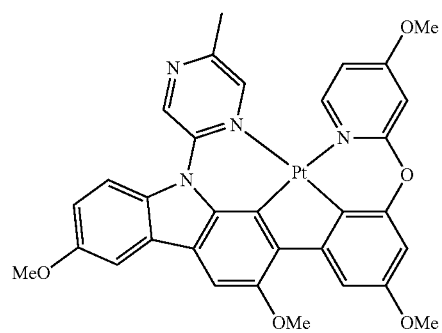
Pt 277
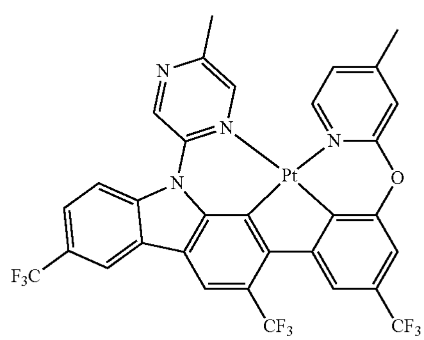

-continued
Pt 278
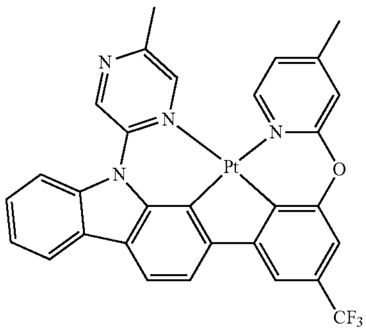
Pt 279
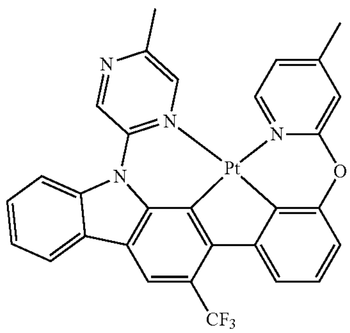
Pt 280
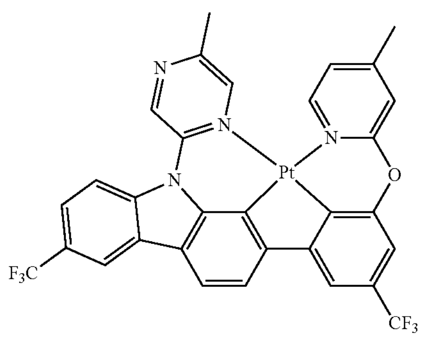
Pt 281
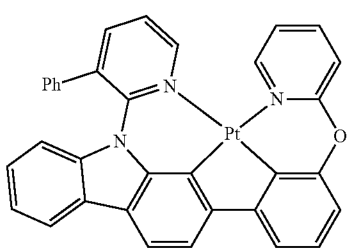
Pt 282
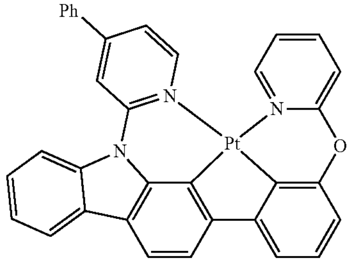
-continued
Pt 283
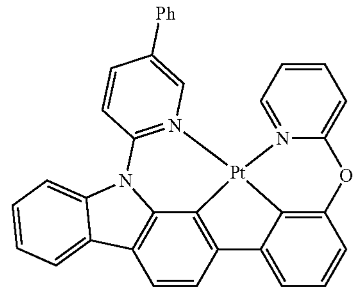
Pt 284
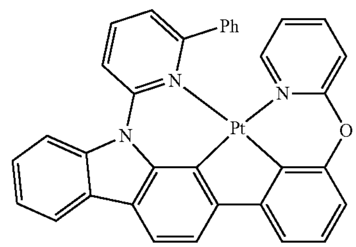
Pt 285
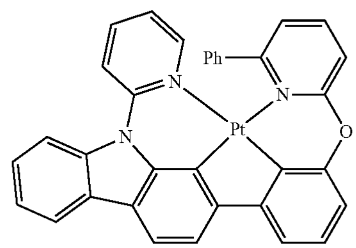
Pt 286
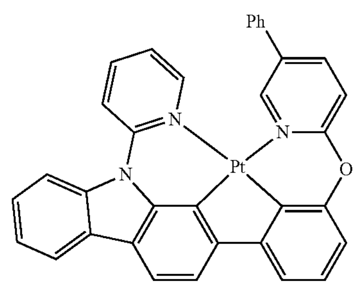
Pt 287
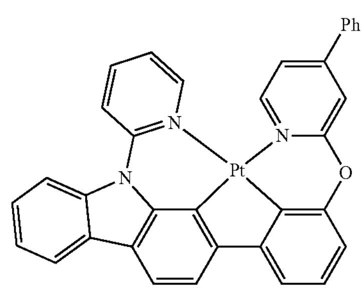
Pt 288
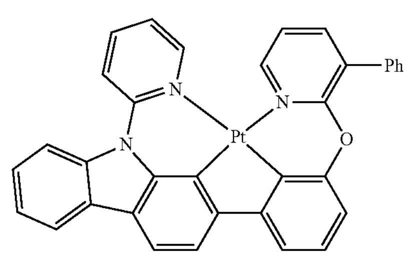

-continued
Pt 289
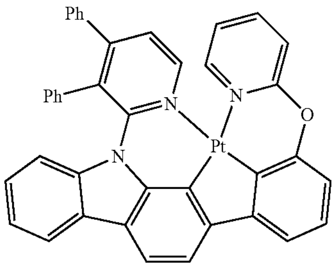
Pt 290
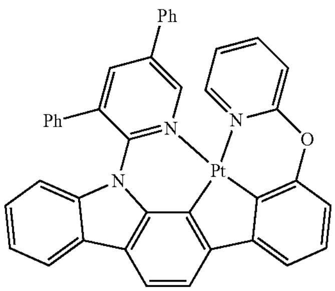
Pt 291
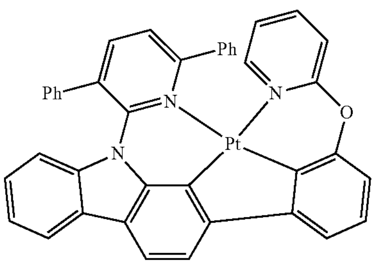
Pt 292
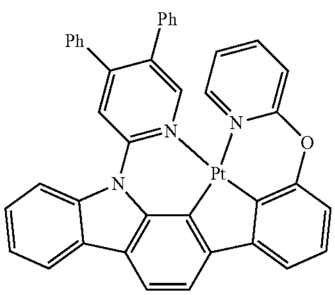
Pt 293
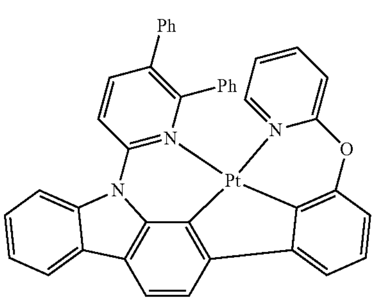
Pt 294
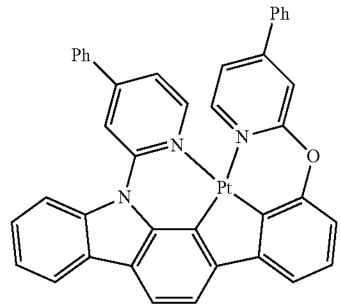
Pt 295
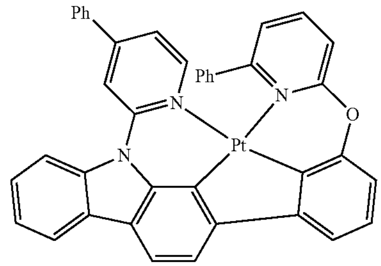
Pt 296
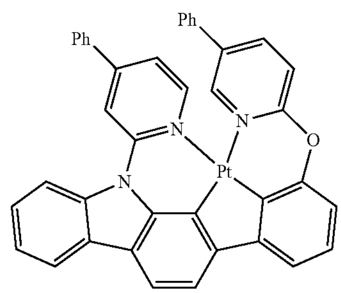
Pt 297
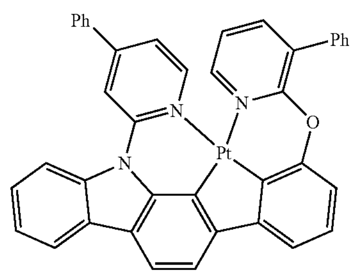
Pt 298
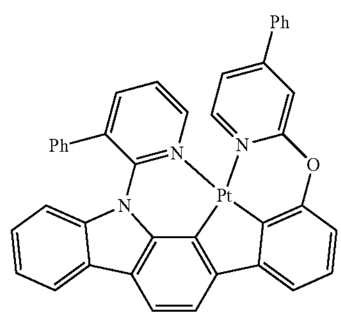

Pt 299
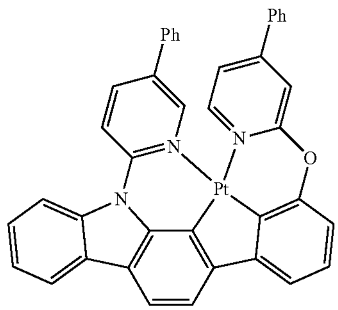
Pt 300
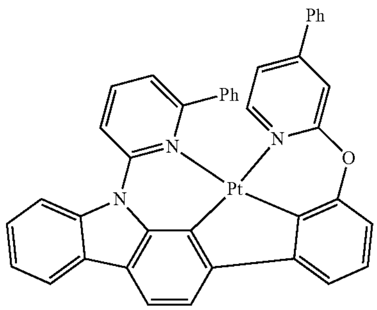
Pt 301
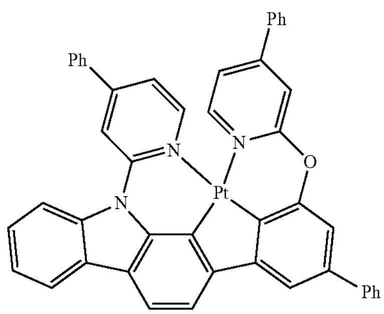
Pt 302
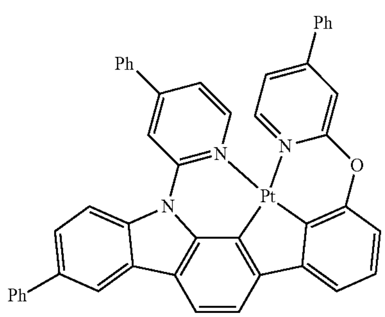
Pt 303
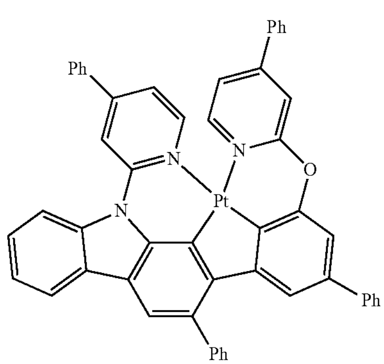
Pt 304
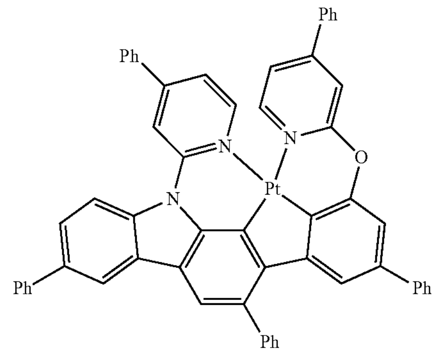
Pt 305
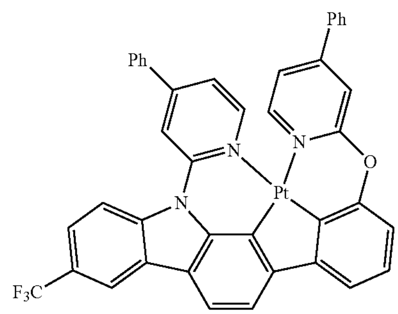
Pt 306
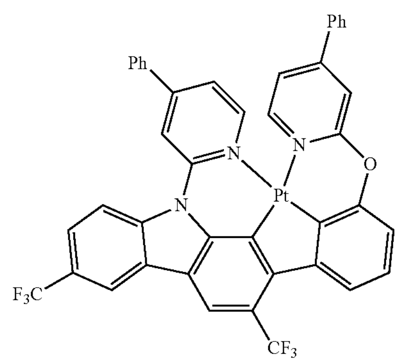
Pt 307
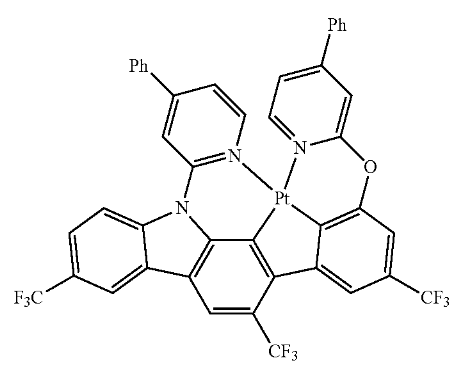

-continued
Pt 308
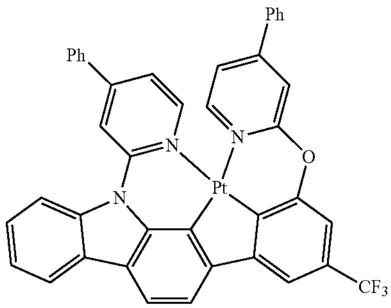
Pt 309
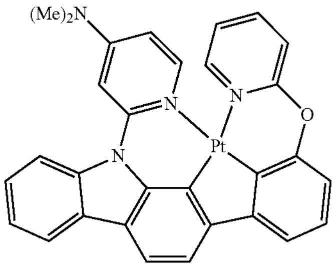
Pt 310
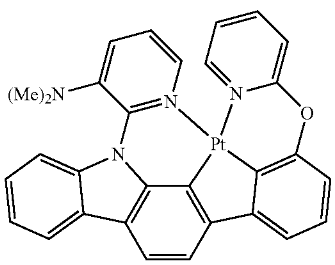
Pt 311
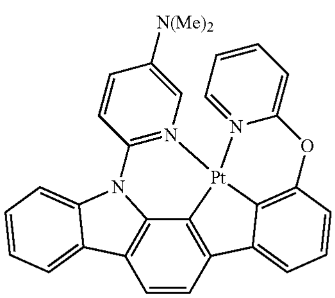
Pt 312
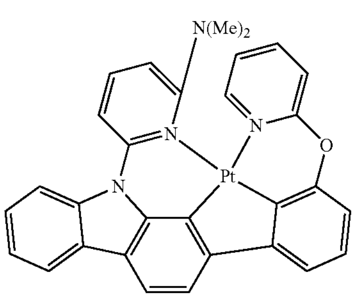
-continued
Pt 313
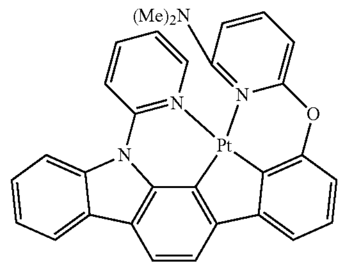
Pt 314
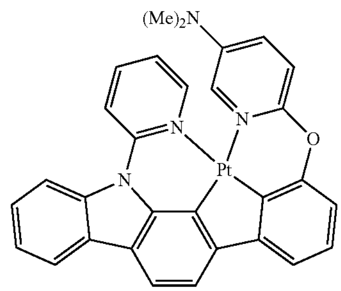
Pt 315
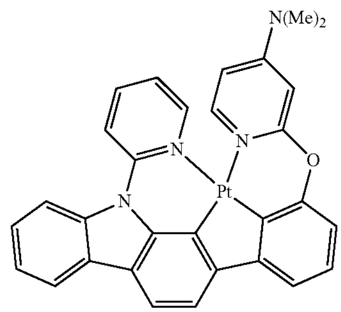
Pt 316
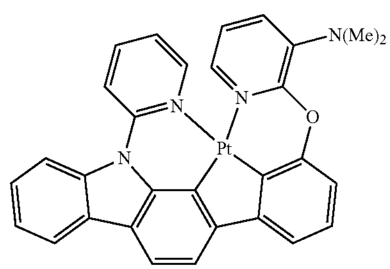
Pt 317
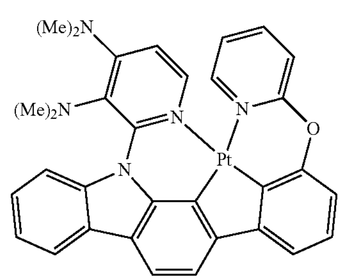

-continued
Pt 318
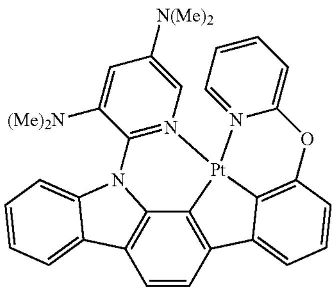
Pt 319
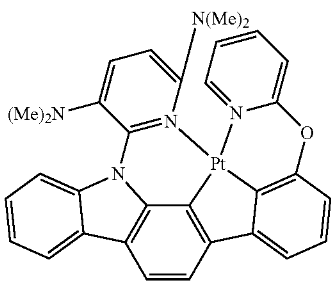
Pt 320
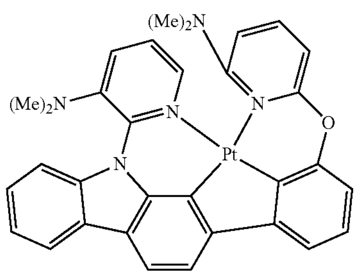
Pt 321
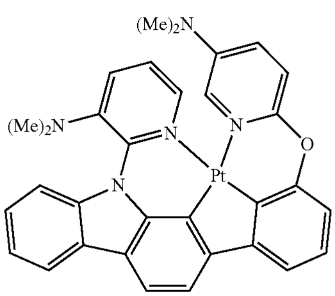
Pt 322
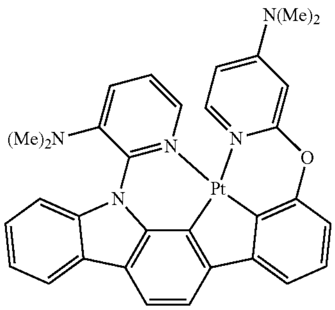
-continued
Pt 323
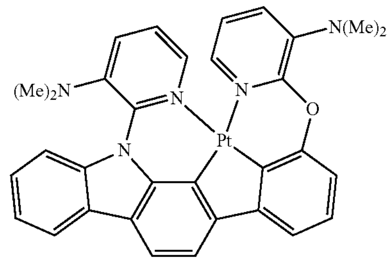
Pt 324
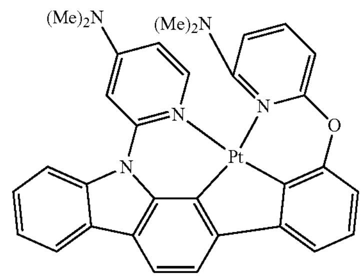
Pt 325
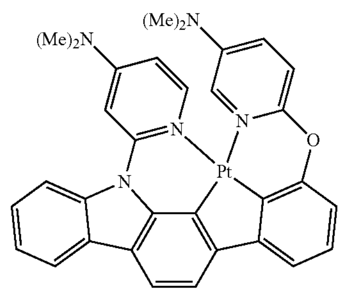
Pt 326
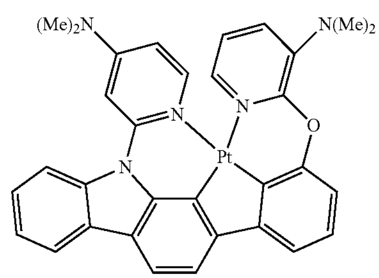
Pt 327
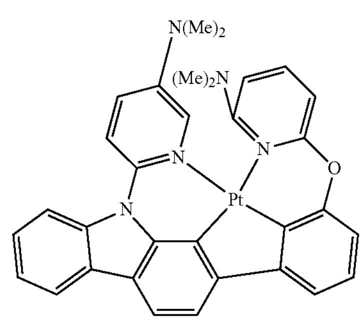

-continued
Pt 328
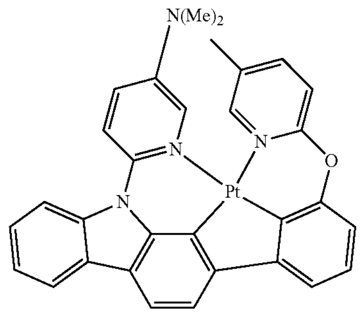
Pt 329
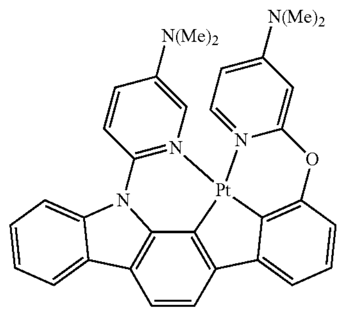
Pt 330
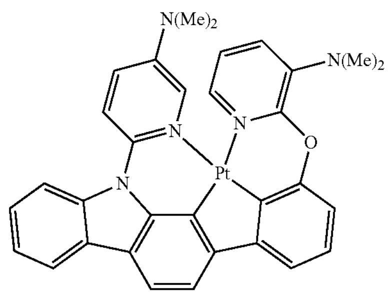
Pt 331
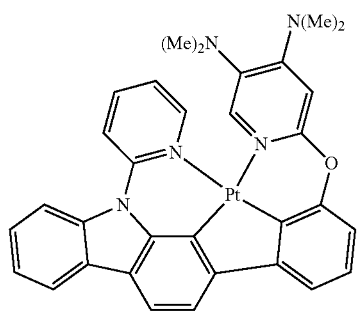
Pt 332
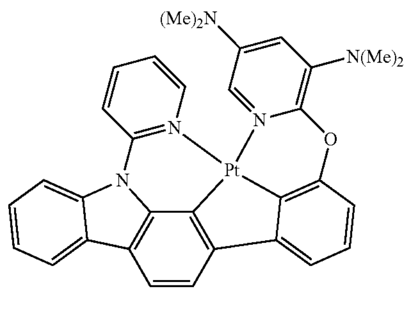
-continued
Pt 333
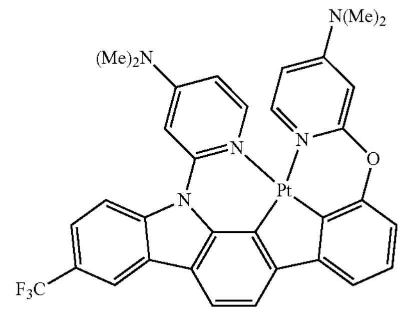
Pt 334
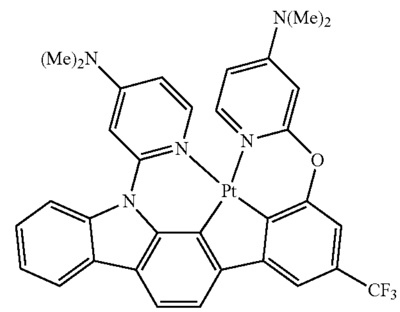
Pt 335
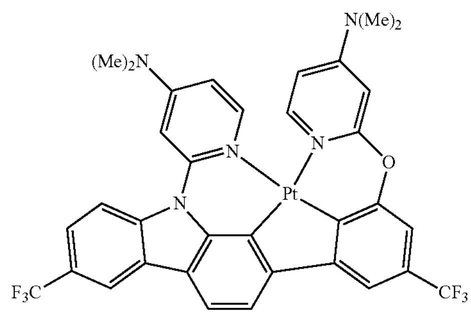
Pt 336
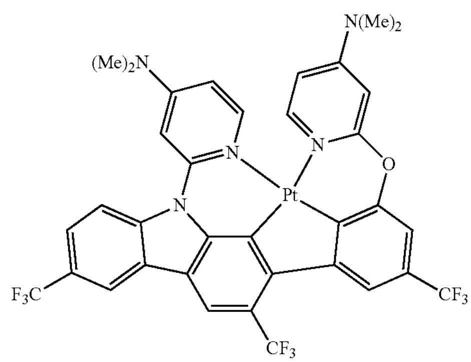
Pt 337
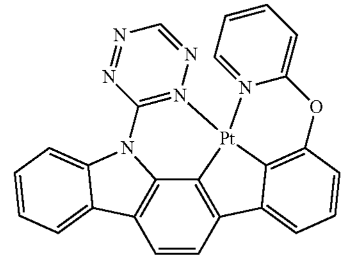

-continued
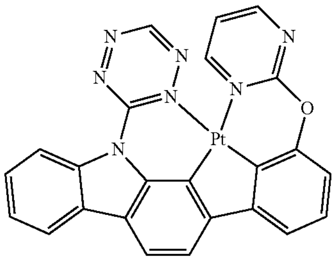
Pt 338
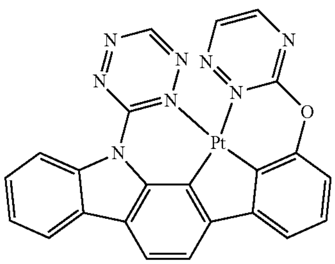
Pt 339
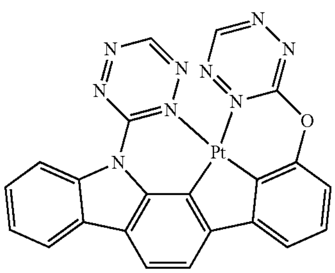
Pt 340
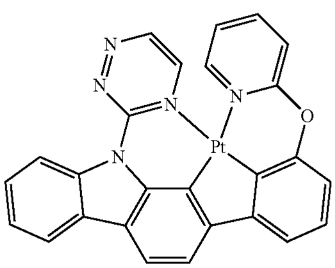
Pt 341
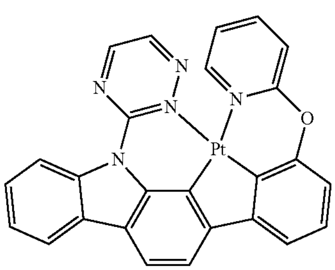
Pt 342
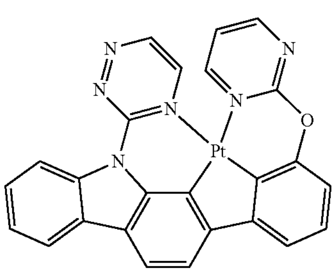
Pt 343
-continued
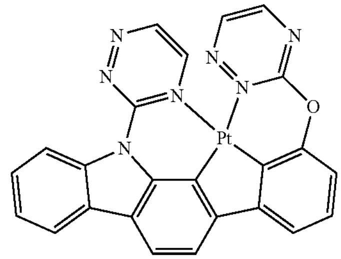
Pt 344
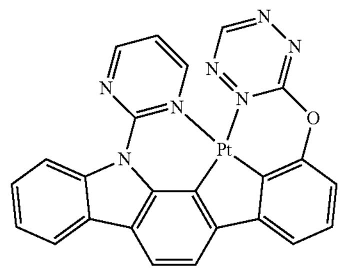
Pt 345
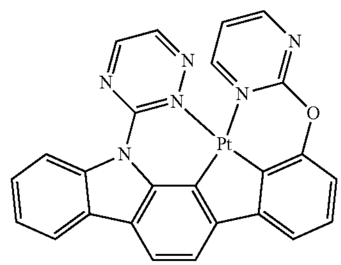
Pt 346
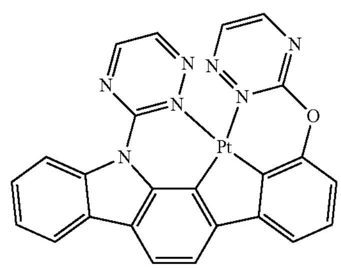
Pt 347
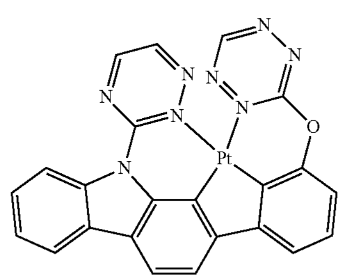
Pt 348
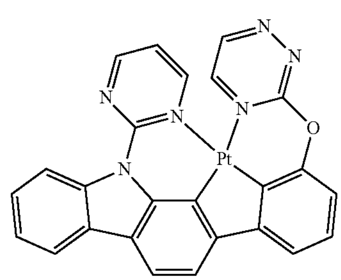
Pt 349

270
-continued
Pt 350
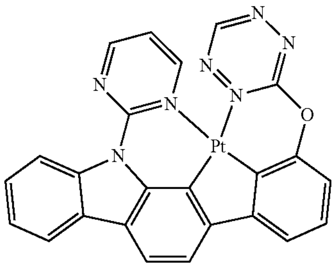
Pt 351
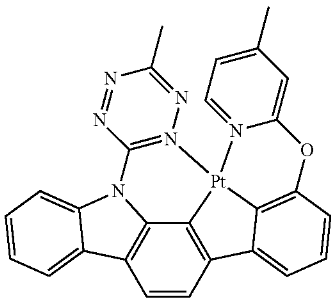
Pt 352
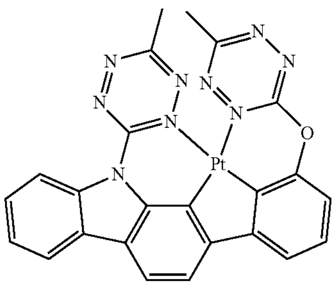
Pt 353
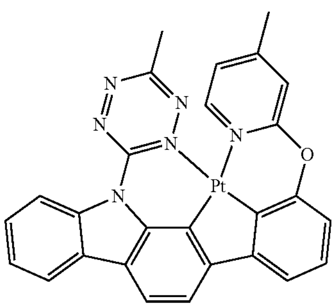
Pt 354
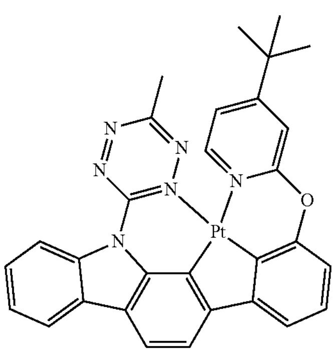
Pt 355
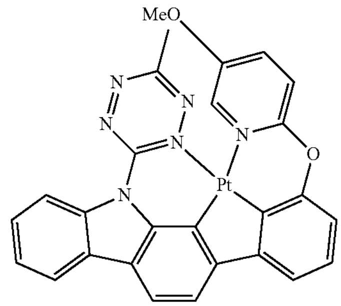
Pt 356
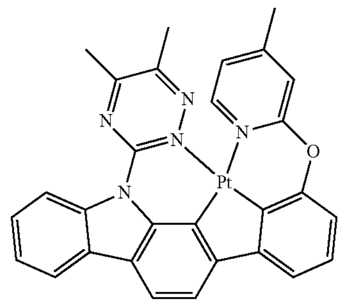
Pt 357
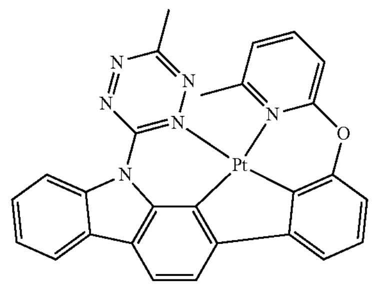
Pt 358
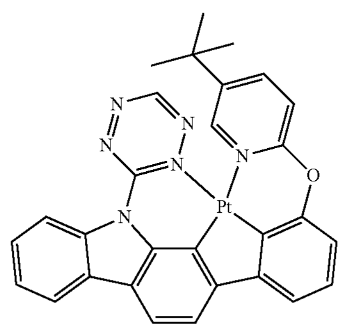
Pt 359
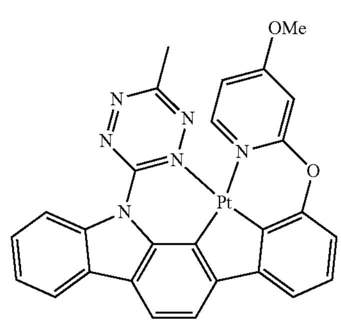

-continued
Pt 360
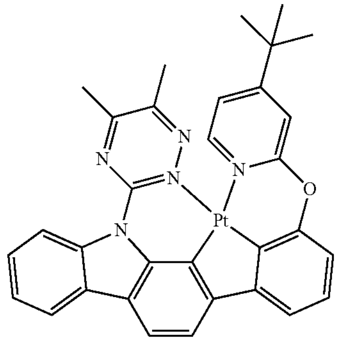
Pt 361
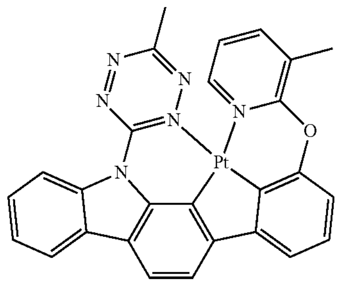
Pt 362
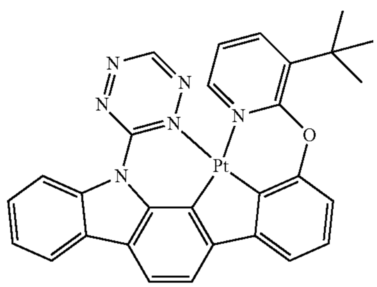
Pt 363
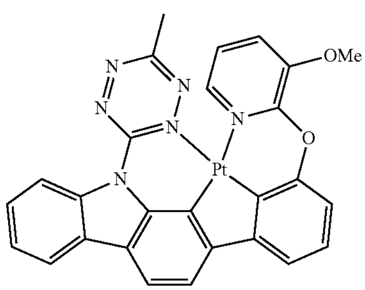
Pt 364
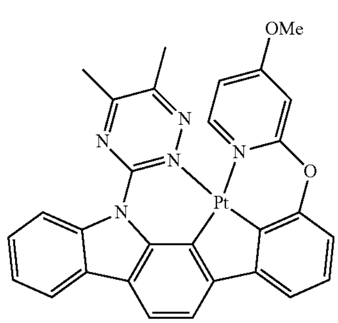
-continued
Pt 365
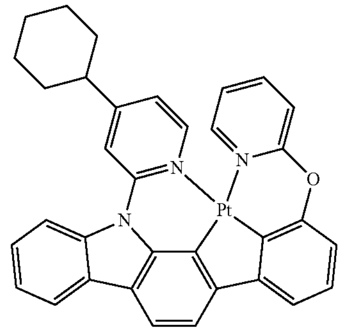
Pt 366
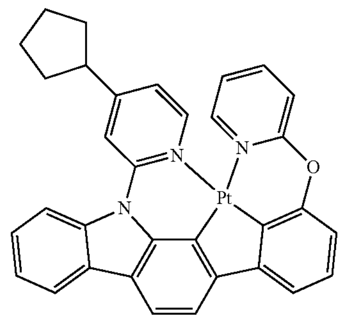
Pt 367
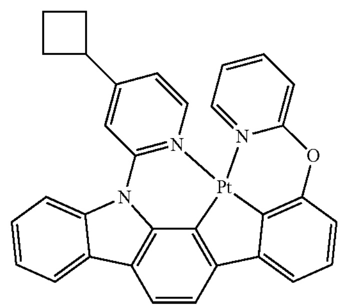
Pt 368
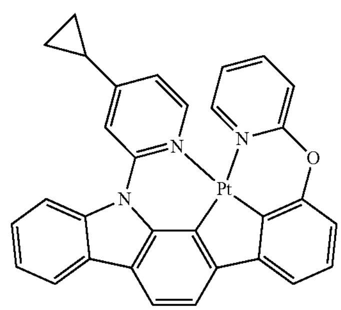
Pt 369
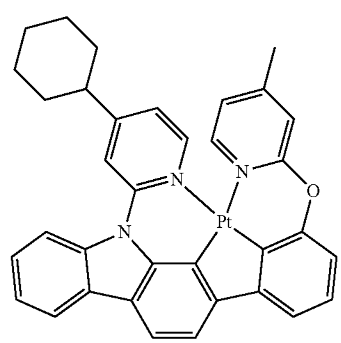

Pt 370
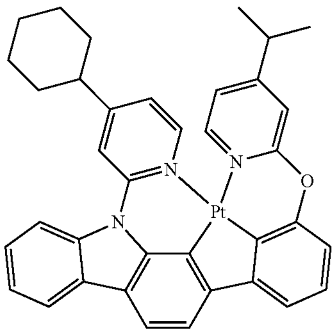
Pt 371
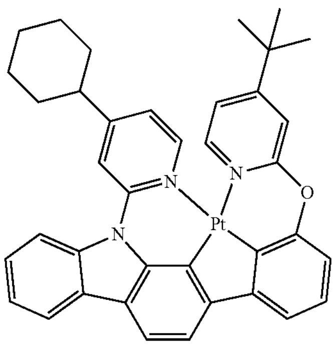
Pt 372
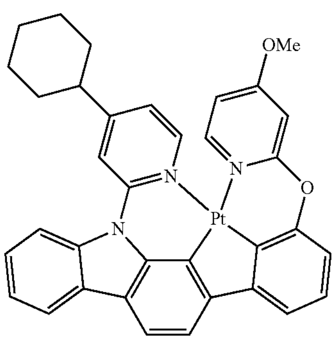
Pt 373
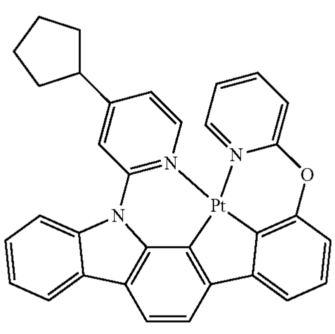
Pt 374
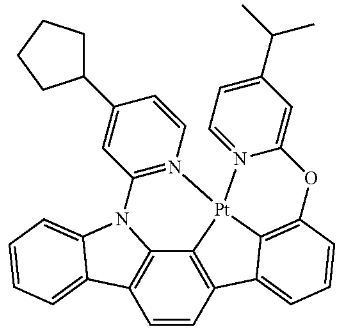
Pt 375
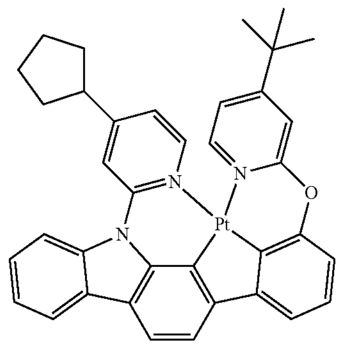
Pt 376
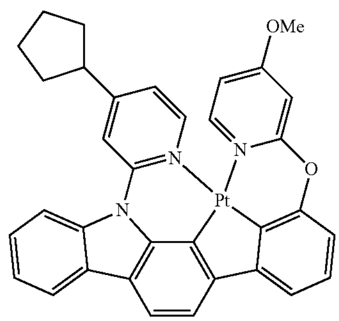
Pt 377
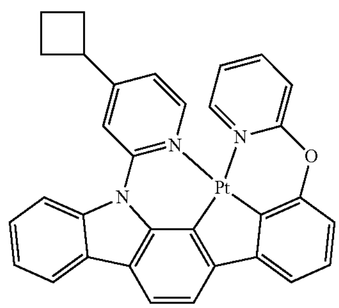
Pt 378
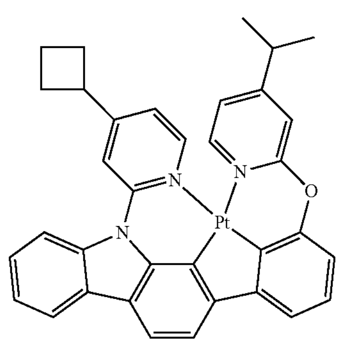

-continued
Pt 379
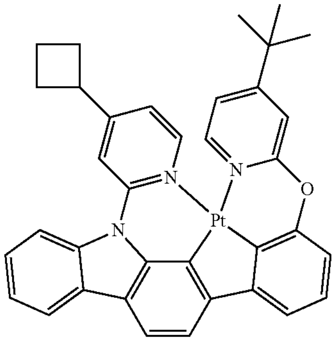
Pt 380
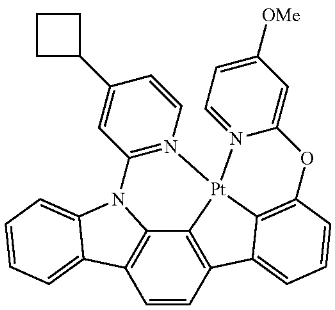
Pt 381
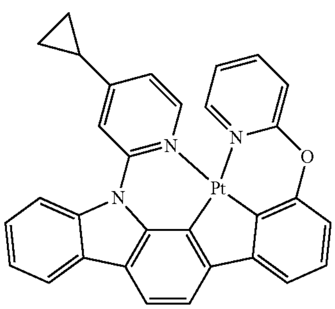
Pt 382
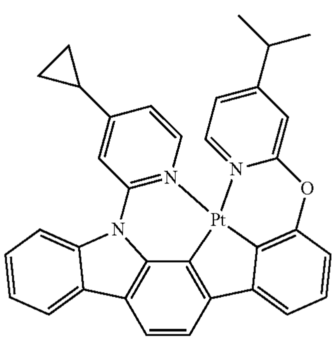
Pt 383
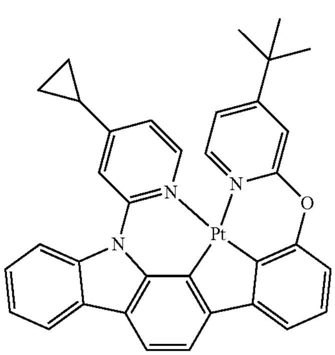
-continued
Pt 384
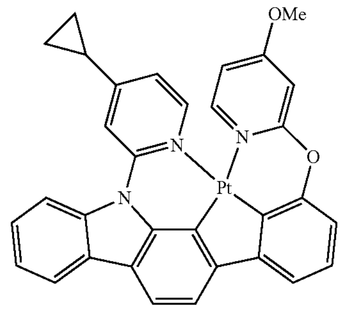
Pt 385
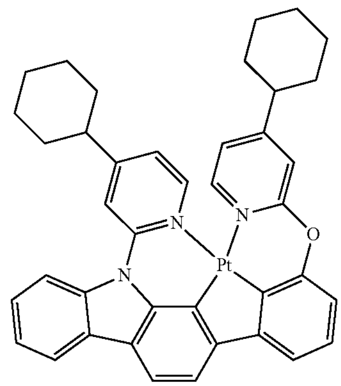
Pt 386
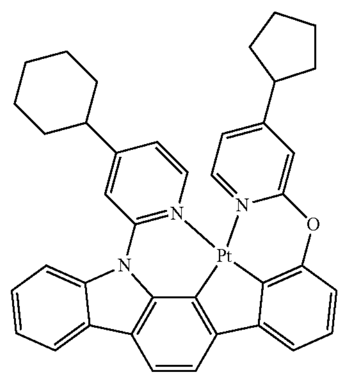
Pt 387
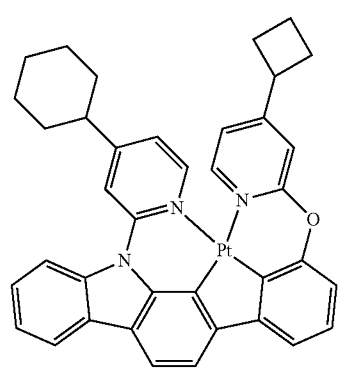

-continued
Pt 388
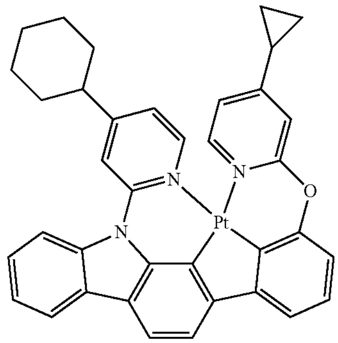
Pt 389
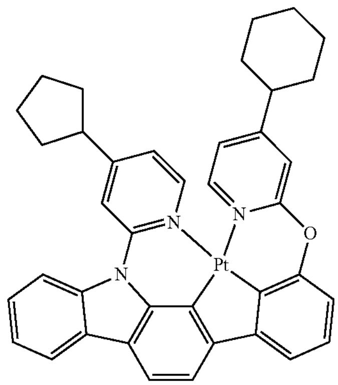
Pt 390
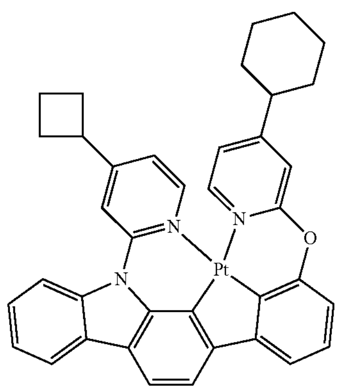
Pt 391
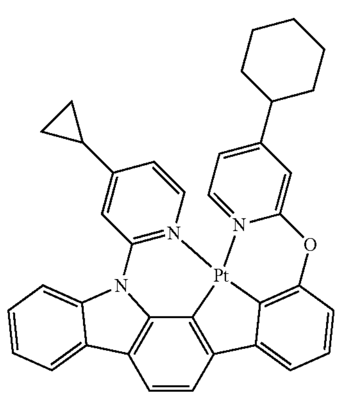
-continued
Pt 392
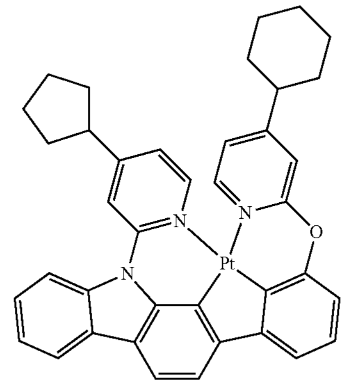
Pt 393
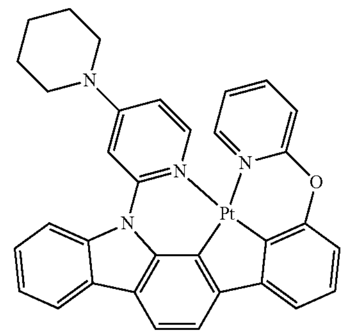
Pt 394
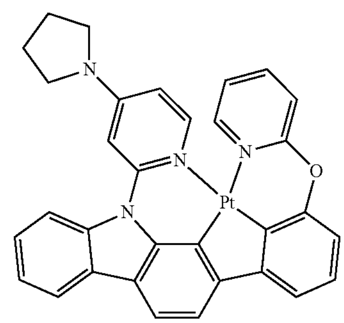
Pt 395
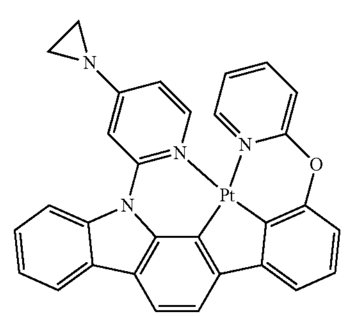

-continued
Pt 396
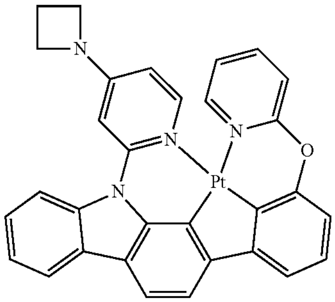
Pt 397
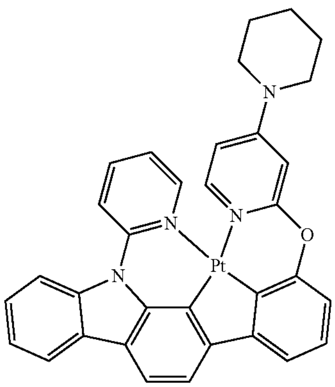
Pt 398
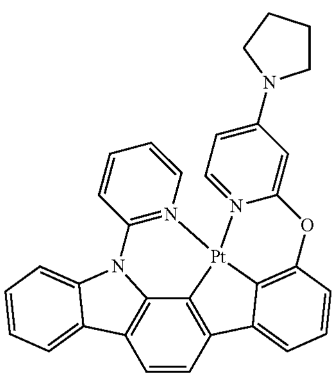
Pt 399
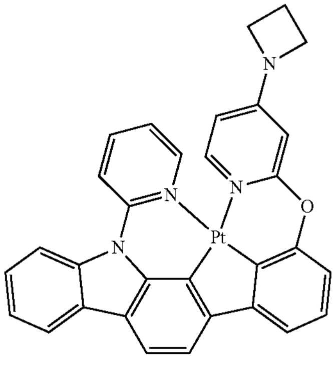
-continued
Pt 400
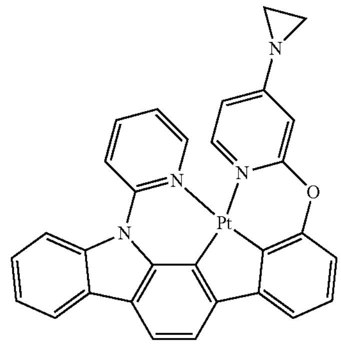
Pt 401
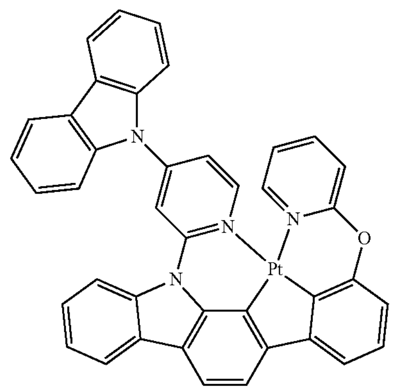
Pt 402
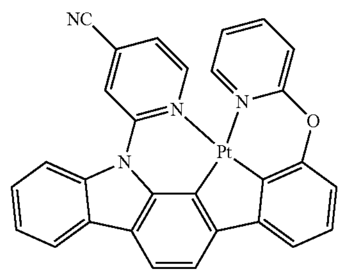
Pt 403
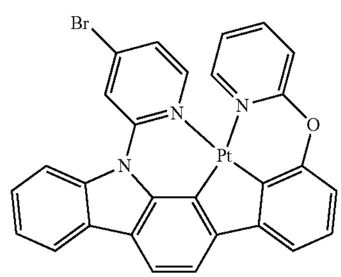
Pt 404
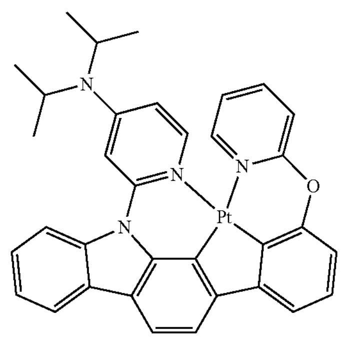

Pt 405
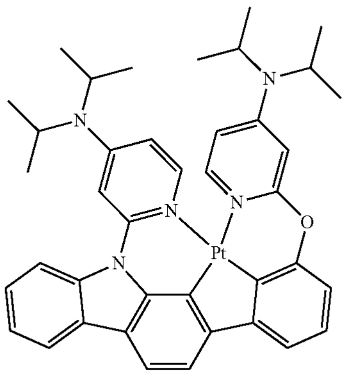
Pt 406
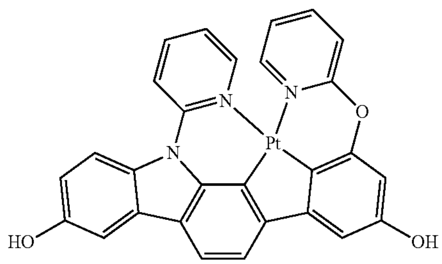
Pt 407
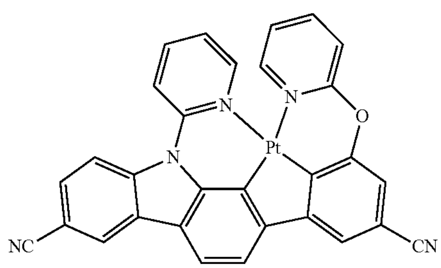
Pt 408
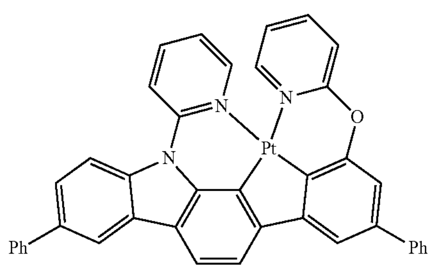
Pt 409
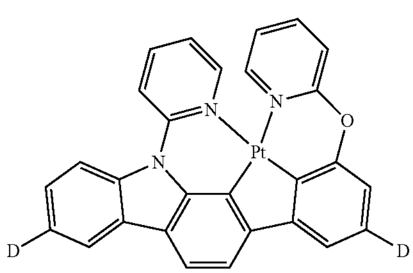
Pt 410
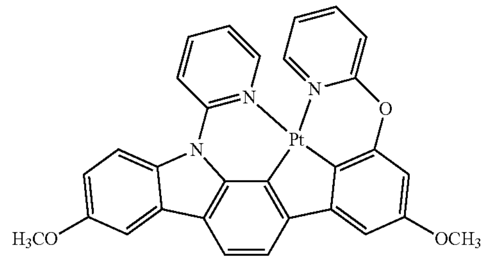
Pt 411
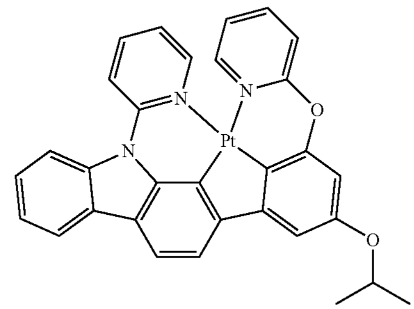
Pt 412
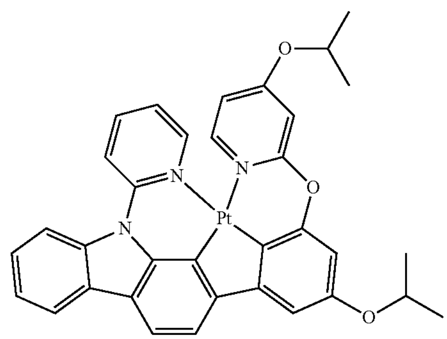
Pt 413
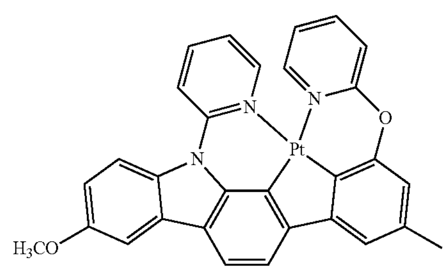
Pt 414
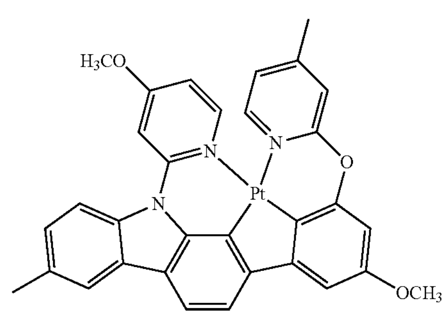

Pt 415
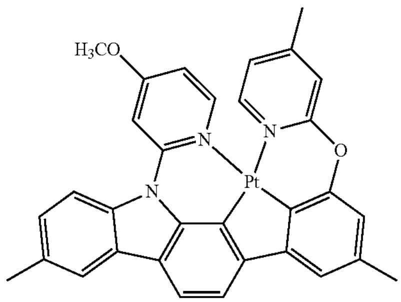
Pt 416
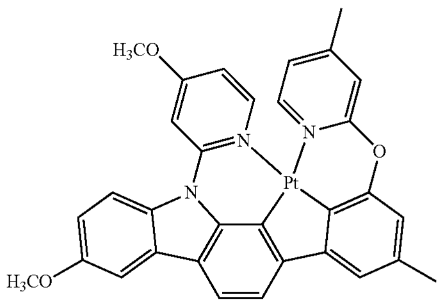
Pt 417
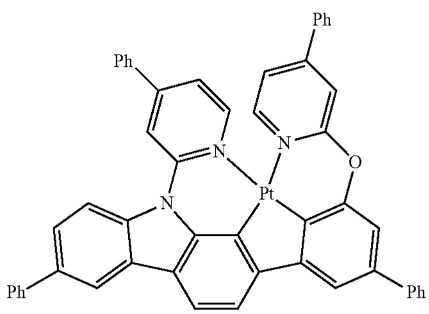
Pt 418
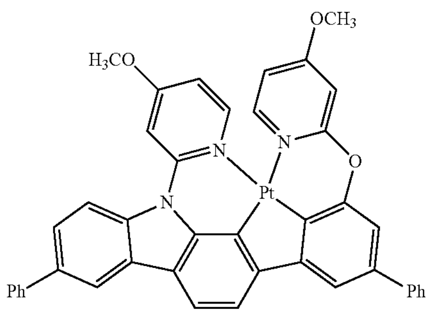
Pt 419
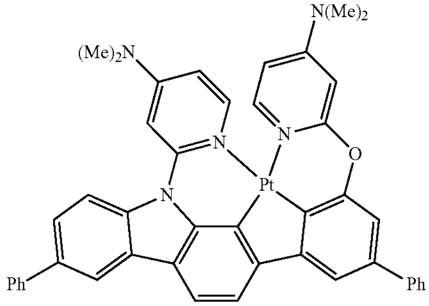
Pt 420
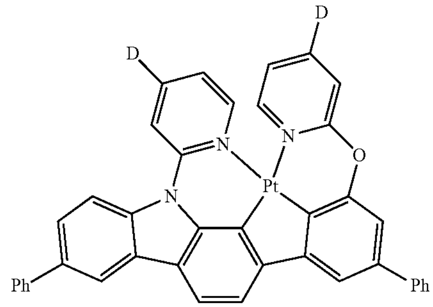
Pt 421
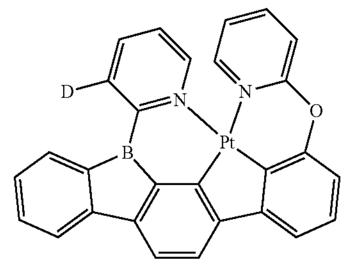
Pt 422
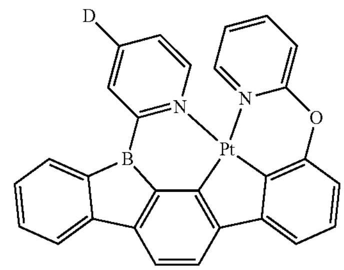
Pt 423
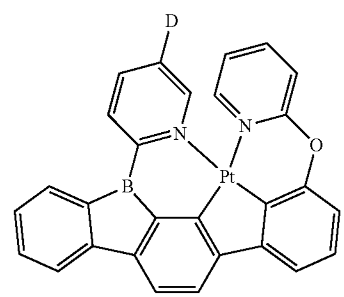
Pt 424
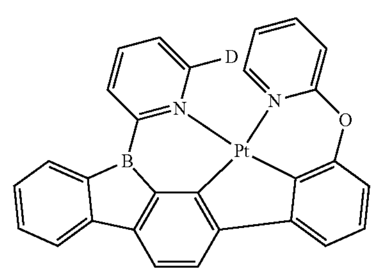

Pt 425
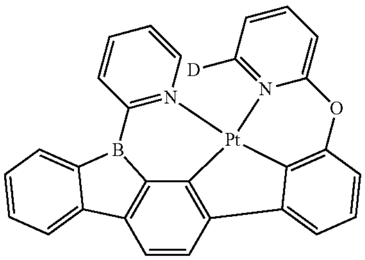
Pt 426
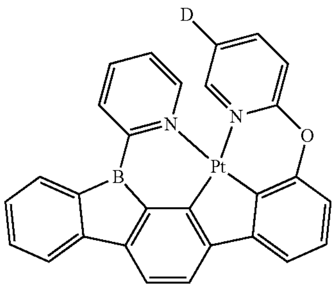
Pt 427
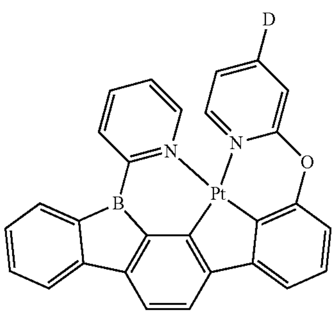
Pt 428
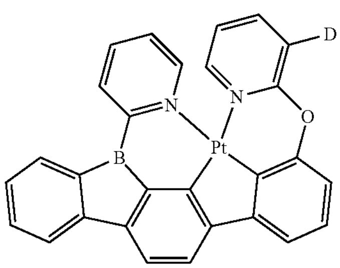
Pt 429
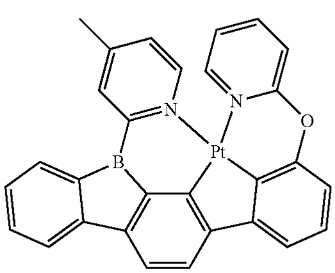
Pt 430
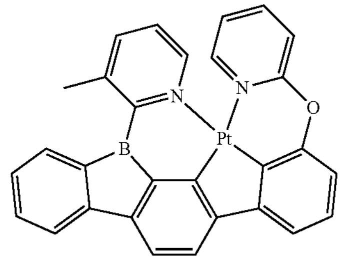
Pt 431
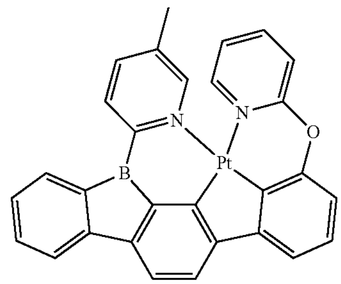
Pt 432
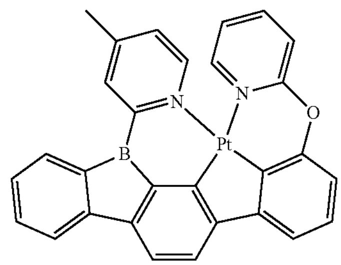
Pt 433
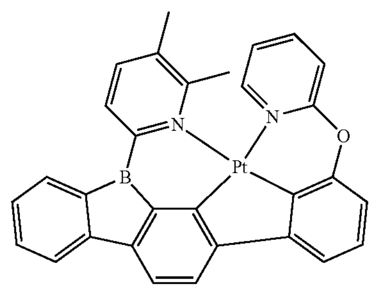
Pt 434
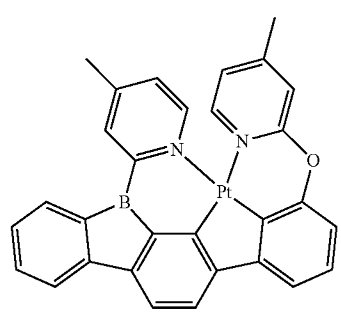

-continued
Pt 435
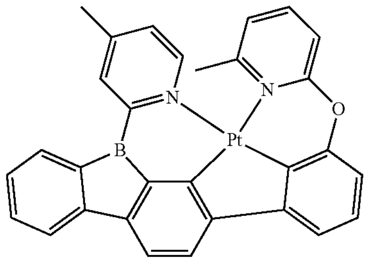
Pt 436
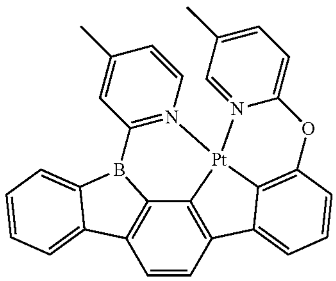
Pt 437
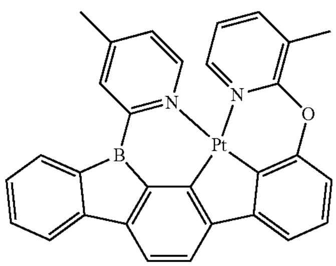
Pt 438
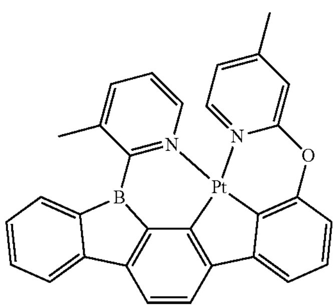
Pt 439
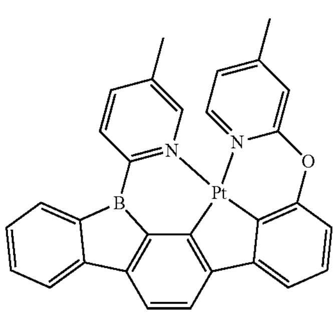
-continued
Pt 440
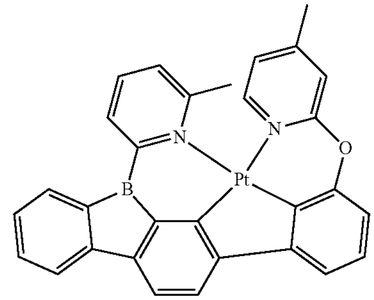
Pt 441
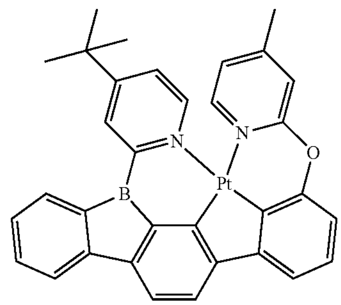
Pt 442
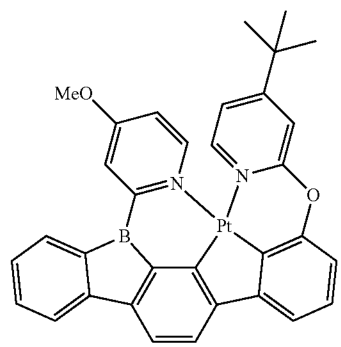
Pt 443
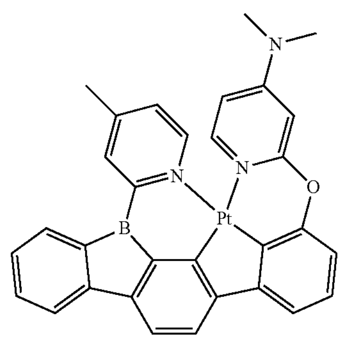
Pt 444
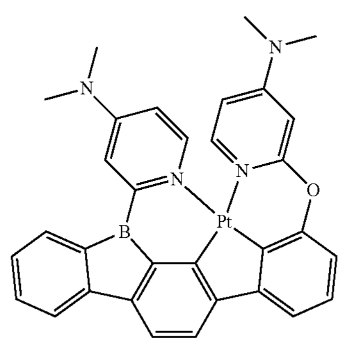

-continued
Pt 445
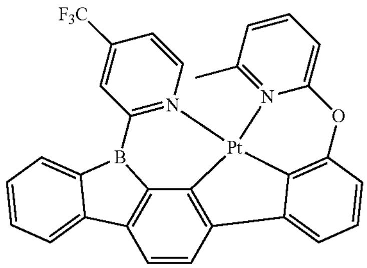
Pt 446
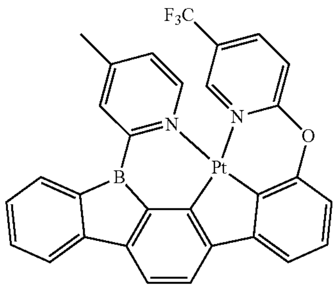
Pt 447
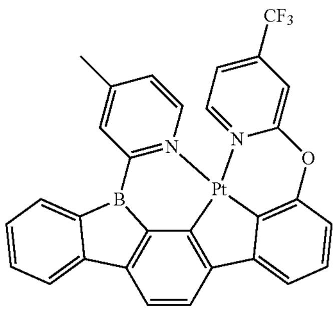
Pt 448
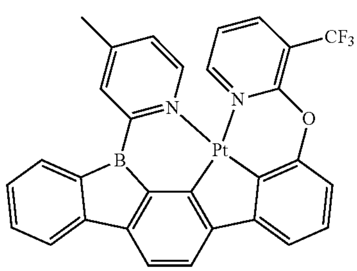
Pt 449
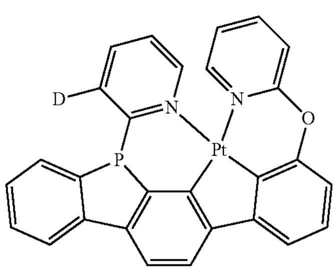
-continued
Pt 450
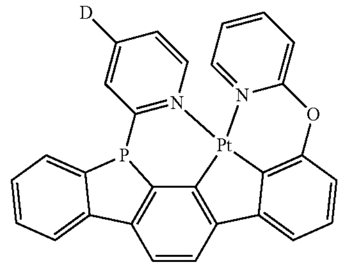
Pt 451
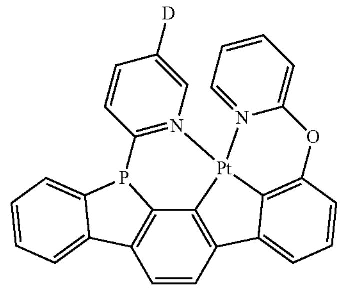
Pt 452
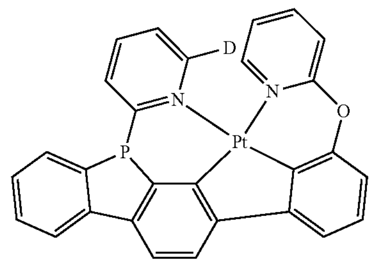
Pt 453
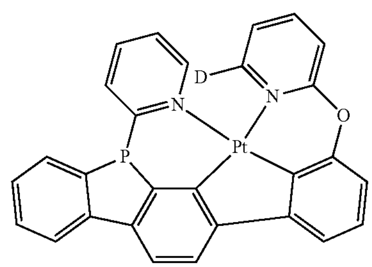
Pt 454
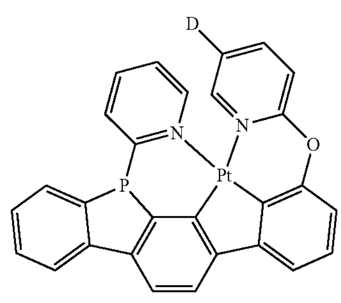

Pt 455
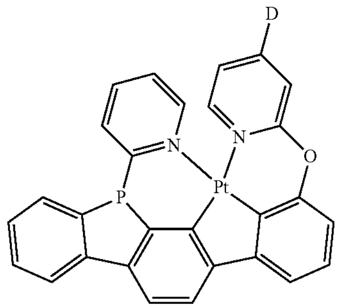
Pt 456
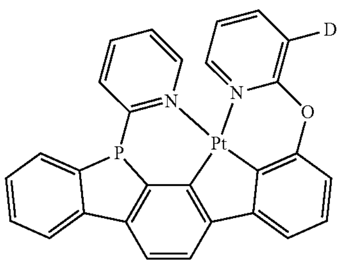
Pt 457
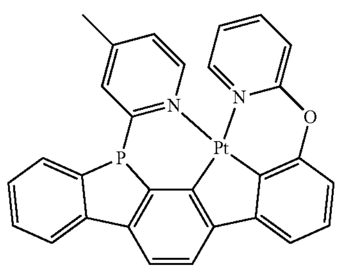
Pt 458
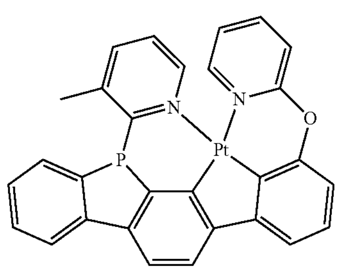
Pt 459
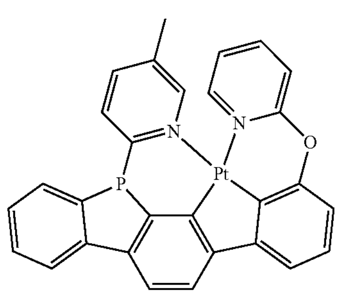
Pt 460
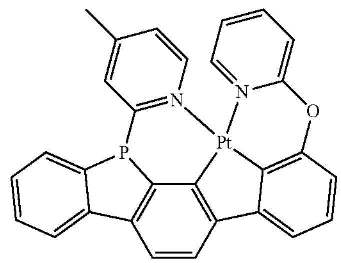
Pt 461
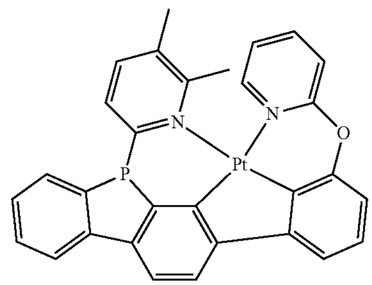
Pt 462
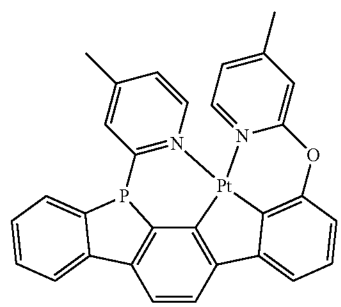
Pt 463
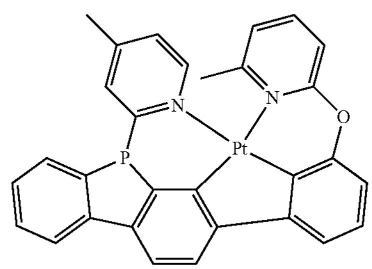
Pt 464
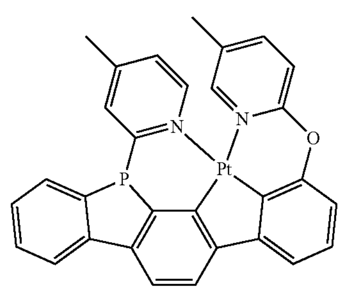

-continued
Pt 465
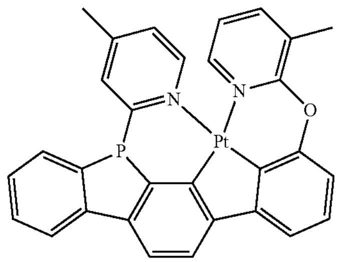
Pt 466
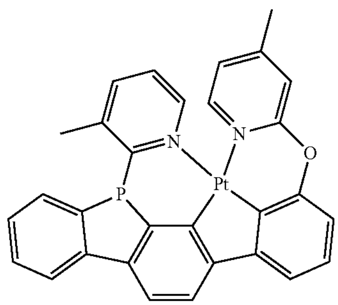
Pt 467
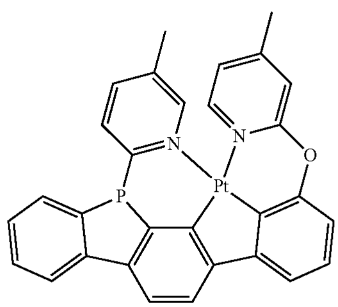
Pt 468
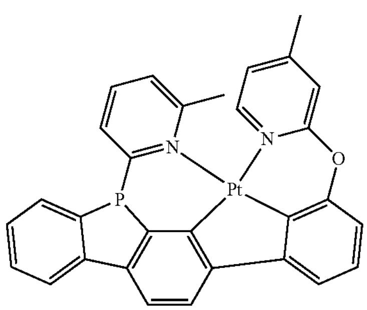
Pt 469
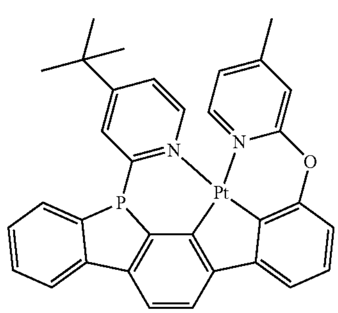
-continued
Pt 470
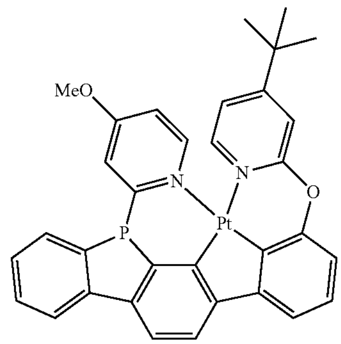
Pt 471
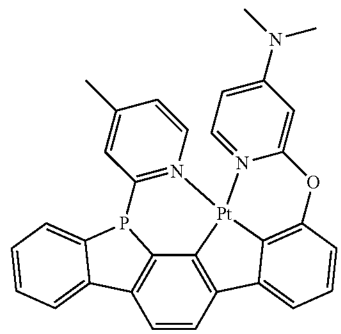
Pt 472
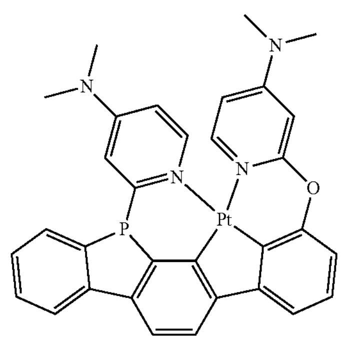
Pt 473
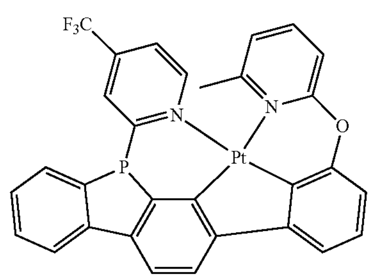
Pt 474
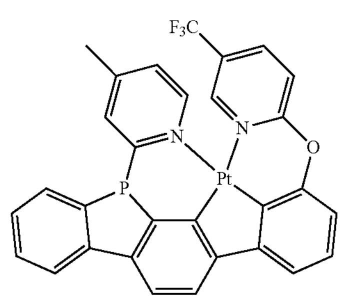

-continued
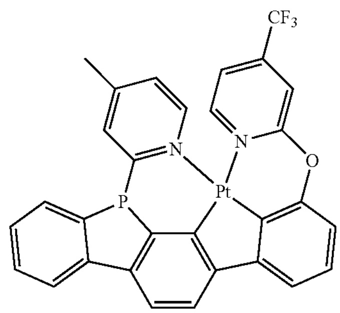
Pt 475
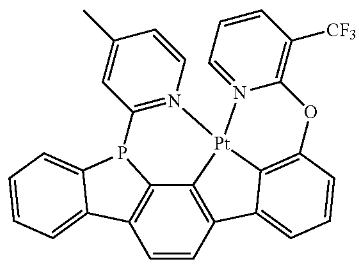
Pt 476
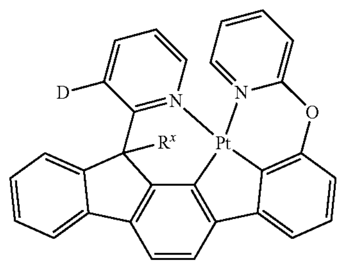
Pt 477
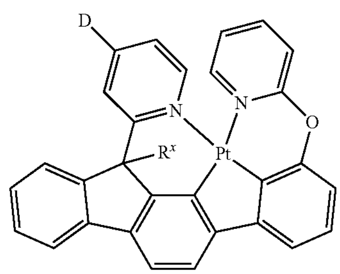
Pt 478
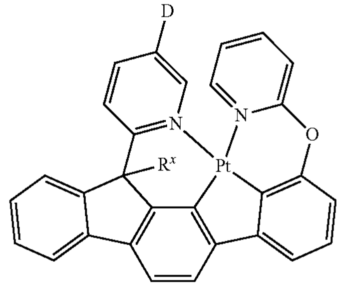
Pt 479
-continued
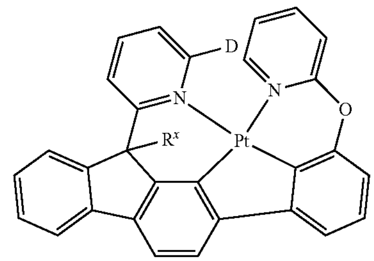
Pt 480
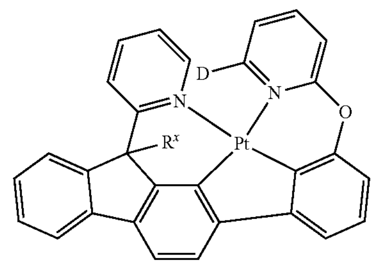
Pt 481
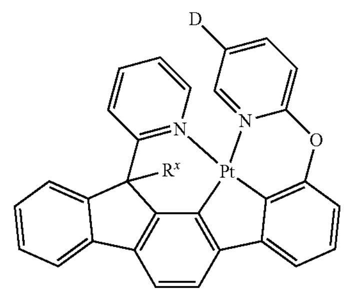
Pt 482
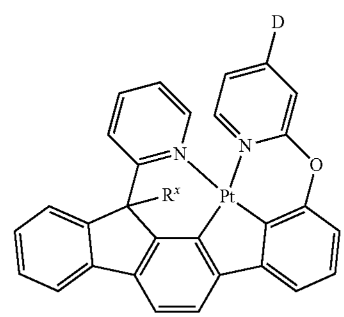
Pt 483
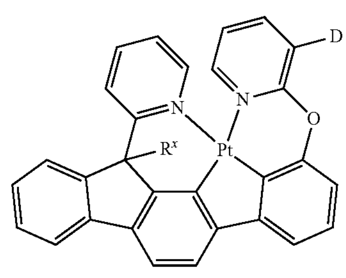
Pt 484

-continued
Pt 485
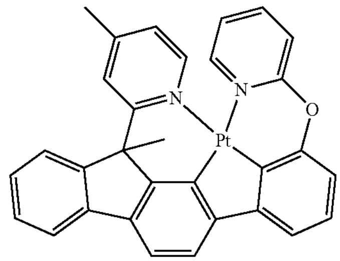
Pt 486
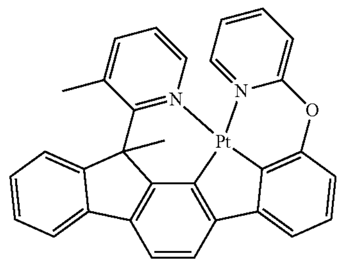
Pt 487
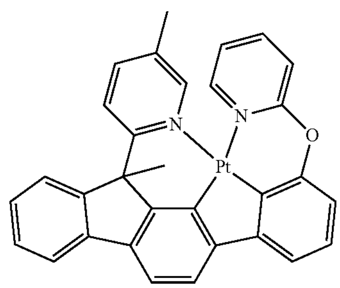
Pt 488
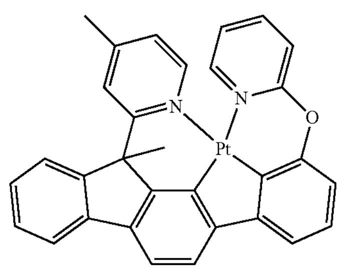
Pt 489
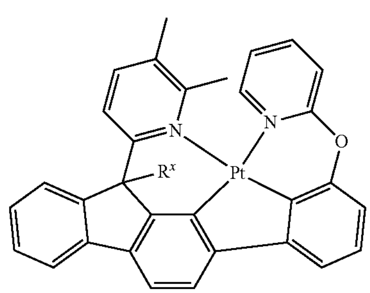
-continued
Pt 490
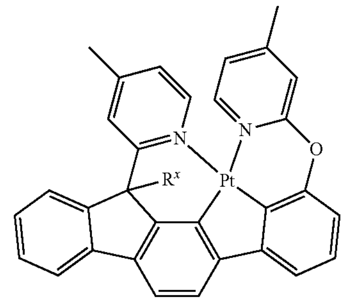
Pt 491
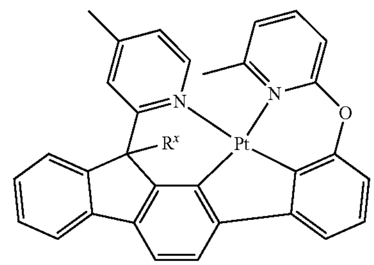
Pt 492
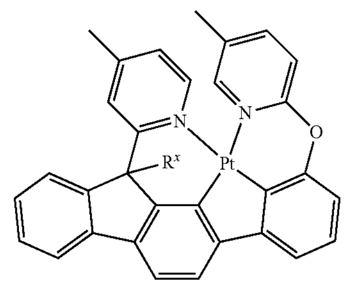
Pt 493
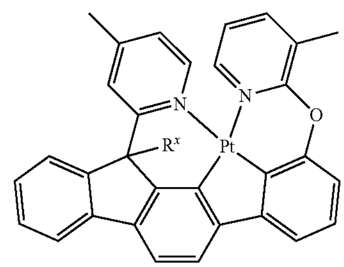
Pt 494
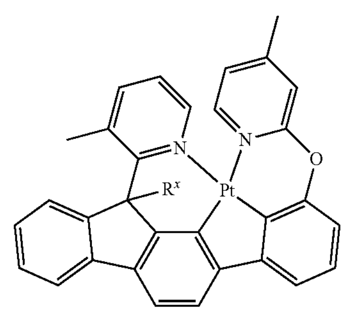

-continued
Pt 495
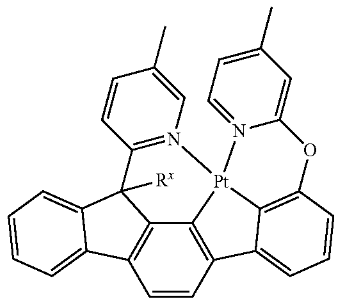
Pt 496
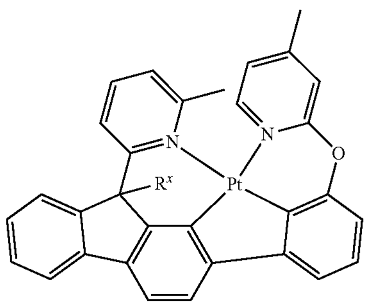
Pt 497
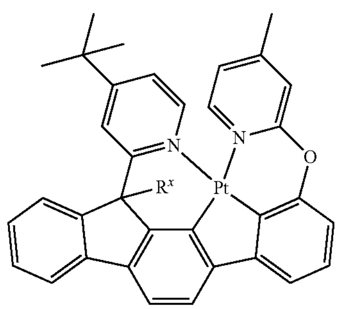
Pt 498
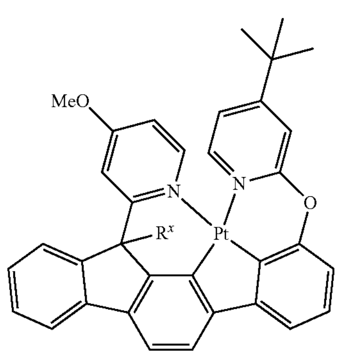
Pt 499
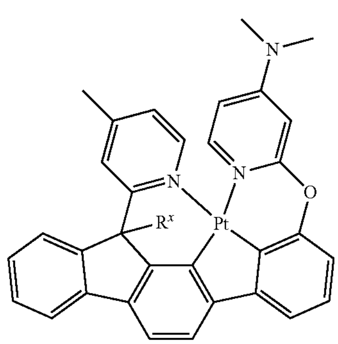
-continued
Pt 500
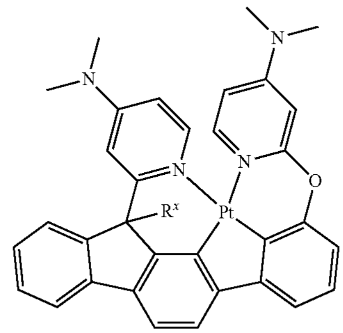
Pt 501
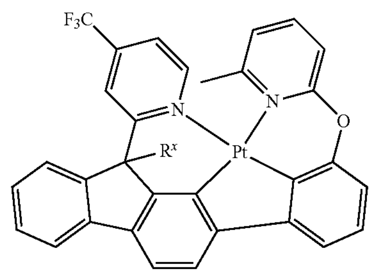
Pt 502
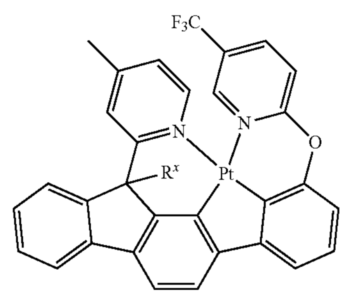
Pt 503
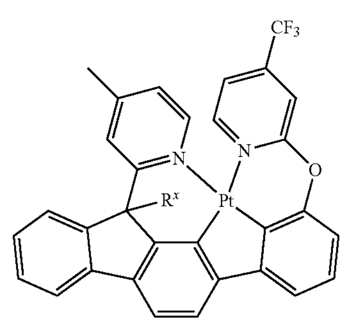
Pt 504
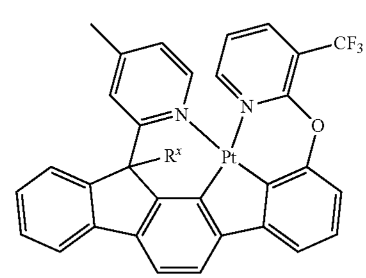

Pt 505
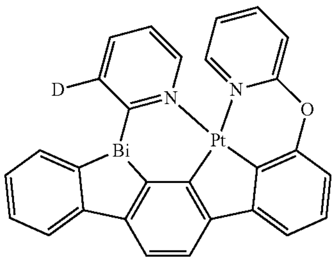
Pt 506
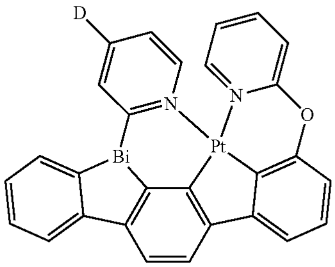
Pt 507
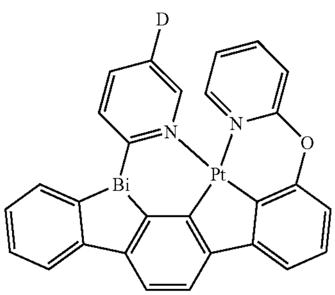
Pt 508
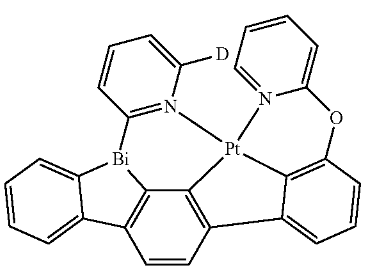
Pt 509
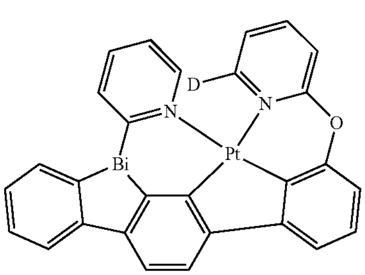
Pt 510
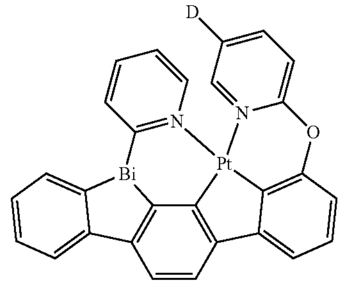
Pt 511
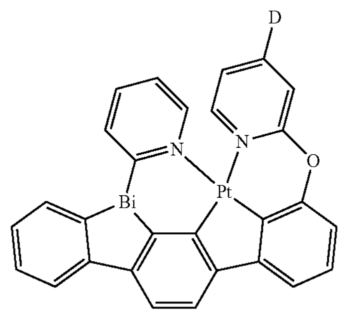
Pt 512
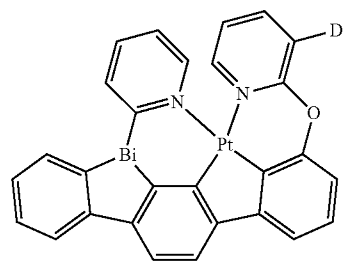
Pt 513
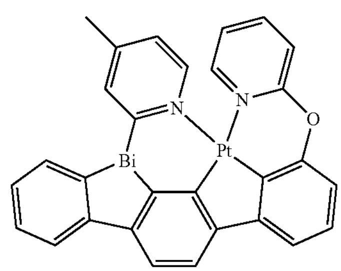
Pt 514
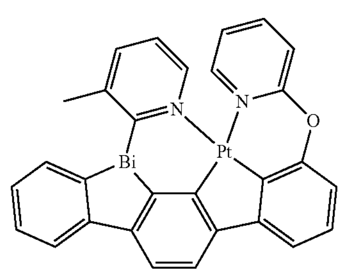

Pt 515
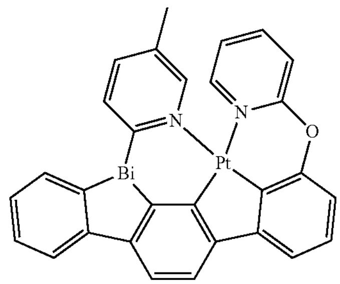
Pt 516
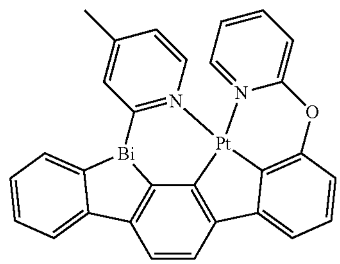
Pt 517
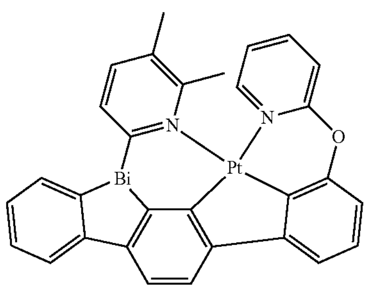
Pt 518
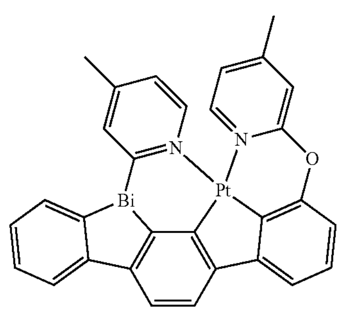
Pt 519
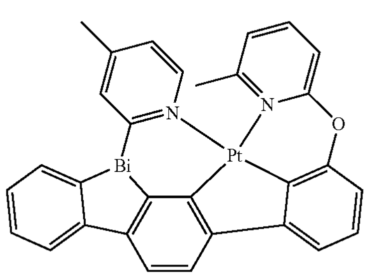
Pt 520
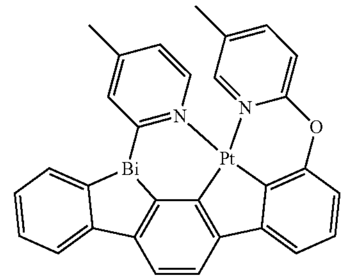
Pt 521
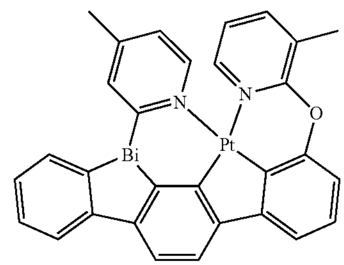
Pt 522
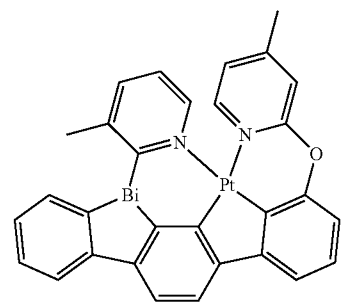
Pt 523
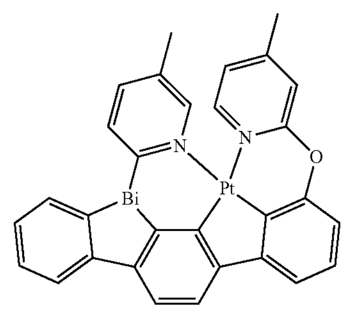
Pt 524
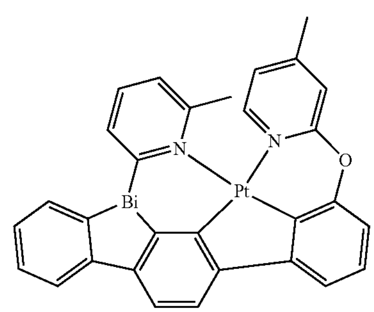

Pt 525
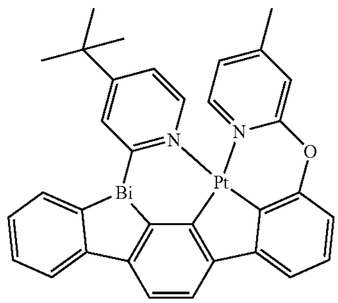
Pt 526
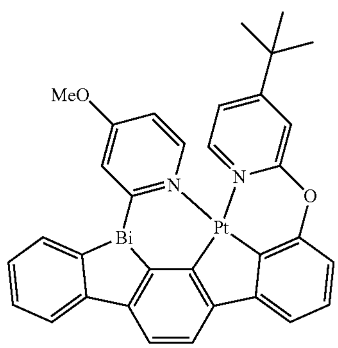
Pt 527
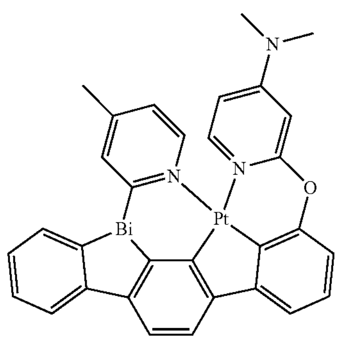
Pt 528
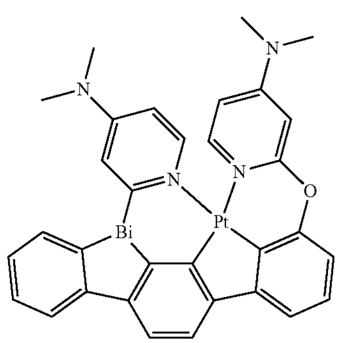
Pt 529
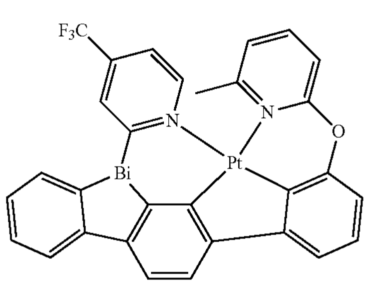
Pt 530
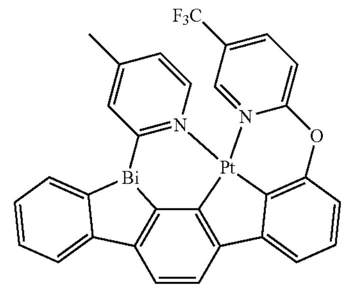
Pt 531
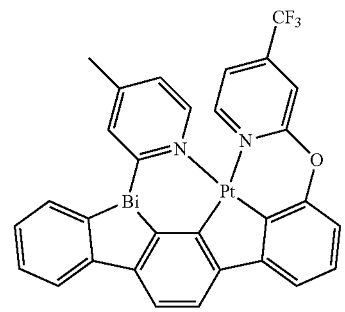
Pt 532
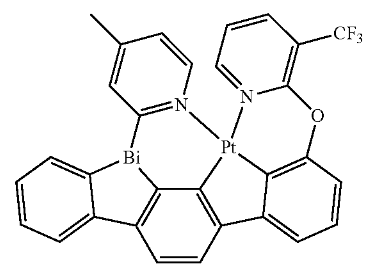
Pt 533
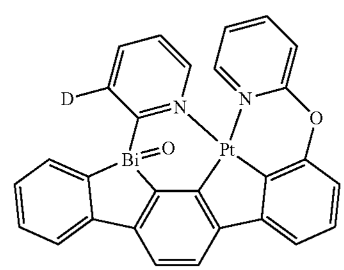
Pt 534
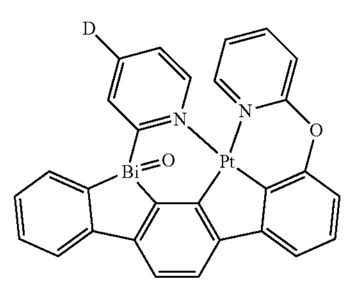

-continued
Pt 535
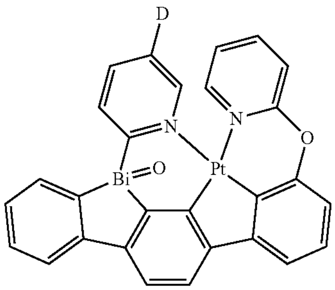
Pt 536
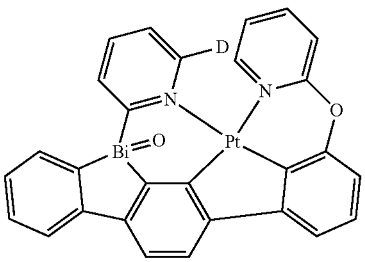
Pt 537
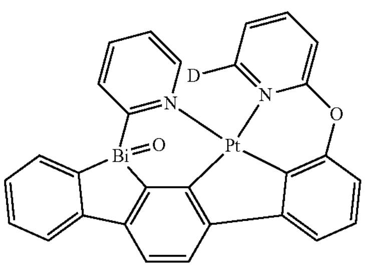
Pt 538
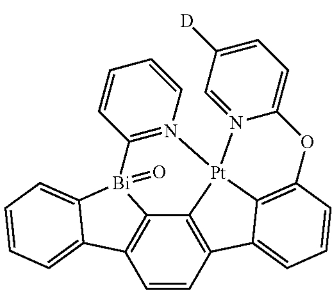
Pt 539
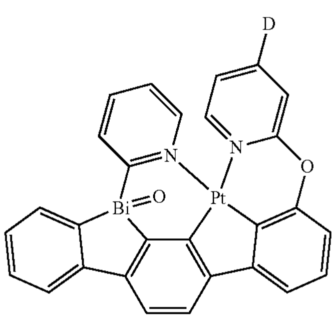
-continued
Pt 540
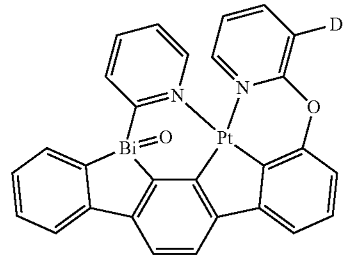
Pt 541
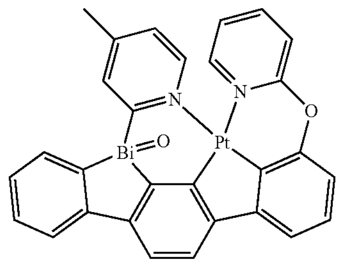
Pt 542
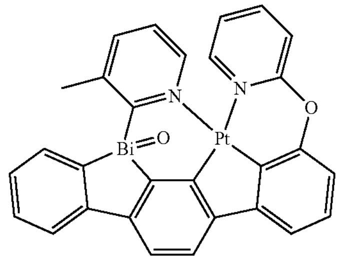
Pt 543
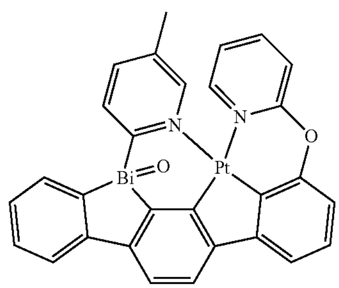
Pt 544
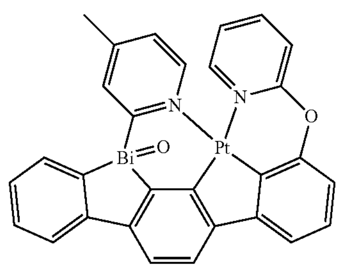
Pt 545
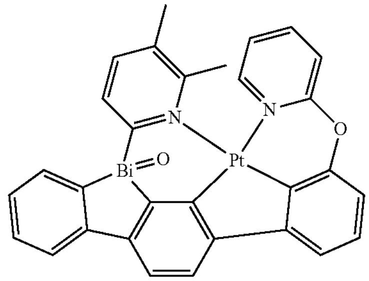

-continued
Pt 546
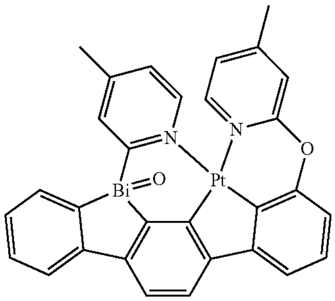
Pt 547
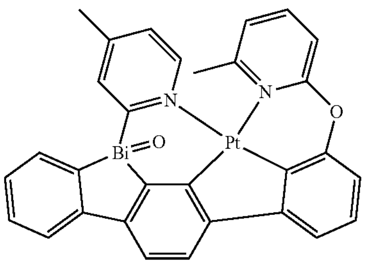
Pt 548
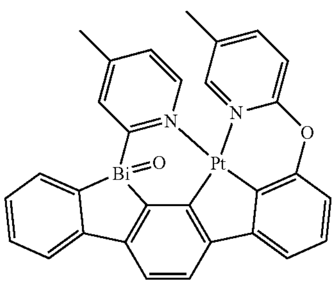
Pt 549
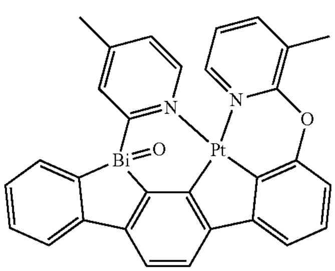
Pt 550
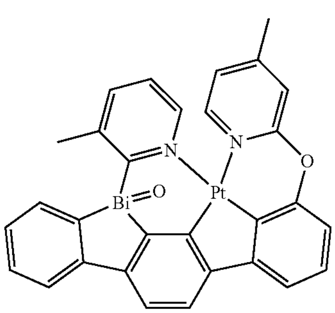
-continued
Pt 551
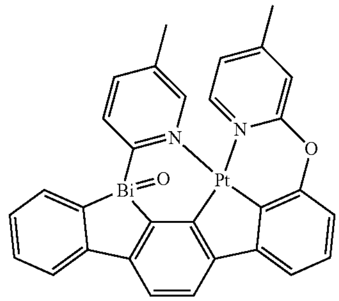
Pt 552
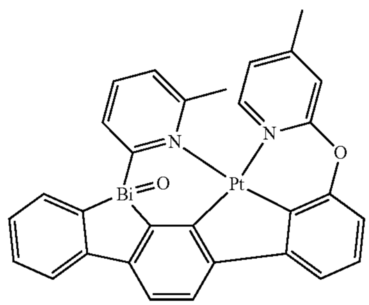
Pt 553
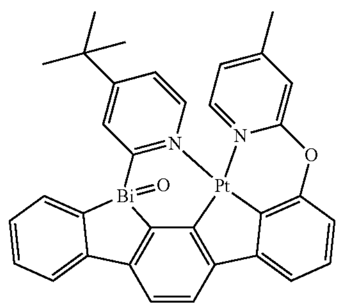
Pt 554
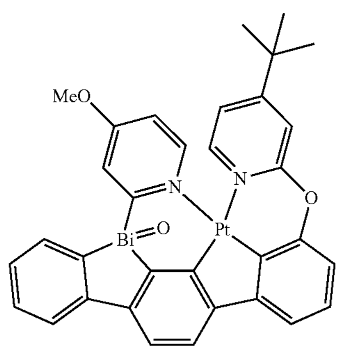
Pt 555
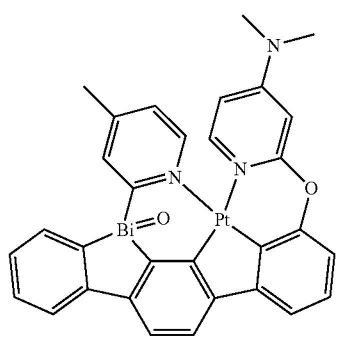

-continued
Pt 556
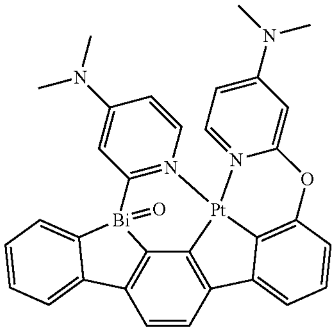
Pt 557
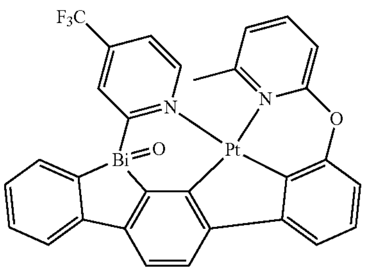
Pt 558
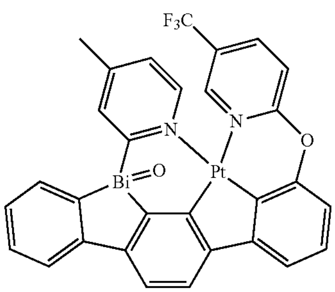
Pt 559
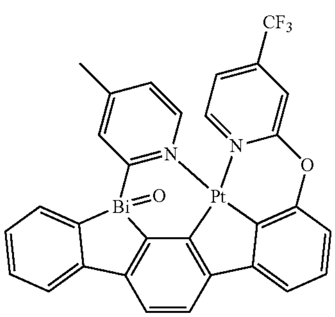
Pt 560
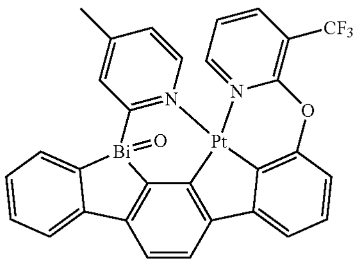
Pt 561
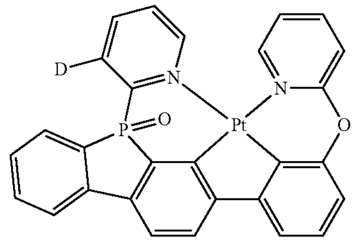
Pt 562
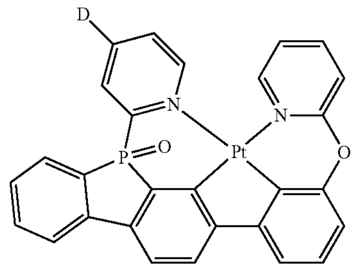
Pt 563
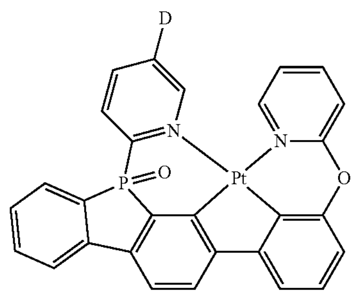
Pt 564
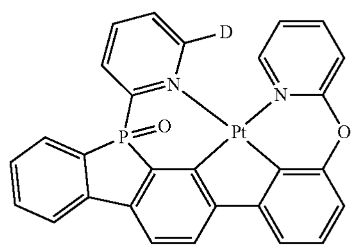
Pt 565
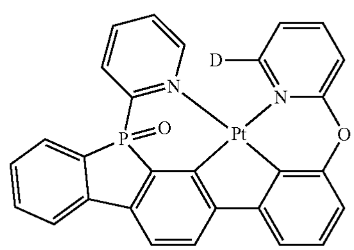
Pt 566
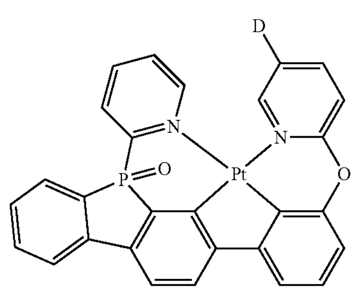

-continued
Pt 567
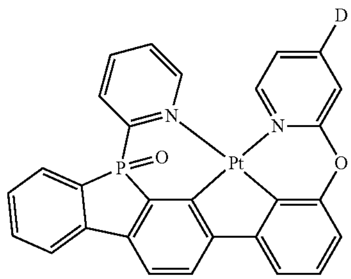
Pt 568
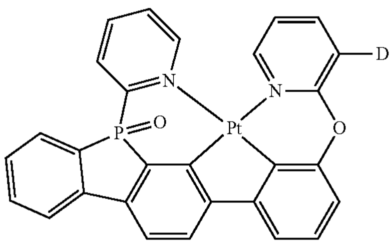
Pt 569
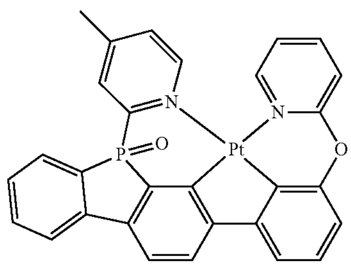
Pt 570
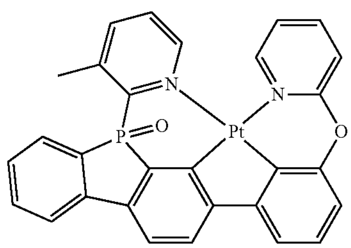
Pt 571
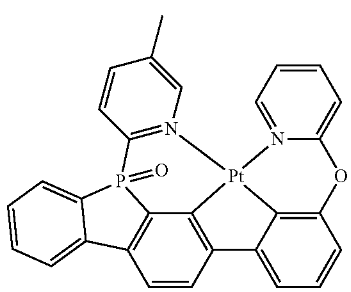
Pt 572
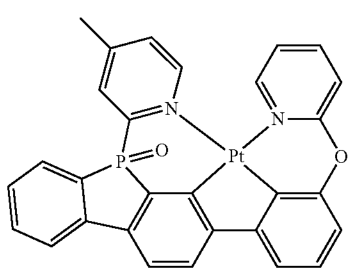
-continued
Pt 573
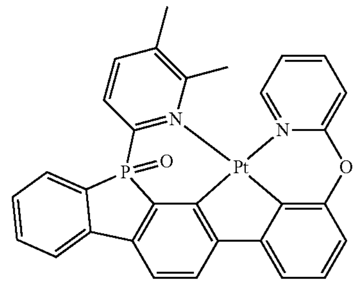
Pt 574
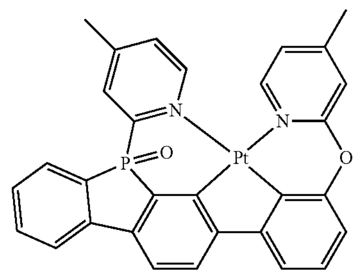
Pt 575
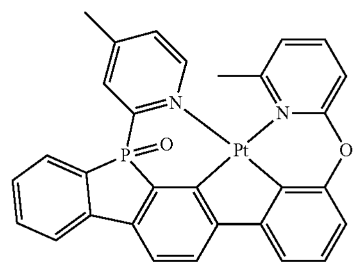
Pt 576
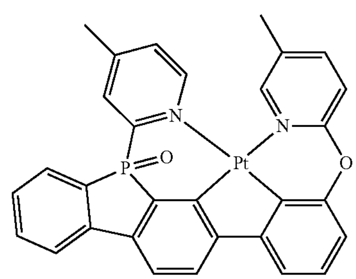
Pt 577
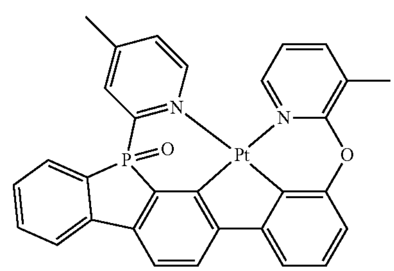

Pt 578
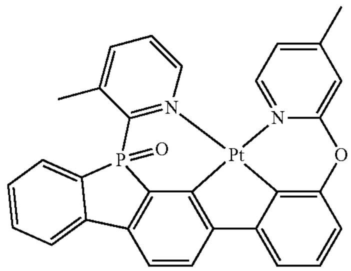
Ptd 579
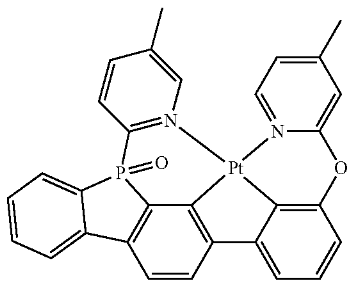
Pt 580
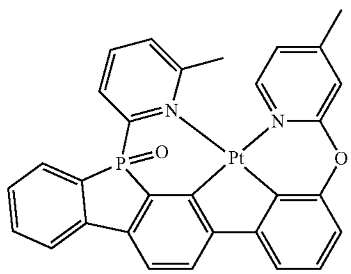
Pt 581
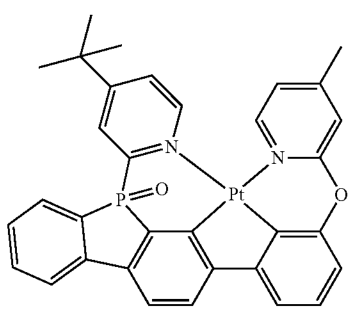
Pt 582
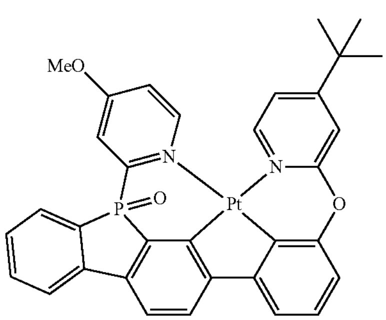
Pt 583
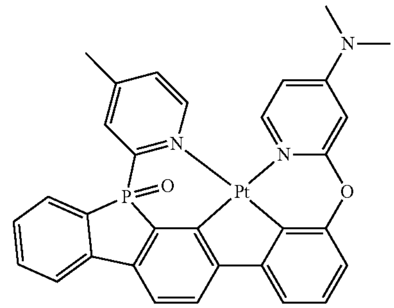
Pt 584
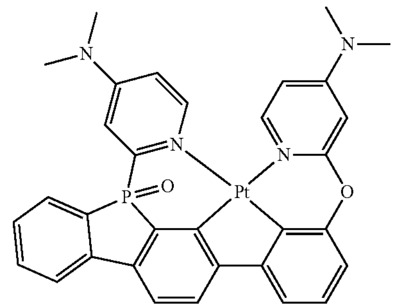
Pt 585
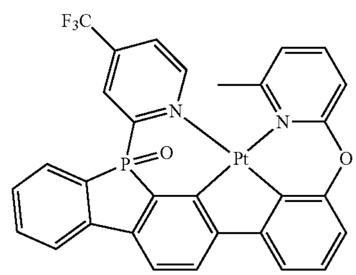
Pt 586
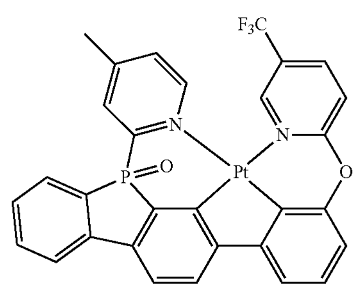
Pt 587
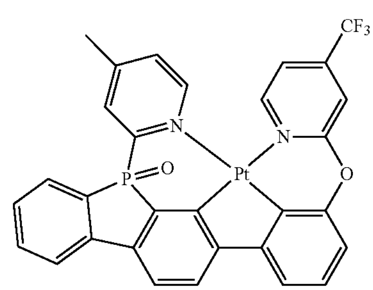

-continued
Pt 588
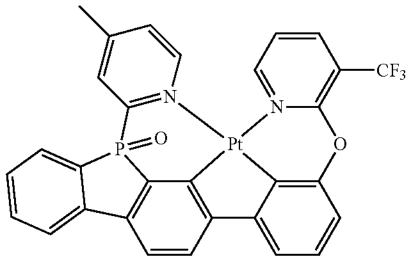
Pt 589
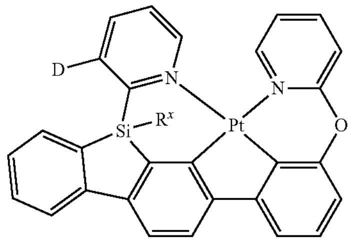
Pt 590
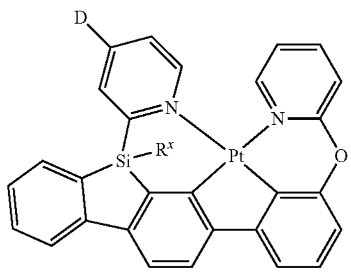
Pt 591
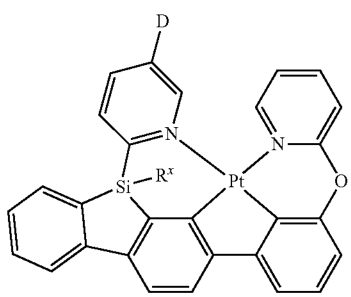
Pt 592
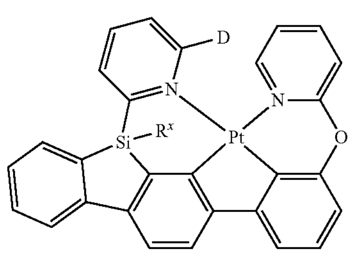
Pt 593
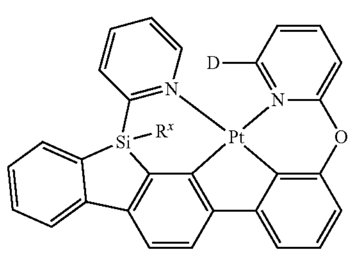
-continued
Pt 594
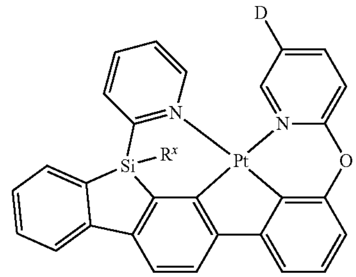
Pt 595
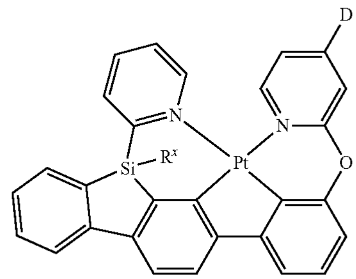
Pt 596
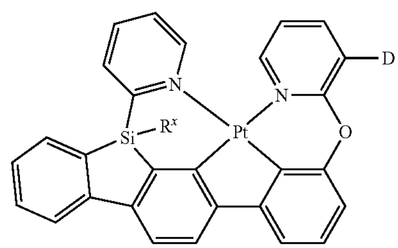
Pt 597
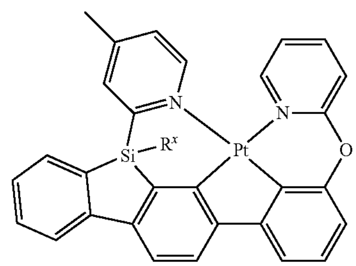
Pt 598
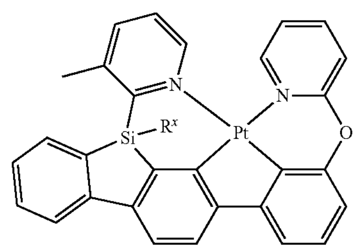
Pt 599
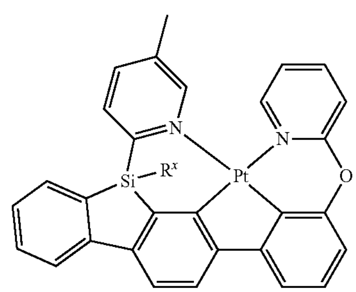

-continued
Pt 600
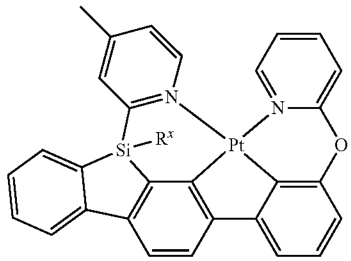
Pt 601
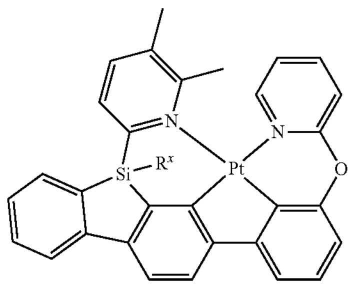
Pt 602
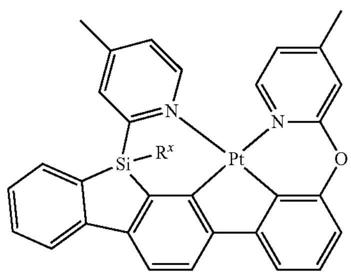
Pt 603
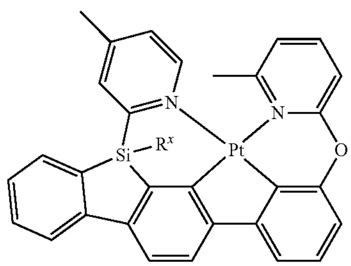
Pt 604
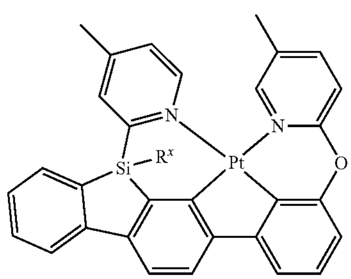
Pt 605
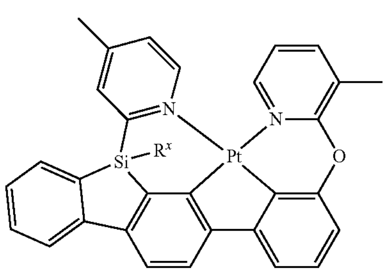
-continued
Pt 606
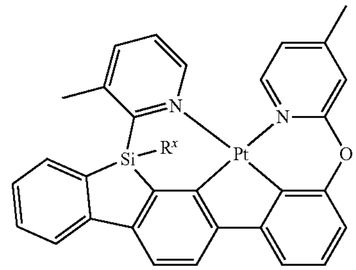
Pt 607
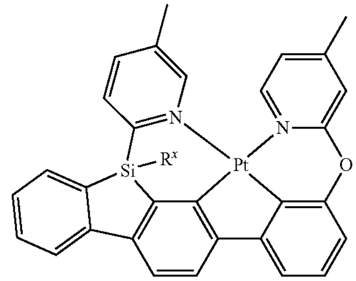
Pt 608
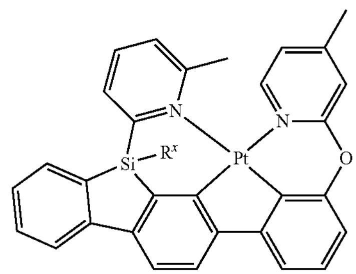
Pt 609
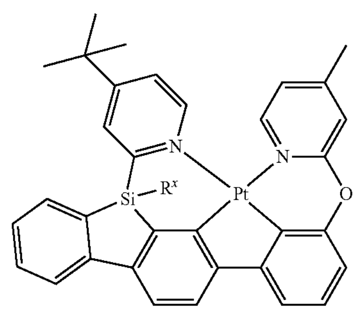
Pt 610
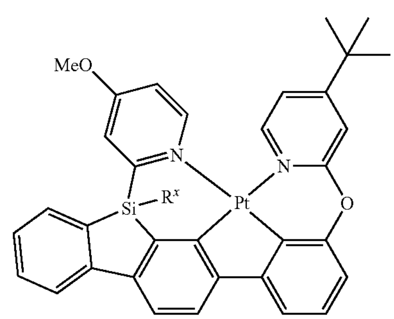

Pt 611
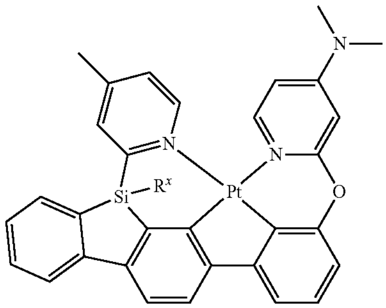
Pt 612
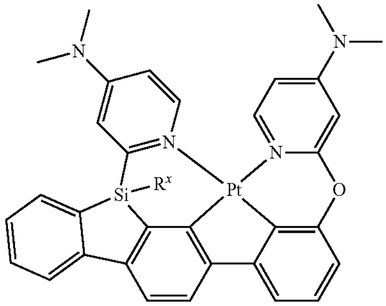
Pt 613
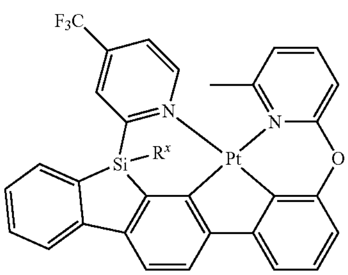
Pt 614
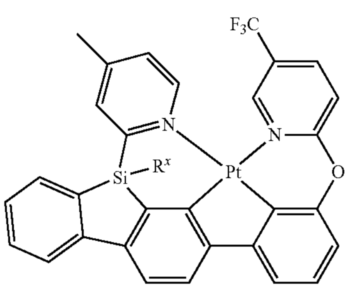
Pt 615
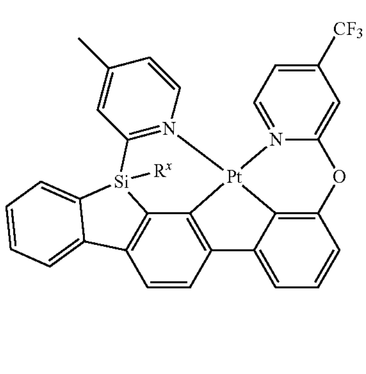
Pt 616
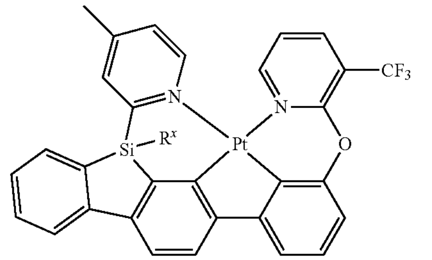
Pt 617
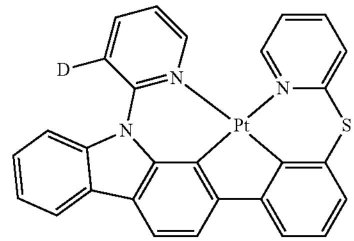
Pt 618
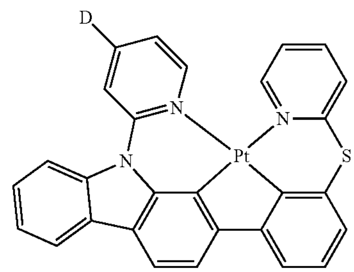
Pt 619
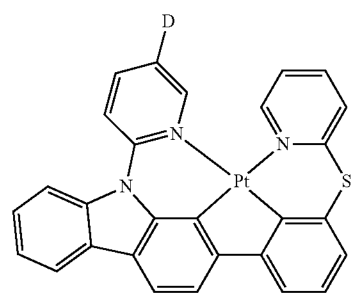
Pt 620
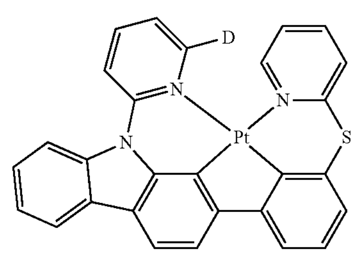
Pt 621
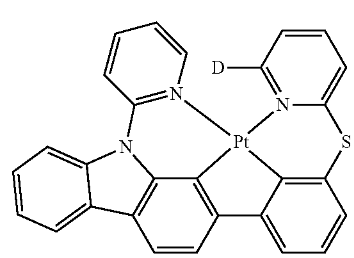

-continued
Pt 622
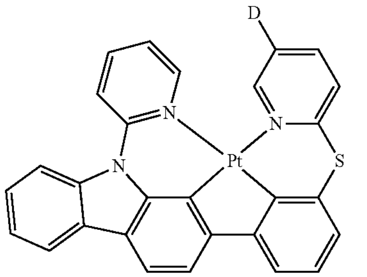
Pt 623
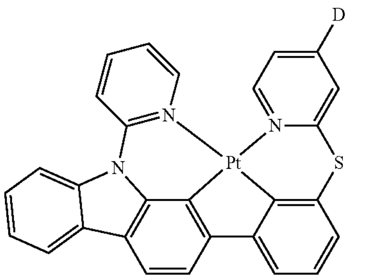
Pt 624
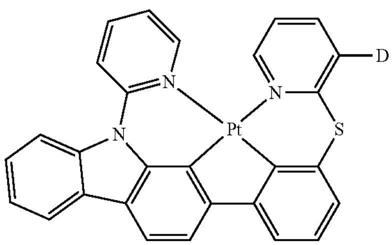
Pt 625
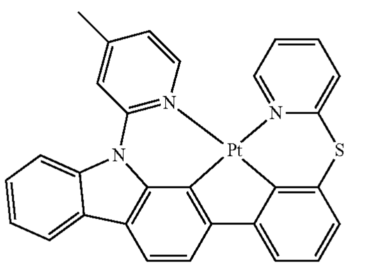
Pt 626
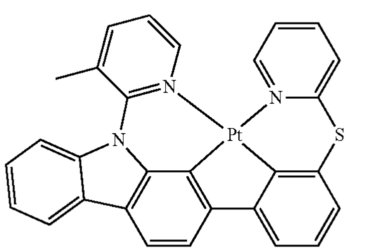
Pt 627
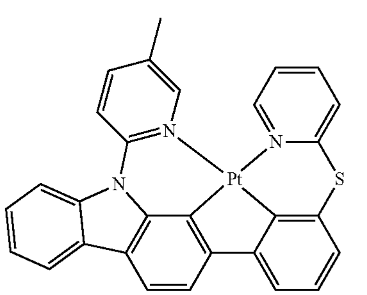
-continued
Pt 628
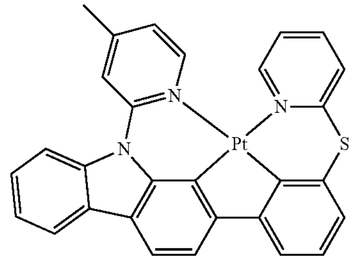
Pt 629
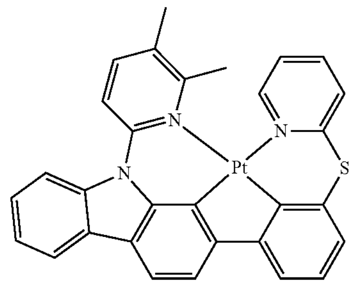
Pt 630
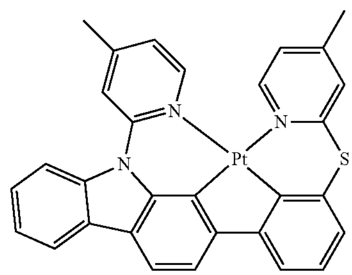
Pt 631
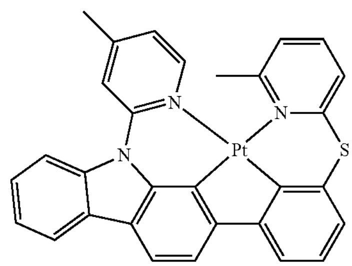
Pt 632
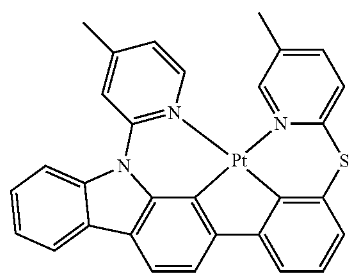
Pt 633
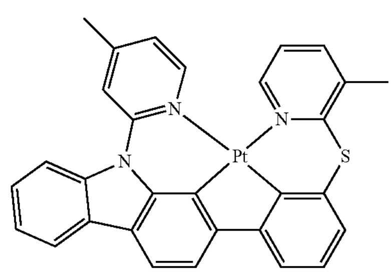

-continued
Pt 634
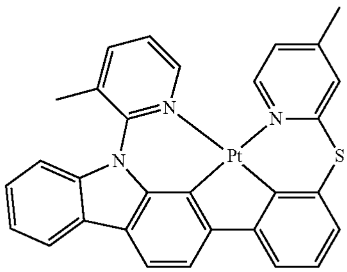
Pt 635
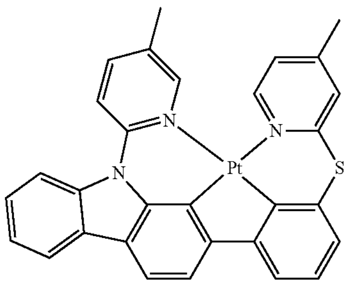
Pt 636
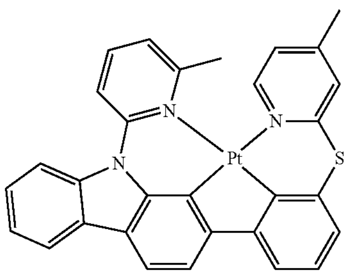
Pt 637
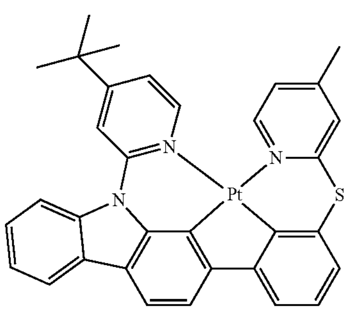
Pt 638
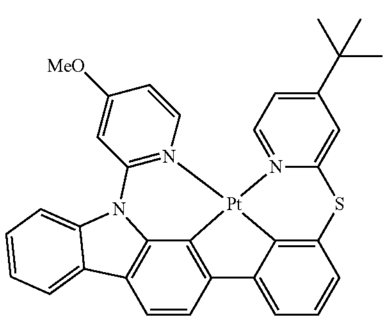
-continued
Pt 639
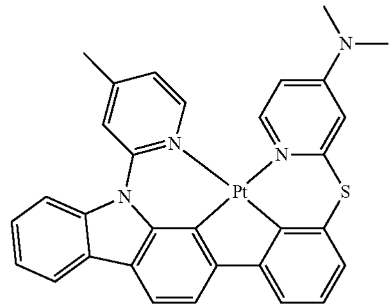
Pt 640
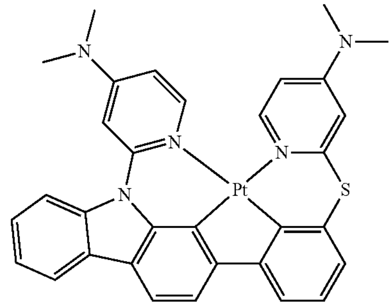
Pt 641
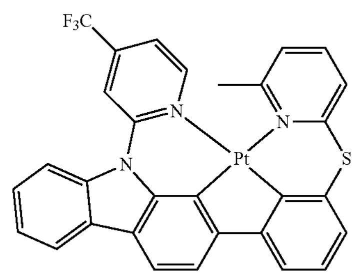
Pt 642
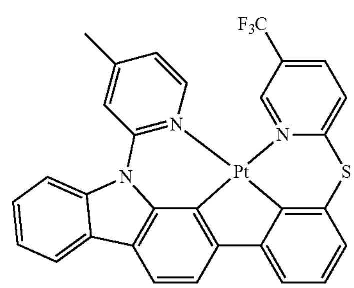
Pt 643
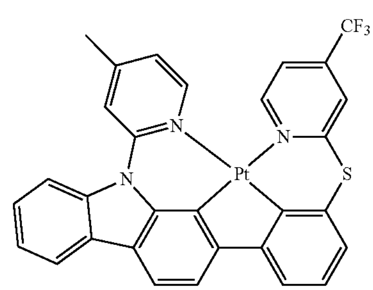

Pt 644
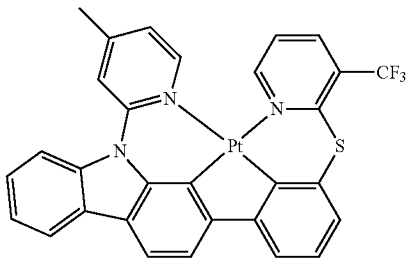
Pt 645
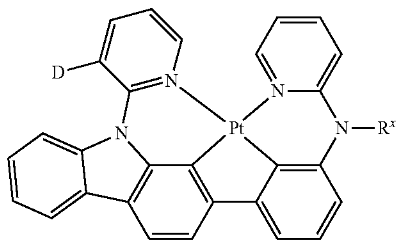
Pt 646
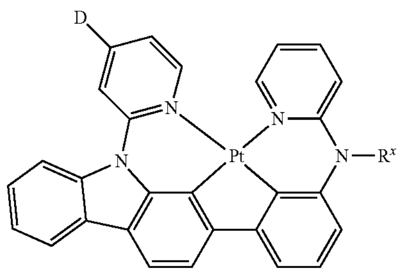
Pt 647
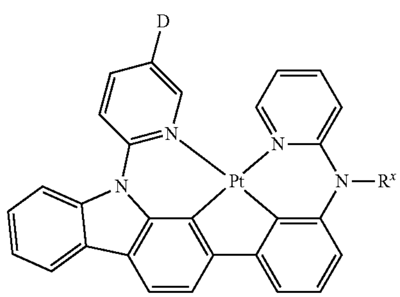
Pt 648
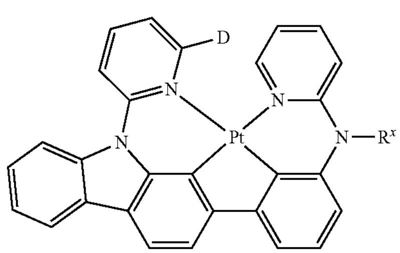
Pt 649
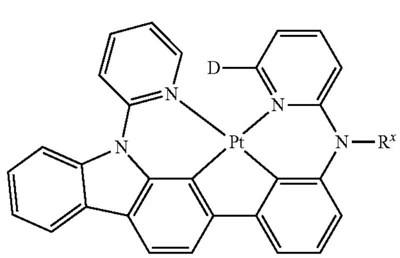
Pt 650
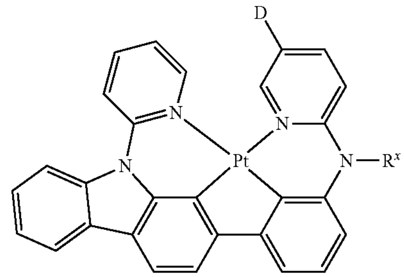
Pt 561
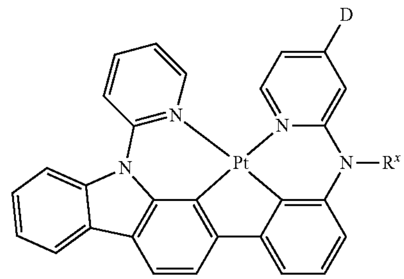
Pt 652
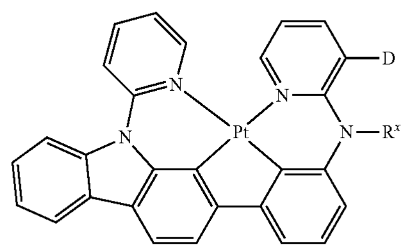
Pt 653
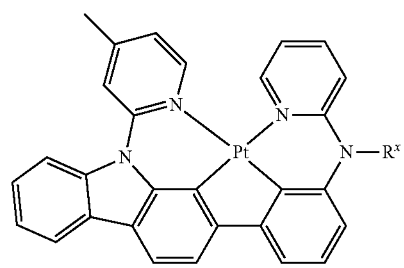
Pt 654
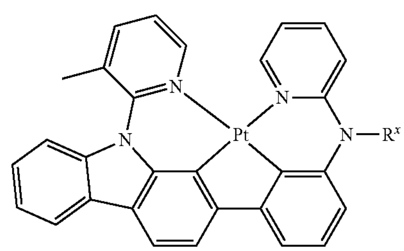
Pt 655
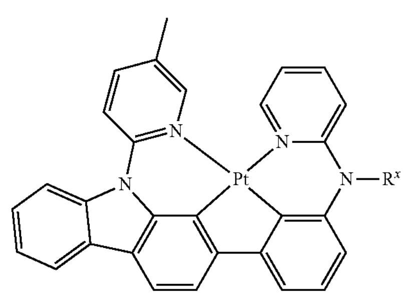

-continued
Pt 656
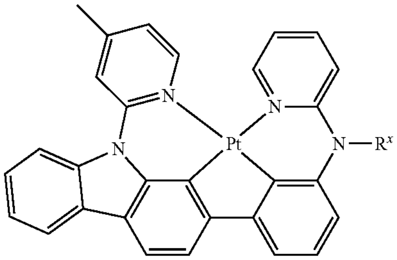
Pt 657
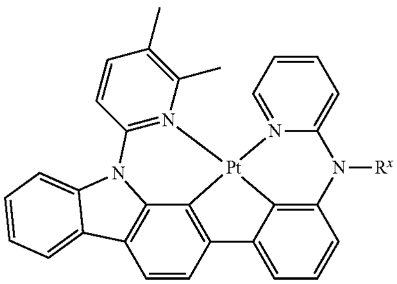
Pt 658
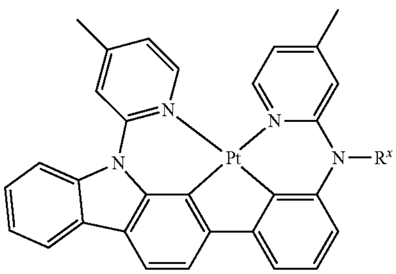
Pt 659
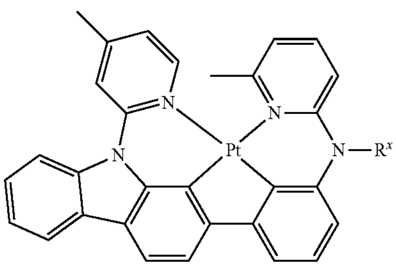
Pt 660
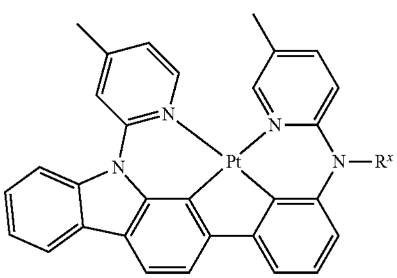
Pt 661
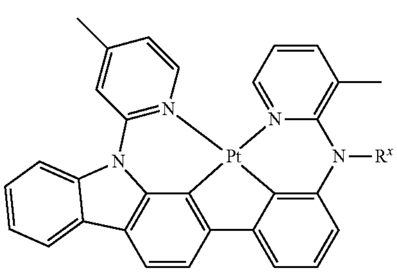
-continued
Pt 662
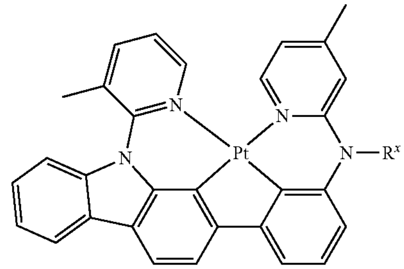
Pt 663
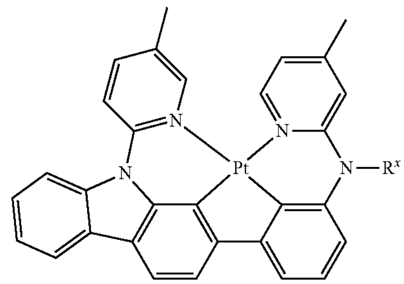
Pt 664
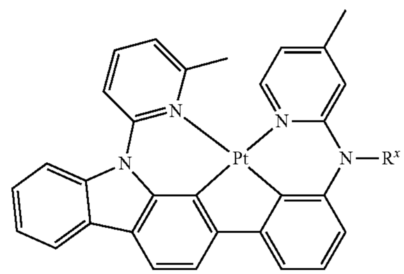
Pt 665
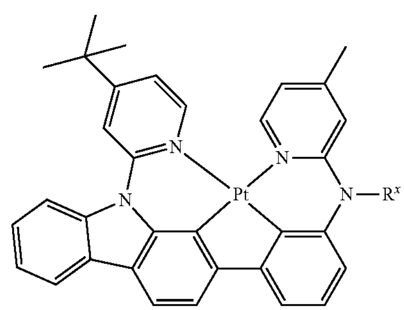
Pt 666
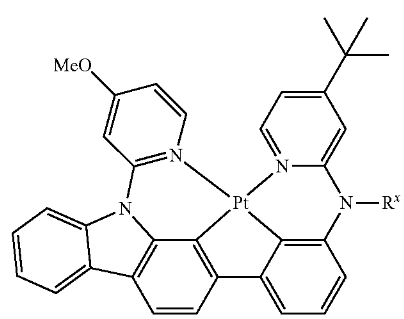

Pt 667
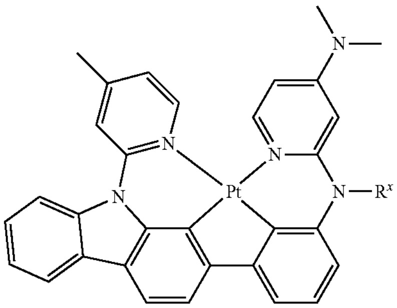
Pt 668
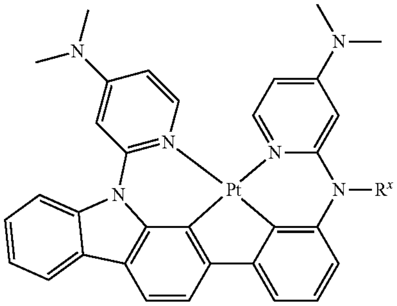
Pt 669
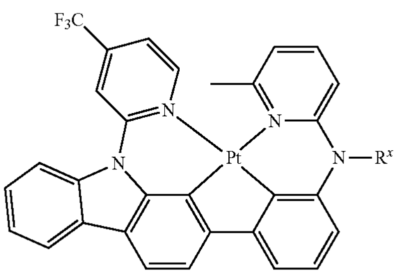
Pt 670
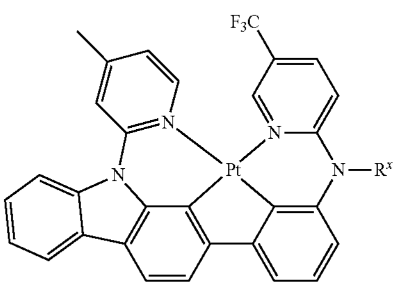
Pt 671
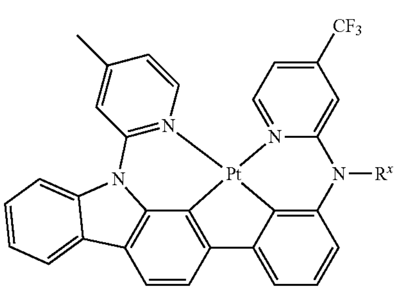
Pt 672
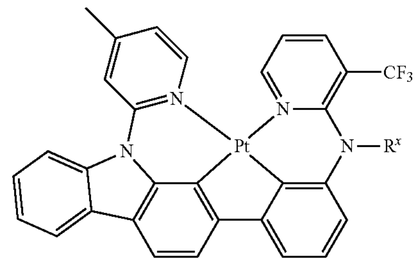
Pt 673
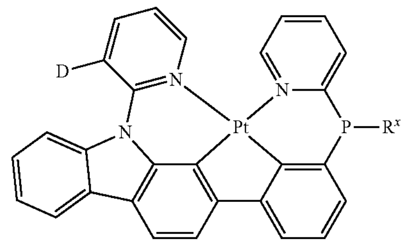
Pt 674
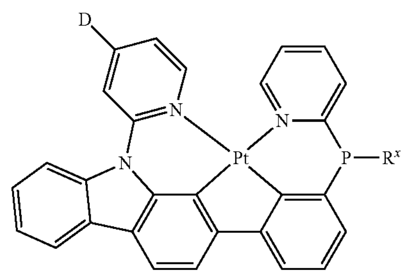
Pt 675
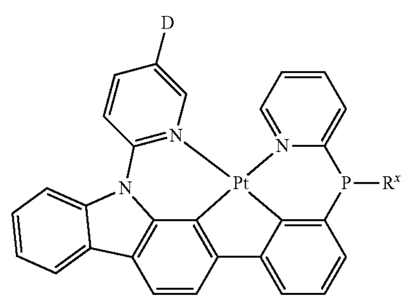
Pt 676
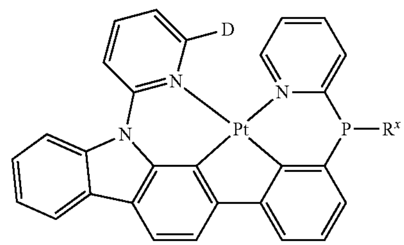
Pt 677
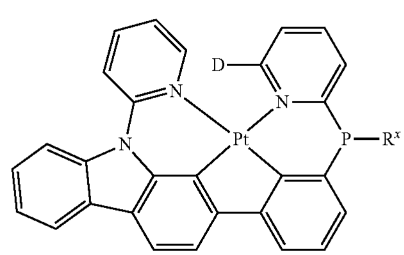

Pt 678
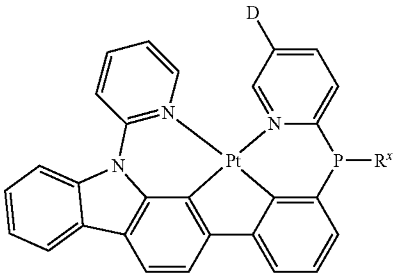
Pt 679
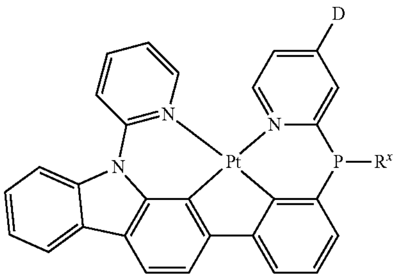
Pt 680
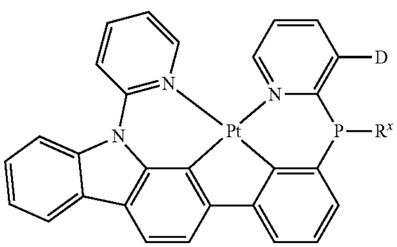
Pt 681
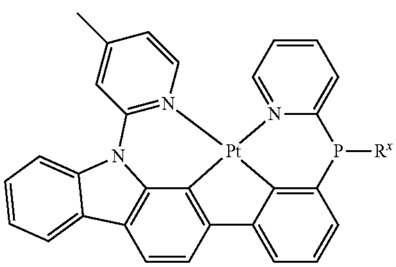
Pt 682
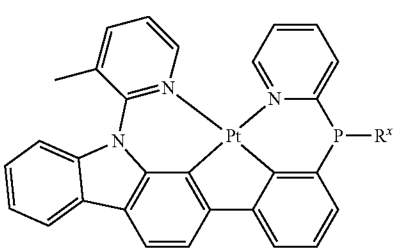
Pt 683
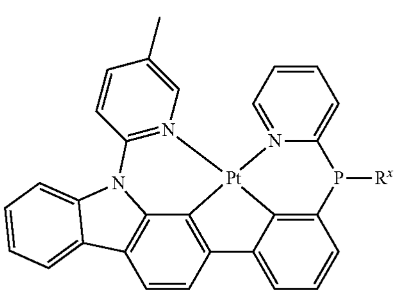
Pt 684
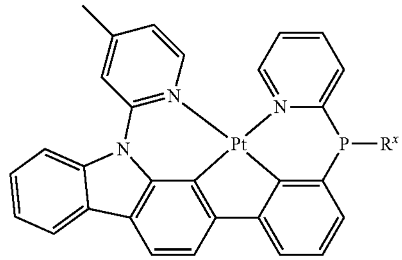
Pt 685
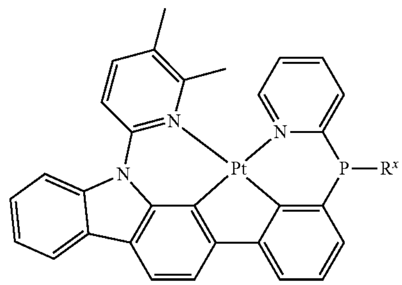
Pt 686
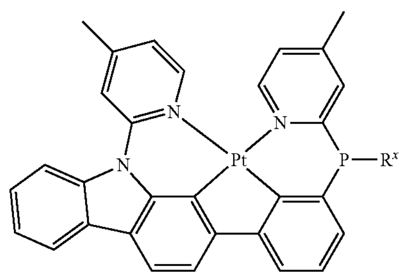
Pt 689
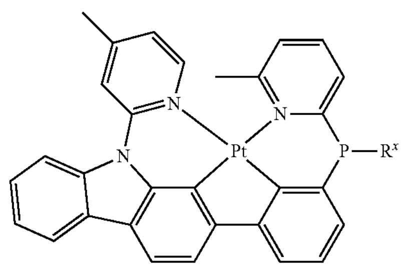
Pt 690
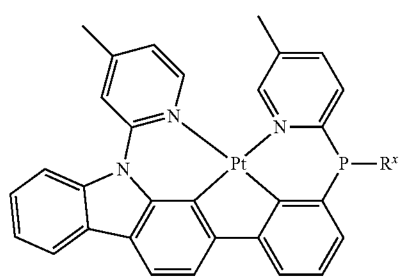
Pt 691
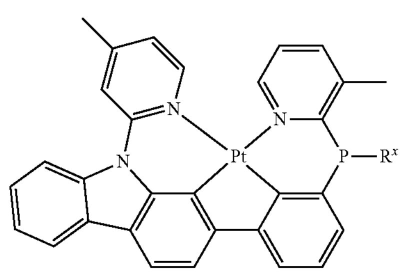

Pt 692
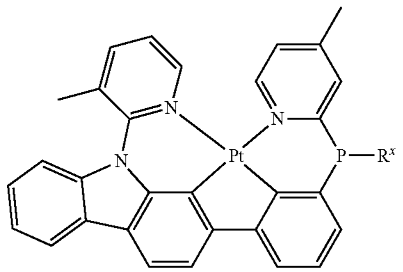
Pt 693
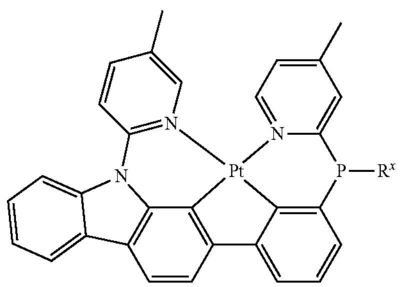
Pt 694
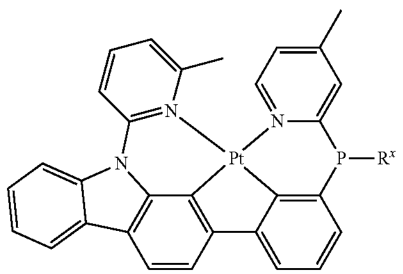
Pt 695
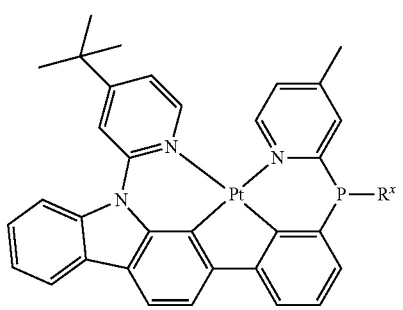
Pt 696
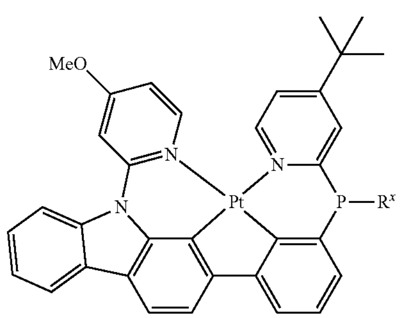
Pt 697
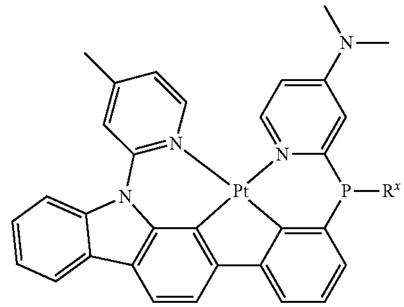
Pt 698
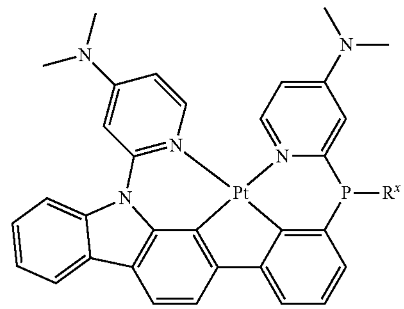
Pt 699
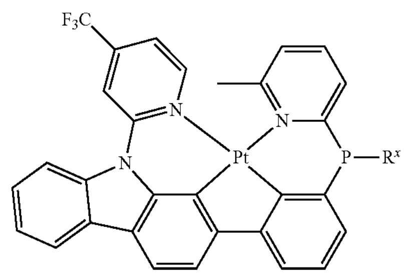
Pt 700
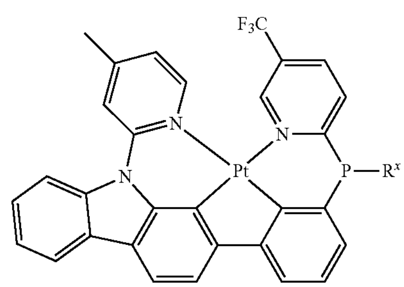
Pt 701
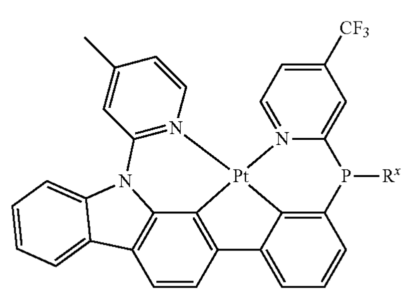

Pt 702
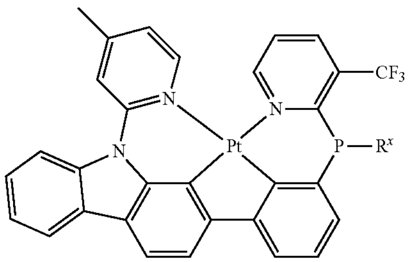
Pt 703
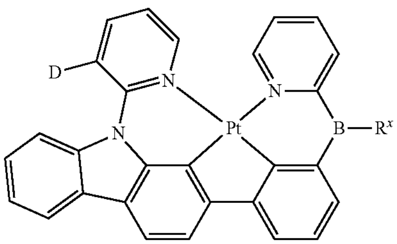
Pt 704
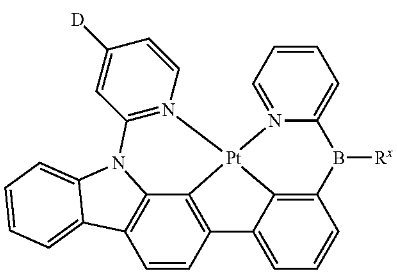
Pt 705
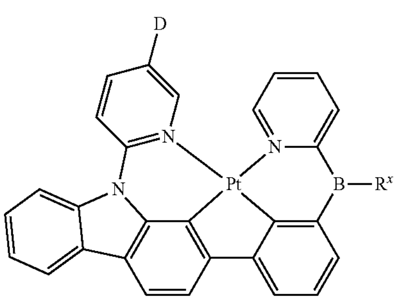
Pt 706
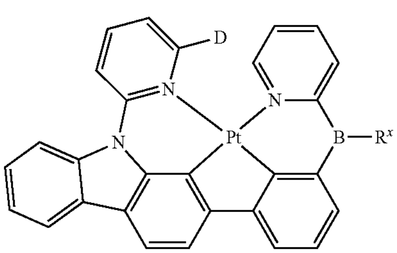
Pt 707
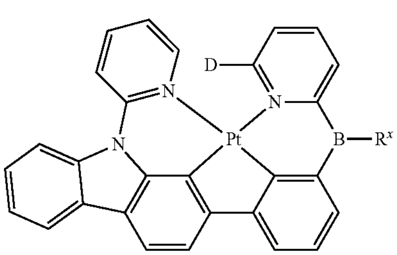
Pt 708
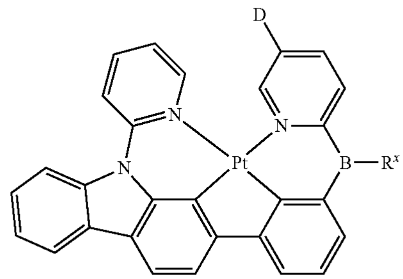
Pt 709
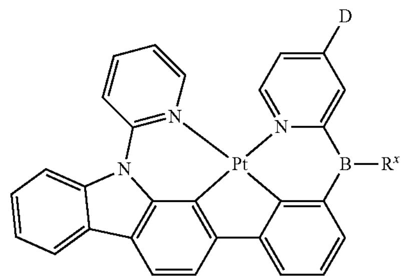
Pt 710
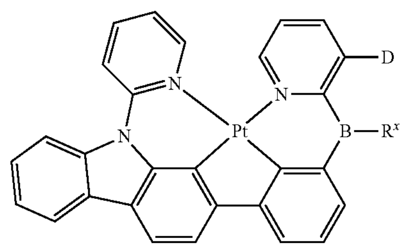
Pt 711
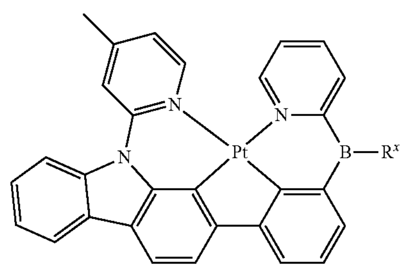
Pt 712
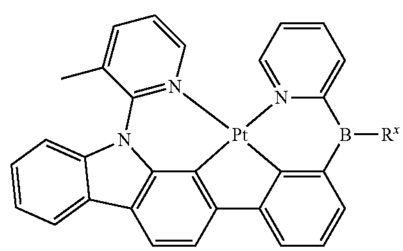
Pt 713
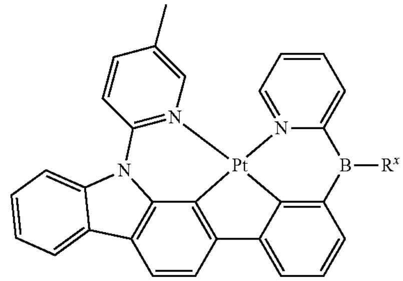

-continued
Pt 714
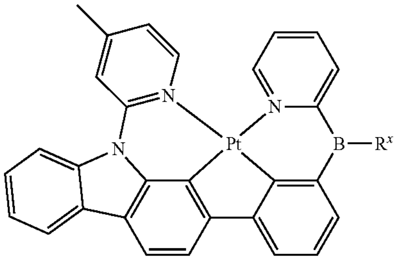
Pt 715
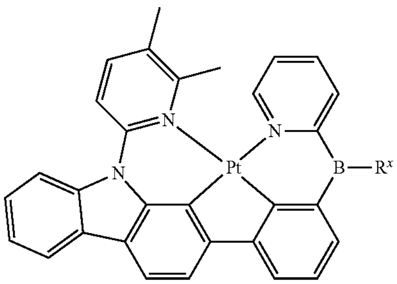
Pt 716
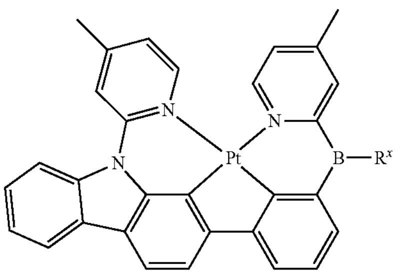
Pt 717
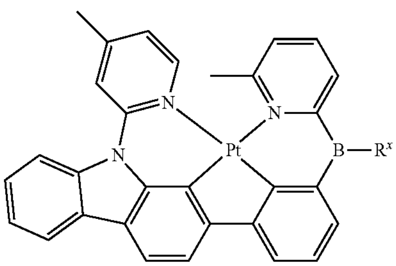
Pt 718
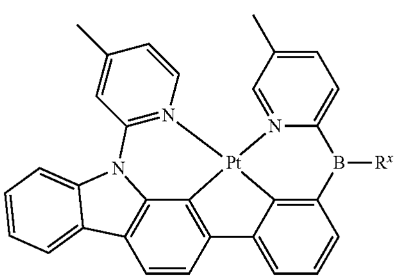
Pt 719
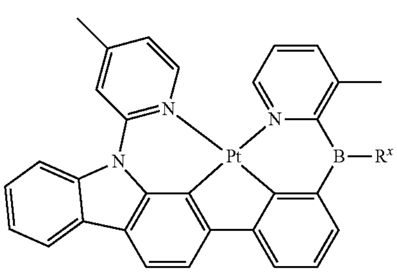
-continued
Pt 720
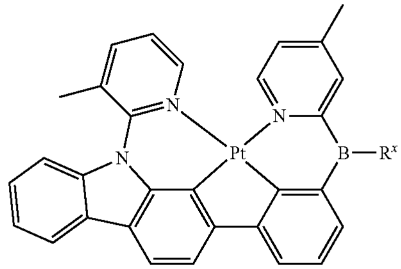
Pt 721
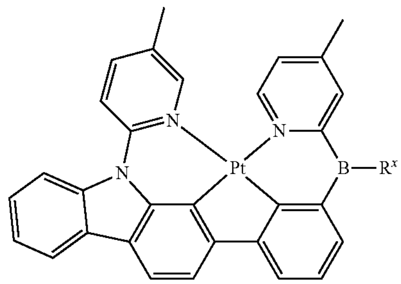
Pt 722
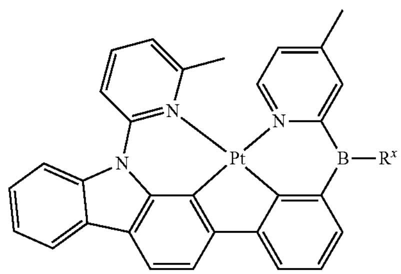
Pt 723
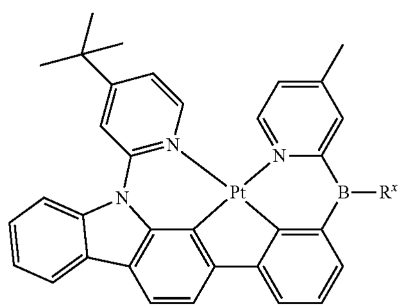
Pt 724
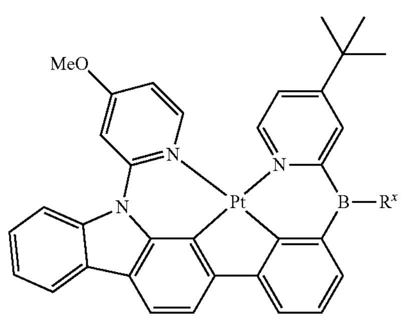

Pt 725
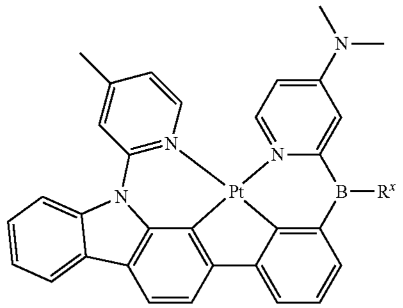
Pt 726
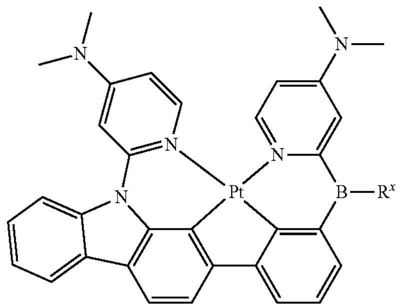
Pt 727
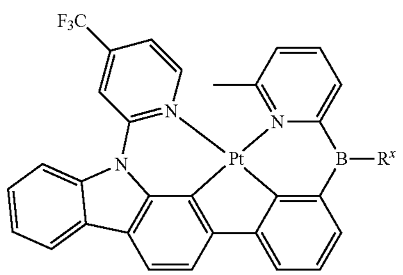
Pt 728
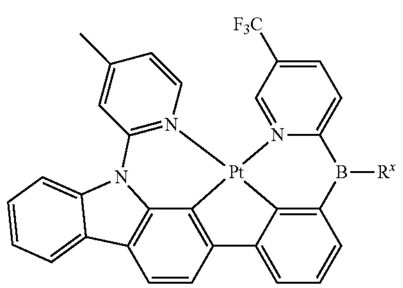
Pt 729
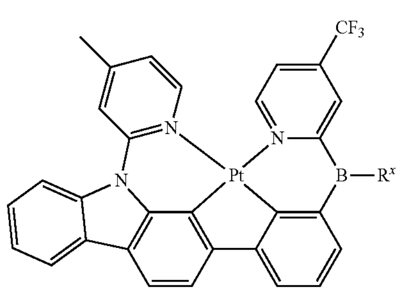
Pt 730
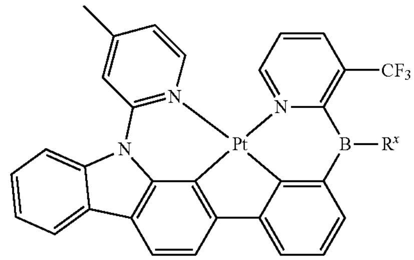
Pt 731
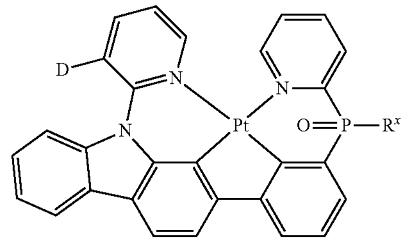
Pt 732
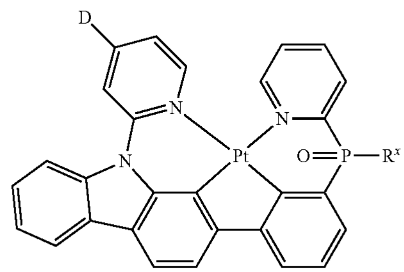
Pt 733
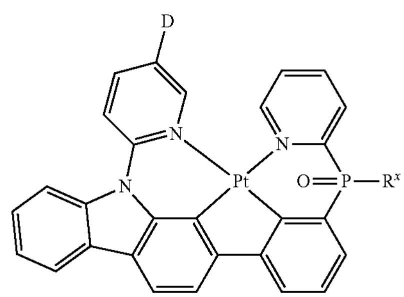
Pt 734
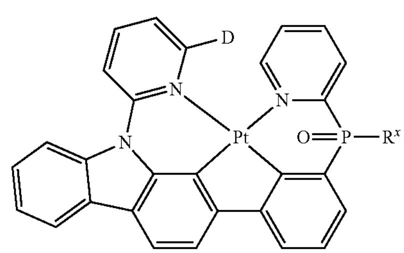
Pt 735
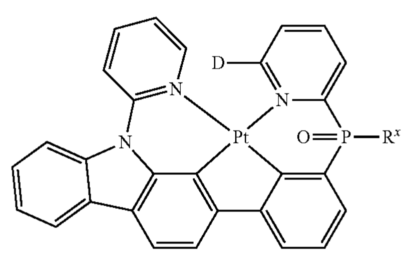

Pt 736
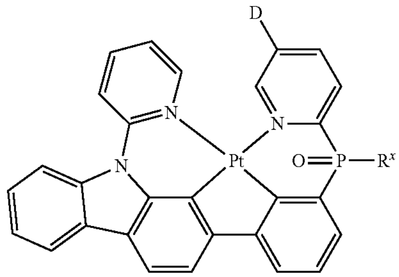
Pt 737
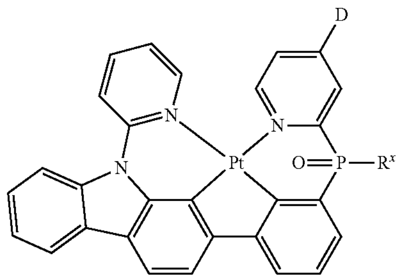
Pt 738
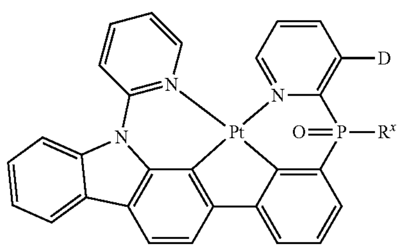
Pt 739
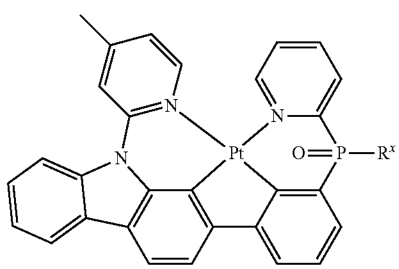
Pt 740
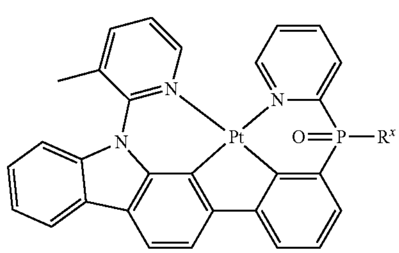
Pt 741
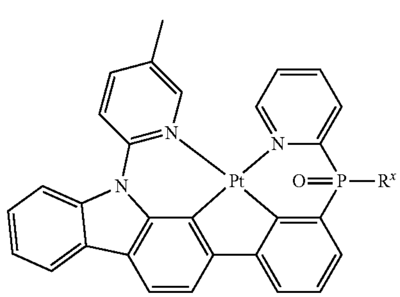
Pt 742
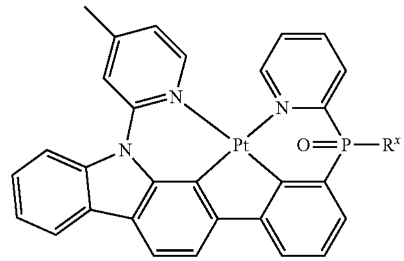
Pt 743
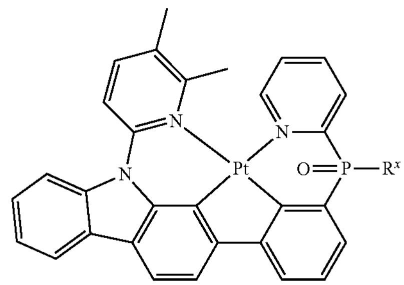
Pt 744
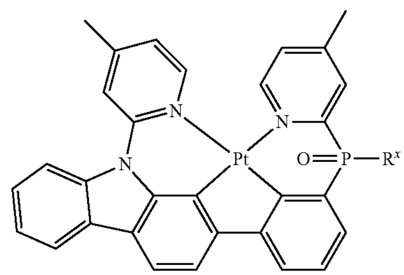
Pt 745
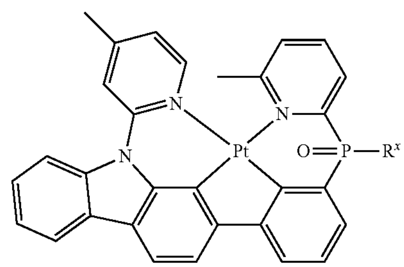
Pt 746
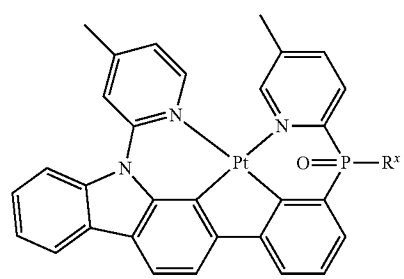
Pt 747
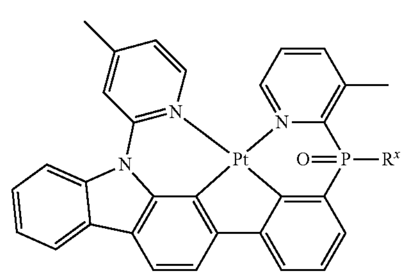

-continued
Pt 748
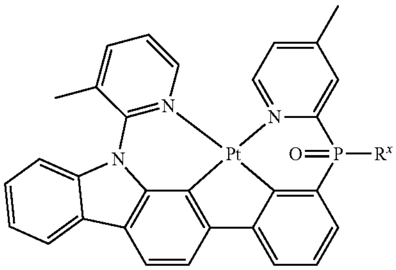
Pt 749
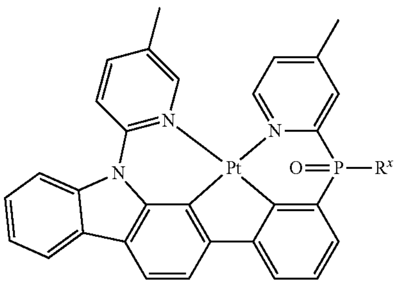
Pt 750
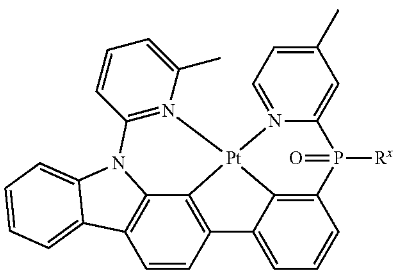
Pt 751
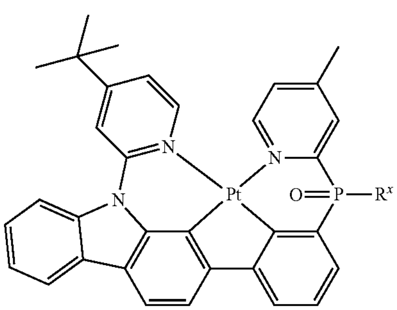
Pt 752
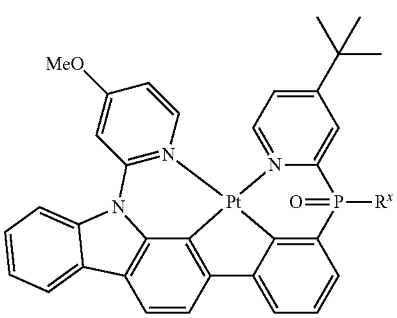
-continued
Pt 753
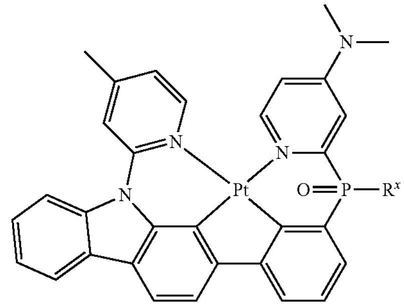
Pt 754
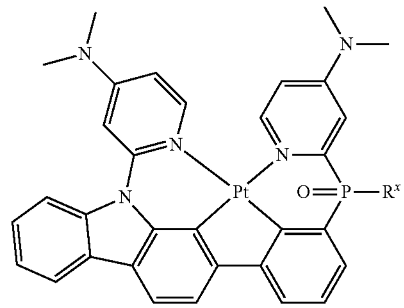
Pt 755
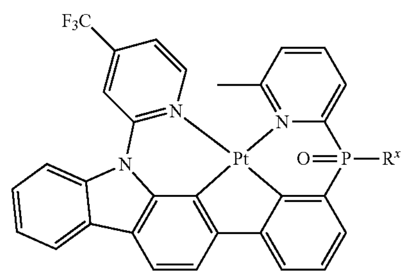
Pt 756
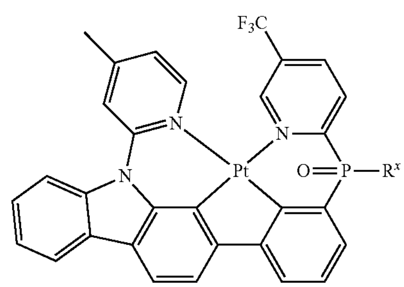
Pt 757
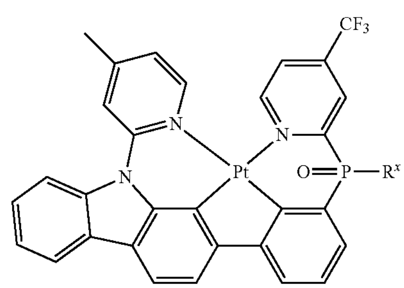

Pt 758
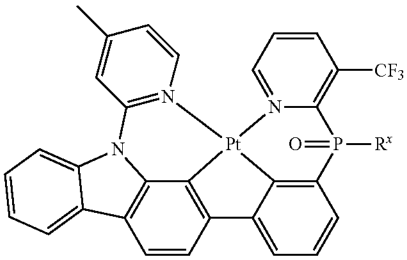
Pt 759
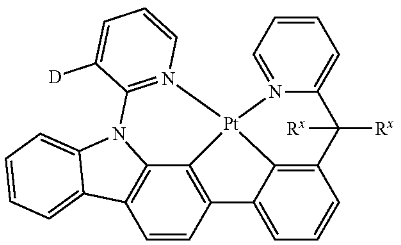
Pt 760
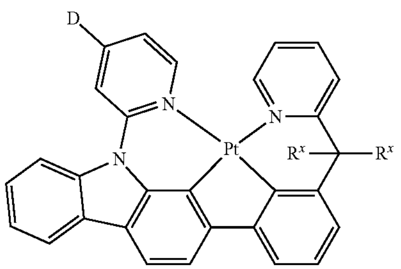
Pt 761
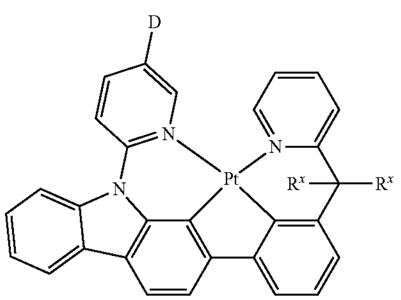
Pt 762
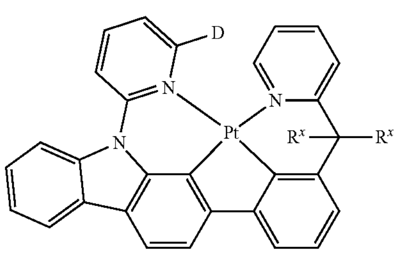
Pt 763
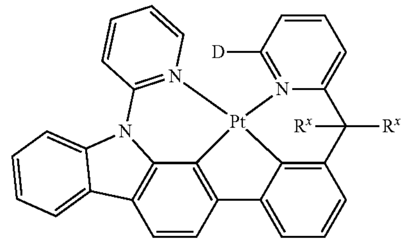
Pt 764
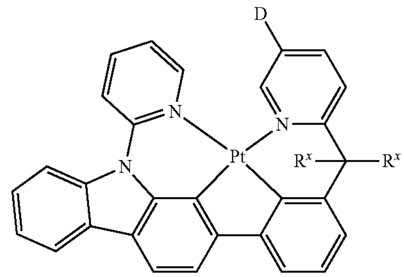
Pt 765
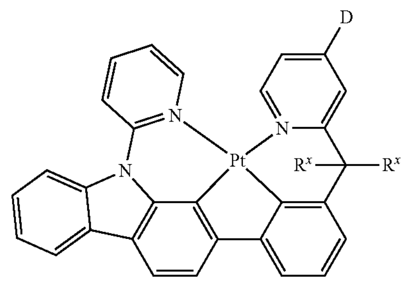
Pt 766
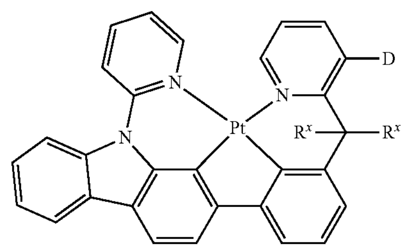
Pt 767
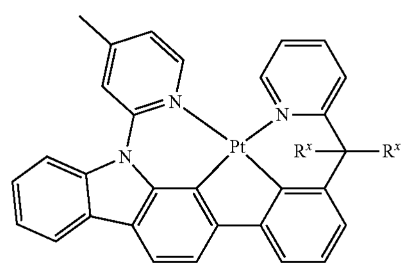
Pt 768
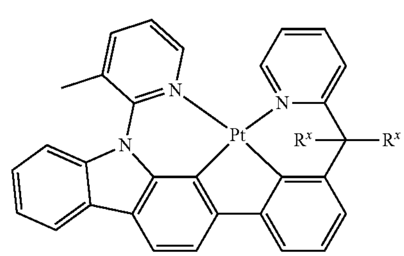

Pt 769
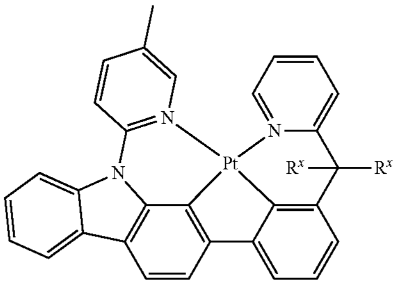
Pt 770
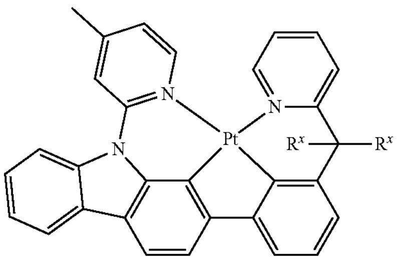
Pt 771
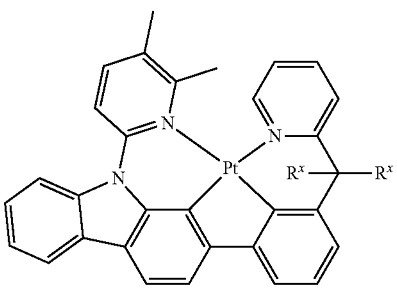
Pt 772
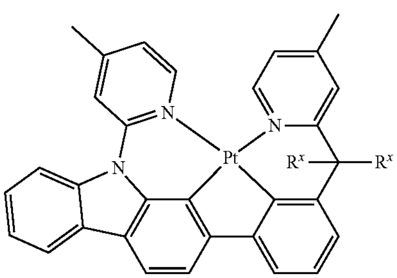
Pt 773
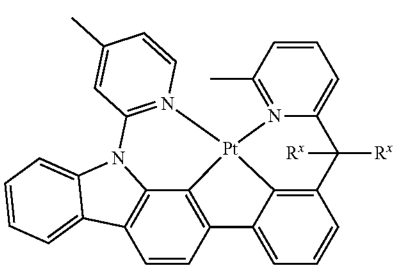
Pt 774
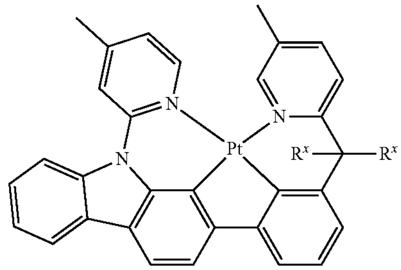
Pt 775
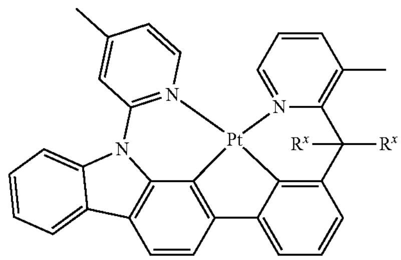
Pt 776
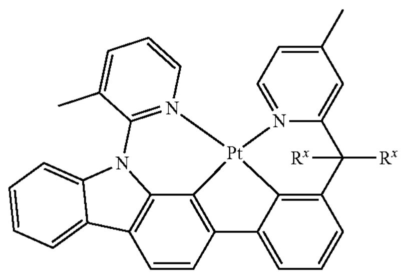
Pt 777
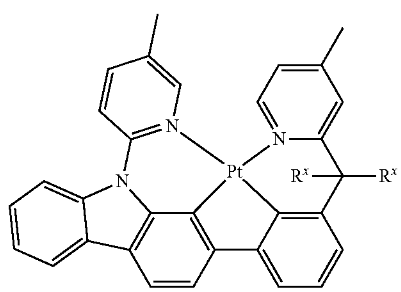
Pt 778
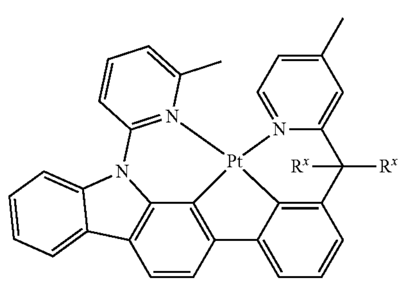

-continued
Pt 779
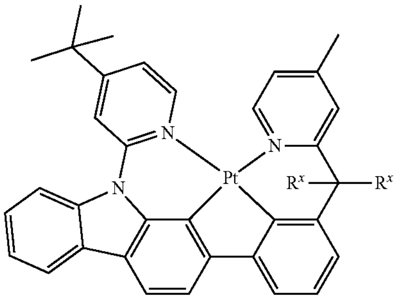
Pt 780
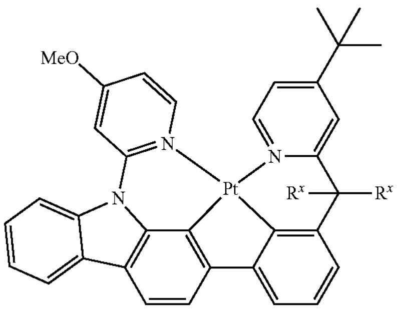
Pt 781
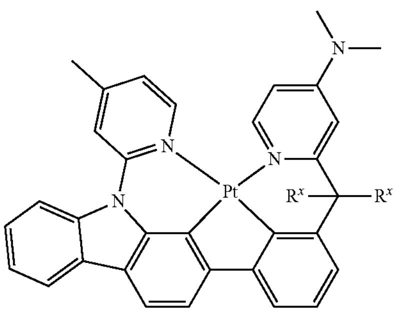
Pt 782
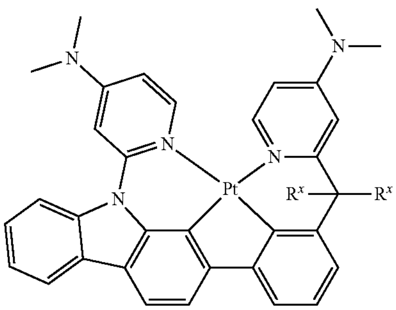
Pt 783
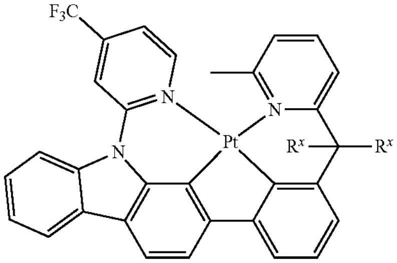
-continued
Pt 784
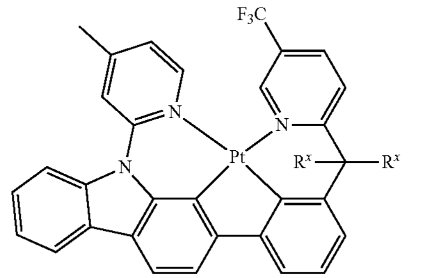
Pt 785
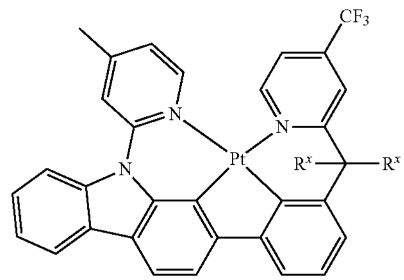
Pt 786
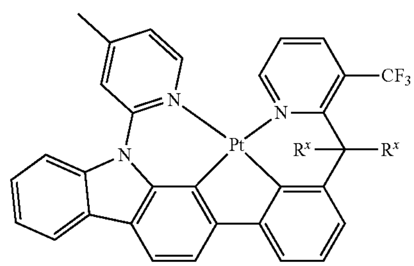
Pt 787
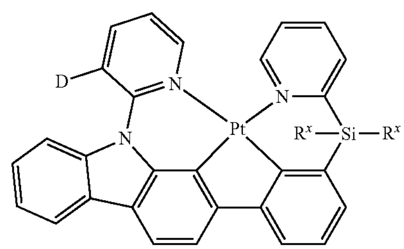
Pt 788
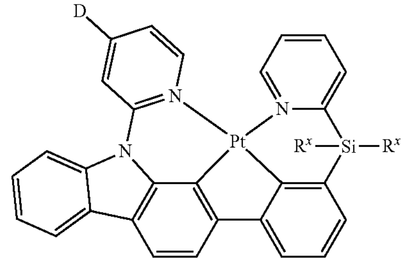
Pt 789
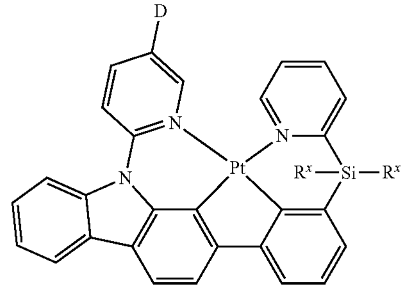

-continued
Pt 790
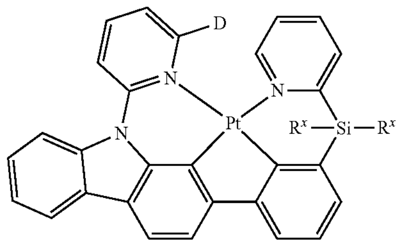
Pt 791
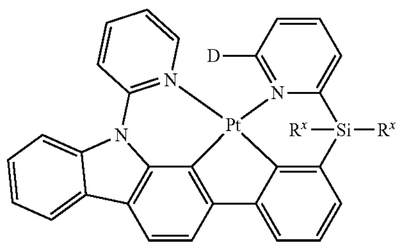
Pt 792
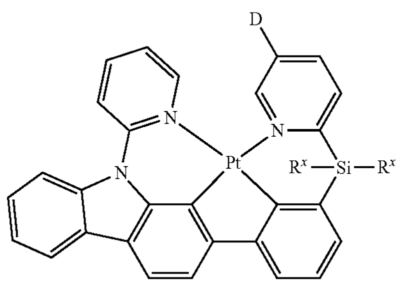
Pt 793
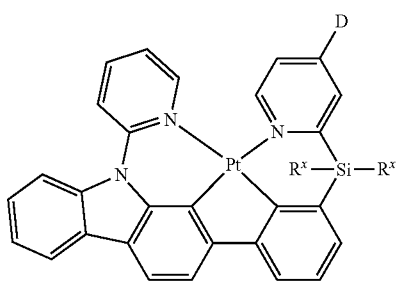
Pt 794
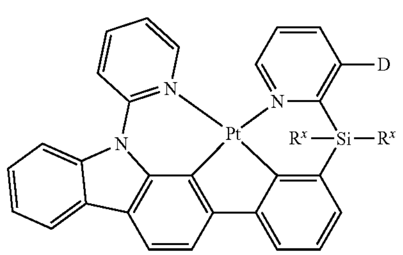
Pt 795
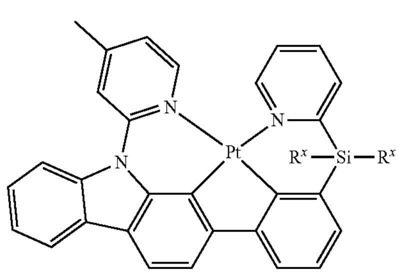
-continued
Pt 796
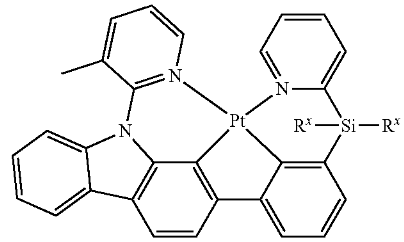
Pt 797
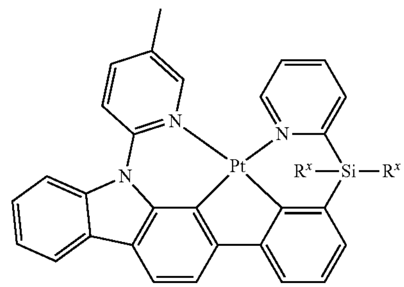
Pt 798
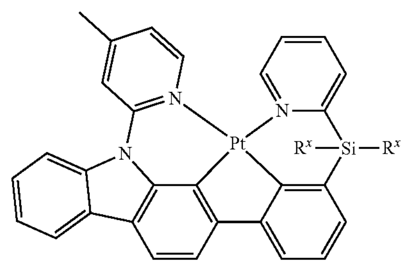
Pt 799
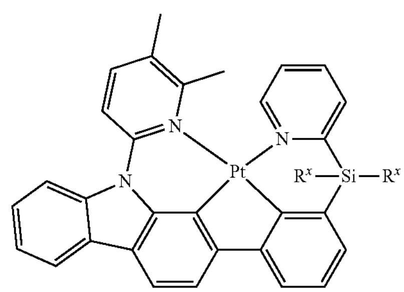
Pt 800
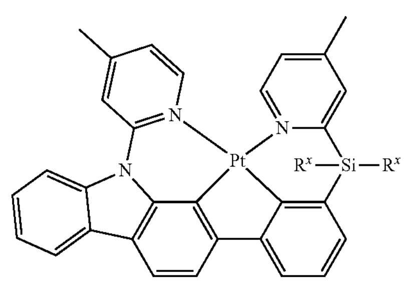
Pt 801
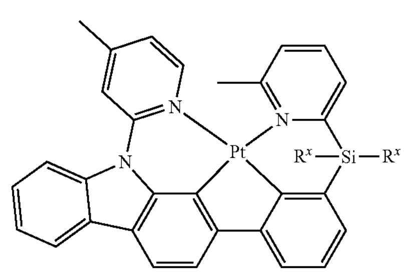

-continued
Pt 802
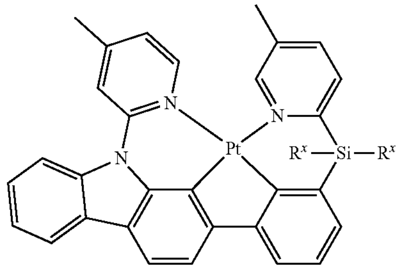
Pt 803
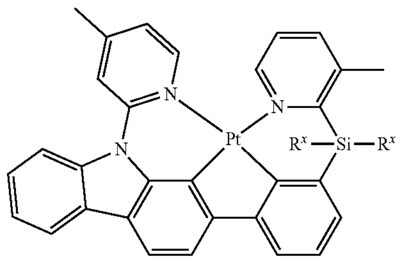
Pt 804
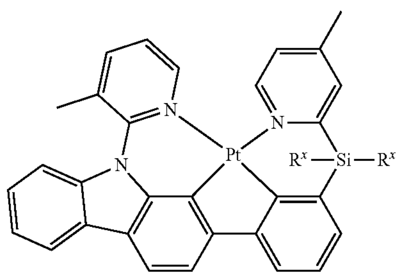
Pt 805
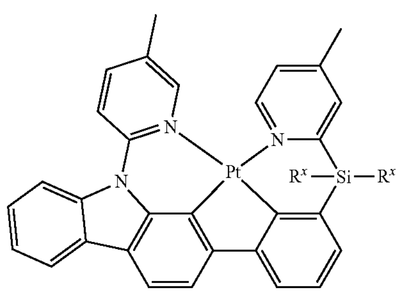
Pt 806
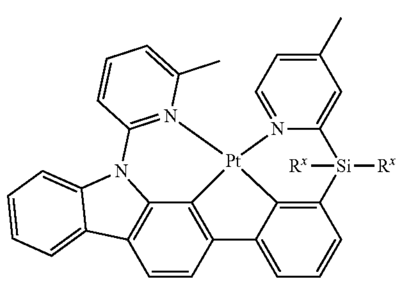
-continued
Pt 807
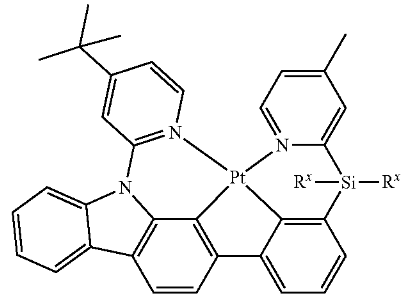
Pt 808
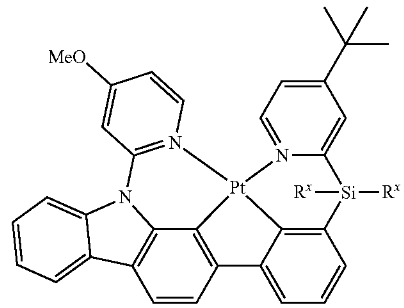
Pt 809
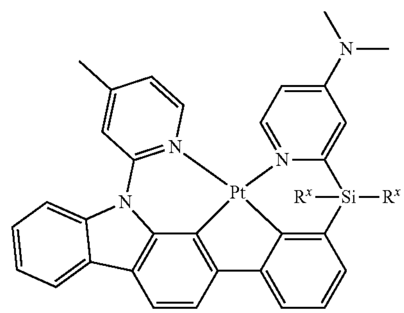
Pt 810
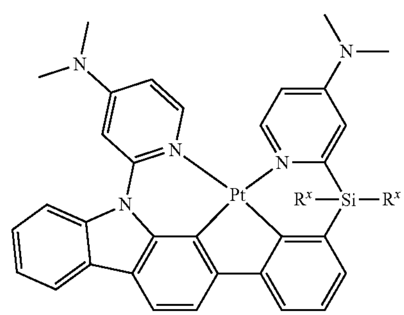
Pt 811
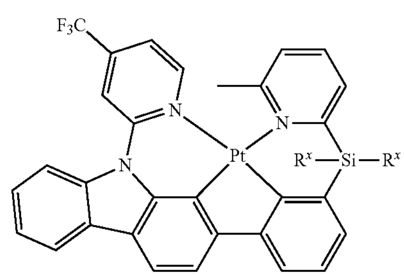

-continued
Pt 812
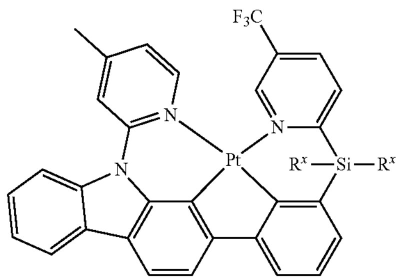
Pt 813
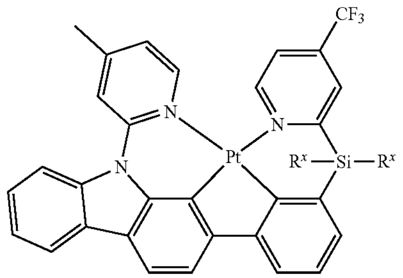
Pt 814
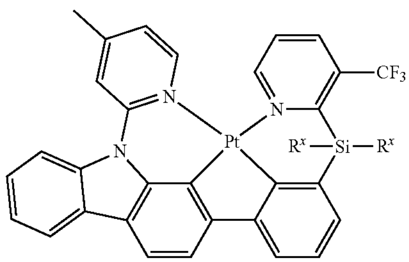
Pt 815
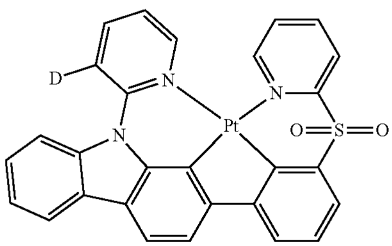
Pt 816
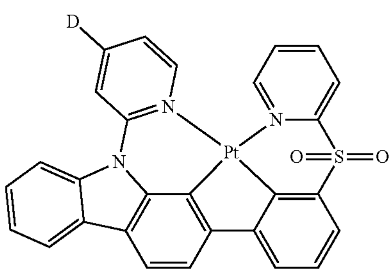
Pt 817
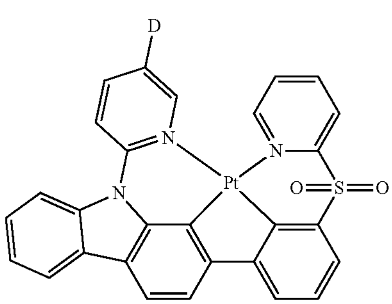
-continued
Pt 818
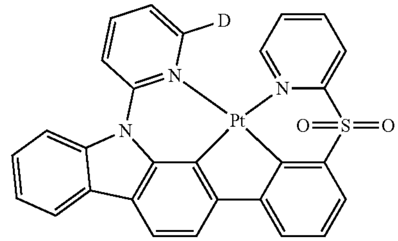
Pt 819
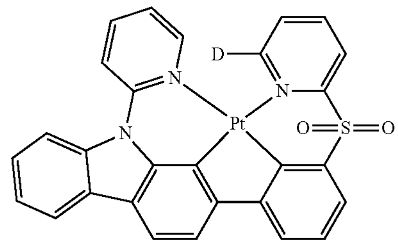
Pt 820
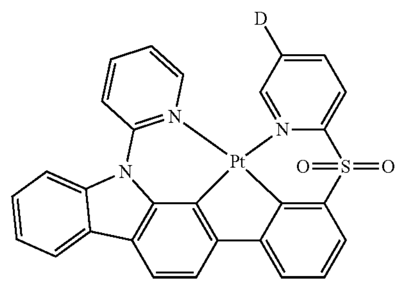
Pt 821
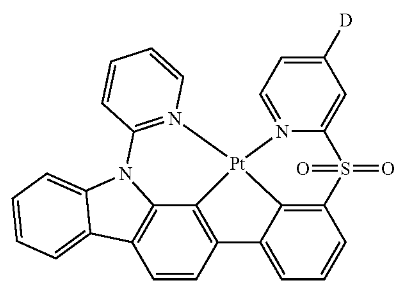
Pt 822
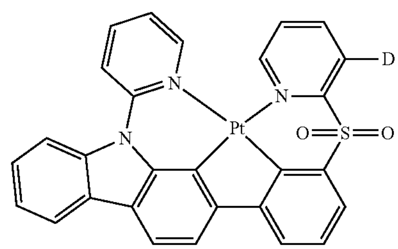
Pt 823
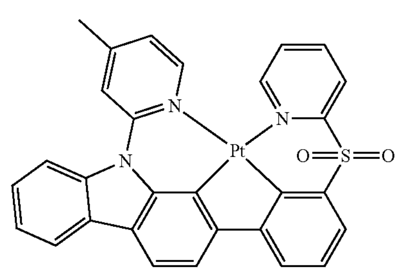

-continued
Pt 824
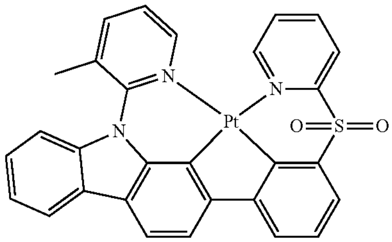
Pt 825
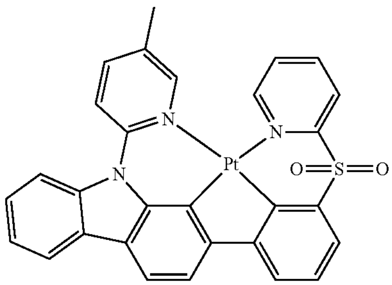
Pt 826
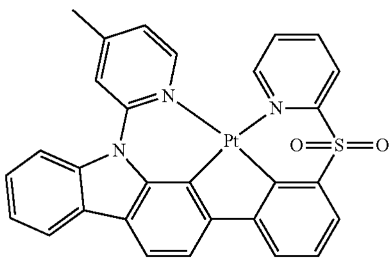
Pt 827
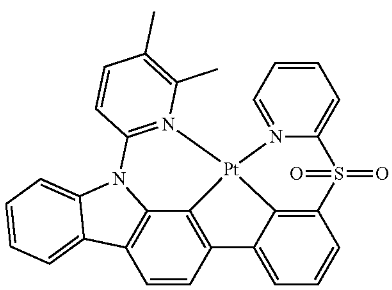
Pt 828
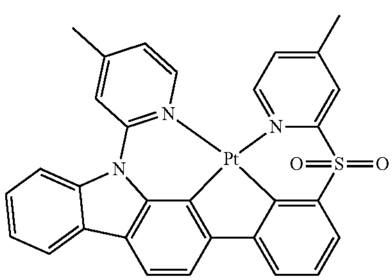
Pt 829
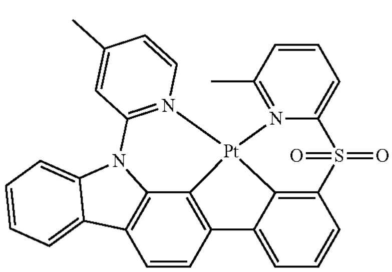
-continued
Pt 830
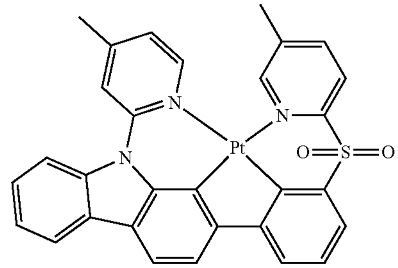
Pt 831
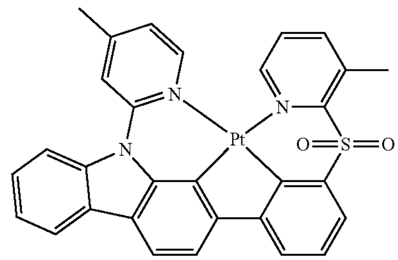
Pt 832
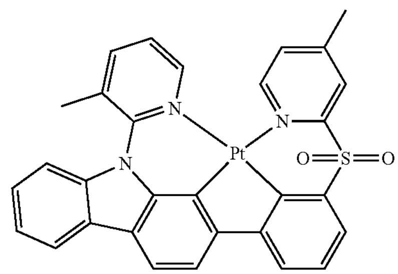
Pt 833
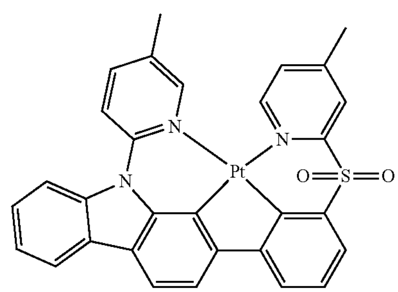
Pt 834
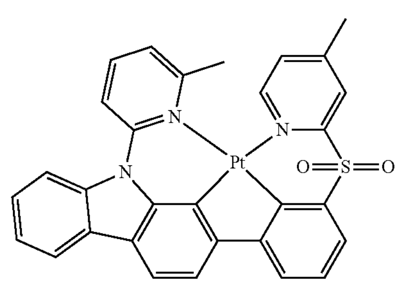

Pt 835
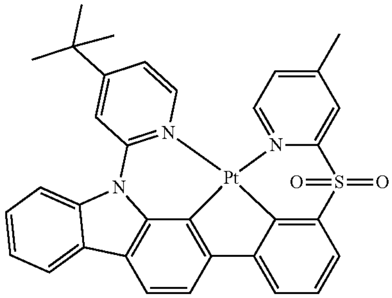
Pt 836
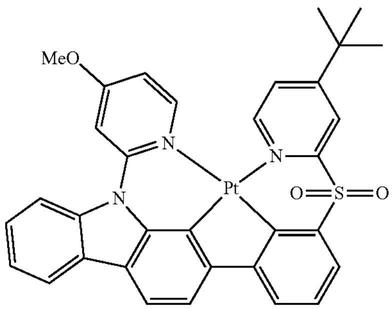
Pt 837
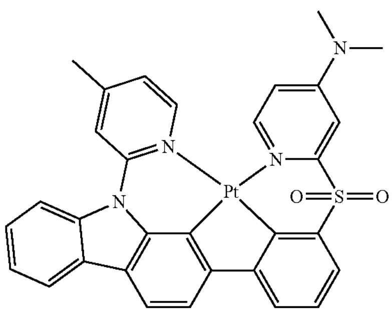
Pt 838
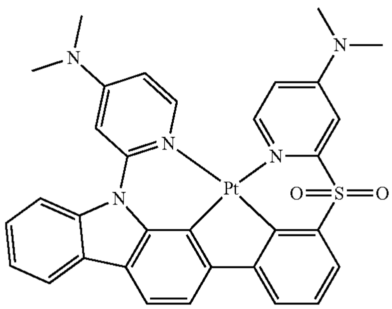
Pt 839
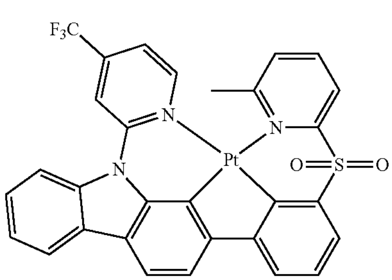
Pt 840
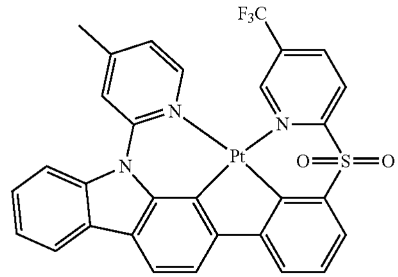
Pt 841
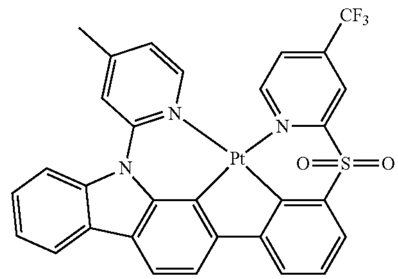
Pt 842
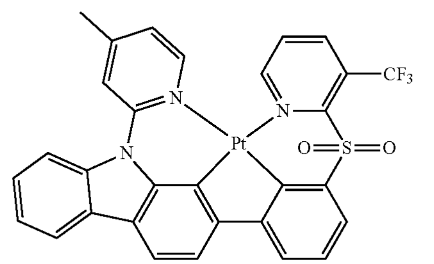
Pt 843
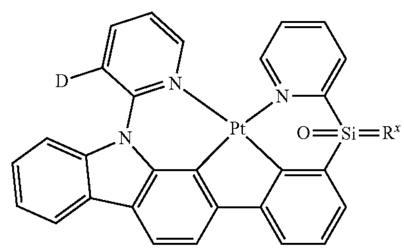
Pt 844
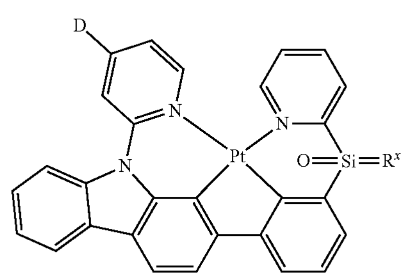
Pt 845
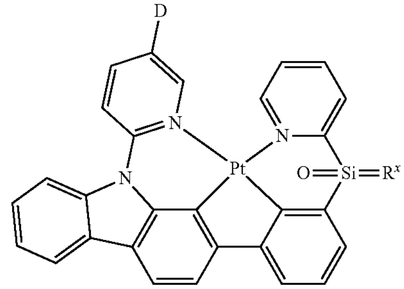

Pt 846
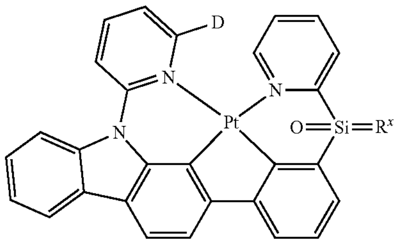
Pt 847
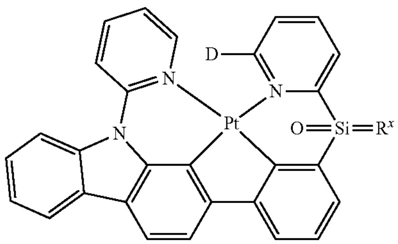
Pt 848
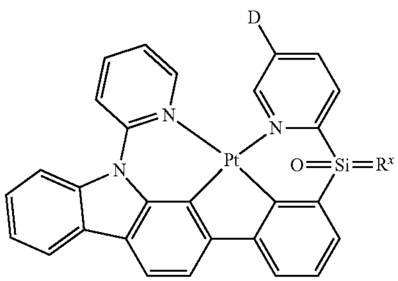
Pt 849
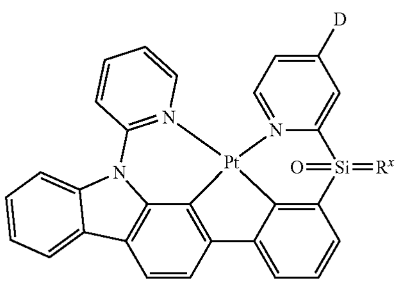
Pt 850
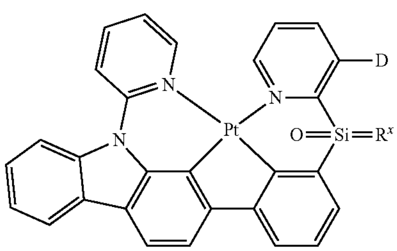
Pt 851
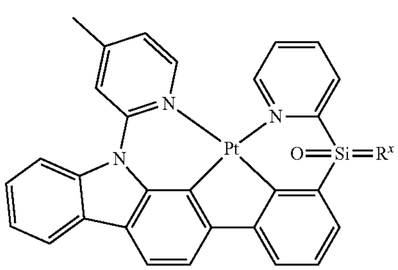
Pt 852
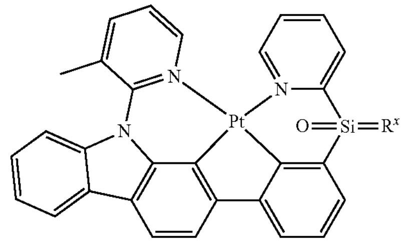
Pt 853
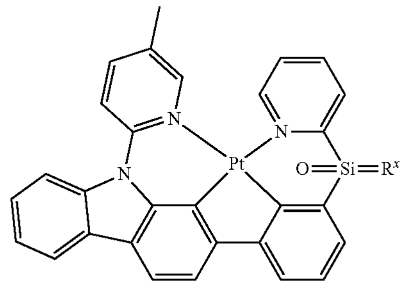
Pt 854
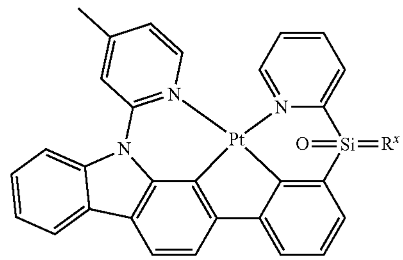
Pt 855
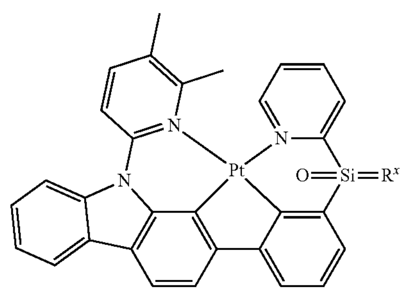
Pt 856
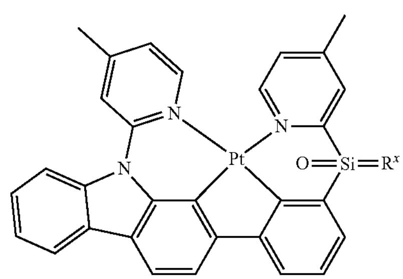
Pt 857
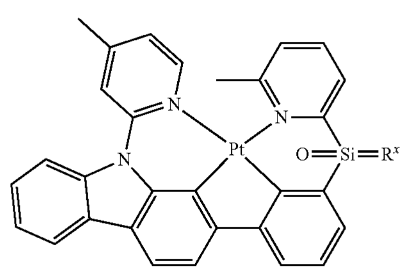

-continued
Pt 858
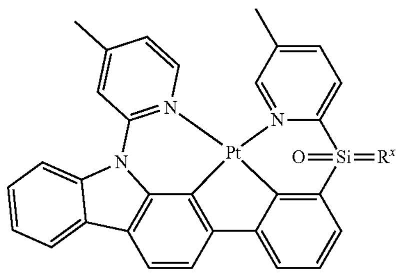
Pt 859
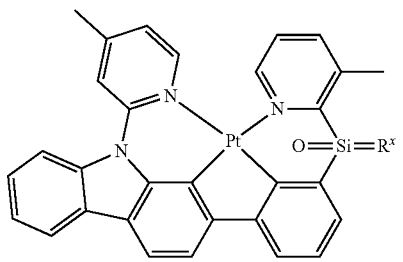
Pt 860
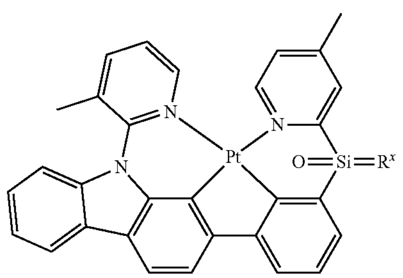
Pt 861
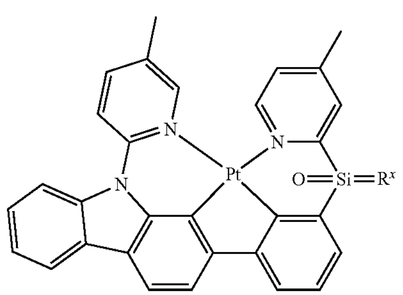
Pt 862
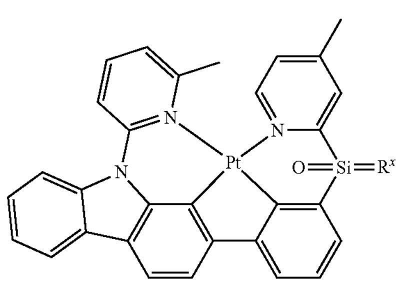
-continued
Pt 863
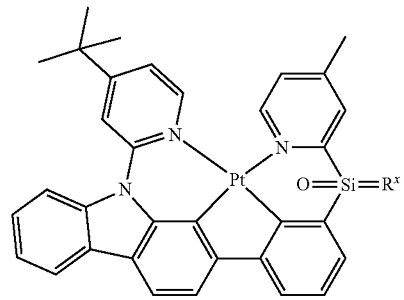
Pt 864
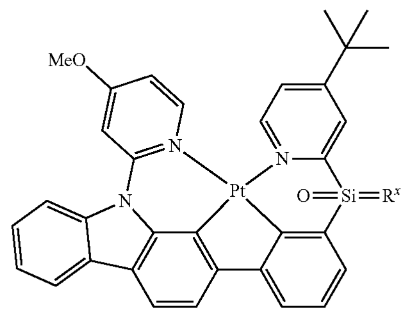
Pt 865
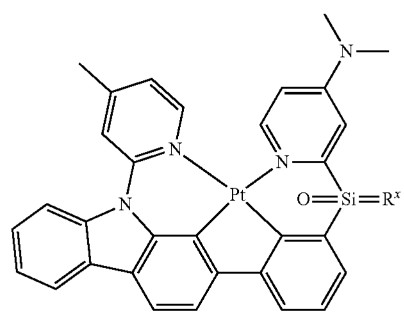
Pt 866
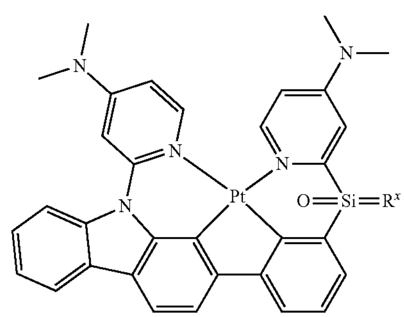
Pt 867
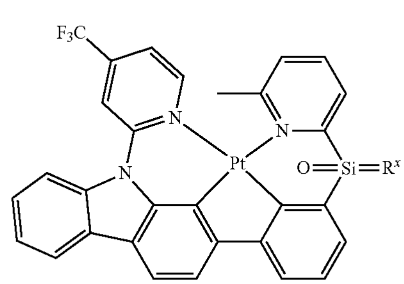

-continued
Pt 868
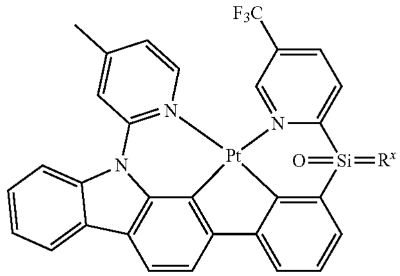
Pt 869
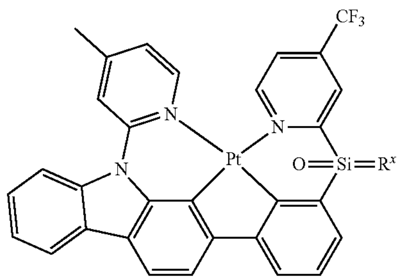
Pt 870
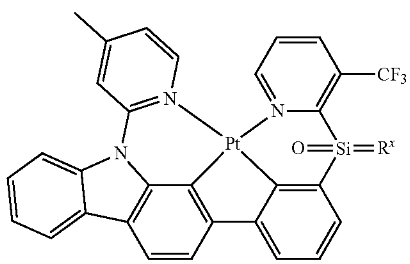
Pt 871
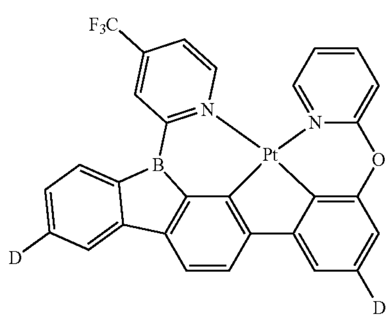
Pt 872
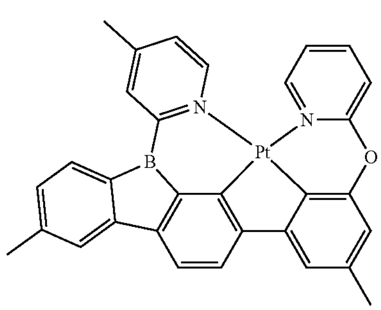
-continued
Pt 873
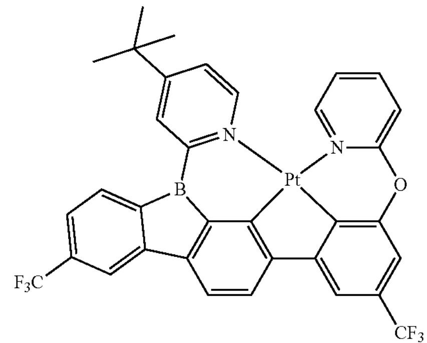
Pt 874
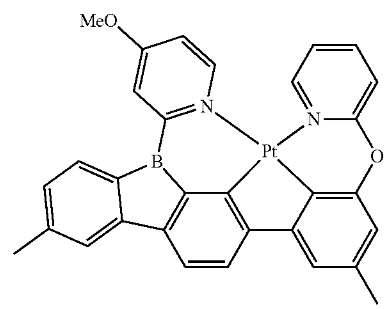
Pt 875
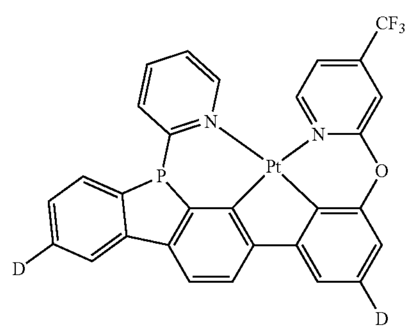
Pt 876
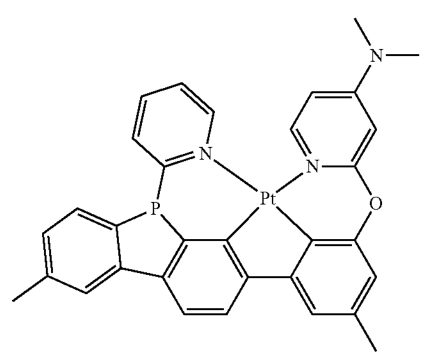

Pt 877
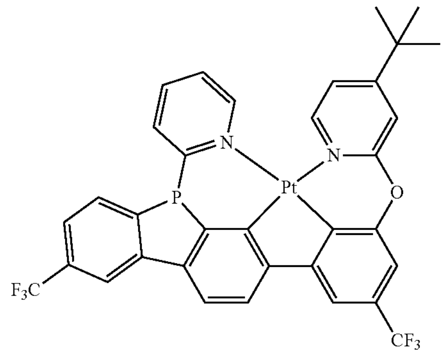
Pt 878
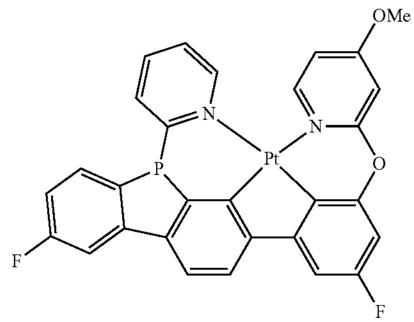
Pt 879
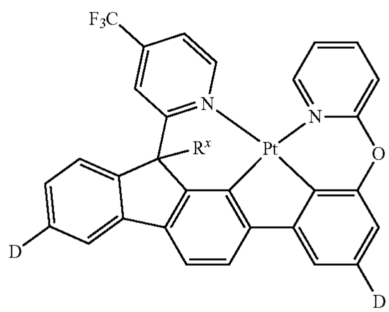
Pt 880
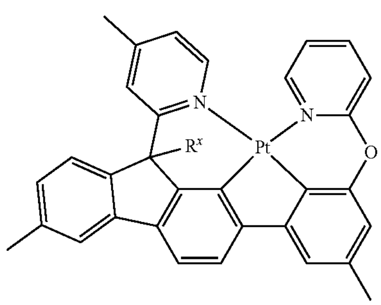
Pt 881
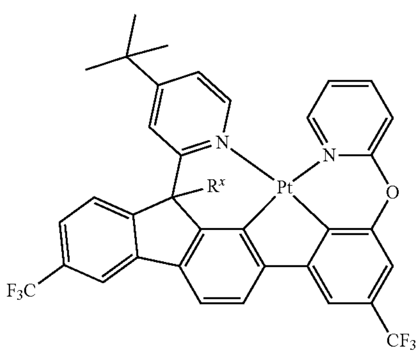
Pt 882
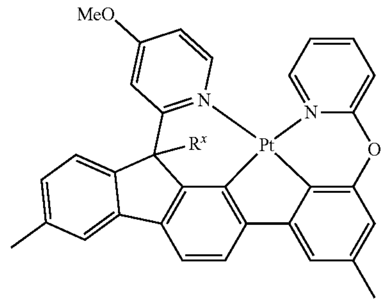
Pt 883
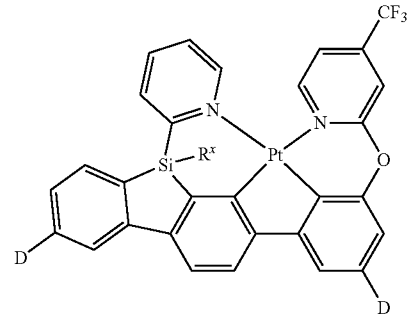
Pt 884
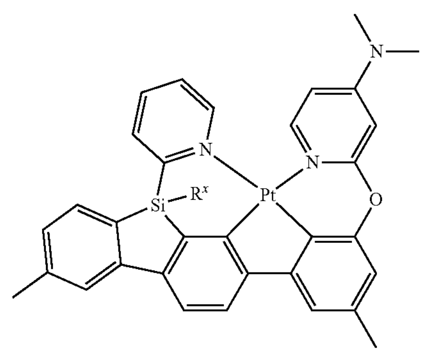
Pt 885
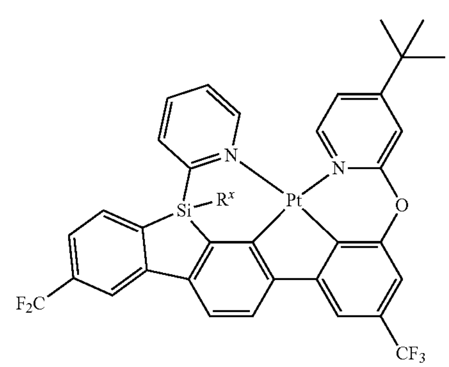

-continued
Pt 886
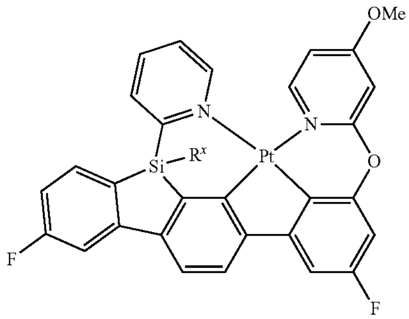
PT 887
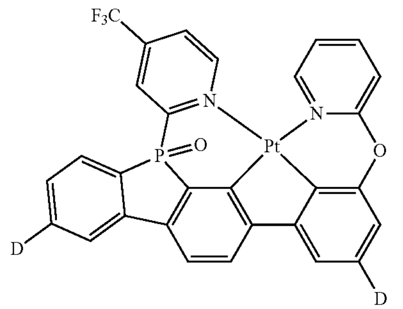
Pt 888
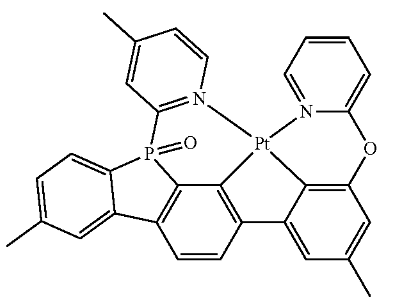
Pt 889
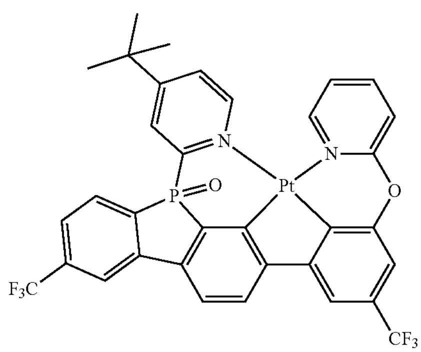
Pt 890
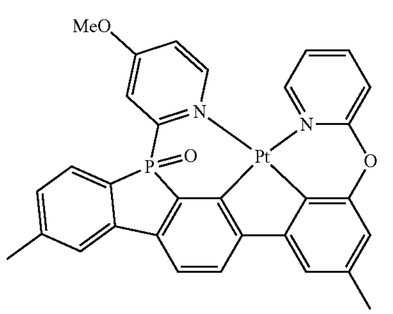
-continued
Pt 891
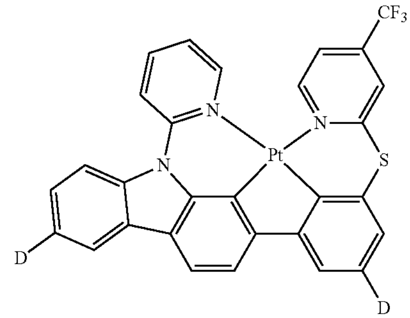
Pt 892
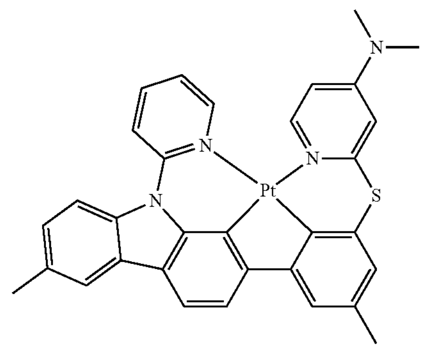
Pt 893
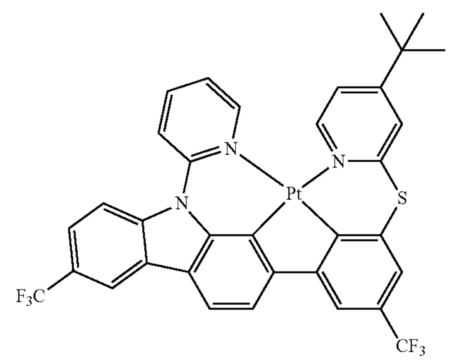
Pt 894
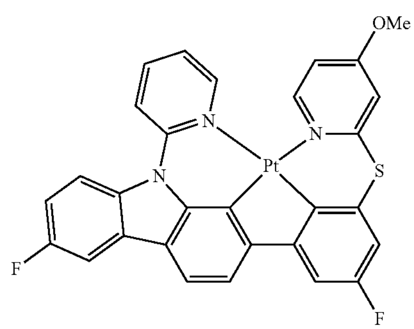

-continued
Pt 895
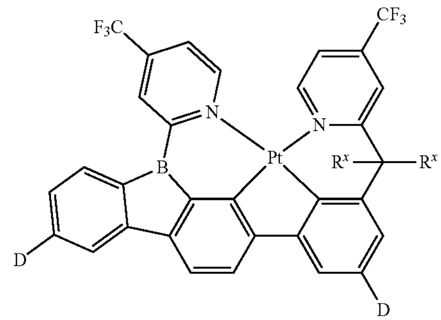
Pt 896
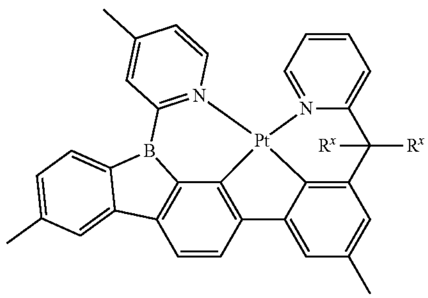
Pt 897
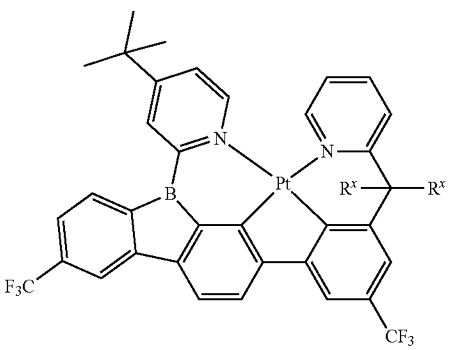
Pt 898
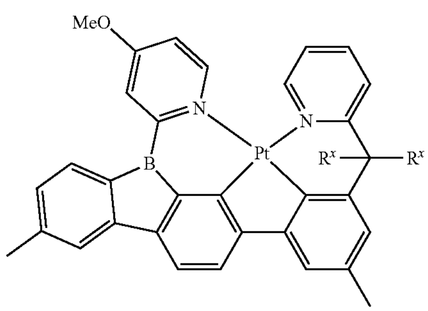
Pt 899
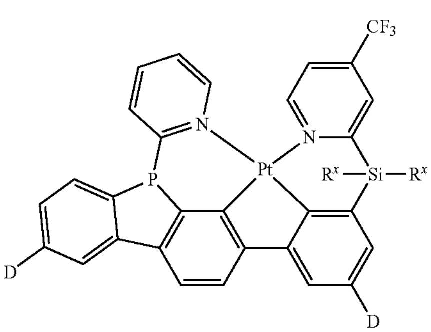
-continued
Pt 900
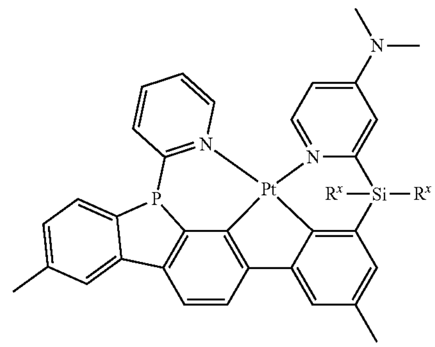
Pt 901
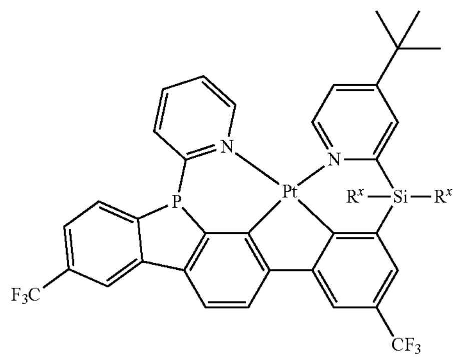
Pt 902
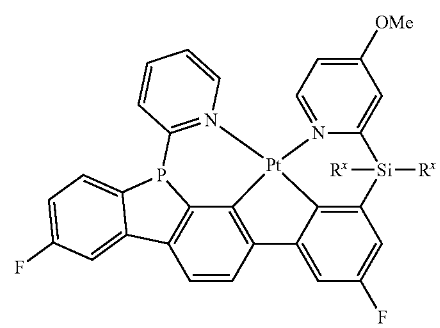
Pt 903
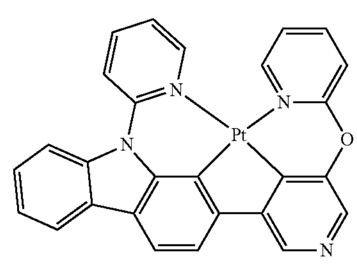
Pt 904
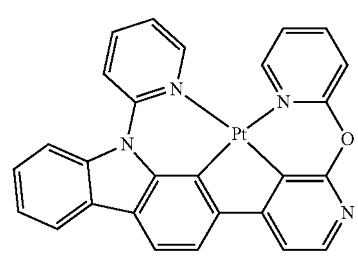

Pt 905
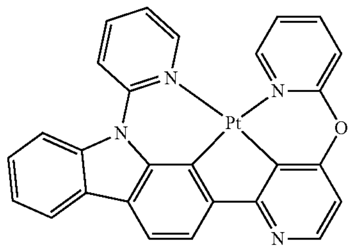
Pt 906
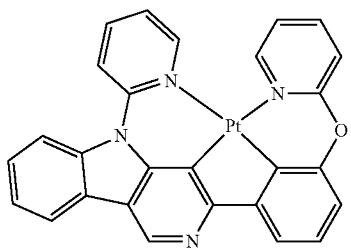
Pt 907
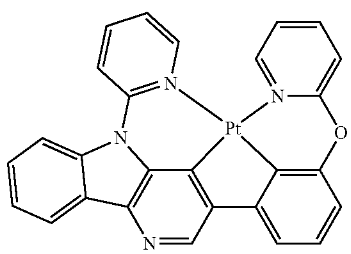
Pt 908
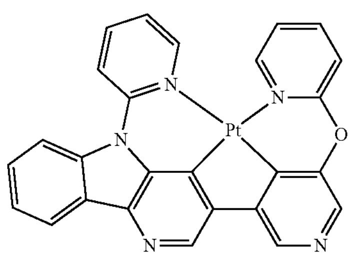
Pt 909
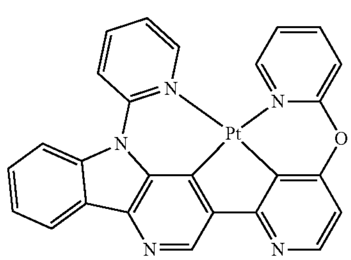
Pt 910
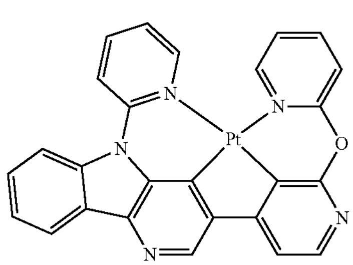
Pt 911
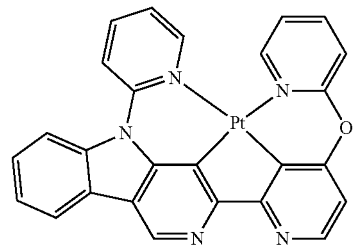
Pt 912
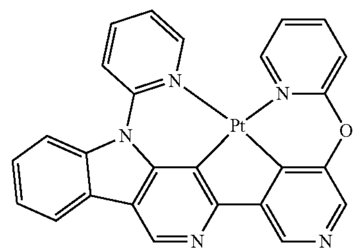
Pt 913
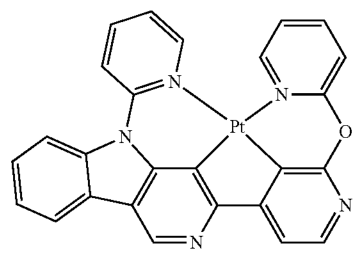
Pt 914
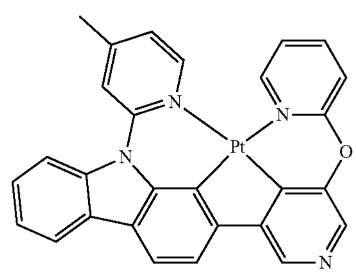
Pt 915
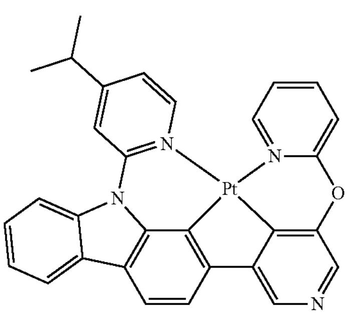
Pt 916
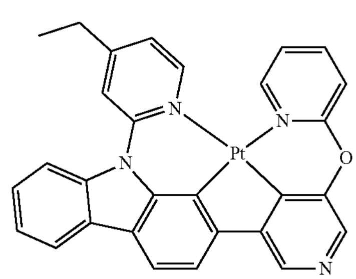

-continued
Pt 917
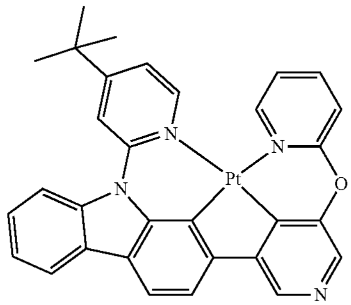
Pt 918
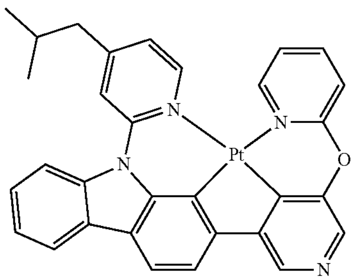
Pt 919
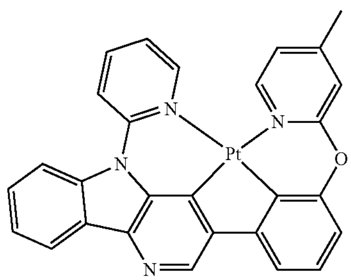
Pt 920
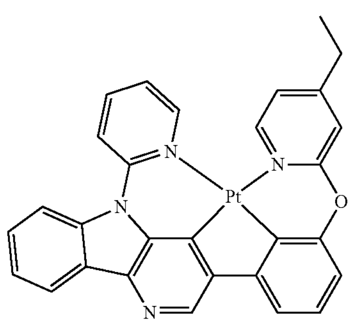
Pt 921
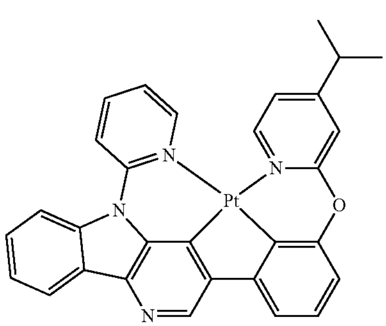
-continued
Pt 922
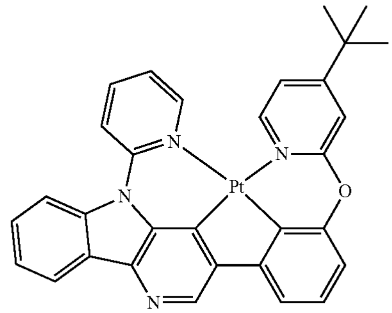
Pt 923
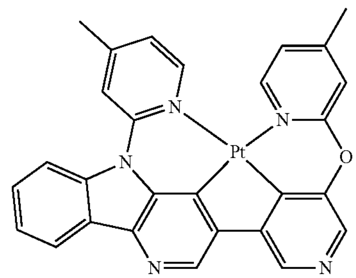
Pt 924
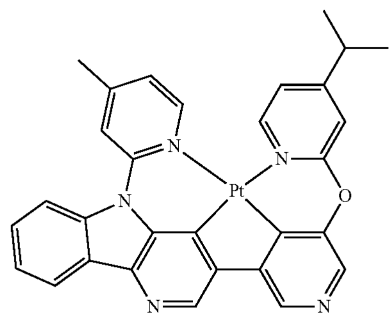
Pt 925
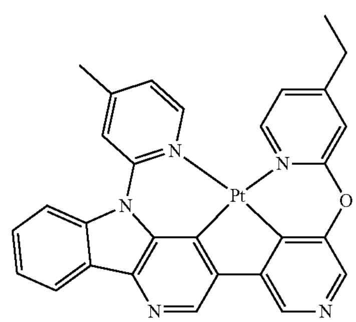
Pt 926
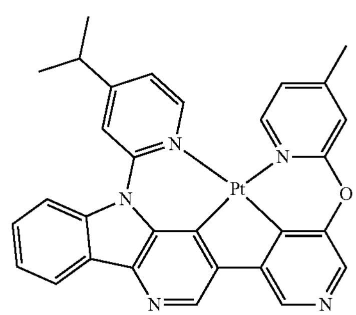

-continued

Pt 927

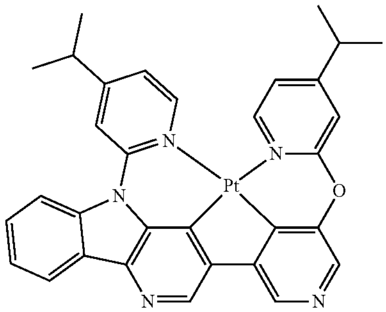

Pt 928

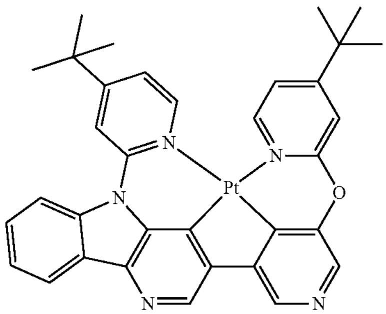

Pt 929

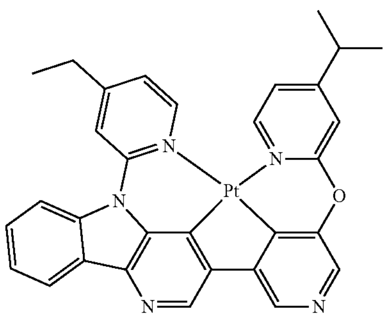

-continued

Pt 930

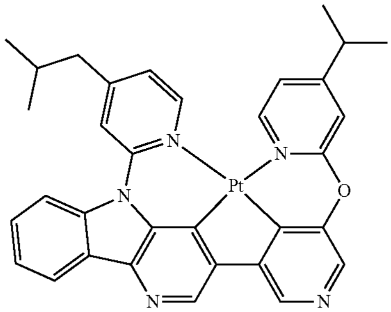

3. The tetradentate cyclometalated platinum complex according to claim 1, wherein the platinum complex has a neutral charge.

4. The tetradentate cyclometalated platinum complex according to claim 2, wherein the platinum complex has a neutral charge.

5. A device, wherein the device comprises the tetradentate cyclometalated platinum complex according to claim 1.

6. The device according to claim 5, wherein the device comprises a full color display.

7. The device according to claim 5, wherein the device is a photovoltaic device.

8. The device according to claim 5, wherein the device is a light emitting display device.

9. The device according to claim 5, wherein the device comprises an organic light emitting diode.

10. The device according to claim 5, wherein the device comprises a phosphorescent organic light emitting diode.

11. The device according to claim 5, wherein the device is a phosphorescent organic light emitting diode.

12. The device according to claim 5, wherein the tetradentate cyclometalated platinum complex is selected to have 100% internal quantum efficiency in the device environment.

13. A light emitting device comprising at least one cathode, at least one anode and at least one light emitting layer, wherein at least one layer of the light emitting layers comprises the tetradentate cyclometalated platinum complex according to claim 1.

* * * * *